(12) United States Patent
Oota et al.

(10) Patent No.: US 10,598,835 B2
(45) Date of Patent: Mar. 24, 2020

(54) INFRARED ABSORBING COMPOSITION, INFRARED CUT FILTER, LAMINATE, PATTERN FORMING METHOD, SOLID IMAGE PICKUP ELEMENT

(71) Applicant: FUJIFILM Corporation, Tokyo (JP)

(72) Inventors: Kazuya Oota, Haibara-gun (JP); Daisuke Sasaki, Haibara-gun (JP); Yuki Hirai, Haibara-gun (JP); Takahiro Okawara, Haibara-gun (JP); Kazuto Shimada, Haibara-gun (JP); Keisuke Arimura, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/802,803

(22) Filed: Nov. 3, 2017

(65) Prior Publication Data

US 2018/0120485 A1 May 3, 2018

Related U.S. Application Data

(63) Continuation of application No. PCT/JP2016/064366, filed on May 13, 2016.

(30) Foreign Application Priority Data

May 20, 2015 (JP) .................................. 2015-102728
Apr. 27, 2016 (JP) .................................. 2016-089420

(51) Int. Cl.
| | | |
|---|---|---|
| G02B 5/22 | (2006.01) |
| H01L 27/14 | (2006.01) |
| C09B 23/08 | (2006.01) |
| G02B 5/20 | (2006.01) |
| C09B 23/01 | (2006.01) |
| C09B 57/00 | (2006.01) |
| C09B 23/00 | (2006.01) |
| G02B 13/14 | (2006.01) |

(52) U.S. Cl.
CPC .............. *G02B 5/223* (2013.01); *C09B 23/00* (2013.01); *C09B 23/0066* (2013.01); *C09B 23/083* (2013.01); *C09B 23/086* (2013.01); *C09B 57/007* (2013.01); *G02B 5/201* (2013.01); *G02B 5/208* (2013.01); *G02B 5/22* (2013.01); *G02B 13/14* (2013.01); *H01L 27/14* (2013.01)

(58) Field of Classification Search
CPC ........ G02B 5/208; G02B 5/201; G02B 5/223; H01L 27/14; G03F 7/0007; C09B 23/0066; C09B 57/007
USPC ................................................ 430/7; 359/350
See application file for complete search history.

(56) References Cited

U.S. PATENT DOCUMENTS

| | | |
|---|---|---|
| 2007/0109548 A1 | 5/2007 | Uchida |
| 2007/0238802 A1 | 10/2007 | Harada et al. |
| 2010/0092885 A1* | 4/2010 | Ito .................. C07D 239/70 430/108.21 |
| 2014/0091419 A1 | 4/2014 | Hasegawa et al. |
| 2014/0198285 A1 | 7/2014 | Fujita et al. |
| 2014/0264202 A1 | 9/2014 | Nagaya et al. |
| 2014/0350146 A1 | 11/2014 | Tsubouchi |
| 2015/0146057 A1 | 5/2015 | Konishi et al. |
| 2016/0170105 A1 | 6/2016 | Nagaya et al. |
| 2017/0023713 A1 | 1/2017 | Takiguchi et al. |

FOREIGN PATENT DOCUMENTS

| | | |
|---|---|---|
| CN | 102317377 A | 1/2012 |
| CN | 103608705 A | 2/2014 |
| CN | 103858028 A | 6/2014 |
| EP | 1655347 A1 | 5/2006 |
| JP | 2003-222719 A | 8/2003 |
| JP | 2003-234456 A | 8/2003 |
| JP | 2007-141876 A | 6/2007 |
| JP | 2007-163644 A | 6/2007 |
| JP | 2007-271745 A | 10/2007 |
| JP | 2008-91535 A | 4/2008 |
| JP | 2010-90340 A | 4/2010 |
| JP | 2012-8532 A | 1/2012 |
| JP | 2012-22267 A | 2/2012 |
| JP | 2013-76926 A | 4/2013 |
| JP | 2013-155353 A | 8/2013 |
| JP | 2013-205820 A | 10/2013 |
| JP | 2014-31435 A | 2/2014 |
| JP | 2014-59550 A | 4/2014 |
| JP | 2014-148567 A | 8/2014 |
| JP | 2015-34252 A | 2/2015 |
| JP | 2015-203863 A | 11/2015 |
| JP | 2016-45372 A | 4/2016 |
| WO | WO 2012/169447 A1 | 12/2012 |
| WO | WO 2014/030628 A1 | 2/2014 |
| WO | WO 2015/056734 A1 | 4/2015 |

OTHER PUBLICATIONS

Computer-generated translation of JP 2008-091535 (Apr. 2008). (Year: 2008).*
Japanese Notification of Reasons for Refusal, dated Oct. 2, 2018, for corresponding Japanese Application No. 2017-519192, with an English translation.
Partial Supplementary European Search Report for corresponding European Application No. 16796443.6, dated Feb. 12, 2018.
Extended European Search Report, dated May 22, 2018, for corresponding European Application No. 16796443.6.
International Preliminary Report on Patentability and Written Opinion of the International Searching Authority (Forms PCT/IB/326, PCT/IB/373 and PCT/ISA/237) for Application No. PCT/JP2016/064366, dated Nov. 30, 2017, with an English translation.
International Search Report and English translation (Form PCT/ISA/210) for Application No. PCT/JP2016/064366, dated Aug. 16, 2016.

(Continued)

*Primary Examiner* — John A McPherson
(74) *Attorney, Agent, or Firm* — Birch, Stewart, Kolasch & Birch, LLP

(57) ABSTRACT

An infrared absorbing composition which is used for forming an infrared cut filter in a solid image pickup element having the infrared cut filter includes at least one infrared absorber having an absorption maximum at a wavelength of 650 nm or longer which is selected from polymethine colorants.

14 Claims, 6 Drawing Sheets

(56) References Cited

OTHER PUBLICATIONS

Korean Office Action, dated Mar. 25, 2019, for corresponding Korean Application No. 10-2017-7032067, with an English translation.
Araki et al., "Absorption Spectra of Unsymmetrical Cyanines", Progress of Theoretical Physics, vol. 15, No. 4, Apr. 1956, pp. 307-321 (15 pages).
Japanese Office Action, dated May 14, 2019, for corresponding Japanese Application No. 2017-519192, with an English translation.
Taiwanese Office Action and Search Report for corresponding Taiwanese Application No. 105115469, dated Jun. 28, 2019, with English translation of the Office Action.
Chinese Office Action and Search Report for Chinese Application No. 201680026024.1, dated Aug. 5, 2019, with an English translation
Korean Office Action for corresponding Korean Application No. 10-2017-7032067, dated Sep. 24, 2019, with an English translation.
Japanese Notice of Reasons for Refusal dated Dec. 17, 2019, for corresponding Japanese Application No. 2017-519192, with an English translation.
Korean Notice of Reasons for Refusal dated Jan. 7, 2020, for corresponding Korean Application No. 10-2017-7032067, with an English translation.

* cited by examiner

INFRARED ABSORBING COMPOSITION, INFRARED CUT FILTER, LAMINATE, PATTERN FORMING METHOD, SOLID IMAGE PICKUP ELEMENT

CROSS-REFERENCE TO RELATED APPLICATIONS

This application is a Continuation of PCT International Application No. PCT/JP2016/64366, filed on May 13, 2016, which claims priority under 35 U.S.C. § 119(a) to Japanese Patent Application No. 2015-102728, filed on May 20, 2015, and Japanese Patent Application No. 2016-89420, filed on Apr. 27, 2016. Each of the above application(s) is hereby expressly incorporated by reference, in its entirety, into the present application.

BACKGROUND OF THE INVENTION

1. Field of the Invention

The present invention relates to an infrared absorbing composition, an infrared cut filter, a laminate, a pattern forming method, and a solid image pickup element.

2. Description of the Related Art

In a video camera, a digital still camera, a mobile phone with a camera function, or the like, a charge coupled device (CCD) or a complementary metal-oxide semiconductor (CMOS), which is a solid image pickup element for a color image, is used. In a light receiving section of this solid image pickup element, a silicon photodiode having sensitivity to infrared light is used. Therefore, it is necessary to correct visibility, and a member that shields infrared light is used in many cases.

As the member that shields infrared light, for example, a dielectric multi-layer film in which a plurality of high refractive index material layers and a plurality of low refractive index material layers are laminated is known. In addition, for example, members described in JP2014-59550A, JP2014-148567A, JP2012-8532A, and JP2014-31435A are known.

SUMMARY OF THE INVENTION

However, since a dielectric multi-layer film is manufactured by laminating a plurality of high refractive index material layers and a plurality of low refractive index material layers, the number of steps is large, and the productivity is poor.

In addition, recently, further improvement in incidence angle dependency has been required. However, there is a problem in that optical characteristics of a dielectric multi-layer film vary depending on whether incidence rays are normal incidence rays or oblique incidence rays, and the incidence angle dependency is poor.

Accordingly, an object of the present invention is to provide an infrared absorbing composition with which an infrared cut filter having excellent incidence angle dependency can be manufactured through a small number of steps. In addition, the present invention also provides an infrared cut filter, a laminate, a pattern forming method, and a solid image pickup element.

As a result of various investigation, the present inventors found that the above-described object can be achieved by using an infrared absorbing composition including at least one infrared absorber having an absorption maximum at a wavelength of 650 nm or longer which is selected from polymethine colorants, thereby completing the present invention. The present invention provides the following.

<1> An infrared absorbing composition which is used for forming an infrared cut filter in a solid image pickup element having the infrared cut filter, the infrared absorbing composition comprising:

at least one infrared absorber having an absorption maximum at a wavelength of 650 nm or longer which is selected from polymethine colorants.

<2> The infrared absorbing composition according to <1>, in which the polymethine colorants are at least one of squarylium colorants or cyanine colorants.

<3> The infrared absorbing composition according to <2>, in which the squarylium colorant is a compound represented by the following Formula (1),

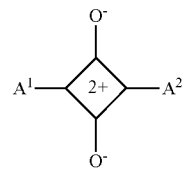

(1)

in Formula (1), $A^1$ and $A^2$ each independently represent an aryl group, a heterocyclic group, or a group represented by the following Formula (2),

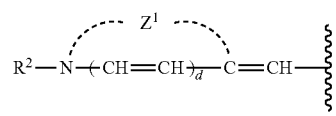

(2)

In Formula (2), $Z^1$ represents a non-metal atomic group for forming a nitrogen-containing heterocycle, $R^2$ represents an alkyl group, an alkenyl group, or an aralkyl group, d represents 0 or 1, and a wave line represents a direct bond to Formula (1).

<4> The infrared absorbing composition according to <2>, in which the cyanine colorant is a compound represented by the following Formula (A),

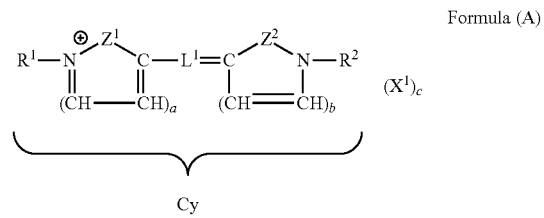

Formula (A)

in Formula (A), $Z^1$ and $Z^2$ each independently represent a non-metal atomic group for forming a 5- or 6-membered nitrogen-containing heterocycle which may be fused, $R^1$ and $R^2$ each independently represent an alkyl group, an alkenyl group, an alkynyl group, an aralkyl group, or an aryl group, $L^1$ represents a methine chain including an odd number of methine groups, and a and b each independently represent 0 or 1, and in a case where a site represented by Cy in Formula (A) is a cation site, $X^1$ represents an anion, and c represents the number of $X^1$'s for balancing charge, in a case where a site represented by Cy in Formula (A) is an anion site, $X^1$ represents a cation, and c represents the number of $X^1$'s for balancing charge, and in a case where charge of a site represented by Cy in Formula (A) is neutralized in a molecule, c represents 0.

<5> The infrared absorbing composition according to any one of <1> to <4>, further comprising:

at least one selected from the group consisting of a resin and a curable compound.

<6> The infrared absorbing composition according to any one of <1> to <5>, further comprising:

a solvent.

<7> The infrared absorbing composition according to any one of <1> to <6>, further comprising:

a chromatic colorant.

<8> An infrared cut filter which is obtained by curing the infrared absorbing composition according to any one of <1> to <7>.

<9> A laminate comprising:

the infrared cut filter according to <8>; and a color filter that includes a chromatic colorant.

<10> A pattern forming method comprising:

forming an infrared absorbing composition layer on a support using the infrared absorbing composition according to any one of claims 1 to 7; and forming a pattern on the infrared absorbing composition layer using a photolithography method or a dry etching method.

<11> A solid image pickup element comprising:

the infrared cut filter according to <8>.

<12> The solid image pickup element according to <11>, further comprising:

a color filter that includes a chromatic colorant.

<13> The solid image pickup element according to <12>, in which the infrared cut filter and the color filter are adjacent to each other in a thickness direction of the infrared cut filter.

<14> The solid image pickup element according to any one of <11> to <13>, further comprising:

an infrared transmitting filter.

According to the present invention, an infrared absorbing composition can be provided with which an infrared cut filter having excellent incidence angle dependency can be manufactured through a small number of steps. In addition, an infrared cut filter, a laminate, a pattern forming method, and a solid image pickup element can also be provided.

DESCRIPTION OF THE PREFERRED EMBODIMENTS

Figure 1:
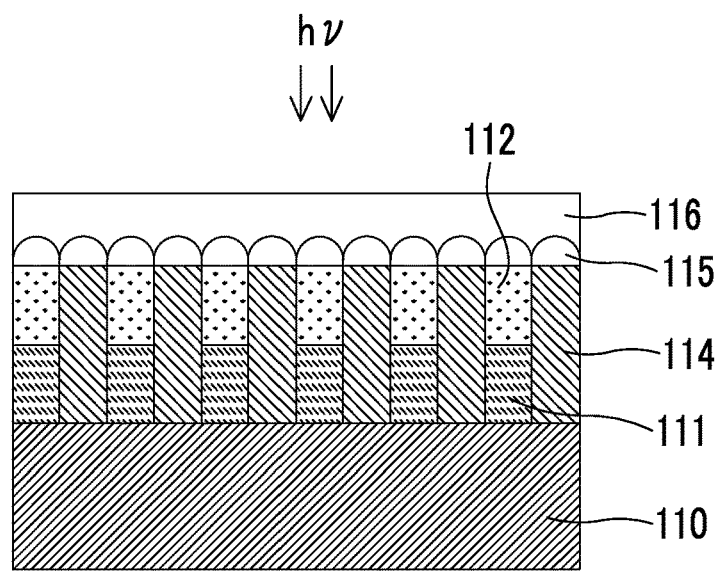
FIG. 1 is a schematic diagram showing an embodiment of a solid image pickup element according to the present invention.

In this specification, "total solid content" denotes the total mass of components of a composition excluding a solvent. In addition, "solid content" denotes a solid content at 25° C.

In this specification, unless specified as a substituted group or as an unsubstituted group, a group (atomic group) denotes not only a group having no substituent but also a group having a substituent. For example, "alkyl group" denotes not only an alkyl group having no substituent (unsubstituted alkyl group) but also an alkyl group having a substituent (substituted alkyl group).

In this specification, "radiation" denotes, for example, a bright light spectrum of a mercury lamp, a far ultraviolet ray represented by excimer laser, an extreme ultraviolet ray (EUV ray), an X-ray, or an electron beam. In addition, in the present invention, "light" denotes an actinic ray or radiation. In this specification, unless specified otherwise, "exposure" denotes not only exposure using a mercury lamp, a far ultraviolet ray represented by excimer laser, an X-ray, an EUV ray, or the like but also drawing using a corpuscular beam such as an electron beam or an ion beam.

In this specification, "(meth)acrylate" denotes either or both of acrylate and methacrylate, "(meth)acryl" denotes either or both of acryl and methacryl, and "(meth)acryloyl" denotes either or both of acryloyl and methacryloyl.

In this specification, the term "step" denotes not only an individual step but also a step which is not clearly distinguishable from another step as long as an effect expected from the step can be achieved.

In this specification, "weight-average molecular weight" and "number-average molecular weight" are defined as values in terms of polystyrene obtained by gel permeation chromatography (GPC).

<Infrared Absorbing Composition>

An infrared absorbing composition (hereinafter, also referred to as "composition") according to the present invention is used for forming an infrared cut filter in a solid image pickup element having the infrared cut filter, the infrared absorbing composition including at least one infrared absorber having an absorption maximum at a wavelength of 650 nm or longer which is selected from polymethine colorants.

In the present invention, "infrared absorber" denotes a compound having an absorption in an infrared range (preferably a wavelength range of 650 to 1000 nm). It is preferable that the infrared absorber is a compound having an absorption maximum at a wavelength of 650 nm or longer. It is more preferable that the absorption maximum of the infrared absorber is present in a wavelength range of 650 to 1000 nm, it is still more preferable that the absorption maximum is present in a wavelength range of 700 to 1000 nm, and it is even still more preferable that the absorption maximum is present in a wavelength range of 800 to 1000 nm.

<<Infrared Absorber>>

In the present invention, it is preferable that the infrared absorber is a polymethine colorant. The polymethine colorant is preferably a compound having an absorption maximum at a wavelength of 650 nm or longer, more preferably a compound having an absorption maximum in a wavelength range of 650 to 1000 nm, still more preferably a compound having an absorption maximum in a wavelength range of 700 to 1000 nm, and even still more preferably a compound having an absorption maximum in a wavelength range of 800 to 1000 nm. In this specification, "having an absorption maximum at a wavelength of 650 nm or longer" denotes having a maximum absorbance at a wavelength 650 nm or longer (preferably in a wavelength range of 650 to 1000 nm) in an absorption spectrum of the infrared absorber in a solution. Examples of a measurement solvent which is used for measuring the absorption spectrum of the infrared absorber in the solution include chloroform and water. In the case of a compound which is soluble in chloroform, chloroform is used as the measurement solvent. In addition, in the case of a compound which is insoluble in chloroform, water is used as the measurement solvent.

Examples of the polymethine colorant depending on the kind of an atomic group to be bonded include a cyanine colorant, a merocyanine colorant, a squarylium colorant, a croconium colorant, and an oxonol colorant. Among these, a cyanine colorant, a squarylium colorant, or an oxonol colorant is preferable, and a cyanine colorant or a squarylium colorant is more preferable.

In the present invention, the infrared absorber may be a pigment or a dye. In addition, the dye-type infrared absorber can be used after dissolved in a solvent having a high solubility for the infrared absorber. In addition, the dye-type infrared absorber can also be used after dispersed in a solvent having a low solubility for the infrared absorber. For example, in the case of an infrared absorber that is soluble in water and is insoluble in an organic solvent, this infrared absorber can be used after dispersed in an organic solvent.

Examples of the solvent having a high solubility for the infrared absorber include a solvent in having a solubility of 0.1 g/100 g Solvent or higher for the infrared absorber at 25° C., in which the solubility is more preferably 1.0 g/100 g Solvent or higher. Examples of the solvent having a low solubility for the infrared absorber include a solvent in having a solubility of 0.01 g/100 g Solvent or lower for the infrared absorber at 25° C., in which the solubility is more preferably 0.001 g/100 g Solvent or lower.

The content of the infrared absorber is preferably 0.1 to 70 mass % with respect to the total solid content of the infrared absorbing composition according to the present invention. The lower limit is preferably 0.5 mass % or higher and more preferably 1.0 mass % or higher. The upper limit is preferably 60 mass % or lower, and more preferably 50 mass % or lower. In the above-described range, excellent infrared absorption capacity can be imparted. In a case where the infrared absorbing composition according to the present invention includes two or more infrared absorbers, it is preferable that the total content of the two or more infrared absorbers is in the above-described range.

The content of the polymethine colorant having an absorption maximum in the above-described range is preferably 0.1 to 70 mass % with respect to the total solid content of the infrared absorbing composition according to the present invention. The lower limit is preferably 0.5 mass % or higher and more preferably 1.0 mass % or higher. The upper limit is preferably 60 mass % or lower, and more preferably 50 mass % or lower. In a case where the infrared absorbing composition according to the present invention includes two or more polymethine colorants, it is preferable that the total content of the two or more polymethine colorants is in the above-described range.

(Squarylium Colorant)

In the present invention, it is preferable that the squarylium colorant is a compound represented by the following Formula (1).

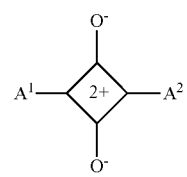

(1)

In Formula (1), $A^1$ and $A^2$ each independently represent an aryl group, a heterocyclic group, or a group represented by the following Formula (2).

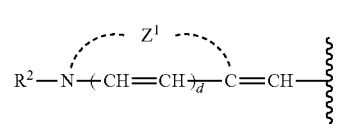

(2)

In Formula (2), $Z^1$ represents a non-metal atomic group for forming a nitrogen-containing heterocycle, $R^2$ represents an alkyl group, an alkenyl group, or an aralkyl group, d represents 0 or 1, and a wave line represents a direct bond to Formula (1).

In Formula (1), $A^1$ and $A^2$ each independently represent an aryl group, a heterocyclic group, or a group represented by the following Formula (2), and preferably a group represented by Formula (2).

The number of carbon atoms in the aryl group represented by $A^1$ and $A^2$ is preferably 6 to 48, more preferably 6 to 24, and still more preferably 6 to 12. Specific examples include a phenyl group and a naphthyl group. In a case where the aryl group has a substituent, the number of carbon atoms in the aryl group denotes the number of carbon atoms excluding the number of carbon atoms in the substituent.

It is preferable that the heterocyclic group represented by $A^1$ and $A^2$ is a 5- or 6-membered ring. In addition, the heterocyclic group is preferably a monocycle or a fused ring, more preferably a monocycle or a fused ring composed of 2 to 8 rings, still more preferably a monocycle or a fused ring composed of 2 to 4 rings, and even still more preferably a monocycle or a fused ring composed of 2 or 3 rings. Examples of a heteroatom included in the heterocyclic group include a nitrogen atom, an oxygen atom, and a sulfur atom. Among these, a nitrogen atom or a sulfur atom is preferable. The number of heteroatoms is preferably 1 to 3 and more preferably 1 or 2. Specific examples include a heterocyclic group derived from a monocycle or a polycyclic aromatic ring such as a 5- or 6-membered ring containing at least one of a nitrogen atom, an oxygen atom, or a sulfur atom.

The aryl group and the heterocyclic group may have a substituent. Examples of the substituent include the following substituent group T.

(Substituent Group T)

The substituent group T includes:

a halogen atom (for example, a fluorine atom, a chlorine atom, a bromine atom, or an iodine atom);

a linear or branched alkyl group (a linear or branched substituted or unsubstituted alkyl group, preferably an alkyl group having 1 to 30 carbon atoms; for example, methyl, ethyl, n-propyl, isopropyl, t-butyl, n-octyl, 2-chloroethyl, 2-cyanoethyl, or 2-ethylhexyl);

a cycloalkyl group (preferably, a substituted or unsubstituted cycloalkyl group having 3 to 30 carbon atoms (for example, cyclohexyl or cyclopentyl) or a polycycloalkyl group, for example, a bicycloalkyl group (preferably a substituted or unsubstituted bicycloalkyl group having 5 to 30 carbon atoms; for example, bicyclo[1,2,2]heptane-2-yl or bicyclo[2,2,2]octan-3-yl) or a tricycloalkyl group; as the cycloalkyl group, a monocycloalkyl group or a bicycloalkyl group is preferable, and a monocycloalkyl group is more preferable);

a linear or branched alkenyl group (a linear or branched substituted or unsubstituted alkenyl group, preferably, an alkenyl group having 2 to 30 carbon atoms; for example, vinyl, allyl, prenyl, geranyl, or oleyl);

a cycloalkenyl group (preferably, a substituted or unsubstituted cyclic cycloalkyl group having 3 to 30 carbon atoms (for example, 2-cyclopenten-1-yl or 2-cyclohexen-1-yl) or a polycycloalkenyl group, for example, a bicycloalkenyl group (preferably a substituted or unsubstituted bicycloalkenyl group having 5 to 30 carbon atoms; for example, bicyclo[2,2,1]hept-2-en-1-yl or bicyclo[2,2,2]oct-2-en-4-yl) or a tricycloalkenyl group; as the cycloalkenyl group, a monocycloalkenyl group is preferable), and an alkynyl group (preferably a substituted or unsubstituted alkynyl group having 2 to 30 carbon atoms; for example, ethynyl, propargyl, or trimethylsilylethynyl group);

an aryl group (preferably a substituted or unsubstituted aryl group having 6 to 30 carbon atoms; for example, phenyl, p-tolyl, naphthyl, m-chlorophenyl, or o-hexadecanoylaminophenyl);

a heteroaryl group (preferably a substituted or unsubstituted and monocyclic or fused heteroaryl group having 5 to 7 carbon atoms, more preferably a heteroaryl group having a ring-constituting atom selected from a carbon atom, a nitrogen atom, and a sulfur atom and having at least one heteroatom selected from a nitrogen atom, an oxygen atom, and a sulfur atom, and still more preferably a 5-membered or 6-membered heteroaryl group having 3 to 30 carbon atoms; for example, 2-furyl, 2-thienyl, 2-pyridyl, 4-pyridyl, 2-pyrimidinyl, or 2-benzothiazolyl);

a cyano group;

a hydroxyl group;

a nitro group;

a carboxyl group (in which a hydrogen atom may be dissociable (that is, a carbonate group), or may be in the form of a salt);

an alkoxy group (preferably a substituted or unsubstituted alkoxy group alkoxy group having 1 to 30 carbon atoms; for example, methoxy, ethoxy, isopropoxy, t-butoxy, n-octyloxy, or 2-methoxyethoxy);

an aryloxy group (preferably a substituted or unsubstituted aryloxy group having 6 to 30 carbon atoms; for example, phenoxy, 2-methylphenoxy, 2,4-di-t-amylphenoxy, 4-t-butylphenoxy, 3-nitrophenoxy, or 2-tetradecanoylaminophenoxy);

a silyloxy group (preferably a silyloxy group having 3 to 20 carbon atoms; for example, trimethylsilyloxy or t-butyldimethylsilyloxy);

a heteroaryloxy group (preferably a substituted or unsubstituted heteroaryloxy group having 2 to 30 carbon atoms in which a heteroaryl portion is preferably configured as described above regarding the heteroaryl group; for example, 1-phenyltetrazole-5-oxy or 2-tetrahydropyranyloxy);

an acyloxy group (preferably a substituted or unsubstituted alkylcarbonyloxy group having 2 to 30 carbon atoms, or a substituted or unsubstituted arylcarbonyloxy group having 6 to 30 carbon atoms; for example, formyloxy, acetyloxy, pivaloyloxy, stearoyloxy, benzoyloxy, or p-methoxyphenylcarbonyloxy);

a carbamoyloxy group (preferably a substituted or unsubstituted carbamoyloxy group having 1 to 30 carbon atoms; for example, N,N-dimethylcarbamoyloxy, N,N-diethylcarbamoyloxy, morpholinocarbonyloxy, N,N-di-n-octylaminocarbonyloxy, or N-n-octylcarbamoyloxy);

an alkoxycarbonyloxy group (preferably a substituted or unsubstituted alkoxycarbonyloxy group having 2 to 30 carbon atoms; for example, methoxycarbonyloxy, ethoxycarbonyloxy, t-butoxycarbonyloxy, or n-octyloxycarbonyloxy);

an aryloxycarbonyloxy group (preferably a substituted or unsubstituted aryloxycarbonyloxy group having 7 to 30 carbon atoms; for example, phenoxycarbonyloxy, p-methoxyphenoxycarbonyloxy, or p-n-hexadecyloxyphenoxycarbonyloxy);

an amino group (preferably an amino group, a substituted or unsubstituted alkylamino group having 1 to 30 carbon atoms, a substituted or unsubstituted arylamino group having 6 to 30 carbon atoms, or a heteroarylamino group having 0 to 30 carbon atoms; for example, amino, methylamino, dimethylamino, anilino, N-methyl-anilino, diphenylamino, or N-1,3,5-triazin-2-yl-amino);

an acylamino group (preferably a substituted or unsubstituted alkylcarbonylamino group having 1 to 30 carbon atoms, or a substituted or unsubstituted arylcarbonylamino group having 6 to 30 carbon atoms; for example, formylamino, acetylamino, pivaloylamino, lauroylamino, benzoylamino, or 3,4,5-tri-n-octyloxyphenylcarbonylamino);

an aminocarbonylamino group (preferably a substituted or unsubstituted aminocarbonylamino group having 1 to 30 carbon atoms; for example, carbamoylamino, N,N-dimethylaminocarbonylamino, N,N-diethylaminocarbonylamino, or morpholinocarbonylamino);

an alkoxycarbonylamino group (preferably a substituted or unsubstituted alkoxycarbonylamino group having 2 to 30 carbon atoms; for example, methoxycarbonylamino, ethoxycarbonylamino, t-butoxycarbonylamino, n-octadecyloxycarbonylamino, or N-methyl-methoxycarbonylamino);

an aryloxycarbonylamino group (preferably a substituted or unsubstituted aryloxycarbonylamino group having 7 to 30 carbon atoms; for example, phenoxycarbonylamino, p-chlorophenoxycarbonylamino, or m-n-octyloxyphenoxy carbonylamino);

a sulfamoylamino group (preferably a substituted or unsubstituted sulfamoylamino group having 0 to 30 carbon atoms; for example, sulfamoylamino, N,N-dimethylaminosulfonylamino, or N-n-octylaminosulfonylamino);

an alkyl- or aryl-sulfonylamino group (preferably a substituted or unsubstituted alkylsulfonylamino group having 1 to 30 carbon atoms or a substituted or unsubstituted arylsulfonylamino group having 6 to 30 carbon atoms; for example, methylsulfonylamino, butylsulfonylamino, phenylsulfonylamino, 2,3,5-trichlorophenylsulfonylamino, or p-methylphenylsulfonylamino);

a mercapto group;

an alkylthio group (preferably a substituted or unsubstituted alkylthio group having 1 to 30 carbon atoms; for example, methylthio, ethylthio, or n-hexadecylthio);

an arylthio group (preferably a substituted or unsubstituted arylthio group having 6 to 30 carbon atoms; for example, phenylthio, p-chlorophenylthio, or m-methoxyphenylthio);

a heteroarylthio group (preferably a substituted or unsubstituted heteroarylthio group having 2 to 30 carbon atoms in which a heteroaryl portion is preferably configured as described above regarding the heteroaryl group; for example, 2-benzothiazolylthio or 1-phenyltetrazole-5-ylthio);

a sulfamoyl group (preferably a substituted or unsubstituted sulfamoyl group having 0 to 30 carbon atoms; for example, N-ethylsulfamoyl, N-(3-dodecyloxypropyl)sulfamoyl, N,N-dimethylsulfamoyl, N-acetylsulfamoyl, N-benzoylsulfamoyl, or N—(N'-phenylcarbamoyl)sulfamoyl);

a sulfo group (in which a hydrogen atom may be dissociable (that is, a sulfonate group), or may be in the form of a salt);

an alkyl- or aryl-sulfinyl group (preferably a substituted or unsubstituted alkylsulfinyl group having 1 to 30 carbon atoms or a substituted or unsubstituted arylsulfinyl group having 6 to 30 carbon atoms; for example, methylsulfinyl, ethylsulfinyl, phenylsulfinyl, or p-methylphenylsulfinyl);

an alkyl- or aryl-sulfonyl group (preferably a substituted or unsubstituted alkylsulfonyl group having 1 to 30 carbon atoms or a substituted or unsubstituted arylsulfonyl group having 6 to 30 carbon atoms; for example, methylsulfonyl, ethylsulfonyl, phenylsulfonyl, or p-methylphenylsulfonyl);

an acyl group (preferably a formyl group, a substituted or unsubstituted alkylcarbonyl group having 2 to 30 carbon atoms, or a substituted or unsubstituted arylcarbonyl group having 7 to 30 carbon atoms; for example, acetyl, pivaloyl, 2-chloroacetyl, stearoyl, benzoyl, or p-n-octyloxyphenylcarbonyl);

an aryloxycarbonyl group (preferably a substituted or unsubstituted aryloxycarbonyl group having 7 to 30 carbon atoms; for example, phenoxycarbonyl, o-chlorophenoxycarbonyl, m-nitrophenoxycarbonyl, or p-t-butylphenoxycarbonyl);

an alkoxycarbonyl group (preferably a substituted or unsubstituted alkoxycarbonyl group having 2 to 30 carbon atoms; for example, methoxycarbonyl, ethoxycarbonyl, t-butoxycarbonyl, or n-octadecyloxycarbonyl);

a carbamoyl group (preferably a substituted or unsubstituted carbamoyl group having 1 to 30 carbon atoms; for example, carbamoyl, N-methylcarbamoyl, N,N-dimethylcarbamoyl, N,N-di-n-octylcarbamoyl, or N-(methylsulfonyl)carbamoyl);

an aryl- or heteroaryl-azo group (preferably a substituted or unsubstituted aryl azo group having 6 to 30 carbon atoms or a substituted or unsubstituted heteroarylazo group having 3 to 30 carbon atoms (in which a heteroaryl portion is preferably configured as described above regarding the heteroaryl group); for example, phenylazo, p-chlorophenylazo, or 5-ethylthio-1,3,4-thiadiazol-2-ylazo);

an imido group (preferably a substituted or unsubstituted imido group having 2 to 30 carbon atoms; for example, N-succinimido or N-phthalimido);

a phosphino group (preferably a substituted or unsubstituted phosphino group having 2 to 30 carbon atoms; for example, dimethylphosphino, diphenylphosphino, or methylphenoxyphosphino);

a phosphinyl group (preferably a substituted or unsubstituted phosphinyl group having 2 to 30 carbon atoms; for example, phosphinyl, dioctyloxyphosphinyl, or diethoxyphosphinyl);

a phosphinyloxy group (preferably a substituted or unsubstituted phosphinyloxy group having 2 to 30 carbon atoms; for example, diphenoxyphosphinyloxy or dioctyloxyphosphinyloxy);

a phosphinylamino group (preferably a substituted or unsubstituted phosphinylamino group having 2 to 30 carbon atoms; for example, dimethoxyphosphinylamino or dimethylaminophosphinylamino); and a silyl group (preferably a substituted or unsubstituted silyl group having 3 to 30 carbon atoms; for example, trimethylsilyl, t-butyldimethylsilyl, or phenyldimethylsilyl).

A substituent which may be included in the aryl group and the heterocyclic group is preferably a halogen atom, an alkyl group, a hydroxyl group, an amino group, or an acylamino group.

The halogen atom is preferably a chlorine atom.

The number of carbon atoms in the alkyl group is preferably 1 to 20, more preferably 1 to 10, still more preferably 1 to 5, and most preferably 1 to 4. The alkyl group is preferably linear or branched.

The amino group is preferably a group represented by —NR$^{100}$R$^{101}$. R$^{100}$ and R$^{101}$ each independently represent a hydrogen atom or an alkyl group having 1 to 30 carbon atoms. The number of carbon atoms in the alkyl group is preferably 1 to 30, more preferably 1 to 20, still more preferably 1 to 10, and even still more preferably 1 to 8. The alkyl group is preferably linear or branched and more preferably linear.

The acylamino group is preferably a group represented by —NR$^{102}$—C(=O)—R$^{103}$. R$^{102}$ represents a hydrogen atom or an alkyl group and preferably a hydrogen atom. R$^{103}$ represents an alkyl group. The number of carbon atoms in the alkyl group represented by R$^{102}$ and R$^{103}$ is preferably 1 to 20, more preferably 1 to 10, still more preferably 1 to 5, and even still more preferably 1 to 4.

In a case where the aryl group and the heterocyclic group have two or more substituents, the substituents may be the same as or different from each other.

Next, the group represented by Formula (2) which is represented by A$^1$ and A$^2$ will be described.

In Formula (2), R$^2$ represents an alkyl group, an alkenyl group, or an aralkyl group and preferably an alkyl group.

The number of carbon atoms in the alkyl group is preferably 1 to 30, more preferably 1 to 20, still more preferably 1 to 12, and even still more preferably 2 to 8.

The number of carbon atoms in the alkenyl group is preferably 2 to 30, more preferably 2 to 20, and still more preferably 2 to 12.

The alkyl group and the alkenyl group may be linear, branched, or cyclic and is preferably linear or branched.

The number of carbon atoms in the aralkyl group is preferably 7 to 30 and more preferably 7 to 20.

In Formula (2), the nitrogen-containing heterocycle formed by Z1 is preferably a 5- or 6-membered ring. In addition, the nitrogen-containing heterocycle is preferably a monocycle or a fused ring, more preferably a monocycle or a fused ring composed of 2 to 8 rings, still more preferably a monocycle or a fused ring composed of 2 to 4 rings, and even still more preferably a fused ring composed of 2 or 3 rings. In addition to a nitrogen atom, the nitrogen-containing heterocycle may include a sulfur atom. In addition, the nitrogen-containing heterocycle may have a substituent Examples of the substituent include the groups described regarding the substituent group T. For example, a halogen atom, an alkyl group, a hydroxyl group, an amino group, or an acylamino group is preferable, and a halogen atom or an alkyl group is more preferable. The halogen atom is preferably a chlorine atom. The number of carbon atoms in the alkyl group is preferably 1 to 30, more preferably 1 to 20, and still more preferably 1 to 12. The alkyl group is preferably linear or branched.

It is preferable that the group represented by Formula (2) is a group represented by the following Formula (3) or (4).

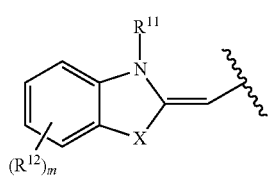

(3)

atom, an alkyl group, a hydroxyl group, an amino group, or an acylamino group is preferable, and a halogen atom or an alkyl group is more preferable. The halogen atom is preferably a chlorine atom. The number of carbon atoms in the alkyl group is preferably 1 to 30, more preferably 1 to 20, and still more preferably 1 to 12. The alkyl group is preferably a linear or branched alkyl group.

In a case where m represents 2 or more, $R^{12}$'s may be linked to each other to form a ring. Examples of the ring include an alicyclic ring (a nonaromatic hydrocarbon ring), an aromatic ring, and a heterocycle. The ring may be a monocycle or a polycycle. In a case where substituents are linked to each other to form a ring through a linking group, for example, the linking group may be selected from the group consisting of —CO—, —O—, —NH—, a divalent aliphatic group, a divalent aromatic group, and a combination thereof. For example, it is preferable that $R^{12}$'s may be linked to each other to form a benzene ring.

In Formula (3), X represents a nitrogen atom or $CR^{13}R^{14}$, and $R^{13}$ and $R^{14}$ each independently represent a hydrogen atom or a substituent. Examples of the substituent include the groups described regarding the substituent group T. For example, the substituent is an alkyl group. The number of carbon atoms in the alkyl group is preferably 1 to 20, more preferably 1 to 10, still more preferably 1 to 5, even still more preferably 1 to 3, and most preferably 1. The alkyl group is preferably a linear or branched alkyl group and more preferably a linear alkyl group.

m represents an integer of 0 to 4 and preferably 0 to 2.

As shown below, cations in Formula (1) are present without localized.

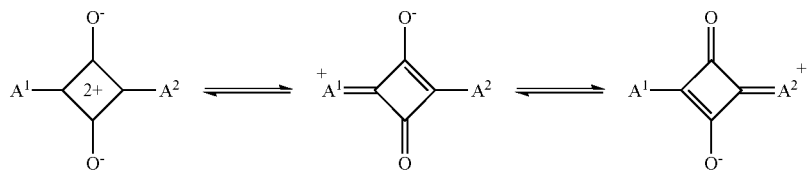

-continued

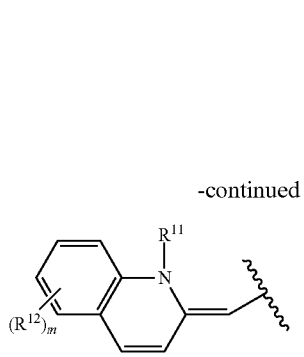

(4)

In Formulae (3) and (4), $R^{11}$ represents an alkyl group, an alkenyl group, or an aralkyl group, $R^{12}$ represents a substituent, in a case where m represents 2 or more, $R^{12}$'s may be linked to each other to form a ring, X represents a nitrogen atom or $CR^{13}R^{14}$, $R^{13}$ and $R^{14}$ each independently represent a hydrogen atom or a substituent, m represents an integer of 0 to 4, and a wave line represents a direct bond to Formula (1).

$R^{11}$ in Formulae (3) and (4) has the same definition and the same preferable range as $R^2$ in Formula (2).

$R^{12}$ in Formulae (3) and (4) represents a substituent. Examples of the substituent include the groups described regarding the substituent group T. For example, a halogen It is preferable that the squarylium colorant is a compound represented by the following Formula (5).

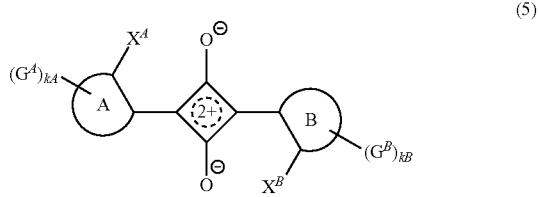

(5)

The ring A and the ring B each independently represent an aromatic ring or a heteroaromatic ring.

$X^A$ and $X^B$ each independently represent a substituent.

$G^A$ and $G^B$ each independently represent a substituent.

kA represents an integer of 0 to $n_A$, and kB represents an integer of 0 to $n_B$.

$n_A$ and $n_B$ represents integers representing the maximum numbers of $G^A$'s and $G^B$'s which may be substituted in the ring A and the ring B, respectively.

$X^A$ and $G^A$, or $X^B$ and $G^B$ may be bonded to each other, and in a case where a plurality of $G^A$'s and a plurality of $G^B$'s are present, $G^A$'s and $G^B$'s may be bonded to each other to form ring structures, respectively.

$G^A$ and $G^B$ each independently represent a substituent. Examples of the substituent include a halogen atom, a cyano group, a nitro group, an alkyl group, an alkenyl group, an alkynyl group, an aryl group, a heteroaryl group, an aralkyl group, —$OR^{10}$, —$COR^{11}$, —$COOR^{12}$, —$OCOR^{13}$, —$NR^{14}R^{15}$, —$NHCOR^{16}$, —$CONR^{17}R^{18}$, —$NHCONR^{19}R^{20}$, —$NHCOOR^{21}$, —$SR^{22}$, —$SO_2R^{23}$, —$SO_2OR^{24}$, —$NHSO_2R^{25}$, and —$SO_2NR^{26}R^{27}$. $R^{10}$ to $R^{27}$ each independently represent a hydrogen atom, an alkyl group, an alkenyl group, an alkynyl group, an aryl group, a heteroaryl group, or an aralkyl group. In a case where $R^{12}$ in —$COOR^{12}$ represents a hydrogen atom (that is, a carboxyl group), the hydrogen atom may be dissociable (that is, a carbonate group) or may be in the form of a salt. In a case where $R^{24}$ in —$SO_2OR^{24}$ represents a hydrogen atom (that is, a sulfo group), the hydrogen atom may be dissociable (that is, a sulfonate group) or may be in the form of a salt.

Examples of the halogen atom include a fluorine atom, a chlorine atom, a bromine atom, and an iodine atom.

The number of carbon atoms in the alkyl group is preferably 1 to 20, more preferably 1 to 15, and still more preferably 1 to 8. The alkyl group may be linear, branched, or cyclic, and a linear or branched alkyl group is preferable.

The number of carbon atoms in the alkenyl group is preferably 2 to 20, more preferably 2 to 12, and still more preferably 2 to 8. The alkenyl group may be linear, branched, or cyclic, and a linear or branched alkenyl group is preferable.

The number of carbon atoms in the alkynyl group is preferably 2 to 40, more preferably 2 to 30, and still more preferably 2 to 25. The alkynyl group may be linear, branched, or cyclic, and a linear or branched alkynyl group is preferable.

The number of carbon atoms in the aryl group is preferably 6 to 30, more preferably 6 to 20, and still more preferably 6 to 12.

An alkyl portion of the aralkyl group is the same as the above-described alkyl group. An aryl portion of the aralkyl group is the same as the above-described aryl group. The number of carbon atoms in the aralkyl group is preferably 7 to 40, more preferably 7 to 30, and still more preferably 7 to 25.

The heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the ring of the heteroaryl group is preferably 1 to 3. It is preferable that the heteroatoms constituting the ring of the heteroaryl group are a nitrogen atom, an oxygen atom, or a sulfur atom. It is preferable that the heteroaryl group is a 5- or 6-membered ring. The number of carbon atoms constituting the ring of the heteroaryl group is preferably 3 to 30, more preferably 3 to 18, and still more preferably 3 to 12. Examples of the heteroaryl group include a pyridine ring, a piperidine ring, a furan ring, a furfuran ring, a thiophene ring, a pyrrole ring, a quinoline ring, a morpholine ring, an indole ring, an imidazole ring, a pyrazole ring, a carbazole ring, a phenothiazine ring, a phenoxazine ring, an indoline ring, a thiazole ring, a pyrazine ring, a thiadiazine ring, a benzoquinoline ring, and a thiadiazole ring.

The alkyl group, the alkenyl group, the alkynyl group, the aralkyl group, the aryl group, and the heteroaryl group may have a substituent or may be unsubstituted. Examples of the substituent include the groups described regarding the substituent group T.

$X^A$ and $X^B$ each independently represent a substituent. As the substituent, a group having active hydrogen is preferable, —OH, —SH, —COOH, —$SO_3H$, —$NR^{X1}R^{X2}$, —$NHCOR^{X1}$, —$CONR^{X1}R^{X2}$, —$NHCONR^{X1}R^{X2}$, —$NHCOOR^{X1}$, —$NHSO_2R^{X1}$, —$B(OH)_2$, or —$PO(OH)_2$ is more preferable, and —OH, —SH, or —$NR^{X1}R^{X2}$ is still more preferable.

$R^{X1}$ and $R^{X2}$ each independently represent a hydrogen atom or a substituent. Examples of the substituent include an alkyl group, an alkenyl group, an alkynyl group, an aryl group, and a heteroaryl group. Among these, an alkyl group is preferable. The alkyl group is preferably a linear or branched alkyl group. The details of the alkyl group, the alkenyl group, the alkynyl group, the aryl group, and the heteroaryl group are the same as the ranges described regarding the $G^A$ and $G^B$.

The ring A and the ring B each independently represent an aromatic ring or a heteroaromatic ring.

The aromatic ring and the heteroaromatic ring may be a monocycle or a fused ring.

Specific examples of the aromatic ring and the heteroaromatic ring include a benzene ring, a naphthalene ring, a pentalene ring, an indene ring, an azulene ring, a heptalene ring, an indecene ring, a perylene ring, a pentacene ring, an acenaphthene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, and a phenazine ring. Among these, a benzene ring or a naphthalene ring is preferable.

The aromatic ring and the heteroaromatic ring may be unsubstituted or may have a substituent. Examples of the substituent include the substituents described regarding $G^A$ and $G^B$.

$X^A$ and $G^A$, or $X^B$ and $G^B$ may be bonded to each other, and in a case where a plurality of $G^A$'s and a plurality of $G^B$'s are present, $G^A$'s and $G^B$'s may be bonded to each other to form rings, respectively.

It is preferable that the ring is a 5- or 6-membered ring. The ring may be a monocycle or a polycycle.

In a case where $X^A$ and $G^A$, $X^B$ and $G^B$, $G^A$'s, or $G^B$'S are bonded to each other to form a ring, the groups may be directly bonded to each other, or may be bonded to each other through a divalent linking group selected from the group consisting of an alkylene group, —CO—, —O—, —NH—, —BR—, and a combination thereof to form a ring. It is preferable that $X^A$ and $G^A$, $X^B$ and $G^B$, $G^A$'s, or $G^B$'S are bonded to each other through —BR— to form a ring.

R represents a hydrogen atom or a substituent. Examples of the substituent include the substituents described regarding $G^A$ and $G^B$. Among these, an alkyl group or an aryl group is preferable.

kA represents an integer of 0 to $n_A$, kB represents an integer of 0 to $n_B$, $n_A$ represents an integer representing the maximum number of $G^A$'s which may be substituted in the ring A, and $n_B$ represents an integer representing the maximum number of $G^B$'s which may be substituted in the ring B.

kA and kB each independently represent preferably an integer of 0 to 4, more preferably 0 to 2, and still more preferably 0 or 1.

As an embodiment of the squarylium colorant, a compound represented by the following Formula (6) is used. This compound has excellent heat resistance.

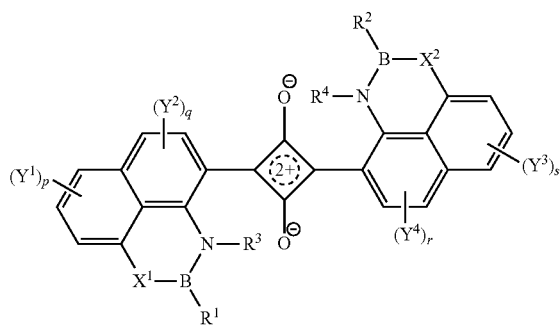

Formula (6)

In the formula $R^1$ and $R^2$ each independently represent a substituent.

$R^3$ and $R^4$ each independently represent a hydrogen atom or an alkyl group.

$X^1$ and $X^2$ each independently an oxygen atom or $-N(R^5)-$.

$R^5$ represents a hydrogen atom, an alkyl group, an aryl group, or a heteroaryl group.

$Y^1$ to $Y^4$ each independently represent a substituent, and $Y^1$ and $Y^2$ or $Y^3$ and $Y^4$ may be bonded to each other to form a ring.

In a case where a plurality of $Y^1$'s, a plurality of $Y^2$'S, a plurality of $Y^3$'S, and a plurality of $Y^4$'s are present, $Y^1$'s, $Y^2$'s, $Y^3$'S, or $Y^4$'s may be bonded to each other to form a ring.

p and s each independently represent an integer of 0 to 3.

q and r each independently represent an integer of 0 to 2.

Examples of the substituent represented by $R^1$, $R^2$, and $Y^1$ to $Y^4$ include the substituents described regarding $G^A$ and $G^b$.

R3 and R4 each independently represent preferably a hydrogen atom, a methyl group, or an ethyl group, more preferably a hydrogen atom or a methyl group, and still more preferably a hydrogen atom.

$X^1$ and $X^2$ each independently an oxygen atom (—O—) or $-N(R^5)-$. $X^1$ and $X^2$ may be the same as or different from each other and is preferably the same as each other.

$R^5$ represents a hydrogen atom, an alkyl group, an aryl group, or a heteroaryl group.

$R^5$ represents preferably a hydrogen atom, an alkyl group, or an aryl group. The alkyl group, the aryl group, and the heteroaryl group represented by $R^5$ may be unsubstituted or may have a substituent. Examples of the substituent include the substituents described regarding $G^A$ and $G^B$.

The number of carbon atoms in the alkyl group is preferably 1 to 20, more preferably 1 to 10, still more preferably 1 to 4, and even still more preferably 1 or 2. The alkyl group may be linear or branched.

The number of carbon atoms in the aryl group is preferably 6 to 20 and more preferably 6 to 12.

The heteroaryl group may be a monocycle or a polycycle. The number of heteroatoms constituting the ring of the heteroaryl group is preferably 1 to 3. It is preferable that the heteroatoms constituting the ring of the heteroaryl group are a nitrogen atom, an oxygen atom, or a sulfur atom. The number of carbon atoms constituting the ring of the heteroaryl group is preferably 3 to 30, more preferably 3 to 18, and still more preferably 3 to 12.

The molecular weight of the compound represented by Formula (1) is preferably 100 to 2000 and more preferably 150 to 1000.

Specific examples of the compound represented by Formula (1) include compounds shown below, but the compound represented by Formula (1) is not limited thereto. In the following structural formulae, Ph represents a phenyl group.

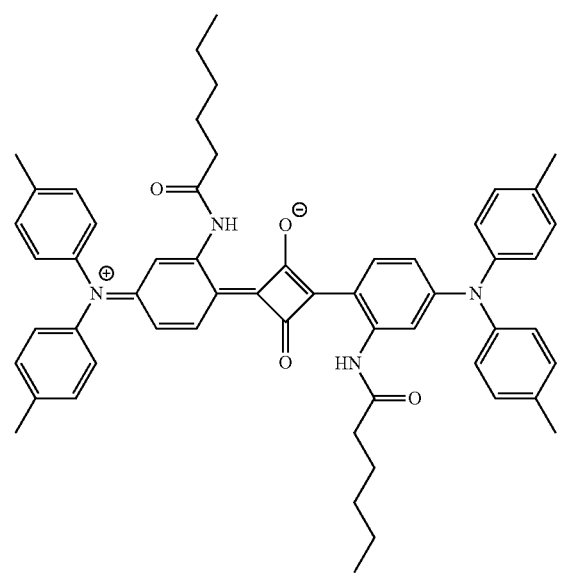

Q-1

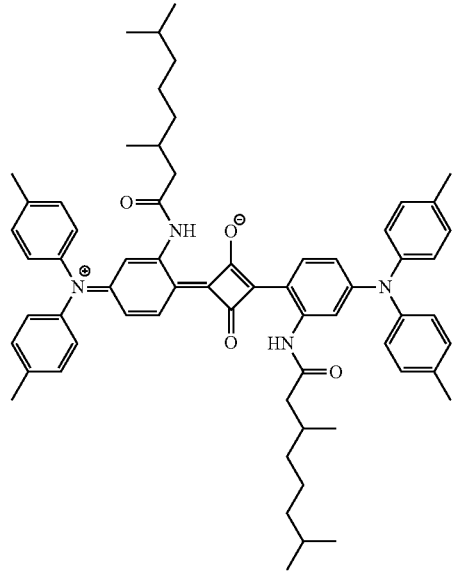

Q-2

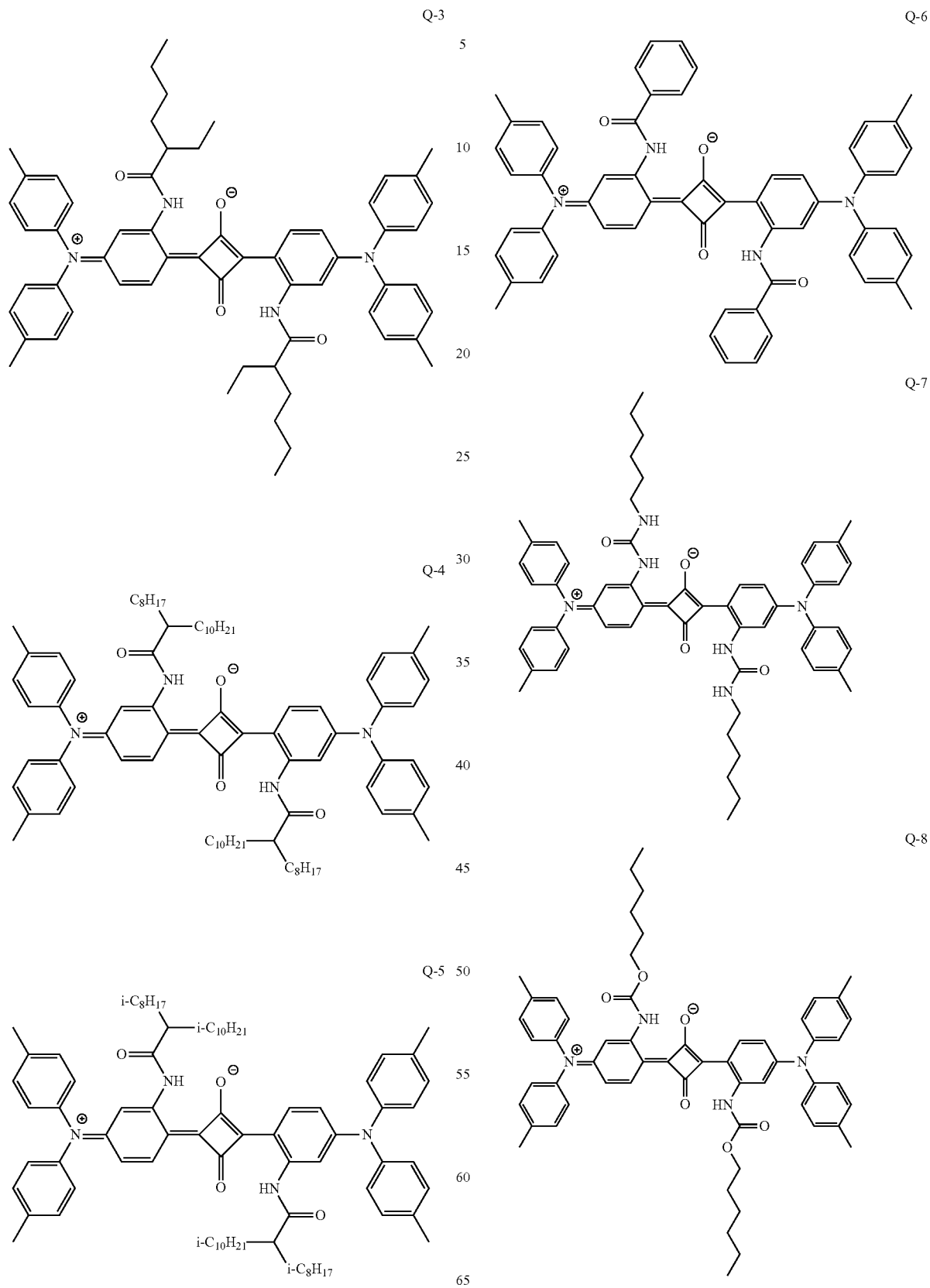

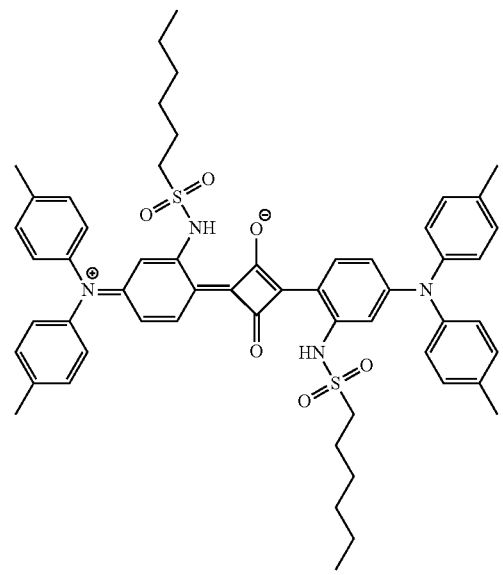
Q-9
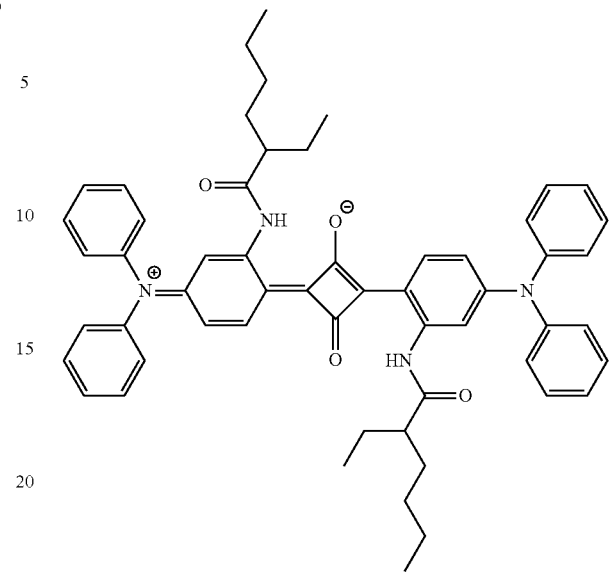
Q-12
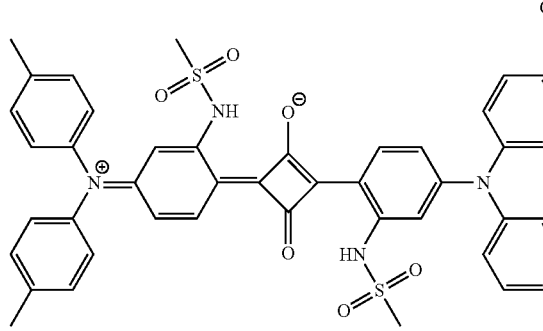
Q-10
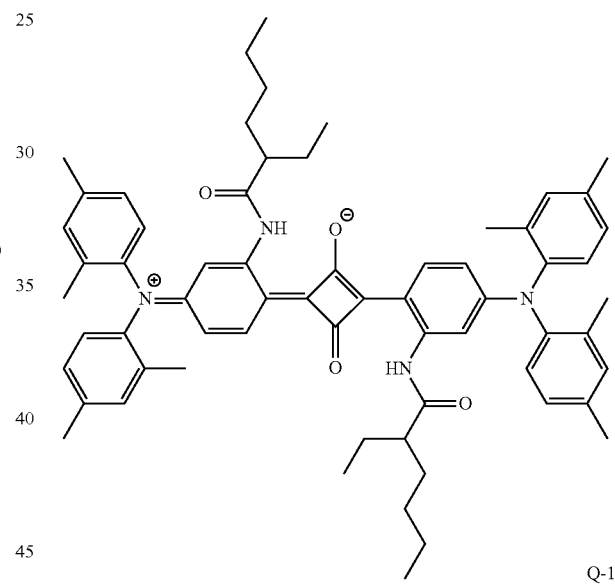
Q-13
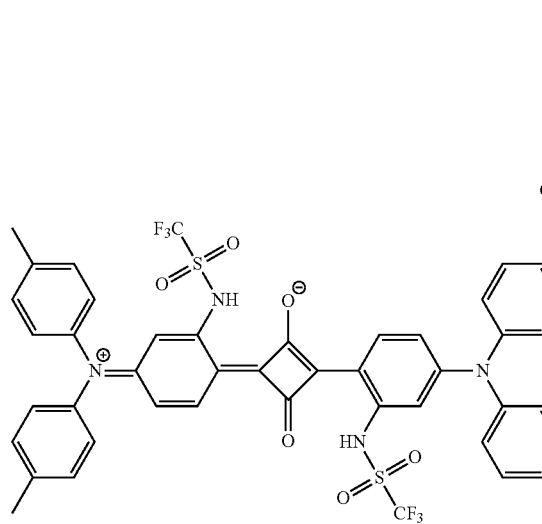
Q-11
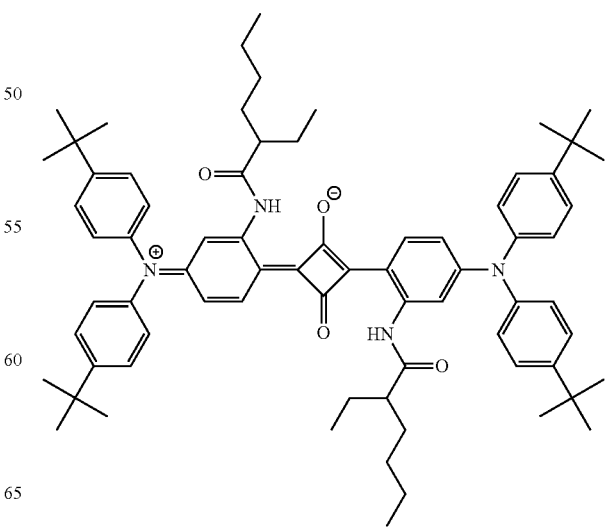
Q-14

Q-15
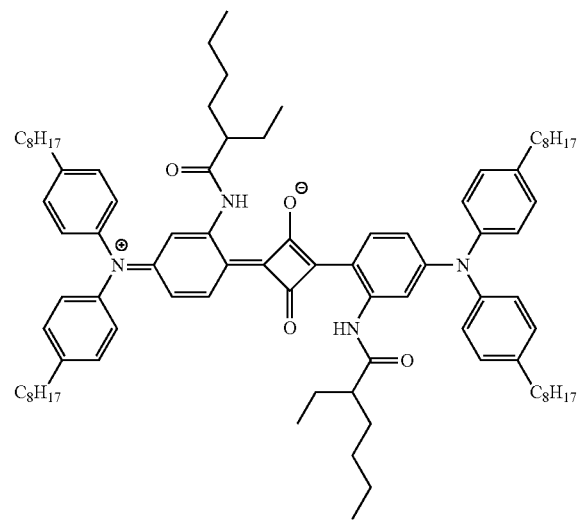
Q-16
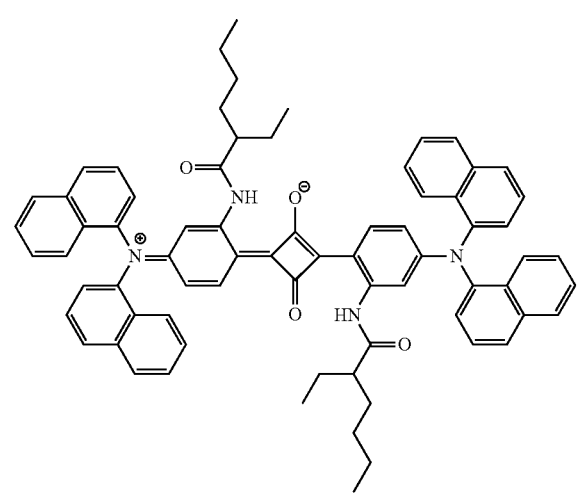
Q-17
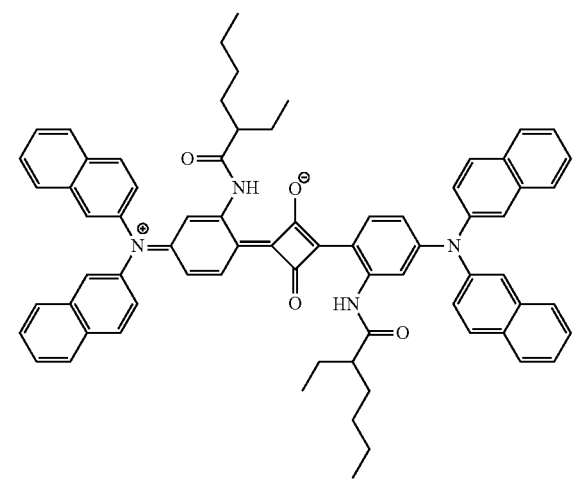
Q-18
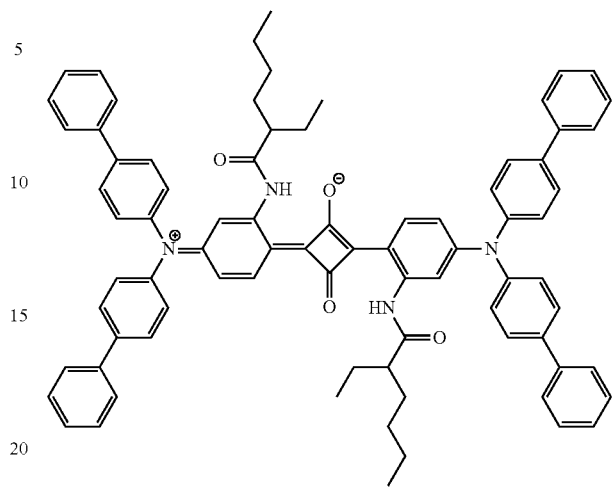
Q-19
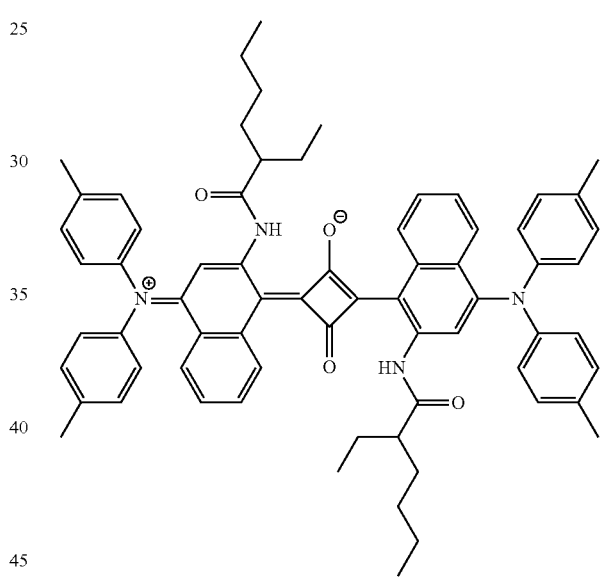
Q-20
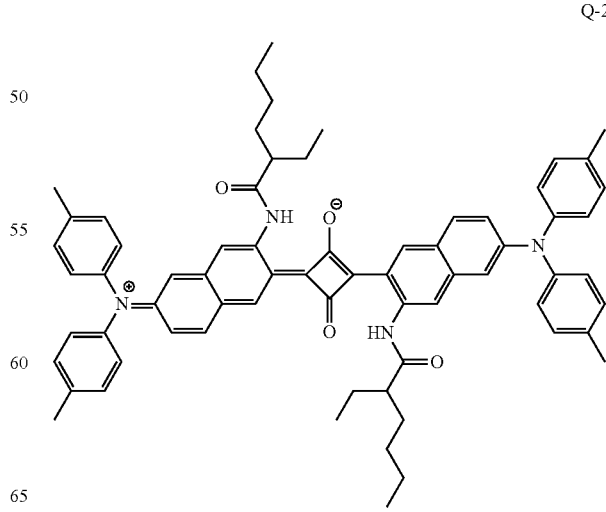

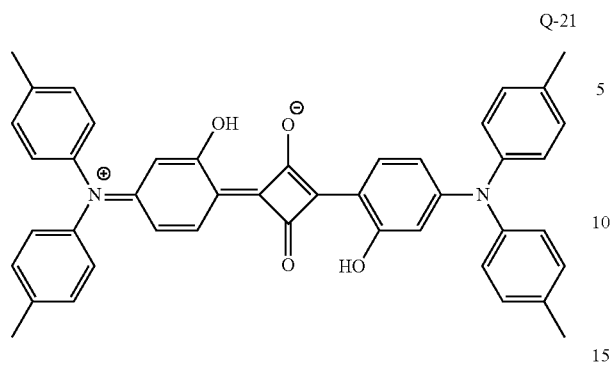
Q-21
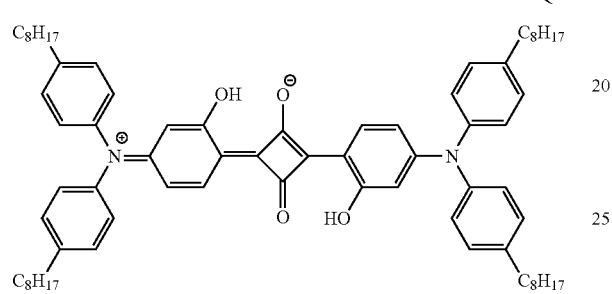
Q-22
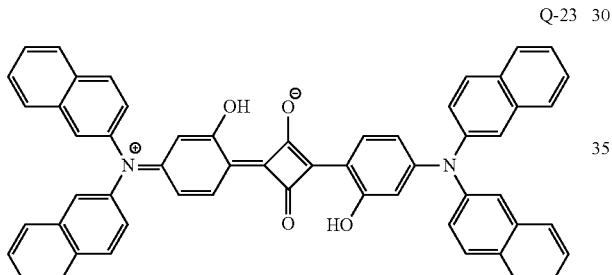
Q-23
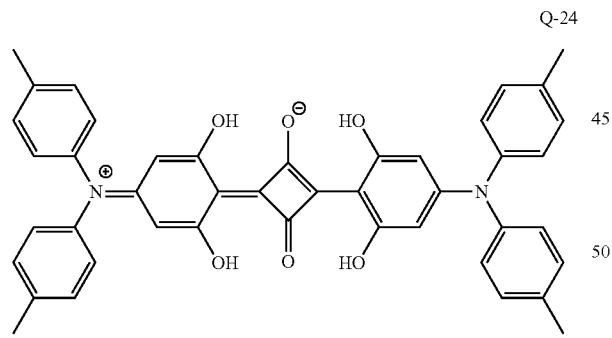
Q-24
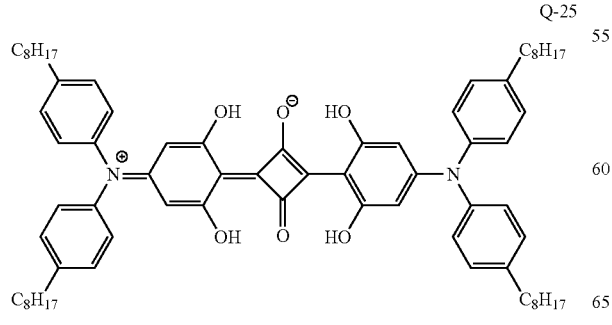
Q-25
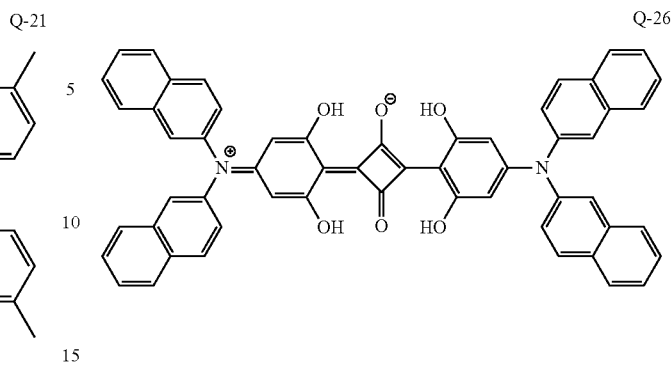
Q-26
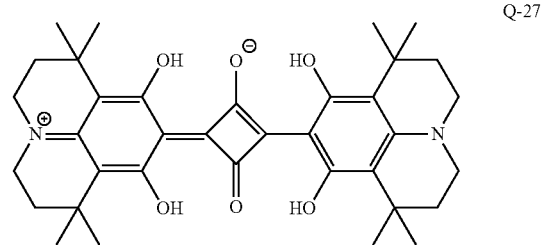
Q-27
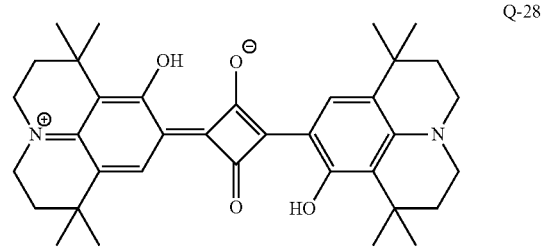
Q-28
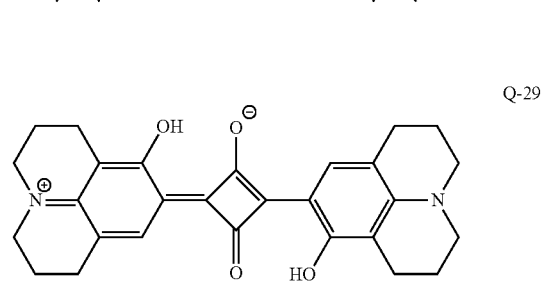
Q-29
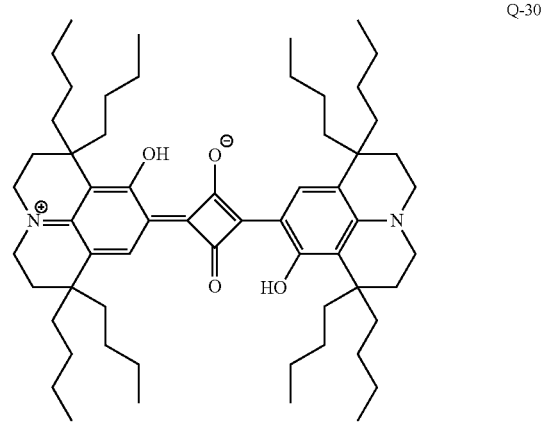
Q-30

-continued
Q-31
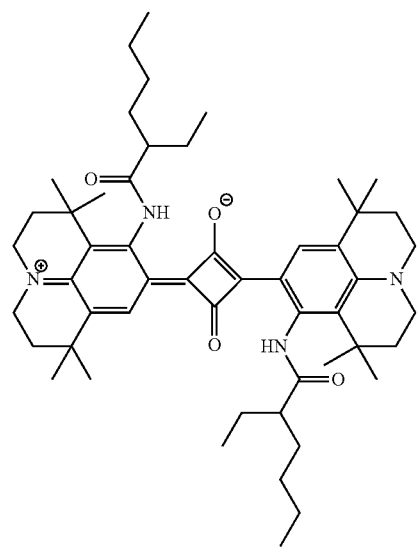
Q-32
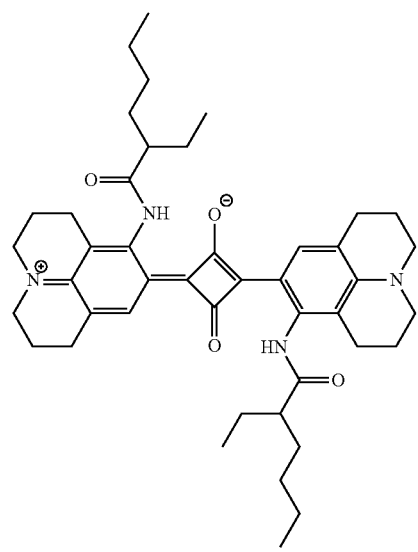
Q-33
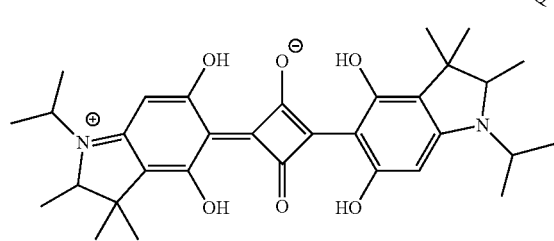
-continued
Q-34
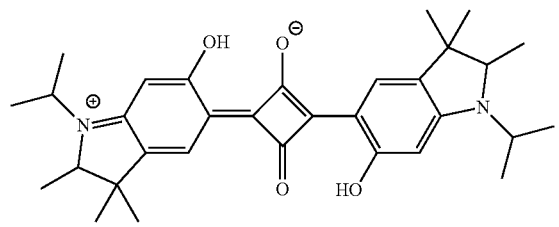
Q-35
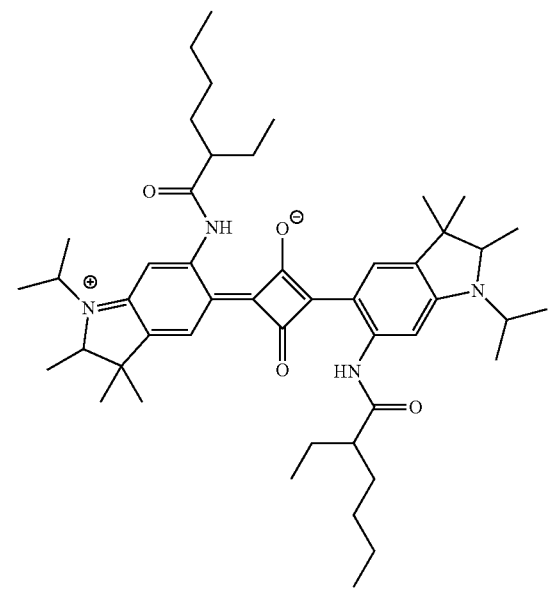
Q-36
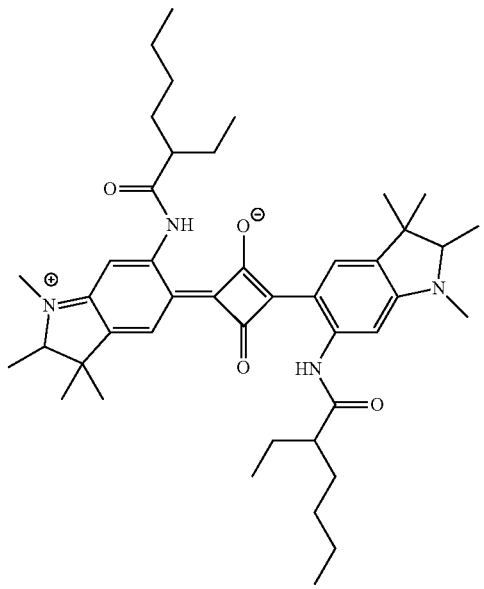

Q-37
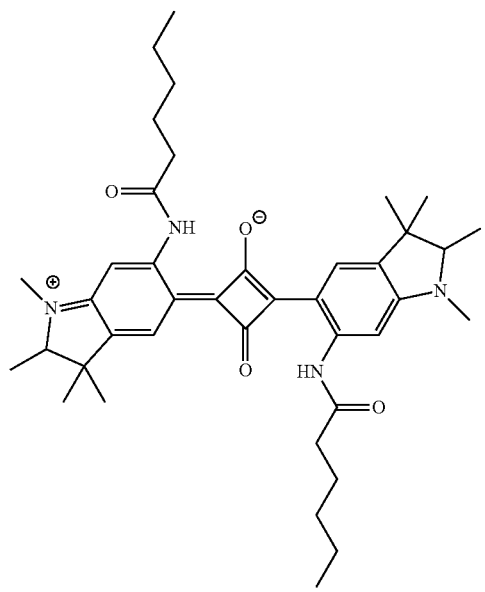
Q-40
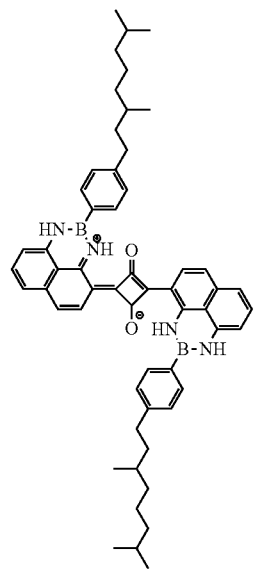
Q-38
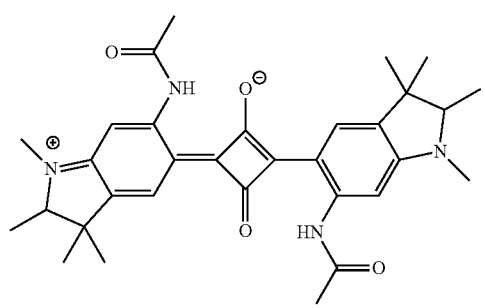
Q-41
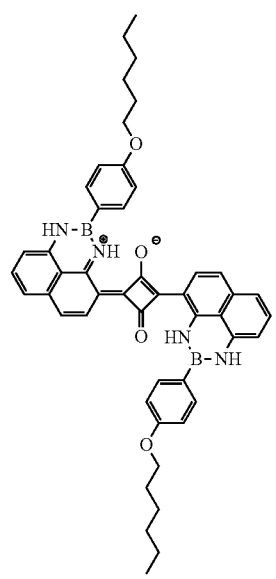
Q-39
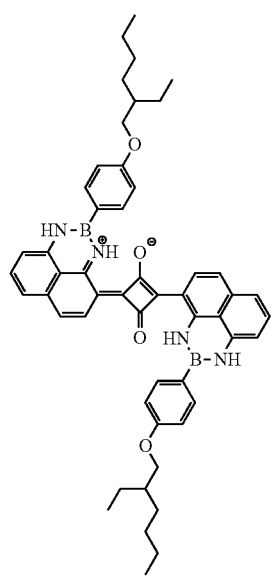
Q-42
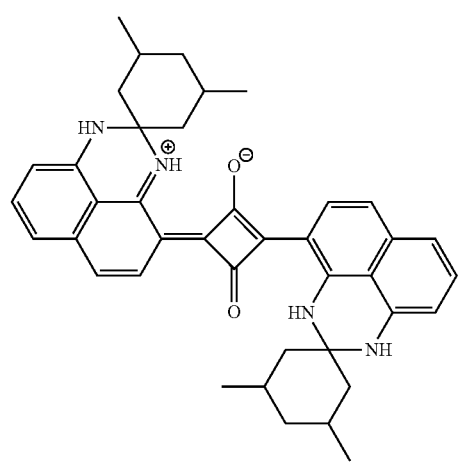

-continued
Q-43
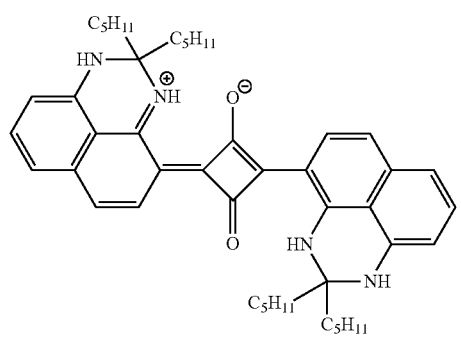
Q-44
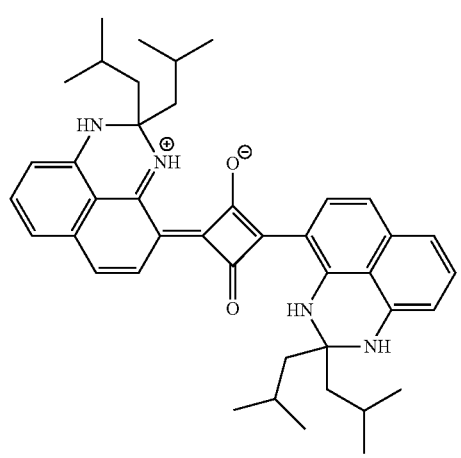
Q-45
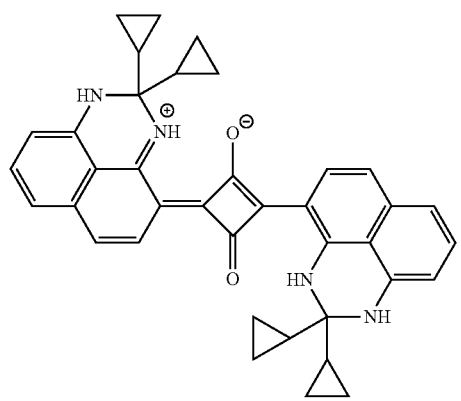
Q-46
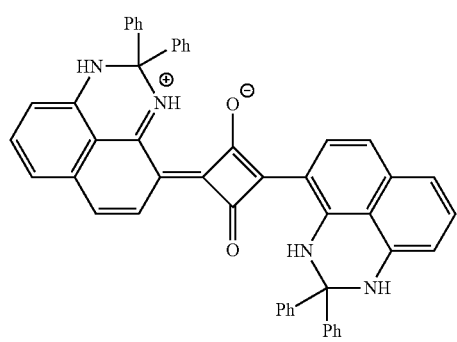
-continued
Q-47
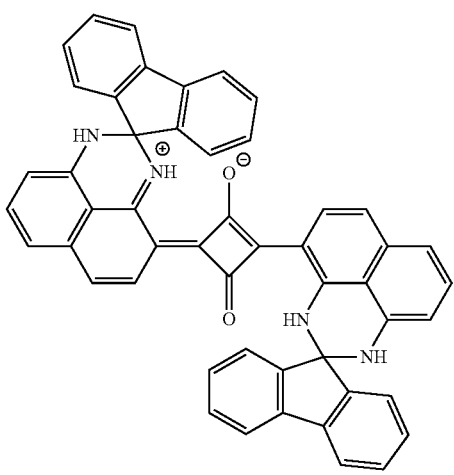
Q-48
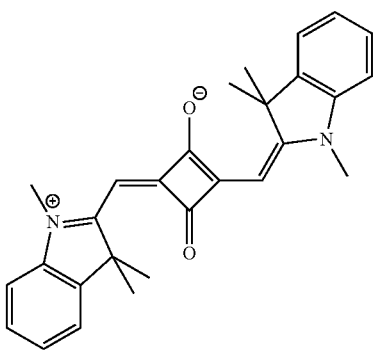
Q-49
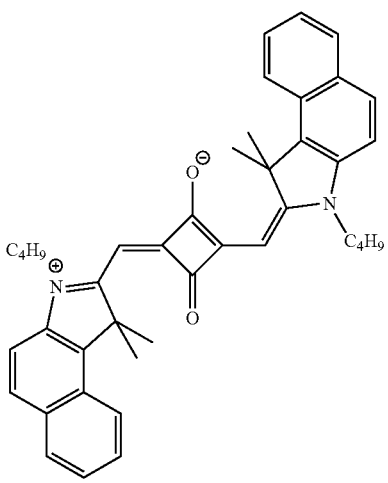

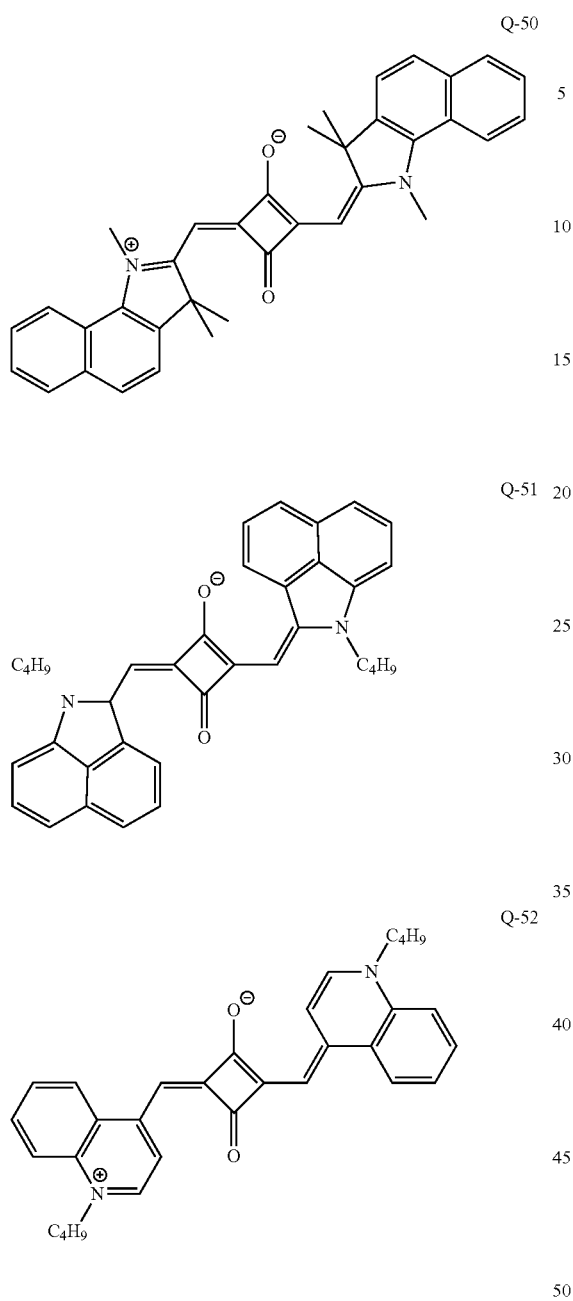
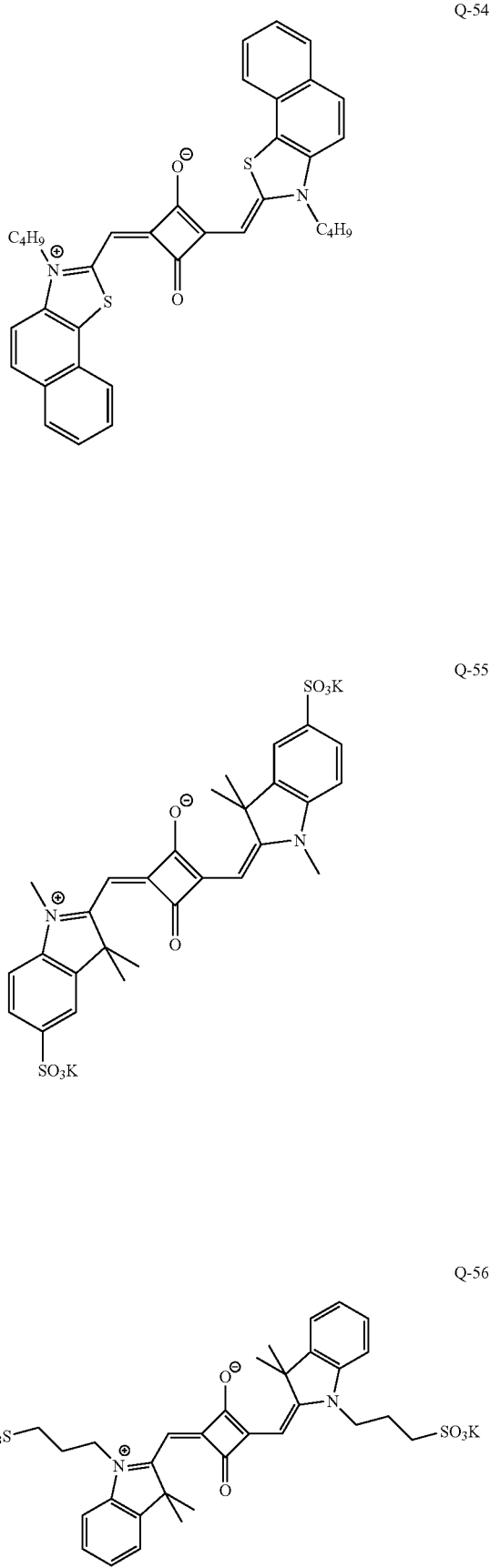

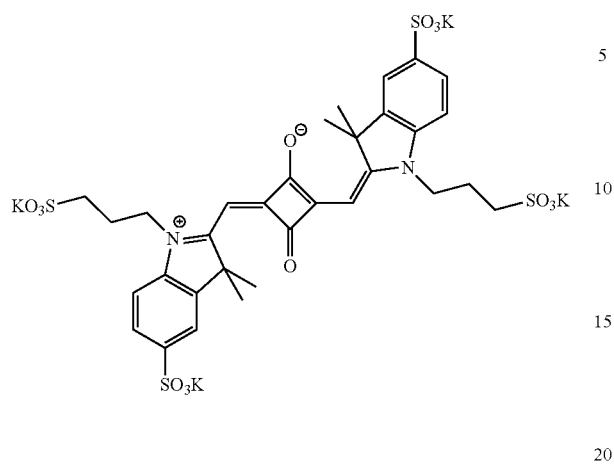
Q-57
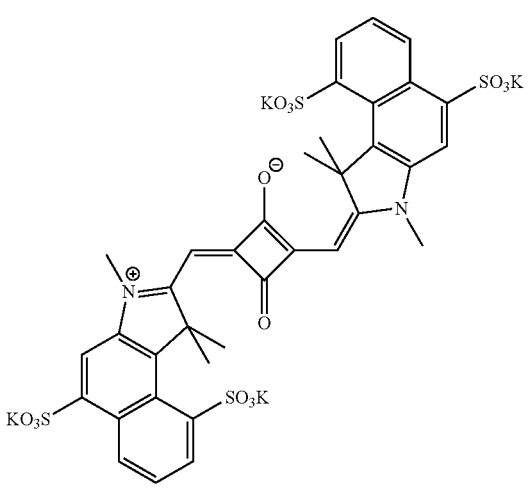
Q-60
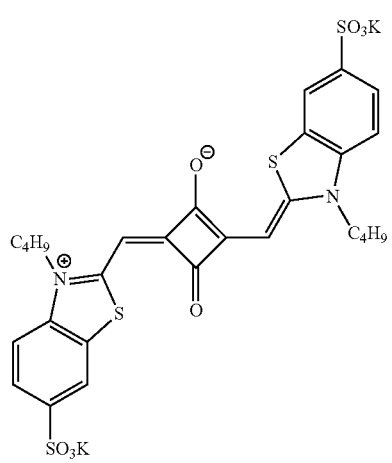
Q-58
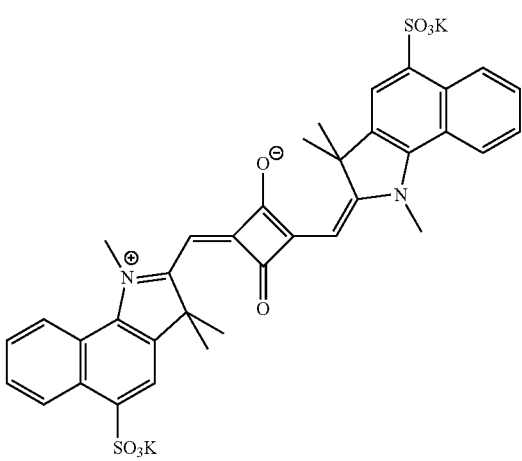
Q-61
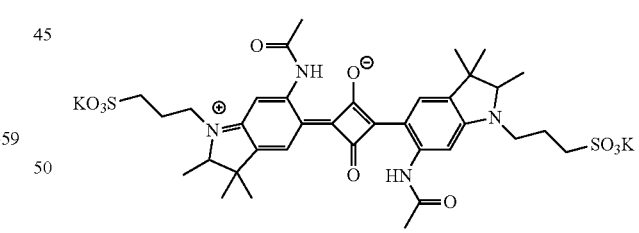
Q-62
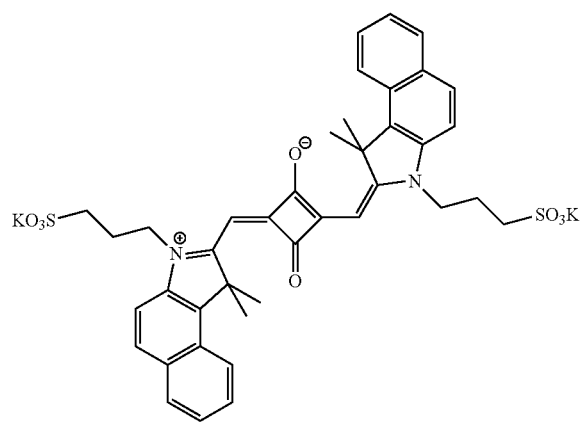
Q-59
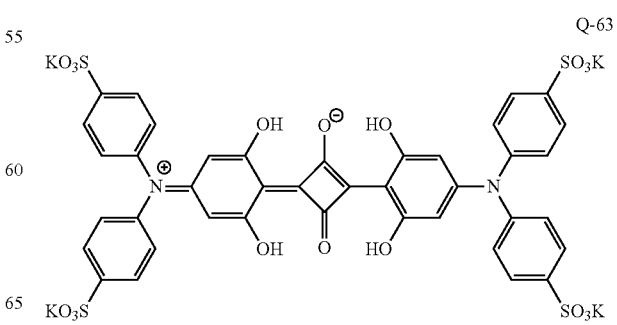
Q-63

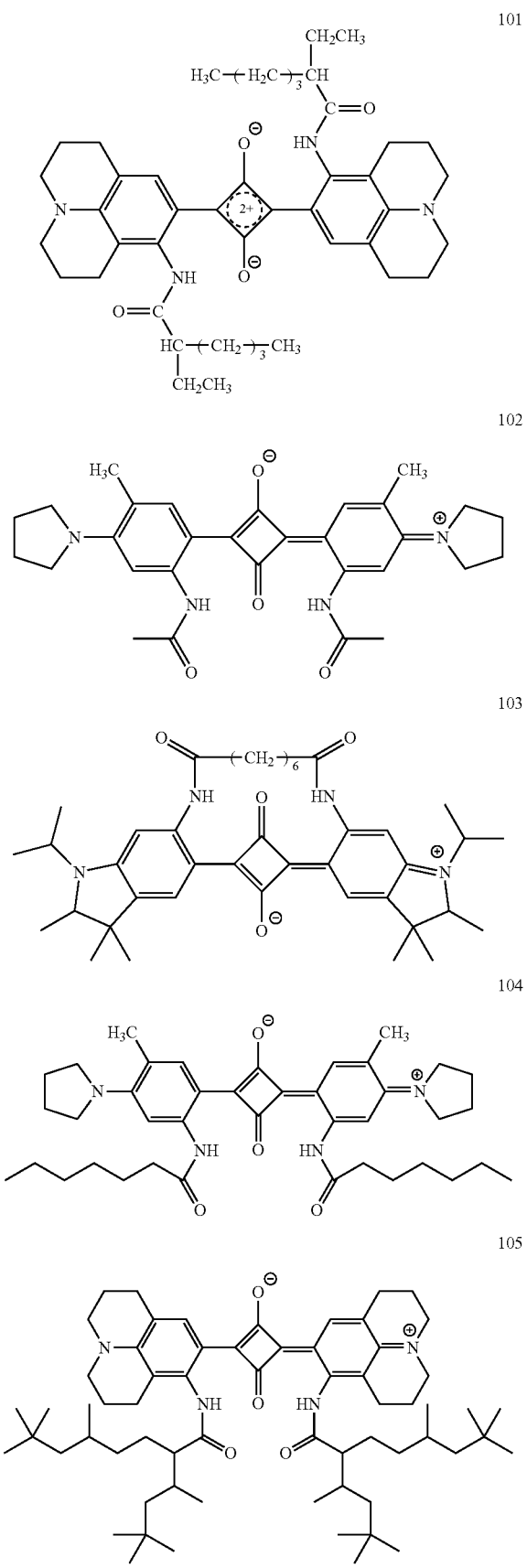

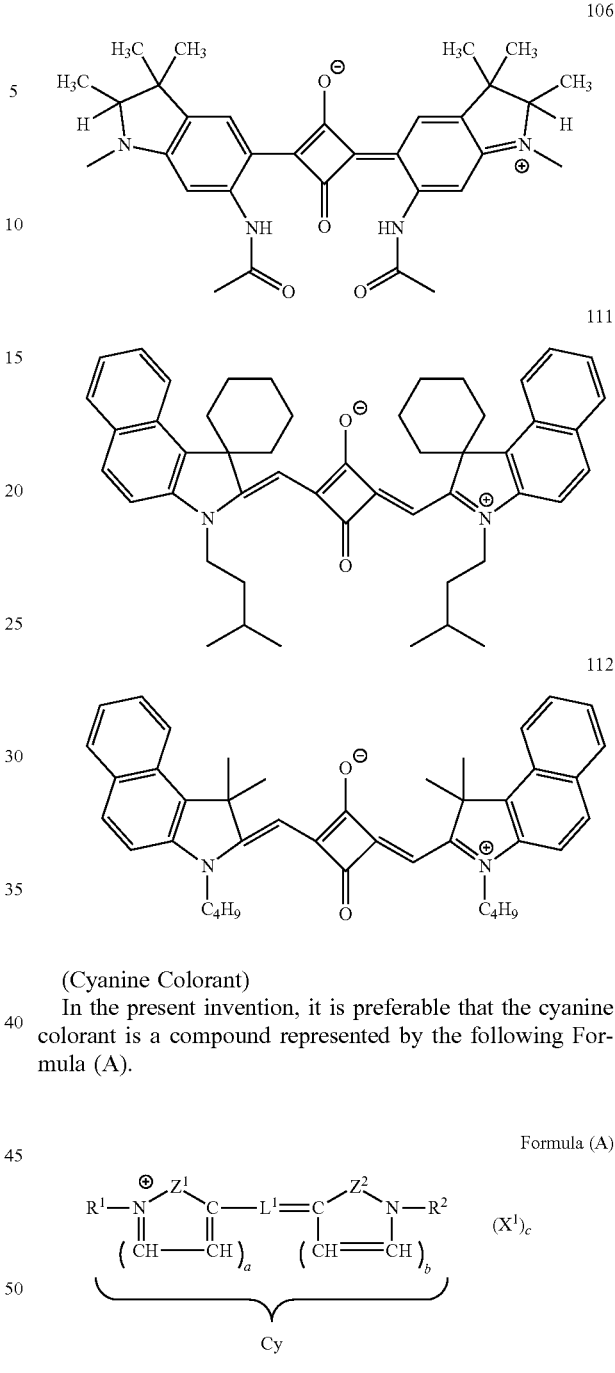

(Cyanine Colorant)

In the present invention, it is preferable that the cyanine colorant is a compound represented by the following Formula (A).

Formula (A)

In Formula (A), $Z^1$ and $Z^2$ each independently represent a non-metal atomic group for forming a 5- or 6-membered nitrogen-containing heterocycle which may be fused, $R^1$ and $R^2$ each independently represent an alkyl group, an alkenyl group, an alkynyl group, an aralkyl group, or an aryl group, $L^1$ represents a methine chain including an odd number of methine groups, and a and b each independently represent 0 or 1.

In a case where a site represented by Cy in the formula is a cation site, $X^1$ represents an anion, and c represents the number of $X^1$'s for balancing charge. In a case where a site represented by Cy in the formula is an anion site, $X^1$ represents a cation, and c represents the number of X's for balancing charge. In a case where charge of a site represented by Cy in the formula is neutralized in a molecule, c represents 0.

In Formula (A), $Z^1$ and $Z^2$ each independently represent a non-metal atomic group for forming a 5- or 6-membered nitrogen-containing heterocycle which may be fused.

Another heterocycle, an aromatic ring, or an aliphatic ring may be fused to the nitrogen-containing heterocycle. It is preferable that the nitrogen-containing heterocycle is a 5-membered ring. It is more preferable that a benzene ring or a naphthalene ring is fused to the 5-membered nitrogen-containing heterocycle. Specific examples of the nitrogen-containing heterocycle include an oxazole ring, an isoxazole ring, a benzoxazole ring, a naphthoxazole ring, an oxazolocarbazole ring, an oxazolodibenzofuran ring, a thiazole ring, a benzothiazole ring, a naphthothiazol ring, an indolenine ring, a benzoindolenine ring, an imidazole ring, a benzoimidazole ring, a naphthoimidazole ring, a quinoline ring, a pyridine ring, a pyrrolopyridine ring, a furopyrrole ring, an indolizine ring, an imidazoquinoxaline ring, and a quinoxaline ring. Among these, a quinoline ring, an indolenine ring, a benzoindolenine ring, a benzoxazole ring, or a benzothiazole ring is preferable, and an indolenine ring, a benzothiazole ring, or a benzoimidazole ring is more preferable.

The nitrogen-containing heterocycle and a ring fused thereto may have a substituent. Examples of the substituent include the substituents described regarding $G^A$ and $G^B$ in Formula (5). Specific examples of the substituent include a halogen atom, a cyano group, a nitro group, an alkyl group, an alkenyl group, an alkynyl group, an aryl group, a heteroaryl group, an aralkyl group, $-OR^{10}$, $-COR^{11}$, $-COOR^{12}$, $-OCOR^{13}$, $-NR^{14}R^{15}$, $-NHCOR^{16}$, $-CONR^{17}R^{18}$, $-NHCONR^{19}R^{20}$, $-NHCOOR^{21}$, $-SR^{22}$, $-SO_2R^{23}$, $-SO_2OR^{24}$, $-NHSO_2R^{25}$, and $-SO_2NR^{26}R^{27}$. $R^{10}$ to $R^{27}$ each independently represent a hydrogen atom, an alkyl group, an alkenyl group, an alkynyl group, an aryl group, a heteroaryl group, or an aralkyl group. In a case where $R^{12}$ in $-COOR^{12}$ represents a hydrogen atom (that is, a carboxyl group), the hydrogen atom may be dissociable (that is, a carbonate group) or may be in the form of a salt. In a case where $R^{24}$ in $-SO_2OR^{24}$ represents a hydrogen atom (that is, a sulfo group), the hydrogen atom may be dissociable (that is, a sulfonate group) or may be in the form of a salt. The details are as described above.

The alkyl group, the alkenyl group, the alkynyl group, the aralkyl group, the aryl group, and the heteroaryl group may have a substituent or may be unsubstituted. Examples of the substituent include the groups described regarding the substituent group T. Among these, a halogen atom, a hydroxyl group, a carboxyl group, a sulfo group, an alkoxy group, or an amino group is preferable, a carboxyl group or a sulfo group is more preferable, and a sulfo group is still more preferable. In the carboxyl group and the sulfo group, a hydrogen atom may be dissociable or may be in the form of a salt.

In Formula (A), $R^1$ and $R^2$ each independently represent an alkyl group, an alkenyl group, an alkynyl group, an aralkyl group, or an aryl group.

The number of carbon atoms in the alkyl group is preferably 1 to 20, more preferably 1 to 15, and still more preferably 1 to 8. The alkyl group may be linear, branched, or cyclic and is preferably linear or branched.

The number of carbon atoms in the alkenyl group is preferably 2 to 20, more preferably 2 to 12, and still more preferably 2 to 8. The alkenyl group may be linear, branched, or cyclic and is preferably linear or branched.

The number of carbon atoms in the alkynyl group is preferably 2 to 40, more preferably 2 to 30, and still more preferably 2 to 25. The alkynyl group may be linear, branched, or cyclic and is preferably linear or branched.

The number of carbon atoms in the aryl group is preferably 6 to 30, more preferably 6 to 20, and still more preferably 6 to 12.

An alkyl portion of the aralkyl group is the same as the above-described alkyl group. An aryl portion of the aralkyl group is the same as the above-described aryl group. The number of carbon atoms in the aralkyl group is preferably 7 to 40, more preferably 7 to 30, and still more preferably 7 to 25.

The alkyl group, the alkenyl group, the alkynyl group, the aralkyl group, and the aryl group may have a substituent or may be unsubstituted. Examples of the substituent include a halogen atom, a hydroxyl group, a carboxyl group, a sulfo group, an alkoxy group, and an amino group. Among these, a carboxyl group or a sulfo group is preferable, and a sulfo group is more preferable. In the carboxyl group and the sulfo group, a hydrogen atom may be dissociable or may be in the form of a salt.

In Formula (A), $L^1$ represents a methine chain including an odd number of methine groups. $L^1$ represents preferably a methine chain including 3, 5, or 7 methine groups and more preferably a methine chain including 5 or 7 methine groups.

The methine group may have a substituent. It is preferable that the methine group having a substituent is a methine group positioned at the center (meso position). Specific examples of the substituent include a substituent which may be included in the nitrogen-containing heterocycle represented by $Z^1$ and $Z^2$, and a group represented by the following Formula (a). In addition, two substituents in the methine chain may be bonded to each other to form a 5- or 6-membered ring.

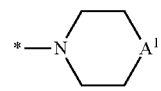

(a)

In Formula (a), * represents a linking portion to the methine chain, and $A^1$ represents an oxygen atom or a sulfur atom.

a and b each independently represent 0 or 1. In a case where a represents 0, a carbon atom and a nitrogen atom are bonded through a double bond. In a case where b represents 0, a carbon atom and a nitrogen atom are bonded through a single bond. It is preferable that both a and b represent 0. In a case where both a and b represent 0, Formula (A) will be shown below.

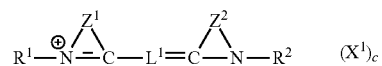

In a case where a site represented by Cy in Formula (A) is a cation site, $X^1$ represents an anion, and c represents the number of $X^1$'s for balancing charge. Examples of the anion include an halide ion ($Cl^-$, $Br^-$, $I^-$), a p-toluenesulfonate ion, an ethyl sulfate ion, $PF_6^-$, $BF_4^-$, $ClO_4^-$, a tris(halogenoalkylsulfonyl)methide anion (for example, $(CF_3SO_2)_3C^-$), a di(halogenoalkylsulfonyl)imide anion (for example, ($CF_3SO_2)_2N^-$), a tetracyano borate anion, and an anion represented by the following Formula A.

Formula A

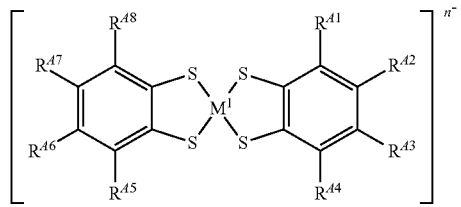

$M^1$ represents a transition metal, n represents an integer of 1 or 2, and $R^{A1}$ to $R^{A8}$ each independently represent a hydrogen atom or a substituent.

Examples of the transition metal include Cu, Co, Ni, Fe, Pd, Pt, Ti, V, Zn, Ru, Rh, and Zr. Among these, Cu, Co, Ni, Fe, Pd, or Pt is preferable, and Cu or Ni is more preferable. Examples of the substituent include the substituents described regarding $G^A$ and $G^B$ in Formula (5). The details of Formula A can be found in paragraphs "0030" to "0050" of JP2015-40895A, the content of which is incorporated herein by reference.

In a case where a site represented by Cy in Formula (A) is an anion site, $X^1$ represents a cation, and c represents the number of $X^1$'s for balancing charge. Examples of the cation include an alkali metal ion (for example, $Li^+$, $Na^+$, or $K^+$), an alkali earth metal ion ($Mg^{2+}$, $Ca^{2+}$, $Ba^{2+}$, or $Sr^{2+}$), a transition metal ion (for example, $Ag^+$, $Fe^{2+}$, $Co^{2+}$, $Ni^{2+}$, $Cu^{2+}$, or $Zn^{2+}$), other metal ions (for example, $Al^{3+}$), an ammonium ion, a triethylammonium ion, a tributylammonium ion, a pyridinium ion, a tetrabutylammonium ion, a guanidinium ion, a tetramethylguanidium ion, and diazabicycloundecenium. As the cation, $Na^+$, $K^+$, $Mg^{2+}$, $Ca^{2+}$, $Zn^{2+}$, or diazabicycloundecenium is preferable.

In a case where charge of a site represented by Cy in Formula (A) is neutralized in a molecule, $X^1$ is not present. That is, c represents 0.

The compound represented by Formula (A) is preferably a compound represented by the following Formula (1A) or (1B), and more preferably a compound represented by the following Formula (1B).

(1A)

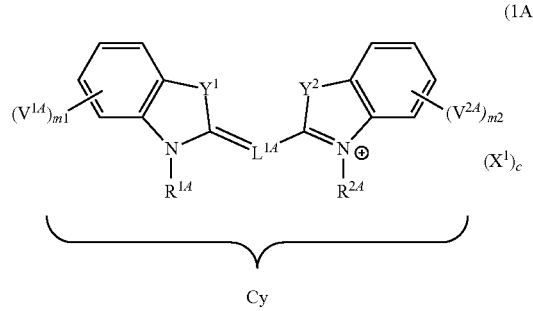

(1B)

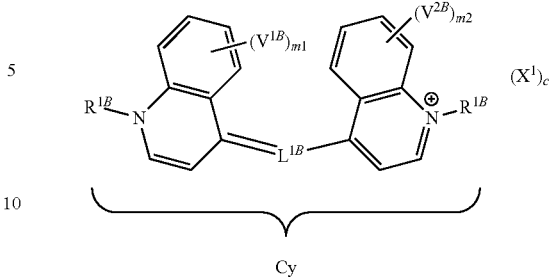

In Formulae (1A) and (1B), $R^{1A}$, $R^{2A}$, $R^{1B}$, and $R^{2B}$ each independently represent an alkyl group, an alkenyl group, an alkynyl group, an aralkyl group, or an aryl group.

$L^{1A}$ and $L^{1B}$ each independently represent a methine chain including an odd number of methine groups.

$Y^1$ and $Y^2$ each independently represent —S—, —O—, —$NR^{X1}$— or, —$CR^{X2}R^{X3}$—.

$R^{X1}$, $R^{X2}$, and $R^{X3}$ each independently represent a hydrogen atom or an alkyl group.

$V^{1A}$, $V^{2A}$, $V^{1B}$, and $V^{2B}$ each independently represent a halogen atom, a cyano group, a nitro group, an alkyl group, an alkenyl group, an alkynyl group, an aralkyl group, an aryl group, a heteroaryl group, —$OR^{10}$, —$COR^{11}$, —$COOR^{12}$, —$OCOR^{13}$, —$NR^{14}R^{15}$, —$NHCOR^{16}$, —$CONR^{17}R^{18}$, —$NHCONR^{19}R^{20}$, —$NHCOOR^{21}$, —$SR^{22}$, —$SO_2R^{23}$, —$SO_2OR^{24}$, —$NHSO_2R^{25}$, or —$SO_2NR^{26}R^{27}$. $V^{1A}$, $V^{2A}$, $V^{1B}$, and $V^{2B}$ may form a fused ring.

$R^{10}$ to $R^{27}$ each independently represent a hydrogen atom, an alkyl group, an alkenyl group, an alkynyl group, an aralkyl group, an aryl group, or a heterocyclic group.

In a case where $R^{12}$ of —$COOR^{12}$ represents a hydrogen atom and in a case where $R^{24}$ of —$SO_2OR^{24}$ represents a hydrogen atom, the hydrogen atom may be dissociable or may be in the form of a salt.

m1 and m2 each independently represent an integer of 0 to 4.

In a case where a site represented by Cy in the formula is a cation site, $X^1$ represents an anion, and c represents the number of $X^1$'s for balancing charge. In a case where a site represented by Cy in the formula is an anion site, $X^1$ represents a cation, and c represents the number of $X^1$'s for balancing charge. In a case where charge of a site represented by Cy in the formula is neutralized in a molecule, c represents 0.

The groups represented by $R^{1A}$, $R^{2A}$, $R^{1B}$, and $R^{2B}$ have the same definitions and the same preferable ranges as those of the alkyl group, the alkenyl group, the alkynyl group, the aralkyl group, and the aryl group described regarding $R^1$ and $R^2$ of Formula (A). These groups may be unsubstituted or may have a substituent. Examples of the substituent include a halogen atom, a hydroxyl group, a carboxyl group, a sulfo group, an alkoxy group, and an amino group. Among these, a carboxyl group or a sulfo group is preferable, and a sulfo group is more preferable. In the carboxyl group and the sulfo group, a hydrogen atom may be dissociable or may be in the form of a salt.

In a case where $R^{1A}$, $R^{2A}$, $R^{1B}$, and $R^{2B}$ represent an alkyl group, it is more preferable that the alkyl group is linear.

$Y^1$ and $Y^2$ each independently represent —S—, —O—, —$NR^{X1}$— or, —$CR^{X2}R^{X3}$— and preferably —$NR^{X1}$—.

$R^{X1}$, $R^{X2}$, and $R^{X3}$ each independently represent a hydrogen atom or an alkyl group and preferably an alkyl group. The number of carbon atoms in the alkyl group is preferably 1 to 10, more preferably 1 to 5, and still more preferably 1 to 3. The alkyl group may be linear, branched, or cyclic and is preferably linear or branched and more preferably linear. The alkyl group is still more preferably a methyl group or an ethyl group.

$L^{1A}$ and $L^{1B}$ have the same definitions and the same preferable ranges as those of $L^1$ in Formula (A).

The groups represented by $V^{1A}$, $V^{2A}$, $V^{1B}$, and $V^{2B}$ have the same ranges and definitions and the same preferable ranges as those of the substituents which may be included in the nitrogen-containing heterocycle represented by $Z^1$ and $Z^2$ in Formula (A).

m1 and m2 each independently represent an integer of 0 to 4 and preferably an integer of 0 to 2.

The anion and the cation represented by $X^1$ have the same range and definitions and the same preferable ranges as those described regarding $X^1$ in Formula (A).

It is preferable that the compound represented by Formula (A) is a compound represented by any one of the following Formulae (1-1) to (1-6).

(1-1)

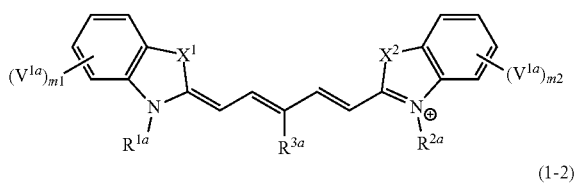

(1-2)

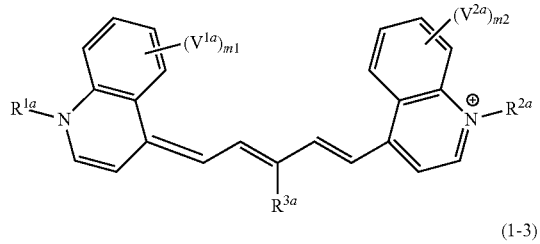

(1-3)

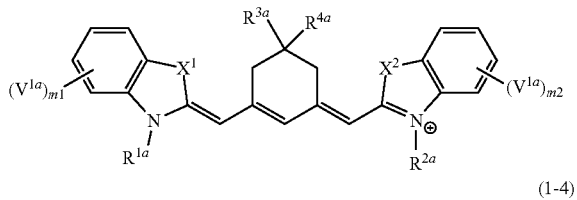

(1-4)

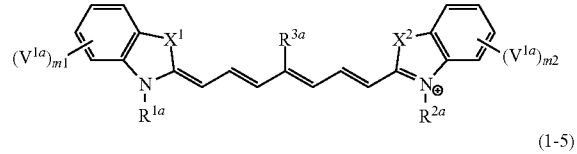

(1-5)

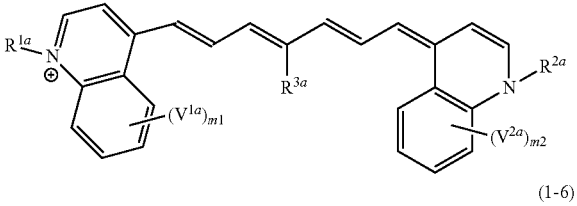

(1-6)

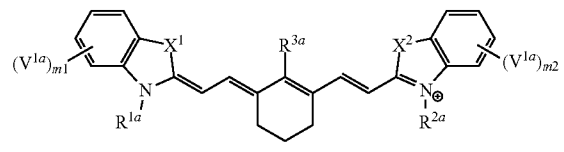

In Formulae (1-1) to (1-6), $R^{1a}$ and $R^{2a}$ each independently represent an alkyl group, an alkenyl group, an alkynyl group, an aralkyl group, or an aryl group.

$X^1$ and $X^2$ each independently represent —S—, —O—, —NR$^{X1}$ or, —CR$^{X2}$R$^{X3}$—.

$R^{X1}$, $R^{X2}$, and $R^{X3}$ each independently represent a hydrogen atom or an alkyl group.

$R^{3a}$, $R^{4a}$, $V^{1a}$, and $V^{2a}$ each independently represent a halogen atom, a cyano group, a nitro group, an alkyl group, an alkenyl group, an alkynyl group, an aralkyl group, an aryl group, a heteroaryl group, —OR$^{10}$, —COR$^{11}$, —COOR$^{12}$, —OCOR$^{13}$, —NR$^{14}$R$^{15}$, —NHCOR$^{16}$, —CONR$^{17}$R$^{18}$, —NHCONR$^{19}$R$^{20}$, —NHCOOR$^{21}$, —SR$^{22}$, —SO$_2$R$^{23}$, —SO$_2$OR$^{24}$, —NHSO$_2$R$^{25}$, or —SO$_2$NR$^{26}$R$^{27}$. $V^{1a}$ and $V^{2a}$ may form a fused ring.

$R^{10}$ to $R^{27}$ each independently represent a hydrogen atom, an alkyl group, an alkenyl group, an alkynyl group, an aralkyl group, an aryl group, or a heterocyclic group. In a case where $R^{12}$ of —COOR$^{12}$ represents a hydrogen atom and in a case where $R^{24}$ of —SO$_2$OR$^{24}$ represents a hydrogen atom, the hydrogen atom may be dissociable or may be in the form of a salt.

m1 and m2 each independently represent an integer of 0 to 4.

The groups represented by $R^{1a}$ and $R^{2a}$ have the same definitions and the same preferable ranges as those of $R^{1A}$ and $R^{2A}$ in Formula (1A). In a case where $R^{1a}$ and $R^{2a}$ represent an alkyl group, it is more preferable that the alkyl group is linear.

$X^1$ and $X^2$ have the same definitions and the same preferable ranges as those of $Y^1$ and $Y^2$ in Formula (1A).

$R^{3a}$ and $R^{4a}$ have the same ranges and definitions and the same preferable ranges as those of the substituents which may be included in $L^1$ in Formula (A).

The groups represented by $V^{1a}$, and $V^{2a}$ have the same ranges and definitions and the same preferable ranges as those of the substituents which may be included in the nitrogen-containing heterocycle or the ring fused thereto in Formula (A).

m1 and m2 each independently represent 0 to 4 and preferably 0 to 2.

Specific examples of the compound represented by Formula (A) will be shown as follows. In the following tables, Me represents a methyl group, Et represents an ethyl group, Bu represents a butyl group, Bn represents a benzyl group, Ph represents a phenyl group, PRS represents $C_3H_6SO_3^-$, and BUS represents $C_4H_9SO_3^-$. In addition, numerical values added to structural formulae in the tables represent binding sites of $V^1$ and $V^2$. In addition, in Table 1, L represents a linked state in the structural formula, "*" represents linking to a single bond, and "**" represents linking to a double bond.

C-1

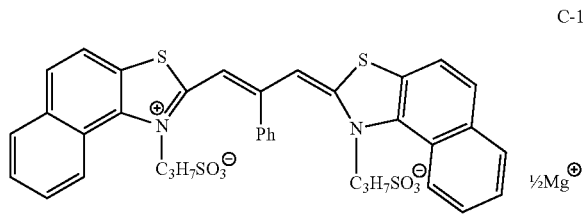

C-2

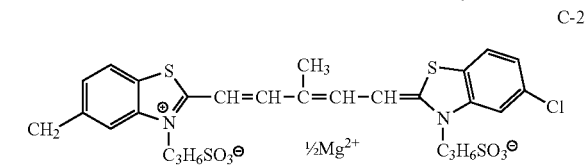

-continued
C-3
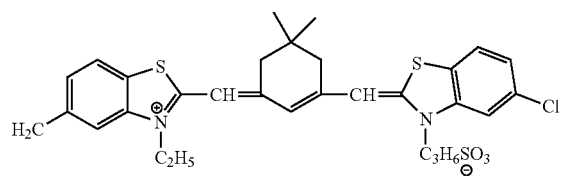
C-4
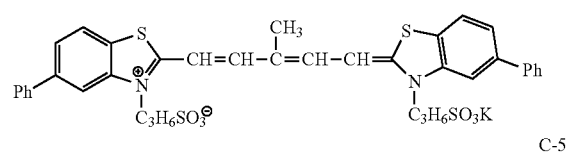
C-5
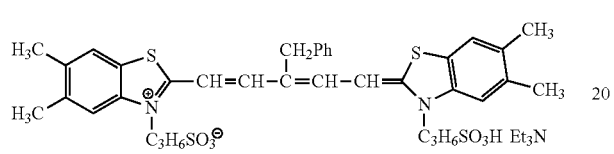
C-6
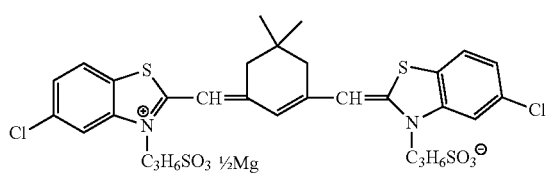
C-7
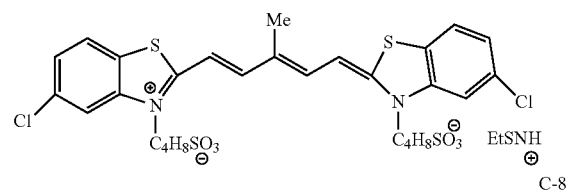
C-8
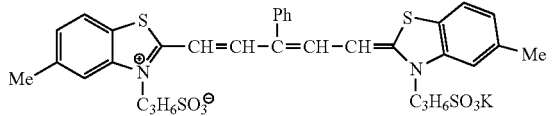
TABLE 1
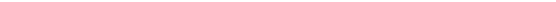
| Compound No. | R | L | V¹ | m | M |
|---|---|---|---|---|---|
| C-9 | PRS | cyclopentene | 5:Cl | 1 | K |
| C-10 | PRS | dihydropyran | 5:Cl | 1 | K |
| C-11 | PRS | Ph-cyclohexene | 6:Cl | 1 | K |
| C-12 | BUS | Ph-cyclohexene | 5:COOH | 1 | K |
| C-13 | PRS | cyclopentene | 5:Cl | 1 | Na |
| C-14 | PRS | cyclopentene | 5:Cl | 1 | 1/2 Mg |
TABLE 2
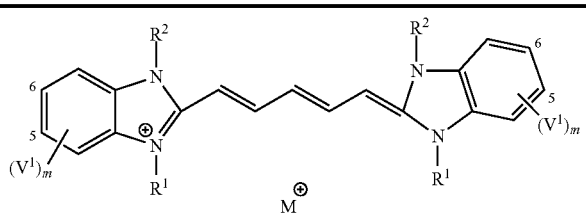
| Compound No. | R¹ | R² | V¹ | m | M |
|---|---|---|---|---|---|
| C-15 | PRS | Et | 5:Cl 6:Cl | 2 | Na |
| C-16 | PRS | Me | 5:Cl 6:Cl | 2 | K |
| C-17 | BUS | Et | 5:Cl 6:Cl | 2 | K |
| C-18 | BUS | $CF_3CH_2$ | 5:Cl 6:Cl | 2 | 1/2 Ca |
| C-19 | PRS | Et | 5:Cl 6:Cl | 2 | K |

TABLE 2-continued
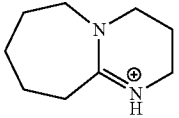
| Compound No. | R¹  | R²  | V¹           | m | M      |
|--------------|-----|-----|--------------|---|--------|
| C-20         | PRS | Et  | 5:Cl<br>6:Cl | 2 | 1/2 Mg |
| C-21         | BUS | Et  | 5:Cl<br>6:Cl | 2 | Na     |
| C-22         | PRS | Me  | 5:Cl<br>6:Cl | 2 | 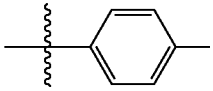 |
| C-23         | PRS | 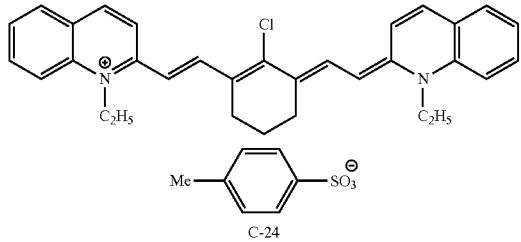 | 5:Cl<br>6:Cl | 2 | Na     |
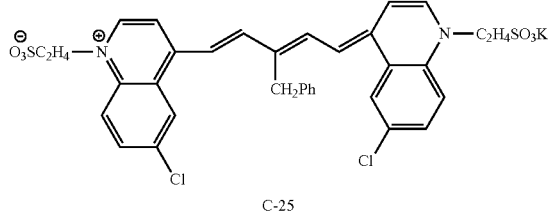
C-24
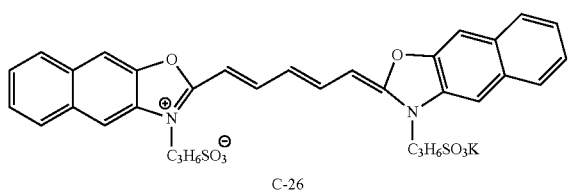
C-25
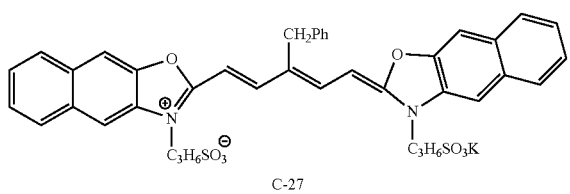
C-26
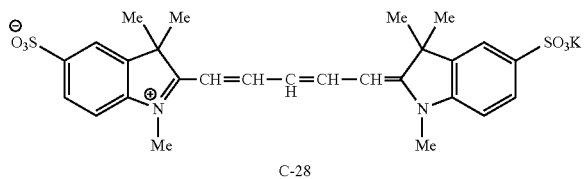
C-27
C-28

TABLE 2-continued
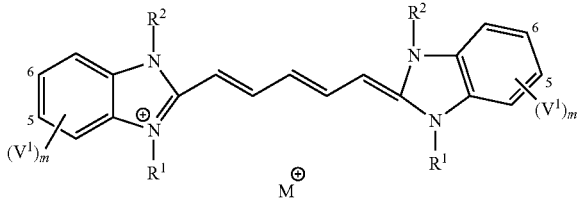
| Compound No. | R¹ | R² | V¹ | m | M |
|---|---|---|---|---|---|
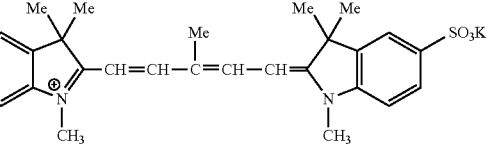
C-29
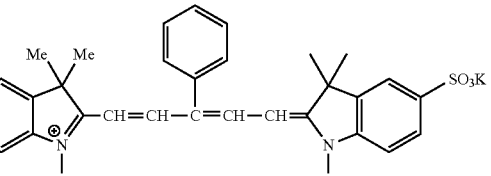
C-30
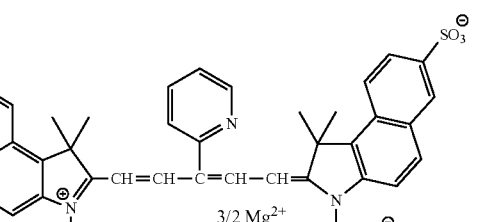
C-31
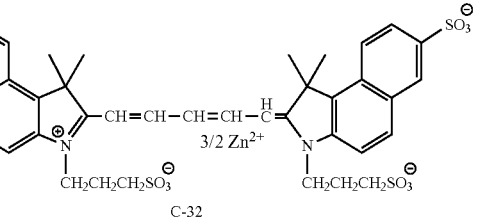
C-32
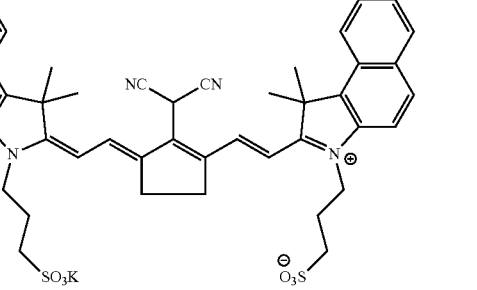
C-33

TABLE 2-continued
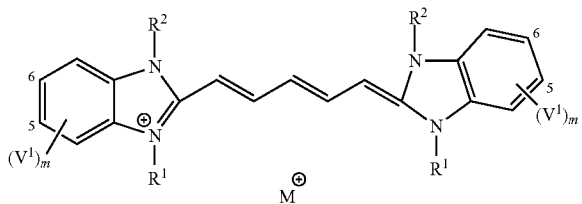
| Compound No. | R¹ | R² | V¹ | m | M |
|---|---|---|---|---|---|
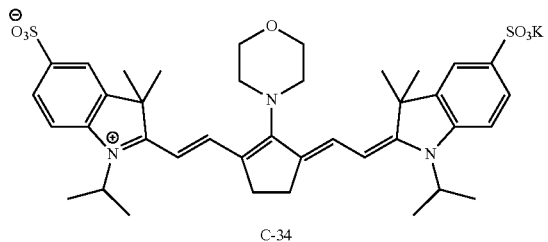
C-34
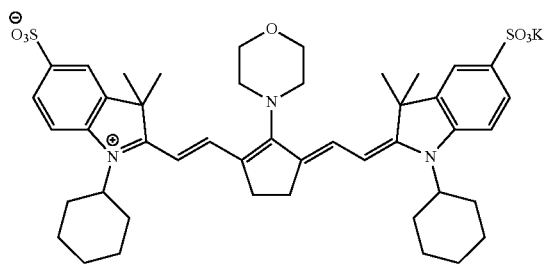
C-35
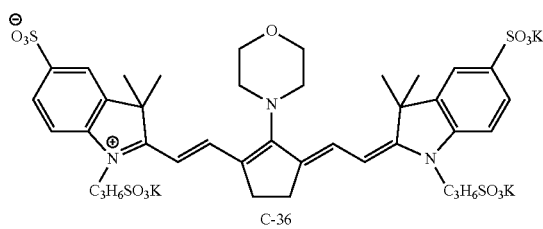
C-36
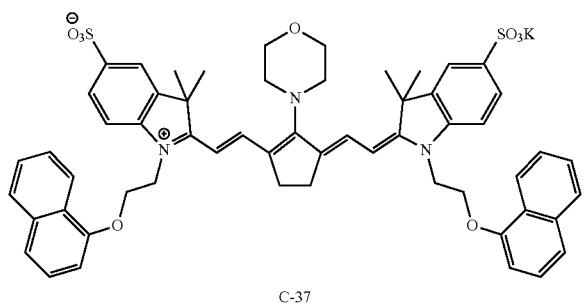
C-37

TABLE 3

| Compound No. | X | R¹ | R² | V¹ | m |
|---|---|---|---|---|---|
| S-1 | S | Et | H | — | 0 |
| S-2 | O | Et | Me | — | 0 |
| S-3 | N—Et | Et | H | 5:Cl<br>6:Cl | 2 |
| S-4 | S | n-Bu | Bn | 5:Cl | 1 |

TABLE 4

| Compound No. | R¹ | R² | V¹ | m |
|---|---|---|---|---|
| S-5 | Et | H | — | 0 |
| S-6 | Et | Me | — | 0 |
| S-7 | Et | Bn | 6:Cl<br>7:Cl | 2 |
| S-8 | n-Bu | Bn | 6:Cl | 1 |

TABLE 5

| Compound No. | X | R¹ | R² | R³ | V¹ | m |
|---|---|---|---|---|---|---|
| S-9 | S | Et | H | H | — | 0 |
| S-10 | O | Et | H | Me | — | 0 |
| S-11 | S | Et | Me | Me | 5:MeO | 1 |
| S-12 | S | n-Bu | H | Ph | 5:Cl | 1 |

TABLE 6

| Compound No. | X | R¹ | R² | V¹ | m1 | V¹ | m |
|---|---|---|---|---|---|---|---|
| S-13 | S | Et | H | — | 0 | — | 0 |
| S-14 | O | Et | H | 5:Cl | 1 | — | 0 |
| S-15 | S | Et | Me | 5:MeO | 1 | 5:MeO | 1 |
| S-16 | S | n-Bu | Bn | 5:Cl | 1 | 5:Cl | 1 |

TABLE 7

| Compound No. | R¹ | R² | V¹ | m |
|---|---|---|---|---|
| S-17 | Et | H | — | 0 |
| S-18 | Et | Me | — | 0 |
| S-19 | Et | Bn | 6:Cl<br>7:Cl | 2 |
| S-20 | n-Bu | Bn | 6:Cl | 1 |

TABLE 8

| Compound No. | X | R¹ | R² | R³ | V¹ | M |
|---|---|---|---|---|---|---|
| S-21 | S | Et | Et | H | — | 0 |
| S-22 | O | Et | Et | Cl | — | 0 |
| S-23 | S | n-Bu | n-Bu | H | 5:MeO | 1 |
| S-24 | S | Et | Et | Ph | 5:Cl | 1 |

S-25

TABLE 8-continued
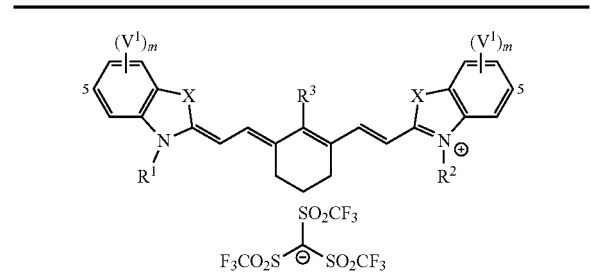
| Compound No. | X | R¹ | R² | R³ | V¹ | M |
|---|---|---|---|---|---|---|
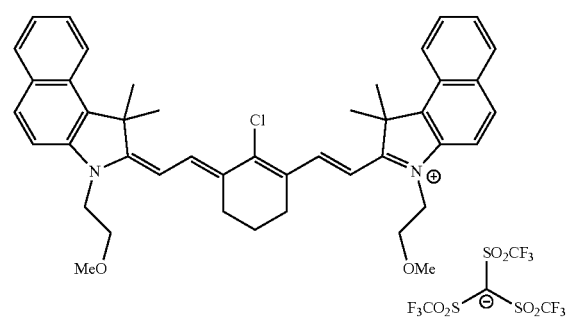
S-26
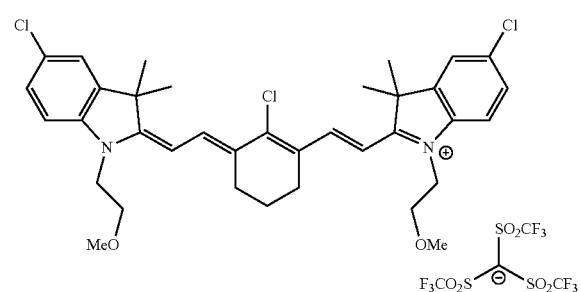
S-27
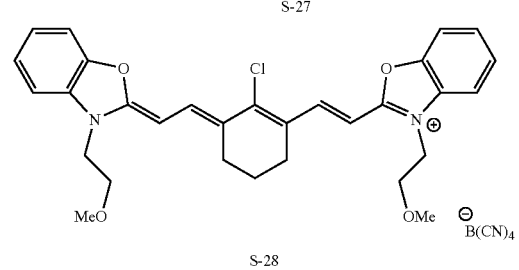
S-28
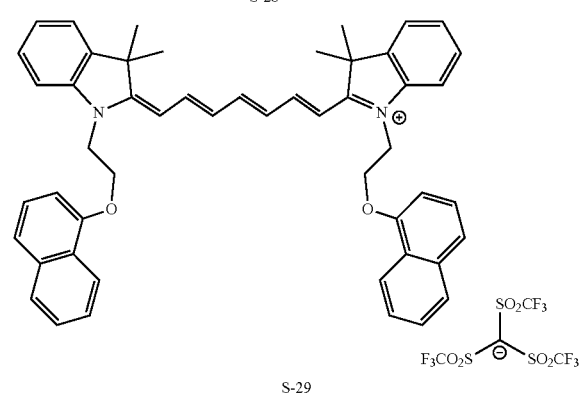
S-29
TABLE 8-continued
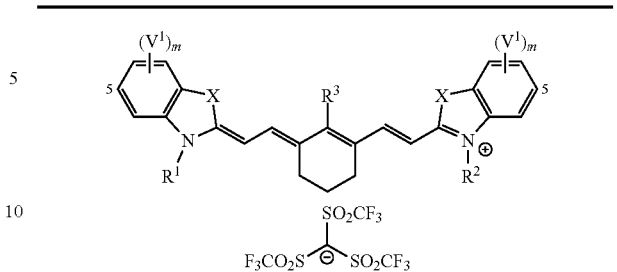
| Compound No. | X | R¹ | R² | R³ | V¹ | M |
|---|---|---|---|---|---|---|
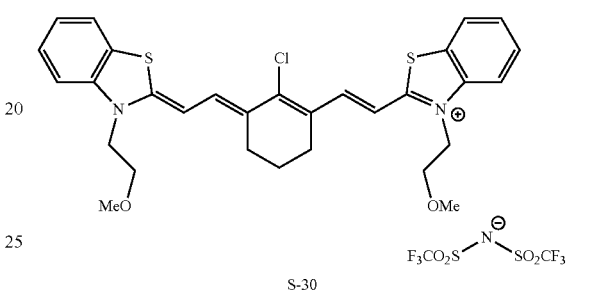
S-30
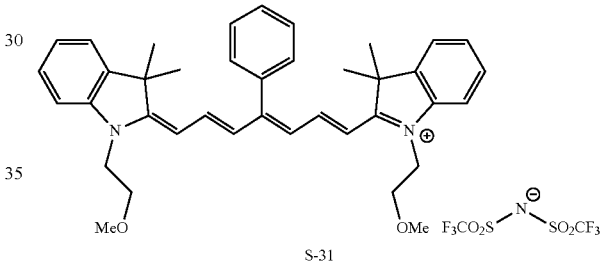
S-31
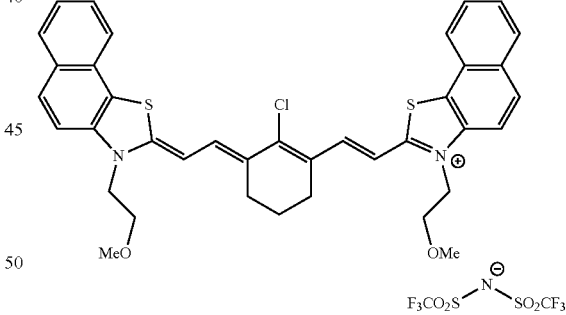
S-32
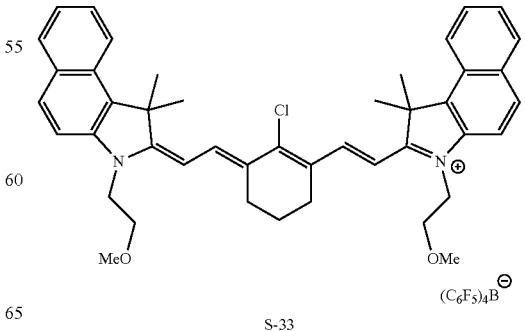
S-33

TABLE 9
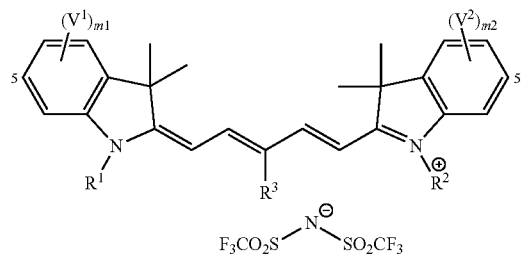
| Compound No. | R¹ | R² | R³ | V¹ | m1 | V² | m2 |
|---|---|---|---|---|---|---|---|
| I-1 | Et | Et | H | — | 0 | — | 0 |
| I-2 | CH₂CH₂OMe | CH₂CH₂OMe | H | — | 0 | — | 0 |
| I-3 | | | | | | | |
| I-4 | Et | Et | Me | 5:Cl | 1 | 5:Cl | 1 |
TABLE 10
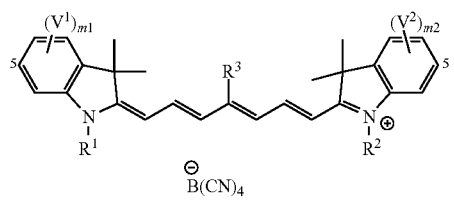
| Compound No. | R¹ | R² | R³ | V¹ | m1 | V² | m2 |
|---|---|---|---|---|---|---|---|
| I-5 | Et | Et | H | — | 0 | — | 0 |
| I-6 | CH₂CH₂OMe | CH₂CH₂OMe | H | — | 0 | — | 0 |
| I-7 | | | | | | | |
| I-8 | Et | Et | Me | 5:Cl | 1 | 5:Cl | 1 |

TABLE 11
| Compound No. | R¹ | R² | R³ | V¹ | m1 | V² | m2 |
|---|---|---|---|---|---|---|---|
| I-9 | Et | Et | H | — | 0 | — | 0 |
| I-10 | CH₂CH₂OMe | CH₂CH₂OMe | H | — | 0 | — | 0 |
| I-11 | | | | | | | |
| I-12 | Et | Et | Cl | 6:MeO | 1 | 6:MeO | 1 |
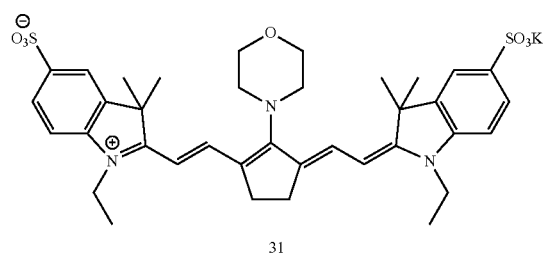
31
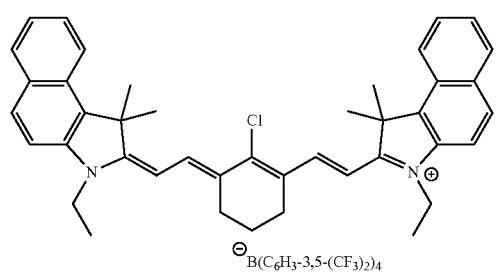
108

TABLE 11-continued

| Compound No. | R¹ | R² | R³ | V¹ | m1 | V² | m2 |
|---|---|---|---|---|---|---|---|

109

110

113

TABLE 11-continued

| Compound No. | R¹ | R² | R³ | V¹ | m1 | V² | m2 |
|---|---|---|---|---|---|---|---|

114

115

116

117

TABLE 11-continued

[Structure of cyanine dye with (V¹)ₘ₁, (V²)ₘ₂, R¹, R², R³ substituents and triflate-based counterion]

| Compound No. | R¹ | R² | R³ | V¹ | m1 | V² | m2 |
|---|---|---|---|---|---|---|---|

[Compound 118: bis-benzoxazole pentamethine cyanine with N-ethyl groups and methide counterion]

[Compound 119: unsymmetrical indoline-based trimethine dye with chloro-cyclohexenyl bridge, N-C₂H₄OCH₃ substituents, with methide counterion]

[Compound 120: indolenine-based pentamethine cyanine with N-C₂H₅ groups and methide counterion]

(Oxonol Colorant)

In the present invention, it is preferable that the oxonol colorant is a compound represented by the following Formula (Ox).

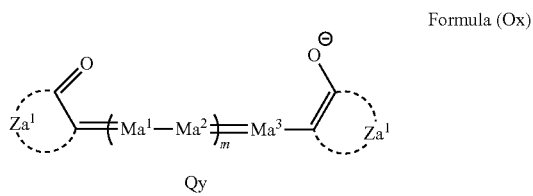

Formula (Ox)

In the formula, $Za^1$ represents an atomic group that forms an acid nucleus, $Ma^1$, $Ma^2$, and $Ma^3$ each independently represent a methine group, m represents an integer of 0 to 3, Q represents an ion which neutralizes charge, and y represents the number of Q's for charge neutralization.

$Za^1$ represents an atomic group that forms an acid nucleus. The acid nucleus is defined by p. 198, "The Theory of the Photographic Process" (Fourth Edition, Edited by James, Macmillan, 1977). Specific examples of the acid nucleus include acid nuclei which may have a substituent: pyrazole-5-one, pyrazolidine-3,5-dione, imidazolin-5-one, hydantoin, 2- or 4-thiohydantoin, 2-iminooxazolidin-4-one, 2-oxazolin-5-one, 2-thiooxazolin-2,4-dione, isorhodamine, rhodamine, a 5- or 6-membered carbon ring (for example, indan-1,3-dione), thiophene-3-one, thiophene-3-one-1,1-dioxide, indolin-2-one, indolin-3-one, 2-oxoindazolinium, 5,7-dioxo-6,7-dihydrothiazolo[3,2-a]pyrimidine, 3,4-dihydroisoquinolin-4-one, 1,3-dioxane-4,6-dione, a barbituric acid, 2-thiobarbituric acid, coumarin-2,4-dione, indazolin-2-one, pyrido[1,2-a]pyrimidine-1,3-dione, pyrazolo[1,5-b]quinazolone, and pyrazolopyridone. Among these, pyrazole-5-one, a barbituric acid, 2-thiobarbituric acid, or 1,3-dioxane-4,6-dione (for example, Meldrum's acid) is preferable. 1,3-dioxane-4,6-dione is more preferable.

Examples of the substituent included in the acid nucleus of $Za^1$ include the substituents described above regarding the substituent group T.

$Ma^1$, $Ma^2$, and $Ma^3$ each independently represent a methine group.

The methine group may have a substituent or may be unsubstituted. Examples of the substituent include the substituents which may be included in the methine group of the cyanine colorant in Formula (A).

$Ma^1$, $Ma^2$, and $Ma^3$ represent preferably an unsubstituted methine group, or a methine group which is substituted with an alkyl group having 1 to 5 carbon atoms, an alkoxy group having 1 to 5 carbon atoms, an aryl group, a heteroaryl group, or a halogen atom.

m represents an integer of 0 to 3 and preferably 2 or 3.

Q represents an ion which neutralizes charge, and y represents the number of Q's for charge neutralization. Whether or not a compound is a cation or an anion or whether or not a compound has a net ionic charge depends on a substituent of the compound. The ion represented by Q may be a cation or an anion depending on the charge of a counter colorant molecule. In addition, in a case where the colorant molecule does not have charge, Q is not present. The ion represented by Q is not particularly limited and may be an ion derived from an inorganic compound or an ion derived from an organic compound. In addition, the charge of the ion represented by Q may be monovalent or polyvalent. Examples of the cation represented by Q include: a metal ion such as a sodium ion or a potassium ion; a quaternary ammonium ion; an onium ion such as an oxonium ion, a sulfonium ion, a phosphonium ion, a selenonium ion, or an iodonium ion; and a hydrogen ion. On the other hand, examples of the anion represented by Q include: a halogen anion such as a chloride ion, a bromide ion, or a fluoride ion; a heteropoly acid ion such as a sulfate ion, a phosphate ion, or a hydrogen phosphate ion; an organic polyvalent anion such as a succinate ion, a maleate ion, a fumarate ion, or an aromatic disulfonate ion; a borate tetrafluoride ion; and a phosphate hexafluoride ion. As the cation represented by Q, a hydrogen ion, a metal ion, or an onium ion is preferable. In a case where Q represents a hydrogen ion, the hydrogen ion is a neutral free form.

The details of the oxonol colorant represented by Formula (Ox) can be found in paragraphs "0039" to "0066" of JP2006-001875A, the content of which is incorporated herein by reference.

Specific examples of the oxonol colorant represented by Formula (Ox) include the following compounds. In the following formulae, Et represents an ethyl group, Ac represents an acetyl group, Ph represents a phenyl group, and Py represents a pyridyl group.

TABLE 12

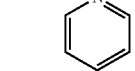

| Compound No. | $R^1$ | $R^2$ | $R^3$ |
|---|---|---|---|
| O-1 | H | 3-NHAc | H |
| O-2 | $CH_3$ | H | H |
| O-3 | $CH_3$ | H | K |
| O-4 | $CH_3$ | 3-NHAc | H |
| O-5 | $CH_3$ | 3-$CONH_2$ | Na |
| O-6 | $CH_3$ | 3-$SO_3K$ | H |
| O-7 | Ph | H | H |
| O-8 | Ph | 4-$CONH_2$ | K |
| O-9 | Ph | 3-$CONH_2$ | H |
| O-10 | Ph | 3-NHAc | H |
| O-11 | Ph | 4-NHAc | Ca |
| O-12 | Ph | 3-COOH | H |
| O-13 | Py | 3-NHAc | H |
| O-14 | Py | 3-NHCOEt | H |
| O-15 | Py | 4-$CONH_2$ | $NHEt_3$ |
| O-16 | Py | 4-COOH | H |

TABLE 12-continued

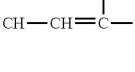

| Compound No. | $R^1$ | $R^2$ | $R^3$ |
|---|---|---|---|

O-17

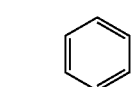

O-18

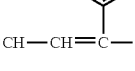

O-19

O-20

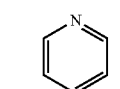

O-21

TABLE 12-continued

[Structure with R1, R2, R3 substituents on barbiturate-methine system]

| Compound No. | R¹ | R² | R³ |

[Structure O-22]

[Structure O-23]

The infrared absorbing composition according to the present invention may include a compound other than a methine colorant as the infrared absorber. Examples of the compound other than a methine colorant include a pyrrolopyrrole compound, a phthalocyanine compound, a naphthalocyanine compound, a quaterrylene compound, a diimonium compound, a dithiol compound, a triarylmethane compound, a pyrromethene compound, an azomethine compound, an anthraquinone compound, and a dibenzofuranone compound.

In the present invention, the content of the compound other than a methine colorant is preferably 20 mass % or lower, more preferably 10 mass % or lower, and still more preferably 5 mass % or lower with respect to the total mass of the infrared absorber. In addition, the infrared absorbing composition according to the present invention may not include the infrared absorber other than a methine colorant.

<<Chromatic Colorant>>

The infrared absorbing composition according to the present invention may include a chromatic colorant. In the present invention, "chromatic colorant" denotes a colorant other than a white colorant and a black colorant. It is preferable that the chromatic colorant is a colorant having an absorption maximum in a wavelength range of 400 nm or longer and shorter than 650 nm.

In the present invention, the chromatic colorant may be a pigment or a dye. It is preferable that the chromatic colorant is a pigment.

It is preferable that an average particle size (r) of the pigment satisfies preferably 20 nm≤r≤300 nm, more preferably 25 nm≤r≤250 nm, and still more preferably 30 nm≤r≤200 nm. "Average particle size" described herein denotes the average particle size of secondary particles which are aggregates of primary particles of the pigment. In addition, regarding a particle size distribution of the secondary particles of the pigment (hereinafter, simply referred to as "particle size distribution") which can be used, it is preferable that secondary particles having a particle size of (average particle size±100) nm account for 70 mass % or higher, preferably, 80 mass % or higher in the pigment. The particle size distribution of the secondary particles can be measured using a scattering intensity distribution.

The average particle size of primary particles can be obtained by observing a pigment with a scanning electron microscope (SEM) or a transmission electron microscope (TEM), measuring particle sizes of 100 particles in a region where particles do not aggregate, and obtaining an average value of the measured particle sizes.

The pigment is preferably an organic pigment, and examples thereof are as follows. However, the present invention is not limited to the examples.

Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all of which are yellow pigments);

C.I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all of which are red pigments);

C.I. Pigment Green 7, 10, 36, 37, 58, and 59 (all of which are green pigments);

C.I. Pigment Violet 1, 19, 23, 27, 32, 37, and 42 (all of which are violet pigments); and C.I. Pigment Blue 1, 2, 15, 15:1, 15:2, 15:3, 15:4, 15:6, 16, 22, 60, 64, 66, 79, and 80 (all of which are blue pigments).

Among these organic pigments, one kind may be used alone, or two or more kinds may be used in combination.

As the dye, well-known dyes can be used without any particular limitation. In terms of a chemical structure, a dye such as a pyrazole azo dye, an anilino azo dye, a triarylmethane dye, an anthraquinone dye, an azomethine dye, an anthrapyridone dye, a benzylidene dye, an oxonol dye, a pyrazolotriazole azo dye, a pyridone azo dye, a cyanine dye, a phenothiazine dye, a pyrrolopyrazole azomethine dye, a xanthene dye, a phthalocyanine dye, a benzopyran dye, an indigo dye, or a pyrromethene dye can be used. In addition, a polymer of the above-described dyes may be used. In addition, dyes described in JP2015-028144A and JP2015-34966A can also be used.

In addition, as the dye, an acid dye and/or a derivative thereof may be suitably used.

Furthermore, for example, a direct dye, a basic dye, a mordant dye, an acid mordant dye, an azoic dye, a dispersed dye, an oil-soluble dye, a food dye, and/or a derivative thereof can be suitably used.

Specific examples of the acid dye are shown below, but the present invention is not limited to these examples. For example, the following dyes and derivatives thereof can be used:

Acid alizarin violet N;

Acid blue 1, 7, 9, 15, 18, 23, 25, 27, 29, 40 to 45, 62, 70, 74, 80, 83, 86, 87, 90, 92, 103, 112, 113, 120, 129, 138, 147, 158, 171, 182, 192, 243, and 324:1;

Acid chrome violet K;

Acid Fuchsin and acid green 1, 3, 5, 9, 16, 25, 27, and 50;

Acid orange 6, 7, 8, 10, 12, 50, 51, 52, 56, 63, 74, and 95;

Acid red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 183, 198, 211, 215, 216, 217, 249, 252, 257, 260, 266, and 274;

Acid violet 6B, 7, 9, 17, and 19;

Acid yellow 1, 3, 7, 9, 11, 17, 23, 25, 29, 34, 36, 42, 54, 72, 73, 76, 79, 98, 99, 111, 112, 114, 116, 184, and 243; and Food Yellow 3.

In addition to the above-described examples, an azo acid dye, a xanthene acid dye, and a phthalocyanine acid dye are preferably used, and acid dyes, such as C.I. Solvent Blue 44 and 38, C.I. Solvent Orange 45, Rhodamine B, and Rhodamine 110 and derivatives of the dyes are also preferably used.

Among these, it is preferable that the dye is a colorant selected from the group consisting of a triarylmethane dye, an anthraquinone dye, an azomethine dye, a benzylidene dye, an oxonol dye, a cyanine dye, a phenothiazine dye, a pyrrolopyrazole azo methine dye, a xanthene dye, a phthalocyanine dye, a benzopyran dye, an indigo dye, a pyrazole azo dye, an anilino azo dye, a pyrazolotriazole azo dye, a pyridone azo dye, an anthrapyridone dye, and a pyrromethene dye.

Further, a combination of a pigment and a dye may be used.

In a case where the infrared absorbing composition according to the present invention includes a chromatic colorant, the content of the chromatic colorant is preferably 0.1 to 70 mass % with respect to the total solid content of the infrared absorbing composition according to the present invention. The lower limit is preferably 0.5 mass % or higher and more preferably 1.0 mass % or higher. The upper limit is preferably 60 mass % or lower, and more preferably 50 mass % or lower.

The content of the chromatic colorant is preferably 10 to 1000 parts by mass and more preferably 50 to 800 parts by mass with respect to 100 parts by mass of the infrared absorber.

In addition, the total content of the chromatic colorant and the infrared absorber is preferably 1 to 80 mass % with respect to the total solid content of the infrared absorbing composition according to the present invention. The lower limit is preferably 5 mass % or higher and more preferably 10 mass % or higher. The upper limit is preferably 70 mass % or lower, and more preferably 60 mass % or lower.

In a case where the infrared absorbing composition according to the present invention includes two or more chromatic colorants, it is preferable that the total content of the two or more chromatic colorants is in the above-described range.

<<Resin>>

The infrared absorbing composition according to the present invention may include a resin. The resin is mixed, for example, in order to disperse the infrared absorber, the chromatic colorant, and the like in the composition and to be used as a binder. The resin which is mainly used to disperse the infrared absorber, the chromatic colorant, and the like will also be called a dispersant. However, the above-described uses of the resin are merely exemplary, and the resin can be used for purposes other than the uses.

The weight-average molecular weight (Mw) of the resin is preferably 2000 to 2000000. The upper limit is preferably 1000000 or lower and more preferably 500000 or lower. The lower limit is preferably 3000 or higher and more preferably 5000 or higher.

The content of the resin is preferably 10 to 80 mass % and more preferably 20 to 60 mass % with respect to the total solid content of the infrared absorbing composition. The infrared absorbing composition may include one resin or two or more resins. In a case where the infrared absorbing composition includes two or more resins, it is preferable that the total content of the two or more resins is in the above-described range.

(Dispersant)

The infrared absorbing composition according to the present invention may include a dispersant as a resin. Examples of the dispersant include: a polymer dispersant such as a resin having an amine group (polyamideamine or a salt thereof), an oligo imine resin, a polycarboxylic acid or a salt thereof, a high-molecular-weight unsaturated acid ester, a modified polyurethane, a modified polyester, a modified poly(meth)acrylate, a (meth)acrylic copolymer, or a naphthalene sulfonic acid formalin condensate;

In terms of a structure, the polymer dispersant can be further classified into a linear polymer, a terminal-modified polymer, a graft polymer, and a block polymer.

In addition, as the polymer dispersant, a resin having an acid value of 60 mgKOH/g or higher (more preferably 60 mgKOH/g or higher and 300 mgKOH/g or lower) can be preferably used.

Examples of the terminal-modified polymer include a polymer having a phosphate group at a terminal thereof described in JP1991-112992A (JP-H3-112992A) or JP2003-533455A, a polymer having a sulfonate group at a terminal thereof described in JP2002-273191A, and a polymer having a partial skeleton or a heterocycle of an organic colorant described in JP1997-77994A (JP-H9-77994A). In addition, polymers described in JP2007-277514A in which two or more anchor sites (for example, an acid group, a basic group, a partial skeleton or a heterocycle of an organic colorant) to a pigment surface are introduced into a terminal thereof are also preferable due to its dispersion stability.

Examples of the graft polymer include a reaction product of poly(low-alkylene imine) and polyester described in JP1979-37082A (JP-S54-37082A), JP1996-507960A (JP-H8-507960A), or JP2009-258668A, a reaction product of polyallylamine and polyester described in JP1997-169821A (JP-H9-169821A), a copolymer of a macromonomer and a monomer having a group containing a nitrogen atom described in JP1998-339949A (JP-H10-339949A) or JP2004-37986A, a graft polymer having a partial skeleton or a heterocycle of an organic colorant described in JP2003-238837A, JP2008-9426A, or JP2008-81732A, and a copolymer of a macromonomer and an acid group-containing monomer described in JP2010-106268A.

As the macromonomer used for manufacturing the graft polymer by radical polymerization, a well-known macromonomer can be used, and examples thereof include macromonomers manufactured by Toagosei Co., Ltd. such as AA-6 (polymethyl methacrylate having a methacryloyl group as a terminal group), AS-6 (polystyrene having a methacryloyl group as a terminal group), AN-6S (a copolymer of styrene and acrylonitrile having a methacryloyl group as a terminal group), and AB-6 (polybutyl acrylate having a methacryloyl group as a terminal group); macromonomers manufactured by Daicel Corporation such as PLACCEL FM5 (an adduct of 2-hydroxyethyl methacrylate and 5 molar equivalents of ε-caprolactone) and FA10L (an adduct of 2-hydroxyethyl acrylate and 10 molar equivalents of ε-caprolactone); and a polyester macromonomer described in JP1990-272009A (JP-H2-272009A). Among these, from the viewpoint of the dispersibility and dispersion stability of the pigment dispersion and the developability of the composition in which the pigment dispersion is used, a polyester macromonomer having excellent flexibility and solvent compatibility is more preferable, and the polyester macromonomer described in JP1990-272009A (JP-H2-272009A) is most preferable.

As the block polymer, a block polymer described in JP2003-49110A or JP2009-52010A is preferable.

As the resin, a graft copolymer including a repeating unit represented by any one of the following Formulae (1) to (4) can also be used.

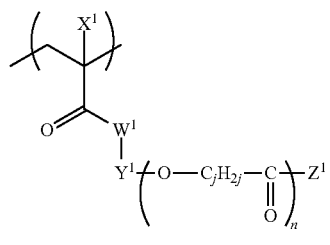

(1)

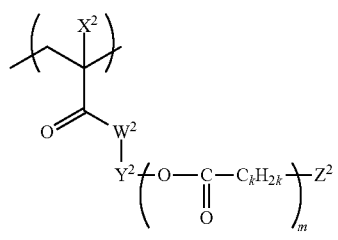

(2)

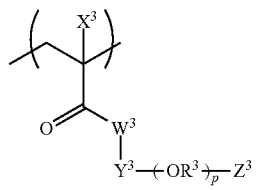

(3)

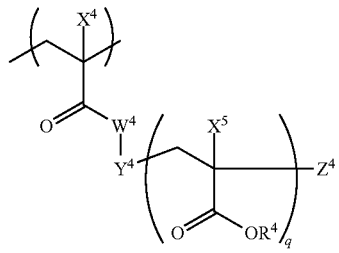

(4)

$X^1$, $X^2$, $X^3$, $X^4$, and $X^5$ each independently represent a hydrogen atom or a monovalent organic group, preferably a hydrogen atom or an alkyl group having 1 to 12 carbon atoms, more preferably a hydrogen atom or a methyl group, and still more preferably a methyl group.

$W^1$, $W^2$, $W^3$, and $W^4$ each independently represent an oxygen atom or NH and preferably an oxygen atom.

$R^3$ represents a branched or linear alkylene group (having preferably 1 to 10 carbon atoms and more preferably 2 or 3 carbon atoms). From the viewpoint of dispersion stability, it is preferable that $R^3$ represents a group represented by —$CH_2$—$CH(CH_3)$— or a group represented by —$CH(CH_3)$—$CH_2$—.

$Y^1$, $Y^2$, $Y^3$, and $Y^4$ each independently represent a divalent linking group, and a structure thereof is not particularly limited.

The graft copolymer can be found in the description of paragraphs "0025" to "0069 of JP2012-255128A, the content of which is incorporated herein by reference.

Specific examples of the graft copolymer are as follows. In addition, a resin described in paragraphs "0072" to "0094" of JP2012-255128A can be used.

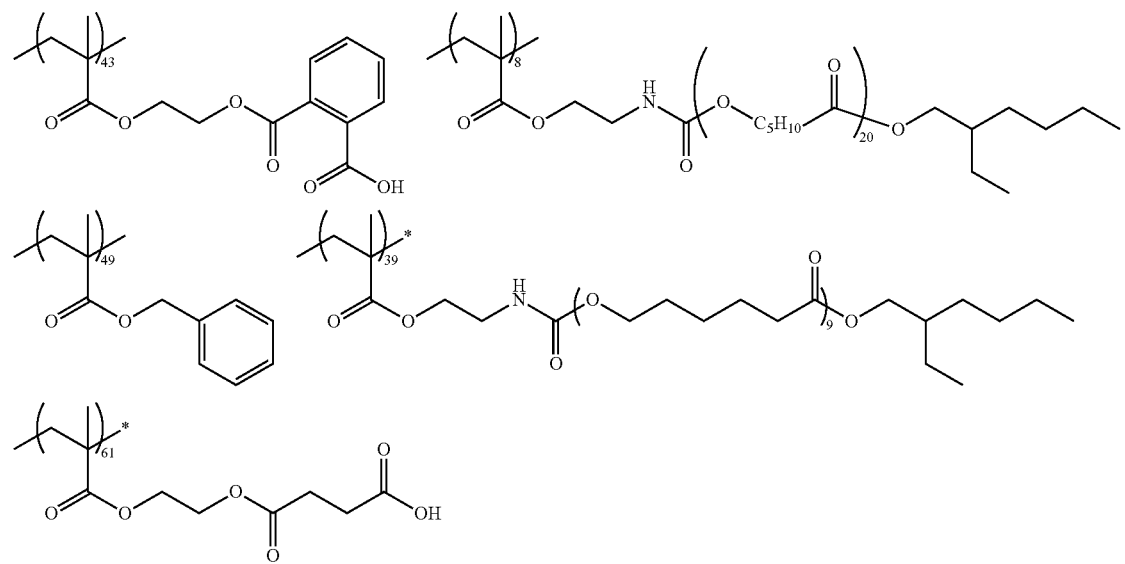

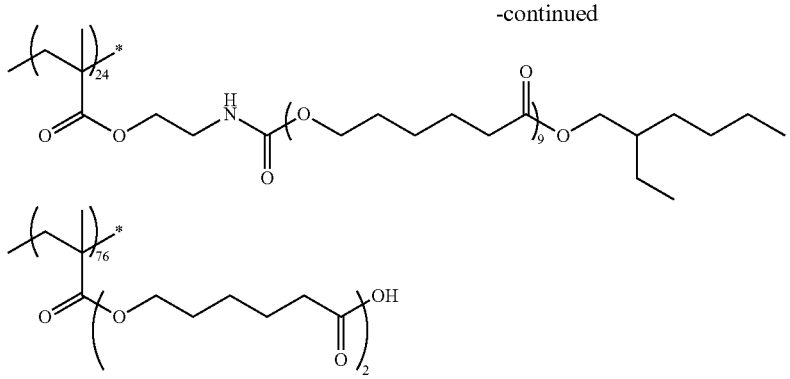

In addition, as the resin, an oligoimine dispersant having a nitrogen atom at at least either a main chain or a side chain can be used. As the oligoimine dispersant, a resin, which includes a repeating unit having a partial structure X with a functional group (pKa: 14 or lower) and side chains including a side chain Y having 40 to 10000 atoms and has a basic nitrogen atom at at least either a main chain or a side chain, is preferable. The basic nitrogen atom is not particularly limited as long as it is a nitrogen atom exhibiting basicity.

Examples of the oligoimine dispersant include a dispersant including a repeating unit represented by the following Formula (I-1), a repeating unit represented by the following Formula (I-2), and/or a repeating unit represented by the following Formula (I-2a).

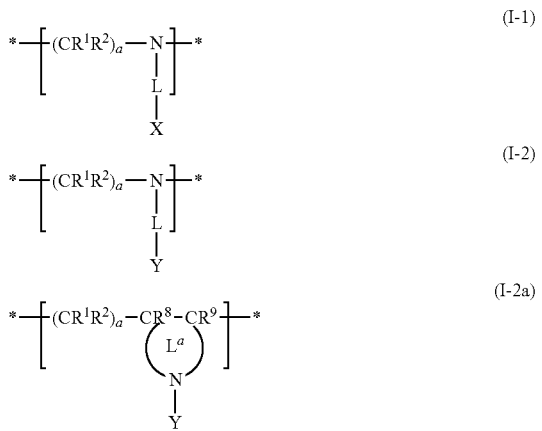

$R^1$ and $R^2$ each independently represent a hydrogen atom, a halogen atom, or an alkyl group (having preferably 1 to 6 carbon atoms). a's each independently represent an integer of 1 to 5. * represents a linking portion between repeating units.

$R^8$ and $R^9$ represent the same group as that of $R^1$.

L represents a single bond, an alkylene group (having preferably 1 to 6 carbon atoms), an alkenylene group (having preferably 2 to 6 carbon atoms), an arylene group (having preferably 6 to 24 carbon atoms), an heteroarylene group (having preferably 1 to 6 carbon atoms), an imino group (having preferably 0 to 6 carbon atoms), an ether group, a thioether group, a carbonyl group, or a linking group of a combination of the above-described groups. Among these, a single bond or —$CR^5R^6$—$NR^7$— (an imino group is present at the X or Y site) is preferable. Here, $R^5$ and $R^6$ each independently represent a hydrogen atom, a halogen atom, or an alkyl group (having preferably 1 to 6 carbon atoms). $R^7$ represents a hydrogen atom or an alkyl group having 1 to 6 carbon atoms.

$L^a$ is a structural unit which forms a ring structure with $CR^8$-$CR^9$ and N, preferably a structural unit which forms a nonaromatic heterocycle having 3 to 7 carbon atoms with $CR^8$-$CR^9$ and a carbon atom, more preferably a structural unit which forms a nonaromatic 5- to 7-membered heterocycle with $CR^8$-$CR^9$ and N (nitrogen atom), still more preferably a structural unit which forms a nonaromatic 5-membered heterocycle with $CR^8$-$CR^9$ and N, and even still more preferably a structural unit which forms pyrrolidine with $CR^8$-$CR^9$ and N. This structural unit may have a substituent such as an alkyl group.

X represents a group having a functional group (pKa: 14 or lower).

Y represents a side chain having 40 to 10000 atoms.

The dispersant (oligoimine dispersant) may further include one or more copolymerization components selected from the group consisting of the repeating unit represented by Formulae (I-3), (I-4), and (I-5). By the dispersant including the above-described repeating units, the dispersion performance can be further improved.

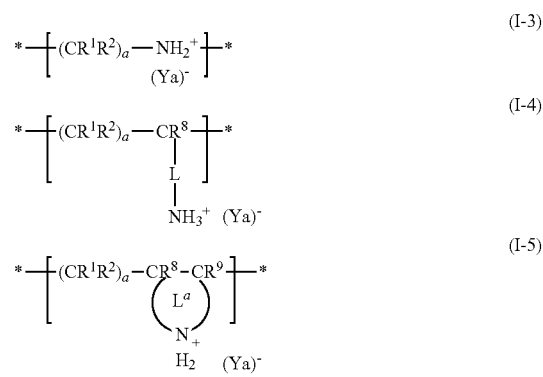

$R^1$, $R^2$, $R^8$, $R^9$, L, $L^a$, a, and * have the same definitions as those in Formulae (I-1), (I-2), and (I-2a).

Ya represents a side chain having 40 to 10000 atoms which has an anionic group. The repeating unit represented by Formula (I-3) can be formed by adding an oligomer or a polymer having a group, which reacts with amine to form a salt, to a resin having a primary or secondary amino group at a main chain such that they react with each other.

The oligoimine dispersant can be found in the description of paragraphs "0102" to "0166" of JP2012-255128A, the content of which is incorporated herein by reference.

Specific examples of the oligoimine dispersant are the following resins. In addition, a resin described in paragraphs "0168" to "0174" of JP2012-255128A can be used.

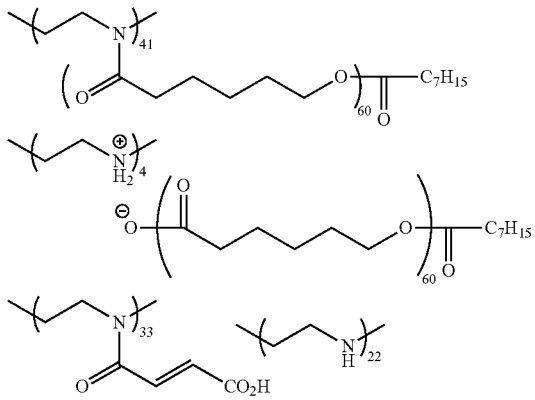

The resin (dispersant) is available as a commercially available product, and specific examples thereof include polymer dispersants such as: "Disperbyk-101 (polyamideamine phosphate), 107 (carboxylate), 110, 111 (copolymer containing an acid group), 130 (polyamide), 161, 162, 163, 164, 165, 166, and 170 (high molecular weight copolymer)" and "BYK-P104, P105 (high molecular weight unsaturated polycarboxylic acid)" all of which are manufactured by BYK Chemie; "EFKA 4047, 4050 to 4165 (polyurethane compound), EFKA 4330 to 4340 (block copolymer), 4400 to 4402 (modified polyacrylate), 5010 (polyester amide), 5765 (high molecular weight polycarboxylate), 6220 (fatty acid polyester), 6745 (phthalocyanine derivative), and 6750 (azo pigment derivative)" all of which are manufactured by EFKA; "AJISPER PB821, PB822, PB880, and PB881" all of which are manufactured by Ajinomoto Fine Techno Co., Inc.; "FLOWLEN TG-710 (urethane oligomer)" and "POLYFLOW No. 50E and No. 300 (acrylate copolymer)" all of which are manufactured by Kyoeisha Chemical Co., Ltd.; "DISPARLON KS-860, 873SN, 874, #2150 (aliphatic polycarboxylic acid), #7004 (polyether ester), DA-703-50, DA-705, and DA-725" all of which are manufactured by Kusumoto Chemicals Ltd.; "DEMOL RN, N (naphthalene sulfonic acid formalin polycondensate), MS, C, and SN-B (aromatic sulfonic acid formalin polycondensate)", "HOMOGENOL L-18 (high molecular polycarboxylic acid)", "EMULGEN 920, 930, 935, and 985 (polyoxyethylene nonylphenyl ether)", and "ACETAMIN 86 (stearylamine acetate)" all of which are manufactured by Kao Corporation; "SOLSPERSE 5000 (phthalocyanine derivative), 22000 (azo pigment derivative), 13240 (polyester amine), 3000, 17000, 27000 (polymer having a functional group at a terminal thereof), 24000, 28000, 32000, and 38500 (graft polymer)" all of which are manufactured by Lubrizol Corporation; "NIKKOL T106 (polyoxyethylene sorbitan monooleate) and MYS-IEX (polyoxyethylene monostearate)" all of which manufactured by Nikko Chemicals Co., Ltd.; HINOACT T-8000E manufactured by Kawaken Fine Chemicals Co., Ltd.; organosiloxane polymer KP341 manufactured by Shin-Etsu Chemical Co., Ltd.; "EFKA-46, EFKA-47, EFKA-47EA, EFKA POLYMER 100, EFKA POLYMER 400, EFKA POLYMER 401, and EFKA POLYMER 450" all of which are manufactured by Morishita Co., Ltd. and "DISPERSE AID 6, DISPERSE AID 8, DISPERSE AID 15, and DISPERSE AID 9100" all of which are manufactured by San Nopco Limited; "ADEKA PLURONIC L31, F38, L42, L44, L61, L64, F68, L72, P95, F77, P84, F87, P94, L101, P103, F108, L121, and P-123" all of which are manufactured by Adeka Corporation; and "IONET S-20" manufactured by Sanyo Chemical Industries Ltd.

Among these resins, one kind may be used alone, or two or more kinds may be used in combination. In addition, an alkali-soluble resin described below can also be used as the dispersant. Examples of the alkali-soluble resin include a (meth)acrylic acid copolymer, an itaconic acid copolymer, a crotonic acid copolymer, a maleic acid copolymer, a partially esterified maleic acid copolymer, an acidic cellulose derivative having a carboxylic acid at a side chain thereof, and a resin obtained by adding an acid anhydride to a polymer having a hydroxyl group. Among these, a (meth)acrylic acid copolymer is preferable. In addition, an N-position-substituted maleimide monomer copolymer described in JP1998-300922A (JP-H10-300922A), an ether dimer copolymer described in JP2004-300204A, or an alkali-soluble resin having a polymerizable group described in JP1995-319161A (JP-H7-319161A) is also preferable. In addition, a resin having the following structure can also be used as the dispersant.

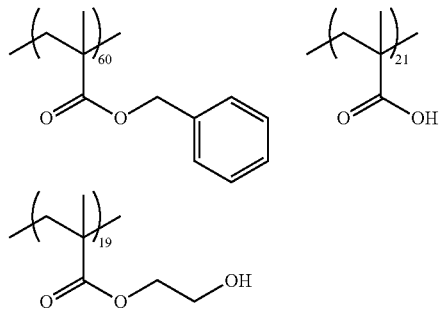

The content of the dispersant is preferably 1 to 80 parts by mass, more preferably 5 to 70 parts by mass, and still more preferably 10 to 60 parts by mass with respect to 100 parts by mass of the pigment.

(Alkali-Soluble Resin)

The infrared absorbing composition according to the present invention may include an alkali-soluble resin as a resin. By the composition including the alkali-soluble resin, developability and pattern formability is improved. The alkali-soluble resin can also be used as the dispersant or the binder. In a case where a pattern is not formed, the alkali-soluble resin may not be used.

The molecular weight of the alkali-soluble resin is not particularly limited, and the weight-average molecular weight (Mw) thereof is preferably 5000 to 100000. In addition, the number-average molecular weight (Mn) of the alkali-soluble resin is preferably 1000 to 20000.

The alkali-soluble resin may be a linear organic polymer and can be appropriately selected from resins having at least one group for promoting alkali dissolution in a molecule (preferably a molecule having an acrylic copolymer or a styrene copolymer as a main chain).

As the alkali-soluble resin, from the viewpoint of heat resistance, a polyhydroxystyrene resin, a polysiloxane resin, an acrylic resin, an acrylamide resin, or an acryl/acrylamide copolymer resin is preferable, and from the viewpoint of controlling developability, an acrylic resin, an acrylamide resin, or an acryl/acrylamide copolymer resin is preferable.

Examples of the group for promoting alkali dissolution (hereinafter, also referred to as the acid group) include a carboxyl group, a phosphate group, a sulfonate group, and a phenolic hydroxyl group. A group that is soluble in an organic solvent and is developable with a weakly alkaline aqueous solution is preferable, and a carboxyl group is more preferable. Among these acid groups, one kind may be used alone, or two or more kinds may be used in combination.

During the preparation of the alkali-soluble resin, for example, a well-known radical polymerization method can be used. Polymerization conditions under which the alkali-soluble resin is prepared using a radical polymerization method, for example, the temperature, the pressure, the kind and amount of a radical initiator, and the kind of a solvent can be easily set by those skilled in the art and can also be experimentally set.

As the alkali-soluble resin, a polymer having a carboxylic acid at a side chain thereof is preferable, and examples thereof include: an alkali-soluble phenol resin such as a methacrylic acid copolymer, an acrylic acid copolymer, an itaconic acid copolymer, a crotonic acid copolymer, a maleic acid copolymer, a partially esterified maleic acid copolymer, or a novolac type resin; an acidic cellulose derivative having a carboxyl group at a side chain thereof; and a resin obtained by adding an acid anhydride to a polymer having a hydroxyl group. In particular, a copolymer of (meth)acrylic acid and another monomer which is copolymerizable with the (meth) acrylic acid is preferable as the alkali-soluble resin. Examples of the monomer which is copolymerizable with the (meth)acrylic acid include an alkyl (meth)acrylate, an aryl (meth)acrylate, and a vinyl compound. Examples of the alkyl (meth)acrylate and the aryl (meth)acrylate include methyl (meth)acrylate, ethyl (meth)acrylate, propyl (meth) acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, and cyclohexyl (meth)acrylate. Examples of the vinyl compound include styrene, α-methylstyrene, vinyl toluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer. Examples of other monomers include a N-position-substituted maleimide monomer described in JP1998-300922A (H10-300922A) (for example, N-phenylmaleimide or N-cyclohexylmaleimide). Among these monomers which are copolymerizable with the (meth)acrylic acid, one kind may be used alone, or two or more kinds may be used in combination.

In addition, in order to improve a crosslinking effect of the film, an alkali-soluble resin having a polymerizable group may be used. Examples of the polymerizable group include a (meth)allyl group and a (meth)acryloyl group. As the alkali-soluble resin having a polymerizable group, an alkali-soluble resin having a polymerizable group at a side chain thereof is preferable.

Examples of the alkali-soluble resin having a polymerizable group include DIANAL NR series (manufactured by Mitsubishi Rayon Co., Ltd.), PHOTOMER 6173 (a COOH-containing polyurethane acrylic oligomer; manufactured by Diamond Shamrock Co., Ltd.), BISCOAT R-264 and KS Resist 106 (both of which are manufactured by Osaka Organic Chemical Industry Ltd.), CYCLOMER-P series (for example, ACA230AA) and PLAKCEL CF200 series (both of which manufactured by Daicel Corporation), EBECRYL 3800 (manufactured by Daicel-UCB Co., Ltd.), and ACRYCURE RD-F8 (manufactured by Nippon Shokubai Co., Ltd.).

As the alkali-soluble resin, a copolymer including benzyl (meth)acrylate and (meth)acrylic acid; a copolymer including benzyl (meth)acrylate, (meth)acrylic acid, and 2-hydroxyethyl (meth)acrylate; or a multi-component copolymer including benzyl (meth)acrylate, (meth)acrylic acid, and another monomer can be preferably used. In addition, copolymers described in JP1995-140654A (JP-H7-140654A) obtained by copolymerization of 2-hydroxyethyl (meth) acrylate can be preferably used, and examples thereof include: a copolymer including 2-hydroxypropyl (meth) acrylate, a polystyrene macromonomer, benzyl methacrylate, and methacrylic acid; a copolymer including 2-hydroxy-3-phenoxypropyl acrylate, a polymethyl methacrylate macromonomer, benzyl methacrylate, and methacrylic acid; a copolymer including 2-hydroxyethyl methacrylate, a polystyrene macromonomer, methyl methacrylate, and methacrylic acid; or a copolymer including 2-hydroxyethyl methacrylate, a polystyrene macromonomer, benzyl methacrylate, and methacrylic acid.

In addition, as a commercially available product, for example, FF-426 (manufactured by Fujikura Kasei Co., Ltd.) can also be used.

As the alkali-soluble resin, a polymer (a) obtained by copolymerization of monomer components including a compound represented by the following Formula (ED1) and/or a compound represented by the following Formula (ED2) (hereinafter, these compounds will also be referred to as "ether dimer") is also preferable.

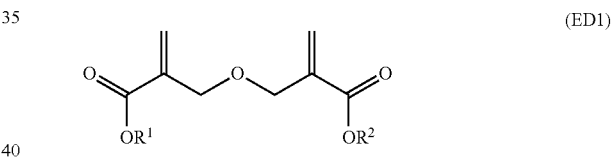

(ED1)

In Formula (ED1), $R^1$ and $R^2$ each independently represent a hydrogen atom or a hydrocarbon group having 1 to 25 carbon atoms which may have a substituent.

(ED2)

In Formula (ED2), R represents a hydrogen atom or an organic group having 1 to 30 carbon atoms. Specific examples of Formula (ED2) can be found in the description of JP2010-168539A.

The hydrocarbon group having 1 to 25 carbon atoms represented by $R^1$ and $R^2$ in Formula (ED1) which may have a substituent is not particularly limited, and examples thereof include a linear or branched alkyl group such as methyl, ethyl, n-propyl, isopropyl, n-butyl, isobutyl, tert-butyl, tert-amyl, stearyl, lauryl, or 2-ethylhexyl; an aryl group such as phenyl; an alicyclic group such as cyclohexyl, tert-butylcyclohexyl, dicyclopentadienyl, tricyclodecanyl, isobornyl, adamantyl, or 2-methyl-2-adamantyl; an alkyl group substituted with alkoxy such as 1-methoxyethyl or 1-ethoxyethyl; and an alkyl group substituted with an aryl group such as benzyl. Among these, a primary or secondary carbon substituent which is not likely to leave due to an acid or heat, for example, methyl, ethyl, cyclohexyl, or benzyl is preferable from the viewpoint of heat resistance.

Specific examples of the ether dimer can be found in paragraph "0317" of JP2013-29760A, the content of which is incorporated herein by reference. Among these ether dimers, one kind may be used alone, or two or more kinds may be used in combination. A structure derived from the compound represented by Formula (ED1) and/or the compound represented by Formula (ED2) may be copolymerized with other monomers.

The alkali-soluble resin may include a repeating unit which is derived from a compound represented by the following Formula (X).

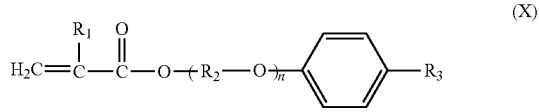

In Formula (X), $R_1$ represents a hydrogen atom or a methyl group, $R_2$ represents an alkylene group having 2 to 10 carbon atoms, $R_3$ represents a hydrogen atom or an alkyl group having 1 to 20 carbon atoms which may have a benzene ring, and n represents an integer of 1 to 15.

In Formula (X), the number of carbon atoms in the alkylene group of $R_2$ is preferably 2 to 3. In addition, the number of carbon atoms in the alkyl group of $R_3$ is 1 to 20 and preferably 1 to 10. The alkyl group of $R_3$ may include a benzene ring. Examples of the alkyl group having a benzene ring represented by $R_3$ include a benzyl group and a 2-phenyl(iso)propyl group.

Specific examples of the alkali-soluble resin are the following resins. In the following structural formulae, Me represents a methyl group.

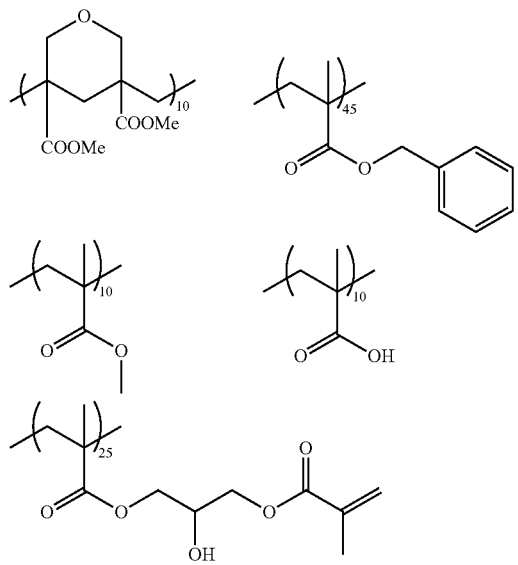

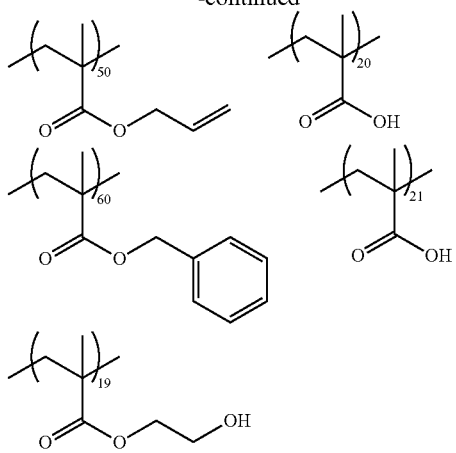

The details of the alkali-soluble resin can be found in paragraphs "0558" to "0571" of JP2012-208494A (corresponding to paragraphs "0685" to "0700" of US2012/0235099A), the content of which is incorporated herein by reference.

Further, a copolymer (B) described in paragraphs "0029" to "0063" and an alkali-soluble resin used in Examples of JP2012-32767A, a binder resin described in paragraphs "0088" to "0098" and a binder resin used in Examples of JP2012-208474A, a binder resin described in paragraphs "0022" to "0032 and a binder resin used in Examples of JP2012-137531A, a binder resin described in paragraphs "0132" to "0143" and a binder resin used in Examples of JP2013-024934A, a binder resin described in paragraphs "0092" to "0098" and Examples of JP2011-242752A, or a binder resin described in paragraphs "0030" to "0072" of JP2012-032770A can also be used. The contents of which are incorporated herein by reference.

The acid value of the alkali-soluble resin is preferably 30 to 500 mgKOH/g. The lower limit is more preferably 50 mgKOH/g or higher and still more preferably 70 mgKOH/g or higher. The upper limit is more preferably 400 mgKOH/g or lower, still more preferably 200 mgKOH/g or lower, even still more preferably 150 mgKOH/g or lower, and even yet still more preferably 120 mgKOH/g or lower.

The content of the alkali-soluble resin is preferably 0.1 to 50 mass % with respect to the total solid content of the infrared absorbing composition. The lower limit is preferably 0.5 mass %% or higher, more preferably 1 mass % or higher, still more preferably 2 mass % or higher, and even still more preferably 3 mass % or higher. The upper limit is more preferably 30 mass % or lower, and still more preferably 10 mass % or lower. The infrared absorbing composition according to the present invention may include one alkali-soluble resin or two or more alkali-soluble resins. In a case where the infrared absorbing composition includes two or more alkali-soluble resins, it is preferable that the total content of the two or more alkali-soluble resins is in the above-described range.

(Aqueous Polymer Dispersion)

The infrared absorbing composition according to the present invention can be made to be water-soluble by using an aqueous polymer dispersion as a resin. In the present invention, the aqueous polymer dispersion is a dispersion in which a resin is dispersed in a dispersion solvent including water as a major component.

The content of water in the dispersion solvent is preferably 30 to 100 mass % and more preferably 50 to 100 mass %. As a solvent other than water, a solvent having solubility in water is preferably used, and examples thereof include an alcohol such as methanol, ethanol, or isopropyl alcohol, a ketone such as acetone or methyl ethyl ketone, a glycol ether such as N-methylpyrrolidone (NMP), tetrahydrofuran, or butyl cellosolve. In addition, in order to improve the dispersion stability and coating properties of the polymer in the aqueous dispersion and the characteristics of the film after drying, a surfactant, ammonia, or an amine such as triethylamine, N,N-dimethylethanolamine may be added in an amount of several mass % with respect to the polymer.

As the polymer, various polymers such as an acrylic resin, a vinyl resin, a polyurethane resin, or a polyester resin can be used. It is preferable that the polymer has any one of a methylol group, a hydroxyl group, a carboxyl group, and an amino group, it is more preferable that the polymer has a hydroxyl group or a carboxyl group, and it is still more preferable that the polymer has a carboxyl group. The content of the hydroxyl group or the carboxyl group in the polymer is preferably 0.0001 to 1 equivalent/kg and more preferably 0.001 to 1 equivalent/kg.

Examples of the acrylic resin include a homopolymer of any one of the following monomers or a copolymer obtained by polymerization two or more monomers selected from the following monomers, the monomers including: an acrylic acid ester such as acrylic acid or an alkyl acrylate; a methacrylic acid ester such as acrylamide, acrylonitrile, methacrylic acid, or an alkyl methacrylate; methacrylamide; and methacrylonitrile. Among these, a homopolymer of an acrylic acid ester such as an alkyl acrylate and a methacrylic acid ester such as an alkyl methacrylate, or a copolymer obtained by polymerization of two or more monomers selected from the above monomers is preferable. For example, a homopolymer of an acrylic acid ester which includes an alkyl group having 1 to 6 carbon atoms and a methacrylic acid ester which includes an alkyl group having 1 to 6 carbon atoms, or a copolymer obtained by polymerization of two or more monomers selected from the above monomers is preferable.

Examples of the vinyl resin include polyvinyl alcohol, an acid-modified polyvinyl alcohol, polyvinyl formal, polyvinyl butyral, polyvinyl methyl ether, polyolefin, an ethylene-butadiene copolymer, polyvinyl acetate, a vinyl chloride-vinyl acetate copolymer, a vinyl chloride-(meth)acrylic acid ester copolymer, and an ethylene-vinyl acetate copolymer (preferably an ethylene-vinyl acetate-(meth)acrylic acid ester copolymer). Among these, polyvinyl alcohol, an acid-modified polyvinyl alcohol, polyvinyl formal, polyolefin, an ethylene-butadiene copolymer, or an ethylene-vinyl acetate copolymer (preferably an ethylene-vinyl acetate-(meth)acrylic acid ester copolymer) is preferable.

Examples of the polyurethane resin include a polyurethane derived from polyisocyanate and any one or a mixture of two or more kinds selected from the following compounds including: a polyhydroxy compound (for example, ethylene glycol, propylene glycol, glycerin, or trimethylolpropane), an aliphatic polyester polyol obtained by a reaction of a polyhydroxy compound and a polybasic acid, a polyether polyol (for example, poly(oxypropylene ether) polyol or poly(oxyethylene-propylene ether)polyol), a polycarbonate polyol, and a polyethylene terephthalate polyol.

As the polyester resin, in general, a polymer obtained by a reaction of a polyhydroxy compound (for example, ethylene glycol, propylene glycol, glycerin, or trimethylolpropane) and a polybasic acid is used.

Among the polymers, an acrylic resin, a polyurethane resin, or a polyester resin is preferable, and an acrylic resin is more preferable. Examples of a commercially available product of the aqueous polymer dispersion include JURYMER ET410 (an aqueous acrylic resin dispersion, manufactured by Nihon Junyaku Co., Ltd.).

(Other Resins)

In the present invention, it is also preferable that the infrared absorbing composition includes a resin having a repeating unit represented by any one of Formulae (A3-1) to (A3-7).

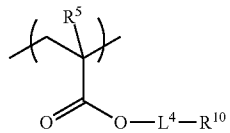

(A3-1)

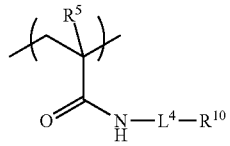

(A3-2)

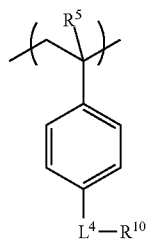

(A3-3)

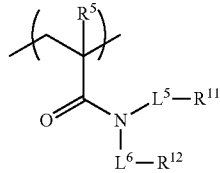

(A3-4)

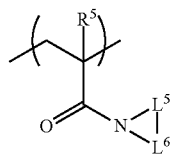

(A3-5)

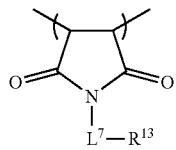

(A3-6)

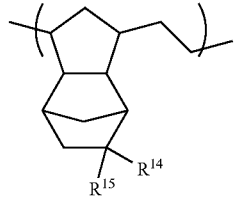

(A3-7)

In the formula, $R^5$ represents a hydrogen atom or an alkyl group, $L^4$ to $L^7$ each independently represent a single bond or a divalent linking group, $R^{10}$ to $R^{13}$ each independently represent an alkyl group or an aryl group, and $R^{14}$ and $R^{15}$ each independently represent a hydrogen atom or a substituent.

$R^5$ represents a hydrogen atom or an alkyl group. The number of carbon atoms in the alkyl group is preferably 1 to 5, more preferably 1 to 3, and still more preferably 1. It is preferable that $R^5$ represents a hydrogen atom or a methyl group.

$L^4$ to $L^7$ each independently represent a single bond or a divalent linking group. Examples of the divalent linking group include an alkylene group, an arylene group, —O—, —S—, —CO—, —COO—, —OCO—, —SO$_2$—, —NR$^{10}$— ($R^{10}$ represents a hydrogen atom or an alkyl group and preferably a hydrogen atom), and a group including a combination thereof. Among these, an alkylene or a group including a combination —O— and at least one of an arylene group or an alkylene group is preferable. The number of carbon atoms in the alkylene group is preferably 1 to 30, more preferably 1 to 15, and still more preferably 1 to 10. The alkylene group may have a substituent but is preferably unsubstituted. The alkylene group may be linear, branched, or cyclic. In addition, the cyclic alkylene group may be monocyclic or polycyclic. The number of carbon atoms in the arylene group is preferably 6 to 18, more preferably 6 to 14, and still more preferably 6 to 10.

The alkyl group represented by $R^{10}$ may be linear, branched, or cyclic and is preferably cyclic. The alkyl group may have a substituent or may be unsubstituted. The number of carbon atoms in the alkyl group is preferably 1 to 30, more preferably 1 to 20, and still more preferably 1 to 10. The number of carbon atoms in the aryl group represented by $R^{10}$ is preferably 6 to 18, more preferably 6 to 12, and still more preferably 6. It is preferable that R10 represents a cyclic alkyl group or an aryl group.

The alkyl group represented by $R^{11}$ and $R^{12}$ may be linear, branched, or cyclic and is preferably linear or branched. The alkyl group may have a substituent or may be unsubstituted. The number of carbon atoms in the alkyl group is preferably 1 to 12, more preferably 1 to 6, and still more preferably 1 to 4. The number of carbon atoms in the aryl group represented by $R^{11}$ and $R^{12}$ is preferably 6 to 18, more preferably 6 to 12, and still more preferably 6. It is preferable that $R^{11}$ and $R^{12}$ represents a linear or branched alkyl group.

The alkyl group represented by $R^{13}$ may be linear, branched, or cyclic and is preferably linear or branched. The alkyl group may have a substituent or may be unsubstituted. The number of carbon atoms in the alkyl group is preferably 1 to 12, more preferably 1 to 6, and still more preferably 1 to 4. The number of carbon atoms in the aryl group represented by $R^{13}$ is preferably 6 to 18, more preferably 6 to 12, and still more preferably 6. It is preferable that $R^{13}$ represents a linear or branched alkyl group or an aryl group.

Examples of the substituent represented by $R^{14}$ and $R^{15}$ include the groups described above regarding Formula (1). In particular, it is preferable that at least one of $R^{14}$ or $R^{15}$ represents a cyano group or —COORa. Ra represents a hydrogen atom or a substituent.

Examples of the substituent include the above-described substituents. For example, an alkyl group or an aryl group is preferable.

Examples of a commercially available product of the resin having a repeating unit represented by Formula (A3-7) include ARTON F4520 (manufactured by JSR Corporation).

(Gelatin)

It is preferable that the infrared absorbing composition according to the present invention includes a gelatin. By the infrared absorbing composition according to the present invention including the gelatin, an infrared cut filter having excellent heat resistance is likely to be formed. The detailed mechanism is unclear but is presumed to be that the infrared absorber and the gelatin are likely to form an associate. In particular, in a case where the cyanine compound is used as the infrared absorber, an infrared cut filter having excellent heat resistance is likely to be formed.

In the present invention, as the gelatin, any one of an acid-treated gelatin and an alkali-treated gelatin (for example, a lime-treated gelatin) can be preferably used in terms of a synthesis method thereof. The molecular weight of the gelatin is preferably 10000 to 1000000. In addition, a modified gelatin which is modified using an amino group or a carboxyl group of a gelatin can also be used (for example, phthalated gelatin). As the gelatin, for example, inert gelatin (for example, NITTA GELATIN 750) or phthalated gelatin (for example, NITTA GELATIN 801) can be used.

In order to improve the water fastness and mechanical strength of the infrared cut filter, it is preferable that the gelatin is cured using various compounds (curing agents). As the curing agent, well-known curing agents of the related art can be used. Examples of the curing agent include: an aldehyde compound such as formaldehyde or glutaraldehyde; a compound having a reactive halogen described in U.S. Pat. No. 3,288,775A; a compound having a reactive ethylenically unsaturated bond described in U.S. Pat. No. 3,642,486A and JP1974-13563B (JP-S49-13563B); an aziridine compound described in U.S. Pat. No. 3,017,280A; an epoxy compound described in U.S. Pat. No. 3,091,537A; a halogencarboxyl aldehyde such as mucochloric acid; a dioxane such as dihydroxydioxane or dichlorodioxane; and an inorganic hardening agent such as Chrome alum or zirconium sulfate. In addition, 1,3-divinylsulfonyl-2-propanol can also be used.

The content of the gelatin in the infrared absorbing composition is preferably 1 to 80 mass % with respect to the total solid content of the infrared absorbing composition. The lower limit is preferably 10 mass % or higher and more preferably 20 mass % or higher. The upper limit is preferably 60 mass % or lower, and more preferably 50 mass % or lower.

<<Pigment Derivative>>

The infrared absorbing composition according to the present invention may include a pigment derivative. Examples of the pigment derivative include a compound having a structure in which a portion of a pigment is substituted with an acidic group, or a basic group. It is preferable that the pigment derivative has an acidic group or a basic group from the viewpoints of dispersibility and dispersion stability.

<<Curable Compound>>

It is preferable that the infrared absorbing composition according to the present invention includes a curable compound. As the curable compound, a well-known compound which is crosslinkable by a radical, an acid, or heat can be used. Examples of the compound include a compound having a group having an ethylenically unsaturated bond, a cyclic ether (epoxy, oxetanyl) group, or a methylol group. Examples of the group having an ethylenically unsaturated bond include a vinyl group, a (meth)allyl group, and a (meth)acryloyl group.

In the present invention, the curable compound is preferably a polymerizable compound and more preferably a radically polymerizable compound.

(Polymerizable Compound)

In the present invention, the polymerizable compound may have any chemical form such as a monomer, a prepolymer, that is, a dimer, a trimer, or an oligomer, or a mixture or polymer thereof. In the case of a radically polymerizable compound, a monomer is preferable.

The molecular weight of the polymerizable compound is preferably 100 to 3000. The upper limit is preferably 2000 or lower and more preferably 1500 or lower. The lower limit is preferably 150 or higher and more preferably 250 or higher.

The polymerizable compound is preferably a (meth)acrylate compound having 3 to 15 functional groups and more preferably a (meth)acrylate compound having 3 to 6 functional groups.

Examples of the monomer and the prepolymer include an unsaturated carboxylic acid (for example, acrylic acid, methacrylic acid, itaconic acid, crotonic acid, isocrotonic acid, or maleic acid), an ester or amide of an unsaturated carboxylic acid, and a polymer thereof. Among these, an ester of an unsaturated carboxylic acid and an aliphatic polyhydric alcohol compound, an amide of an unsaturated carboxylic acid and an aliphatic polyamine compound, or a polymer thereof is preferable. In addition, for example, an adduct of an unsaturated carboxylic acid ester or amide having a nucleophilic substituent, such as a hydroxyl group, an amino group, or a mercapto group, with a monofunctional or polyfunctional isocyanate or epoxy, or a dehydrated condensate of an unsaturated carboxylic acid ester or amide having a nucleophilic substituent with a monofunctional or polyfunctional carboxylic acid is also preferably used. In addition, a reactant of an unsaturated carboxylic acid ester or amide having an electrophilic substituent such as an isocyanate group or an epoxy group with a monofunctional or polyfunctional alcohol, amine, or thiol, or a reactant of an unsaturated carboxylic acid ester or amide having a leaving substituent such as a halogen group or a tosyloxy group with a monofunctional or polyfunctional alcohol, amine, or thiol is also preferable. In addition, a group of compounds in which the unsaturated carboxylic acid is substituted with, for example, an unsaturated phosphonic acid, a vinylbenzene derivative such as styrene, vinyl ether, or allyl ether can also be used.

As specific examples of the compounds, compounds described in paragraphs "0095" to "0108" of JP2009-288705A can be preferably used in the present invention.

In the present invention, as the polymerizable compound, a compound having one or more ethylenically unsaturated bonds and having a boiling point of 100° C. or higher under normal pressure is also preferable. Examples of the compound include compounds described in paragraph "0227" of JP2013-29760 and paragraphs "0254" to "0257" of JP2008-292970A, the content of which is incorporated herein by reference.

As the polymerizable compound, dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth)acrylate (KAYARAD D-310 as a commercially available product; manufactured by Nippon Kayaku Co., Ltd.), dipentaerythritol hexa(meth)acrylate (KAYARAD DPHA as a commercially available product; manufactured by Nippon Kayaku Co., Ltd., A-DPH-12E as a commercially available product; manufactured by Shin-Nakamura Chemical Co., Ltd.), and a structure (for example, SR454 or SR499; manufactured by Sartomer) in which these (meth)acryloyl groups are bonded through an ethylene glycol or a propylene glycol residue is preferable. Oligomers of the above-described examples can be used. In addition, KAYARAD RP-1040 or DPCA-20 (manufactured by Nippon Kayaku Co., Ltd.) can also be used.

Hereinafter, a preferable aspect of the polymerizable compound will be described.

The polymerizable compound may have an acid group such as a carboxyl group, a sulfonate group, or a phosphate group. As the polymerizable compound having an acid group, an ester of an aliphatic polyhydroxy compound and an unsaturated carboxylic acid is preferable. A polymerizable compound having an acid group obtained by causing a nonaromatic carboxylic anhydride to react with an unreacted hydroxyl group of an aliphatic polyhydroxy compound is more preferable. In particular, an ester in which the aliphatic polyhydroxy compound is pentaerythritol and/or dipentaerythritol is still more preferable. Examples of a commercially available product of the monomer having an acid group include M-305, M-510, and M-520 as polybasic acid-modified acrylic oligomer (manufactured by Toagosei Co., Ltd.).

The acid value of the polymerizable compound having an acid group is preferably 0.1 to 40 mgKOH/g and more preferably 5 to 30 mgKOH/g. In a case where the acid value of the polymerizable compound is 0.1 mgKOH/g or higher, development solubility is excellent. In a case where the acid value of the polymerizable compound is 40 mgKOH/g or lower, there are advantageous effects in manufacturing and handleability. Further, photopolymerization performance is excellent, and curing properties are excellent.

In addition, a compound having a caprolactone structure is also preferable as the polymerizable compound.

The compound having a caprolactone structure is not particularly limited as long as it has a caprolactone structure in the molecule thereof, and examples thereof include ε-caprolactone-modified polyfunctional (meth)acrylate obtained by esterification of a polyhydric alcohol, (meth)acrylic acid, and ε-caprolactone, the polyhydric alcohol being, for example, trimethylolethane, ditrimethylolethane, trimethylolpropane, ditrimethylolpropane, pentaerythritol, dipentaerythritol, tripentaerythritol, glycerin, diglycerol, or trimethylolmelamine. In particular, a compound having a caprolactone structure represented by the following Formula (Z-1) is preferable.

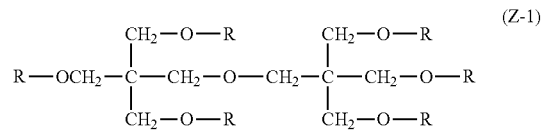

In Formula (Z-1), all of six R's represent a group represented by the following Formula (Z-2), or one to five R's among the six R's represent a group represented by the following Formula (Z-2) and the remaining R's represent a group represented by the following Formula (Z-3).

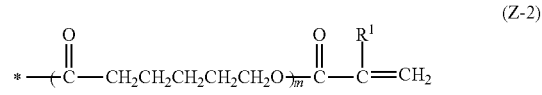

In Formula (Z-2), $R^1$ represents a hydrogen atom or a methyl group, m represents 1 or 2, and "*" represents a direct bond.

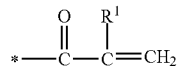

(Z-3)

In Formula (Z-3), $R^1$ represents a hydrogen atom or a methyl group, and "*" represents a direct bond.

The polymerizable compound having a caprolactone structure is commercially available as for example, KAYARAD DPCA series (manufactured by Nippon Kayaku Co., Ltd.), and examples thereof include DPCA-20 (a compound in which m=1 in Formulae (Z-1) to (Z-3), the number of groups represented by Formula (Z-2)=2, and all of $R^1$'s represent a hydrogen atom), DPCA-30 (a compound in which m=1 in Formulae (Z-1) to (Z-3), the number of groups represented by Formula (Z-2)=3, and all of $R^1$'s represent a hydrogen atom), DPCA-60 (a compound in which m=1 in Formulae (Z-1) to (Z-3), the number of groups represented by Formula (Z-2)=6, and all of $R^1$'s represent a hydrogen atom), and DPCA-120 (a compound in which m=2 in Formulae (Z-1) to (Z-3), the number of groups represented by Formula (Z-2)=6, and all of $R^1$'s represent a hydrogen atom).

In addition, the following compounds can be used.

In Formula (Z-5), the total number of (meth)acryloyl groups is 5 or 6, n's each independently represent an integer of 0 to 10, and the sum of n's is an integer of 0 to 60.

In Formula (Z-4), m represents preferably an integer of 0 to 6 and more preferably an integer of 0 to 4.

In addition, the sum of m's is preferably an integer of 2 to 40, more preferably an integer of 2 to 16, and still more preferably an integer of 4 to 8.

In Formula (Z-5), n represents preferably an integer of 0 to 6 and more preferably an integer of 0 to 4.

In addition, the sum of n's is preferably an integer of 3 to 60, more preferably an integer of 3 to 24, and still more preferably an integer of 6 to 12.

In addition, it is preferable that, in —$((CH_2)_yCH_2O)$— or —$((CH_2)_yCH(CH_3)O)$— of Formula (Z-4) or (Z-5), a terminal thereof on an oxygen atom side is bonded to X.

Among these compounds represented by Formula (Z-4) or (Z-5), one kinds may be used alone, or two or more kinds may be used in combination. In particular, it is preferable that all of six X's in Formula (Z-5) represent an acryloyl group, and a mixture of a compound in which all of six X's in Formula (Z-5) represent an acryloyl group and a compound in which at least one among six X's represents a hydrogen atom is also preferable. With the above-described configuration, developability can be further improved.

In addition, the total content of the compound represented by Formula (Z-4) or (Z-5) in the polymerizable compound is preferably 20 mass % or higher and more preferably 50 mass % or higher.

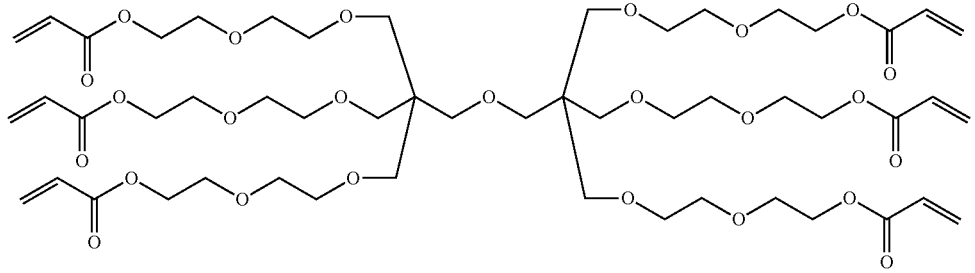

As the polymerizable compound, a compound represented by Formula (Z-4) or (Z-5) can be used.

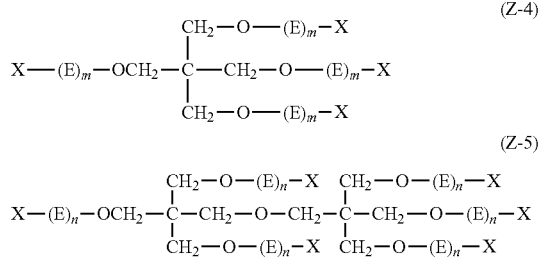

In Formulae (Z-4) and (Z-5), E's each independently represent —$((CH_2)_yCH_2O)$— or —$((CH_2)_yCH(CH_3)O)$—, y's each independently represent an integer of 0 to 10, and X's each independently represent a (meth)acryloyl group, a hydrogen atom, or a carboxyl group.

In Formula (Z-4), the total number of (meth)acryloyl groups is 3 or 4, m's each independently represent an integer of 0 to 10, and the sum of m's is an integer of 0 to 40.

The compound represented by Formula (Z-4) or (Z-5) can be synthesized through well-known steps of the related art including: a step of bonding a ring-opened skeleton using a ring-opening addition reaction between pentaerythritol or dipentaerythritol and ethylene oxide or propylene oxide; and a step of causing, for example, (meth)acryloyl chloride to react with a terminal hydroxyl group of the ring-opened skeleton to introduce a (meth)acryloyl group to the terminal hydroxyl group. The respective steps are well-known in the art, and those skilled in the art can easily synthesize the compound represented by Formula (Z-4) or (Z-5).

Among the compounds represented by Formula (Z-4) or (Z-5), a pentaerythritol derivative and/or a dipentaerythritol derivative is more preferable.

Specific examples of the pentaerythritol derivative and/or the dipentaerythritol derivative include compounds represented by the following Formulae (a) to (f) (hereinafter, also referred to as "Exemplary Compounds (a) to (f)"). Among these, Exemplary Compound (a), (b), (e), or (f) is preferable.

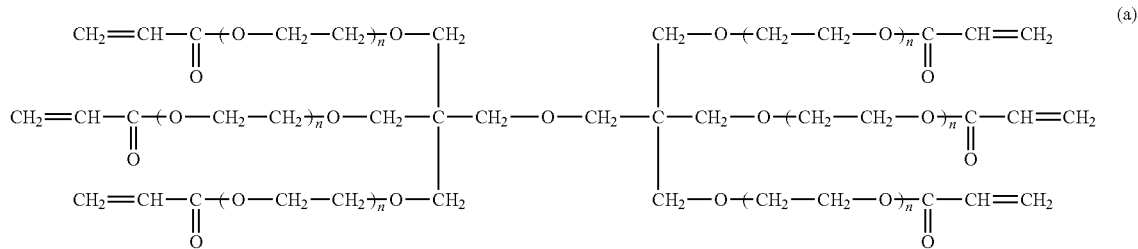
(a)
(The sum of n's is 6)
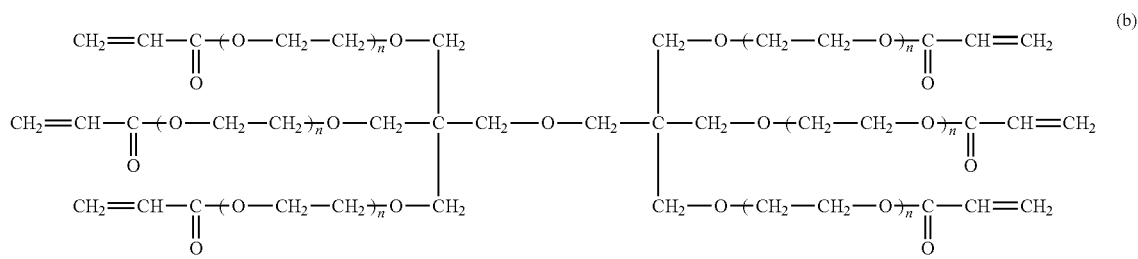
(b)
(The sum of n's is 12)
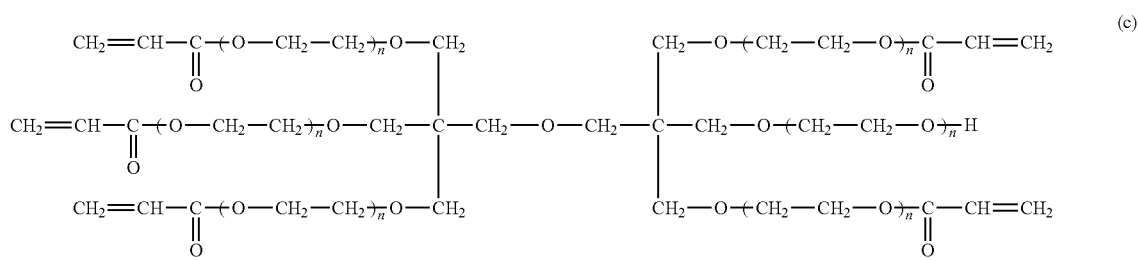
(c)
(The sum of n's is 12)
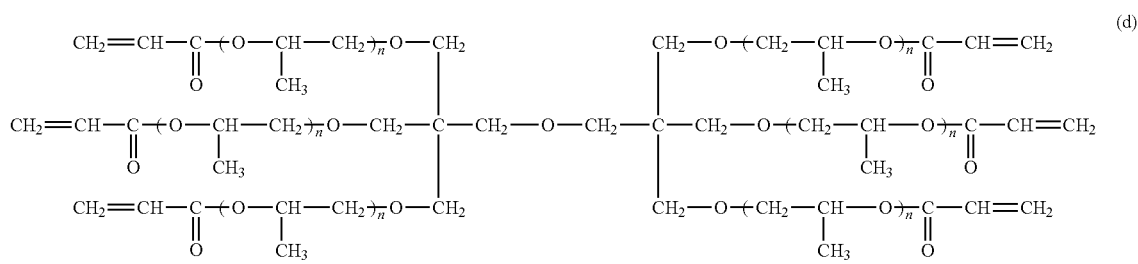
(d)
(The sum of n's is 6)
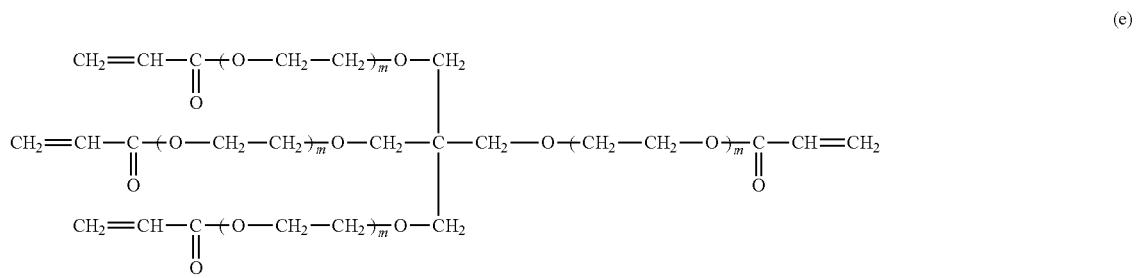
(e)
(The sum of m's is 4)

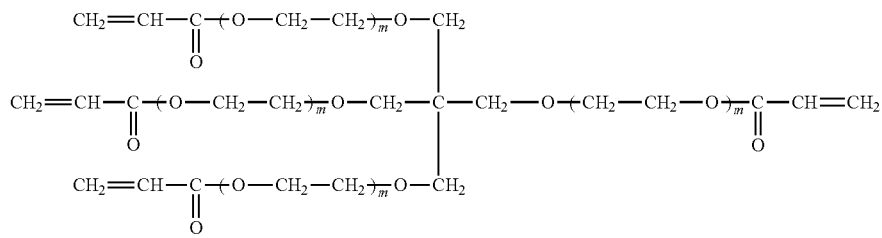

(f)

(The sum of m's is 12)

Examples of a commercially available product of the polymerizable compound represented by Formula (Z-4) or (Z-5) include SR-494 (manufactured by Sartomer) which is a tetrafunctional acrylate having four ethyleneoxy chains, DPCA-60 (manufactured by Nippon Kayaku Co., Ltd.) which is a hexafunctional acrylate having six pentyleneoxy chains, and TPA-330 (manufactured by Nippon Kayaku Co., Ltd.) which is a trifunctional acrylate having three isobutyleneoxy chains.

As the polymerizable compound, a urethane acrylate described in JP1973-41708B (JP-S48-41708B), JP1976-37193A (JP-S51-37193A), JP1990-32293B (JP-H2-32293B), or JP1990-16765B (JP-H2-16765B), or a urethane compound having a ethylene oxide skeleton described in JP1983-49860B (JP-S58-49860B), JP1981-17654B (JP-S56-17654B), JP1987-39417B (JP-S62-39417B), or JP1987-39418B (JP-S62-39418B) is also preferable. In addition, an infrared absorbing composition having an excellent film speed can be obtained by using an addition-polymerizable compound having an amino structure or a sulfide structure in the molecules described in JP1988-277653A (JP-S63-277653A), JP1988-260909A (JP-S63-260909A), or JP1989-105238A (JP-H1-105238A).

Examples of a commercially available product of the polymerizable compound include URETHANE OLIGOMER UAS-10 and UAB-140 (manufactured by Sanyo-Kokusaku Pulp Co., Ltd.), UA-7200 (manufactured by Shin-Nakamura Chemical Co., Ltd.), DPHA-40H (manufactured by Nippon Kayaku Co., Ltd.), and UA-306H, UA-306T, UA-306I, AH-600, T-600 and AI-600 (manufactured by Kyoeisha Chemical Co., Ltd.).

(Compound Having Cyclic Ether Group)

In the present invention, as the curable compound, a compound having a cyclic ether group can also be used. Examples of the cyclic ether group include an epoxy group and an oxetanyl group. Among these, an epoxy group is preferable. That is, it is preferable that the compound having a cyclic ether group is a compound having an epoxy group.

In a case where a pattern is formed using a dry etching method, a compound having a cyclic ether group is preferably used as the curable compound.

As the compound having a cyclic ether group, a compound having two or more cyclic ether groups in one molecule is preferable. The number of cyclic ether groups in one molecule is preferably 2 to 10, more preferably 2 to 5, and still more preferably 3.

It is preferable that the compound having a cyclic ether group in the present invention has a structure in which two benzene rings are linked to each other through a hydrocarbon group. As the hydrocarbon group, an alkylene group having 1 to 6 carbon atoms is preferable.

In addition, it is preferable that the cyclic ether groups are linked to each other through a linking group. Examples of the linking group include an alkylene group, an arylene group, —O—, a structure represented by —NR'— (R' represents a hydrogen atom, an alkyl group which may have a substituent, or an aryl group which may have a substituent and preferably represents a hydrogen atom), and a group having at least one selected from —SO$_2$—, —CO—, —O—, and —S—.

The compound having a cyclic ether group may be a low molecular weight compound (for example, molecule weight: 2000 or lower or 1000 or lower) or a high molecular weight compound (macromolecule; for example, molecular weight: 1000 or higher, and in the case of a polymer, weight-average molecular weight: 1000 or higher). The weight-average molecular weight of the compound having an epoxy group is preferably 200 to 100000 and more preferably 500 to 50000. The upper limit of the weight-average molecular weight is preferably 3000 or lower, more preferably 2000 or lower, and still more preferably 1500 or lower.

As the compound having a cyclic ether group, compounds described in paragraphs "0034" to "0036" of JP2013-011869A, paragraphs "0147" to "0156" of JP2014-043556A, and paragraphs "0085" to "0092" of JP2014-089408A can also be used. The contents of which are incorporated herein by reference. In addition, a polymer having a repeating unit represented by the following Formula (B1) can also be used. The polymer having the repeating unit represented by Formula (B1) may further have a repeating unit represented by Formula (B2).

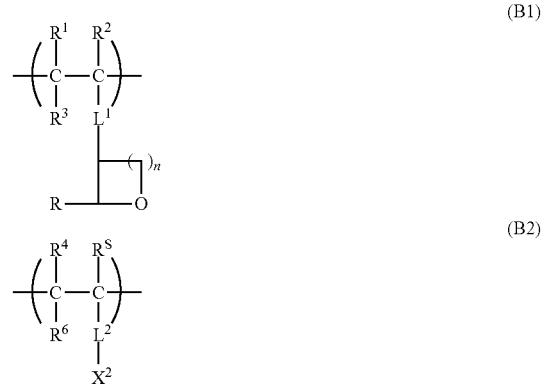

In the formula, $R^1$ to $R^6$ each independently represent a hydrogen atom, an alkyl group, or a halogen atom. $L^1$ and $L^2$ each independently represent a single bond or a divalent linking group. $X^2$ represents an alkyl group which is substituted with a fluorine atom or an aryl group which is substituted with a fluorine atom. R represents a hydrogen atom or an alkyl group and may be bonded to $L^1$ to form a ring. n represents 0 or 1.

It is preferable that $R^1$ to $R^6$ each independently represent a hydrogen atom or an alkyl group. In a case where $R^1$ to $R^6$ represent an alkyl group, an alkyl group having 1 to 3 carbon atoms is preferable. In a case where $R^1$ to $R^6$ represent a halogen atom, a fluorine atom is preferable.

In a case where $L^1$ and $L^2$ represent a divalent linking group, examples of the divalent linking group include an alkylene group which may be substituted with a halogen atom, an arylene group which may be substituted with a halogen atom, $-NR^{12}-$, $-CONR^{12}-$, $-CO-$, $-CO_2-$, $-SO_2NR^{12}-$, $-O-$, $-S-$, $-SO_2-$, and a combination thereof. Among these, at least one selected from the group consisting of an alkylene group having 2 to 10 carbon atoms which may be substituted with a halogen atom and an arylene group having 6 to 12 carbon atoms which may be substituted with a halogen atom, or a group including a combination of the above group and at least one selected from the group consisting of $-NR^{12}-$, $-CONR^{12}-$, $-CO-$, $-CO_2-$, $-SO_2NR^{12}-$, $-O-$, $-S-$, and $-SO_2-$ is preferable, and an alkylene group having 2 to 10 carbon atoms which may be substituted with a halogen atom, $-CO_2-$, $-O-$, $-CO-$, $-CONR^{12}-$, or a group including a combination thereof is more preferable. Here, $R^{12}$ represents a hydrogen atom or a methyl group.

R represents a hydrogen atom or an alkyl group. In a case where R represents an alkyl group, the number of carbon atoms in the alkyl group is preferably 1 to 10 and more preferably 1 to 6. In addition, R may be bonded to $L^1$ to form a ring. It is preferable that the ring formed by R and $L^1$ being bonded to each other is a 5- or 6-membered ring. In addition, examples of the ring include an alicyclic ring and an aromatic ring. Among these, an alicyclic ring is preferable.

Examples of a monomer which forms the repeating unit represented by Formula (B1) include the following compounds.

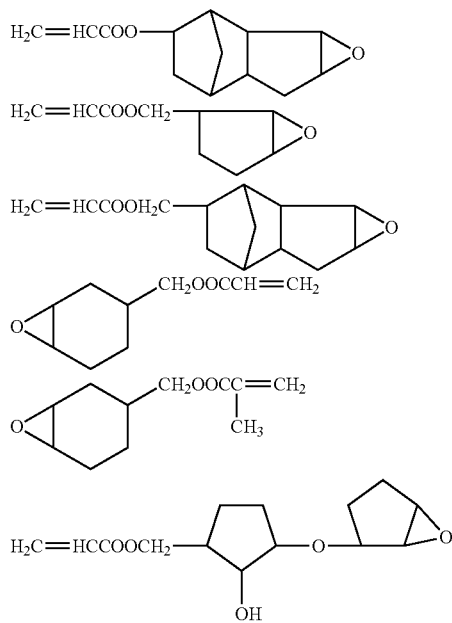

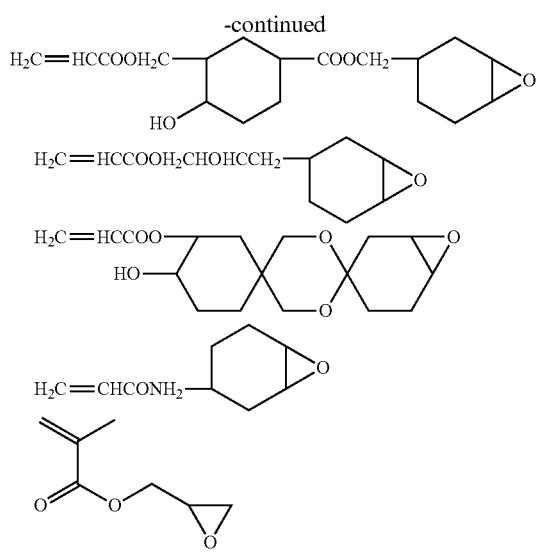

Specific examples of a polymer including the repeating unit represented by Formula (B1) include the following polymers.

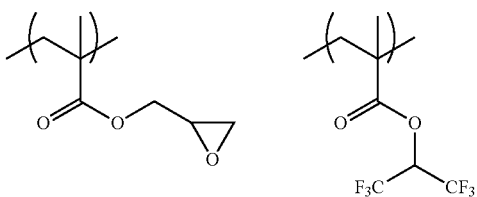

In the present invention, it is preferable that the compound having a cyclic ether group is an epoxy resin. Examples of the epoxy resin include an epoxy resin which is a glycidyl-etherified product of a phenol compound, an epoxy resin which is a glycidyl-etherified product of various novolac resins, an alicyclic epoxy resin, an aliphatic epoxy resin, a heterocyclic epoxy resin, a glycidyl ester epoxy resin, a glycidyl amine epoxy resin, an epoxy resin which is a glycidylated product of a halogenated phenol, a condensate of a silicon compound having an epoxy group and another silicon compound, and a copolymer of a polymerizable unsaturated compound having an epoxy group and another polymerizable unsaturated compound.

Examples of the epoxy resin which is a glycidyl-etherified product of a phenol compound include: 2-[4-(2,3-epoxypropoxy)phenyl]-2-[4-[1,1-bis[4-(2,3-hydroxy)phenyl]ethyl]phenyl]propane, bisphenol A, bisphenol F, bisphenol S, 4,4'-biphenol, tetramethyl bisphenol A, dimethyl bisphenol A, tetramethyl bisphenol F, dimethyl bisphenol F, tetramethyl bisphenol S, dimethyl bisphenol S, tetramethyl-4,4'-biphenol, dimethyl-4,4'-biphenol, 1-(4-hydroxyphenyl)-2-[4-(1,1-bis(4-hydroxyphenyl)ethyl)phenyl]propane, 2,2'-methylene-bis(4-methyl-6-t-butylphenol), 4,4'-butylidene-bis(3-methyl-6-t-butylphenol), trishydroxyphenylmethane, resorcinol, hydroquinone, pyrogallol, fluoroglycinol, a phenol having a diisopropylidene skeleton; a phenol having a fluorene skeleton such as 1,1-di-4-hydroxyphenyl fluorene; and an epoxy resin which is a glycidyl-etherified product of a polyphenol compound, such as phenolic polybutadiene.

Examples of the epoxy resin which is a glycidyl-etherified product of a novolac resin include glycidyl-etherified products of various novolac resins including: novolac resins which contain various phenols, for example, phenol, cresols, ethyl phenols, butyl phenols, octyl phenols, bisphenols such as bisphenol A, bisphenol F, or bisphenol S, or naphthols; phenol novolac resins having a xylylene skeleton; phenol novolac resins having a xylylene skeleton; phenol novolac resins having a biphenyl skeleton; or phenol novolac resins having a fluorene skeleton.

Examples of the alicyclic epoxy resin include an alicyclic epoxy resin having an aliphatic ring skeleton such as 3,4-epoxycyclohexylmethyl-(3,4-epoxy)cyclohexylcarboxylate or bis(3,4-epoxycyclohexylmethyl)adipate.

Examples of the aliphatic epoxy resin include glycidyl ethers of polyhydric alcohols such as 1,4-butanediol, 1,6-hexanediol, polyethylene glycol, or pentaerythritol.

Examples of the heterocyclic epoxy resin include an heterocyclic epoxy resin having a heterocycle such as an isocyanuric ring or a hydantoin ring.

Examples of the glycidyl ester epoxy resin include an epoxy resin including a carboxylic acid ester such as hexahydrophthalic acid diglycidyl ester.

Examples of the glycidyl amine epoxy resin include an epoxy resin which is a glycidylated product of an amine such as aniline or toluidine.

Examples of the epoxy resin which is a glycidylated product of a halogenated phenol include an epoxy resin which is a glycidylated product of a halogenated phenol such as brominated bisphenol A, brominated bisphenol F, brominated bisphenol S, brominated phenol novolac, brominated cresol novolac, chlorinated bisphenol S, or chlorinated bisphenol A.

Examples of a commercially available product of the copolymer of a polymerizable unsaturated compound having an epoxy group and another polymerizable unsaturated compound include MARPROOF G-0150M, G-0105SA, G-0130SP, G-0250SP, G-1005S, G-1005SA, G-1010S, G-2050M, G-01100, and G-01758. Examples of the polymerizable unsaturated compound having an epoxy group include glycidyl acrylate, glycidyl methacrylate, and 4-vinyl-1-cyclohexene-1,2-epoxide. In addition, examples of a copolymer of the other polymerizable unsaturated compound include methyl (meth)acrylate, benzyl (meth)acrylate, cyclohexyl (meth)acrylate, styrene, and vinyl cyclohexane. Among these, methyl (meth)acrylate, benzyl (meth) acrylate, or styrene is preferable.

The epoxy equivalent of the epoxy resin is preferably 310 to 3300 g/eq, more preferably 310 to 1700 g/eq, and still more preferably 310 to 1000 g/eq. As the epoxy resin, one kind may be used alone, or a mixture of two or more kinds may be used.

As the epoxy resin, a commercially available product can also be used. Examples of the commercially available product are as follows.

Examples of the bisphenol A epoxy resin include JER827, JER828, JER834, JER1001, JER1002, JER1003, JER1055, JER1007, JER1009, and JER1010 (all of which are manufactured by Mitsubishi Chemical Corporation) and EPICLON860, EPICLON1050, EPICLON1051, and EPICLON1055 (all of which are manufactured by DIC Corporation).

Examples of the bisphenol F epoxy resin include JER806, JER807, JER4004, JER4005, JER4007, and JER4010 (all of which are manufactured by Mitsubishi Chemical Corporation), EPICLON830 and EPICLON835 (all of which are manufactured by DIC Corporation), and LCE-21 and RE-602S (all of which are manufactured by Nippon Kayaku Co., Ltd.).

Examples of the phenol novolac epoxy resin include JER152, JER154, JER157S70, and JER157S65 (all of which are manufactured by Mitsubishi Chemical Corporation) and EPICLON N-740, EPICLON N-770, and EPICLON N-775 (all of which are manufactured by DIC Corporation).

Examples of the cresol novolac epoxy resin include EPICLON N-660, EPICLON N-665, EPICLON N-670, EPICLON N-673, EPICLON N-680, EPICLON N-690, and EPICLON N-695 (all of which are manufactured by DIC Corporation) and EOCN-1020 (manufactured by Nippon Kayaku Co., Ltd.).

Examples of the aliphatic epoxy resin include ADEKA RESIN EP-4080S, ADEKA RESIN EP-4085S, and ADEKA RESIN EP-4088S (all of which are manufactured by Adeka Corporation), CELLOXIDE 2021P, CELLOXIDE 2081, CELLOXIDE 2083, CELLOXIDE 2085, EHPE3150, EPOLEAD PB 3600, and EPOLEAD PB 4700 (all of which are manufactured by Daicel Corporation), and DENACOL EX-212L, DENACOL EX-214L, DENACOL EX-216L, DENACOL EX-321L, and DENACOL EX-850L (all of which are manufactured by Nagase ChemteX Corporation).

Other examples of the commercially available product include ADEKA RESIN EP-4000S, ADEKA RESIN EP-4003S, ADEKA RESIN EP-4010S, and ADEKA RESIN EP-4011S (all of which are manufactured by Adeka Corporation), NC-2000, NC-3000, NC-7300, XD-1000, EPPN-501, and EPPN-502 (all of which are manufactured by Adeka Corporation), and JER1031S (manufactured by Mitsubishi Chemical Corporation).

The content of the curable compound is preferably 0.1 to 40 mass % with respect to the total solid content of the composition. For example, the lower limit is preferably 0.5 mass % or higher and more preferably 1 mass % or higher. For example, the upper limit is more preferably 30 mass % or lower and still more preferably 20 mass % or lower. As the curable compound, one kind may be used alone, or two or more kinds may be used in combination.

In a case where two or more curable compounds are used in combination, it is preferable that the total content of the curable compounds is in the above-described range.

<<Photopolymerization Initiator>>

It is preferable that the infrared absorbing composition according to the present invention includes a photopolymerization initiator.

The photopolymerization initiator is not particularly limited as long as it has an ability to initiate the polymerization of the polymerizable compound, and can be selected from well-known photopolymerization initiators. For example, a photopolymerization initiator having photosensitivity to light in a range from the ultraviolet range to the visible range is preferable. In addition, the photopolymerization initiator may be an activator which causes an action with a photo-excited sensitizer to generate active radicals, or may be an initiator which initiates cation polymerization depending on the kinds of monomers. It is preferable that the photopolymerization initiator is a photoradical polymerization initiator.

In addition, it is preferable that the photopolymerization initiator is at least one compound having a molar absorption coefficient of at least 50 in a range of about 300 nm to 800 nm (preferably 330 nm to 500 nm).

Specific examples of the photopolymerization initiator include: a halogenated hydrocarbon derivative (for example, a halogenated hydrocarbon having a triazine skeleton or a halogenated hydrocarbon having an oxadiazole skeleton); an acylphosphine compound such as acylphosphine oxide; an oxime compound such as hexaarylbiimidazole or an oxime derivative; an organic peroxide, a thio compound, a ketone compound, an aromatic onium salt, keto oxime ether, an aminoacetophenone compound, and hydroxyacetophenone. Examples of the halogenated hydrocarbon compound having a triazine skeleton include a compound described in Bull. Chem. Soc. Japan, 42, 2924 (1969) by Wakabayashi et al., a compound described in Great Britain Patent No. 1388492, a compound described in JP1978-133428A (JP-S53-133428A), a compound described in Great German Patent No. 3337024, a compound described in J. Org. Chem.; 29, 1527 (1964) by F. C. Schaefer et al., a compound described in JP1987-58241A (JP-S62-58241A), a compound described in JP1993-281728A (JP-H5-281728A), a compound described in JP1993-34920A (JP-S5-34920A), and a compound described in U.S. Pat. No. 4,212,976A (for example, a compound having an oxadiazole skeleton).

In addition, from the viewpoint of exposure sensitivity, a compound selected from the group consisting of a trihalomethyltriazine compound, a benzyldimethylketanol compound, an α-hydroxy ketone compound, an α-amino ketone compound, an acylphosphine compound, a phosphine oxide compound, a metallocene compound, an oxime compound, a triarylimidazole dimer, an onium compound, a benzothiazole compound, a benzophenone compound, an acetophenone compound and a derivative thereof, a cyclopentadiene-benzene-iron complex and a salt thereof, and a halomethyl oxadiazole compound, a 3-aryl-substituted coumarin compound is preferable.

Among these, a trihalomethyltriazine compound, an α-aminoketone compound, an acylphosphine compound, a phosphine oxide compound, an oxime compound, a triarylimidazole dimer, an onium compound, a benzophenone compound, or an aminoacetophenone compound is more preferable, and at least one compound selected from the group consisting of a trihalomethyltriazine compound, an α-amino ketone compound, an oxime compound, a triarylimidazole dimer, and a benzophenone compound is still more preferable.

In particular, in a case where the infrared cut filter according to the present invention is used for a solid image pickup element, it is necessary to form a fine pattern in a sharp shape, and thus it is preferable to obtain excellent curing properties and to perform development without a residue remaining in a non-exposed portion. From these viewpoint, it is preferable that an oxime compound is used as the photopolymerization initiator. In particular, in a case where a fine pattern is formed in a solid image pickup element, a stepper is used for exposure for curing, and this exposure device may be damaged by halogen. Therefore, it is necessary to reduce the addition amount of the photopolymerization initiator to be small. Therefore, in consideration of this point, it is more preferable an oxime compound is used as the photopolymerization initiator for forming a fine pattern in a solid image pickup element or the like. In addition, by using the oxime compound, color transfer properties can be improved.

Examples of the photopolymerization initiator can be found in paragraphs "0265" to "0268" of JP2013-29760A, the content of which is incorporated herein by reference.

As the photopolymerization initiator, a hydroxyacetophenone compound, an aminoacetophenone compound, or an acylphosphine compound can also be preferably used. More specifically, for example, an aminoacetophenone initiator described in JP1998-291969A (JP-H10-291969A) or an acylphosphine initiator described in JP4225898B can also be used.

As the hydroxyacetophenone initiator, for example, IRGACURE-184, DAROCUR-1173, IRGACURE-500, IRGACURE-2959, or IRAGACURE-127 (trade name, all of which are manufactured by BASF SE) can be used.

As the aminoacetophenone initiator, IRGACURE-907, IRGACURE-369, or IRGACURE-379EG (trade name, all of which are manufactured by BASF SE) which is a commercially available product can be used. As the aminoacetophenone initiator, a compound described in JP2009-191179A whose absorption wavelength is adjusted to match with that of a light source having a long wavelength of, for example, 365 nm or 405 nm can also be used.

As the acylphosphine initiator, IRGACURE-819, or DAROCUR-TPO (trade name, all of which are manufactured by BASF SE) which is a commercially available product can be used.

As the photopolymerization initiator, for example, an oxime compound is more preferable.

Specific examples of the oxime compound include a compound described in JP2001-233842A, a compound described in JP2000-80068A, and a compound described in JP2006-342166A.

Examples of the oxime compound which can be preferably used in the present invention include 3-benzoyloxy-iminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxy-imino-1-phenylpropane-1-one, 3-(4-toluene sulfonyloxy)iminobutane-2-one, and 2-ethoxycarbonyloxyimino-1-phenylpropane-1-one.

In addition, examples of the oxime compound include a compound described in J.C.S. Perkin II (1979), pp. 1653-1660, J. C. S. Perkin II (1979), pp. 156-162 and Journal of Photopolymer Science and Technology (1995), pp. 202-232, JP2000-66385A, JP2000-80068A, JP2004-534797A, or JP2006-342166A.

As a commercially available product of the oxime compound, IRGACURE-OXE01, IRGACURE-OXE02, IRGACURE-OXE03, or IRGACURE-OXE04 (all of which are manufactured by BASF SE) can also be preferably used. In addition, TR-PBG-304 (manufactured by Changzhou Tronly New Electronic Materials Co., Ltd.), ADEKA ARKLS NCI-930 (manufactured by Adeka Corporation), ADEKA OPTOMER N-1919 (manufactured by Adeka Corporation, a photopolymerization initiator 2 described in JP2012-14052A) can also be used.

In addition, in addition to the above-described oxime compounds, for example, a compound described in JP2009-519904A in which oxime is linked to a N-position of a carbazole ring, a compound described in U.S. Pat. No. 7,626,957B in which a hetero substituent is introduced into the benzophenone site, a compound described in JP2010-15025A or US2009/292039A in which a nitro group is introduced into a colorant site, a ketoxime compound described in WO2009/131189A, a compound described in U.S. Pat. No. 7,556,910B having a triazine skeleton and an oxime skeleton in the same molecule, a compound described in JP2009-221114A having an absorption maximum at 405 nm and having excellent sensitivity to a light source of g-rays may be used.

Other preferable examples of the oxime compound can be found in paragraphs "0274" to "0275" of JP2013-29760A, the content of which is incorporated herein by reference.

Specifically, as the oxime compound, a compound represented by the following Formula (OX-1) is preferable. In the oxime compound, an N—O bond of oxime may form an (E) isomer, a (Z) isomer, or a mixture of an (E) isomer and a (Z) isomer.

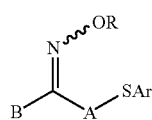

In Formula (OX-1), R and B each independently represent a monovalent substituent, A represents a divalent organic group, and Ar represents an aryl group.

In Formula (OX-1), it is preferable that the monovalent substituent represented by R is a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. In addition, these groups may have one or more substituents. In addition, the above-described substituent may have another substituent.

Examples of the substituent include a halogen atom, an aryloxy group, an alkoxycarbonyl group or aryloxycarbonyl group, an acyloxy group, an acyl group, an alkyl group, and an aryl group.

In Formula (OX-1), as the monovalent substituent represented by B, an aryl group, a heterocyclic group, an arylcarbonyl group, or a heterocyclic carbonyl group is preferable.

These groups may have one or more substituents. Examples of the substituent are as described above.

In Formula (OX-1), as the divalent organic group represented by A, an alkylene group having 1 to 12 carbon atoms, a cycloalkylene group, or an alkynylene group is preferable. These groups may have one or more substituents. Examples of the substituent are as described above.

In the present invention, a compound represented by the following Formula (1) or (2) can also be used as the photopolymerization initiator.

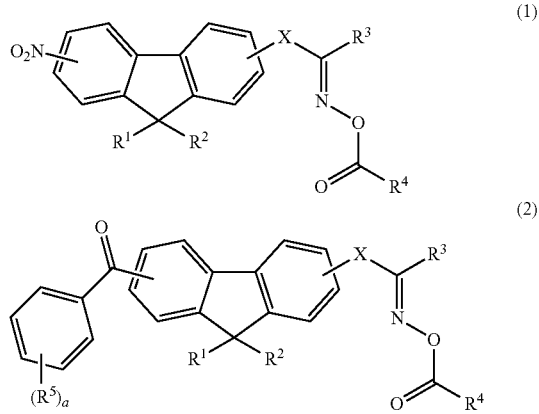

In Formula (1), $R^1$ and $R^2$ each independently represent an alkyl group having 1 to 20 carbon atoms, an alicyclic hydrocarbon group having 4 to 20 carbon atoms, an aryl group having 6 to 30 carbon atoms, or an arylalkyl group having 7 to 30 carbon atoms; in a case where $R^1$ and $R^2$ represent a phenyl group, the phenyl groups may be bonded to each other to form a fluorene group; $R^3$ and $R^4$ each independently represent a hydrogen atom, an alkyl group having 1 to 20 carbon atoms, an aryl group having 6 to 30 carbon atoms, an arylalkyl group having 7 to 30 carbon atoms, or a heterocyclic group having 4 to 20 carbon atoms; and X represents a direct bond or a carbonyl group.

In Formula (2), $R^1$, $R^2$, $R^3$, and $R^4$ have the same definitions as those of $R^1$, $R^2$, $R^3$, and $R^4$ in Formula (1), $R^5$ represents —$R^6$, —$OR^6$, —$SR^6$, —$COR^6$, —$CONR^6R^6$, —$NR^6COR^6$, —$OCOR^6$, —$COOR^6$, —$SCOR^6$, —$OCSR^6$, —$COSR^6$, —$CSOR^6$, —CN, a halogen atom, or a hydroxyl group, $R^6$ represents a hydrogen atom, an alkyl group having 1 to 20 carbon atoms, an aryl group having 6 to 30 carbon atoms, an arylalkyl group having 7 to 30 carbon atoms, or a heterocyclic group having 4 to 20 carbon atoms, X represents a direct bond or a carbonyl group, and a represents an integer of 0 to 5.

In Formulae (1) and (2), it is preferable that $R^1$ and $R^2$ each independently represent a methyl group, an ethyl group, an n-propyl group, an i-propyl group, a cyclohexyl group, or a phenyl group. It is preferable that $R^3$ represents a methyl group, an ethyl group, a phenyl group, a tolyl group, or a xylyl group. It is preferable that $R^4$ represents an alkyl group having 1 to 6 carbon atoms or a phenyl group. It is preferable that $R^5$ represents a methyl group, an ethyl group, a phenyl group, a tolyl group, or a naphthyl group. It is preferable that X represents a direct bond.

Specific examples of the compounds represented by Formulae (1) and (2) include compounds described in paragraphs "0076" to "0079" of JP2014-137466A. the content of which is incorporated herein by reference.

In the present invention, an oxime compound having a fluorine atom can also be used as the photopolymerization initiator. Specific examples of the oxime compound having a fluorine atom include a compound described in JP2010-262028A, Compound 24 and 36 to 40 described in JP2014-500852A, and Compound (C-3) described in JP2013-164471A. the content of which is incorporated herein by reference.

In the present invention, as the photopolymerization initiator, an oxime compound having a nitro group can be used. It is preferable that the oxime compound having a nitro group is a dimer. Specific examples of the oxime compound having a nitro group include compounds described in paragraphs "0031" to "0047" of JP2013-114249A and paragraphs "0008" to "0012" and "0070" to "0079" of JP2014-137466A, compounds described in paragraphs "0007" to 0025" of JP4223071B, and ADEKA ARKLS NCI-831 (manufactured by Adeka Corporation).

In the present invention, as the photopolymerization initiator, an oxime compound having a benzofuran skeleton can also be used. Specific examples include OE-01 to OE-75 described in WO2015/036910A.

The oxime compound is preferably an oxime compound having an absorption maximum in a wavelength range of 350 nm to 500 nm and more preferably an oxime compound having an absorption maximum in a wavelength range of 360 nm to 480 nm. In addition, the oxime compound is preferably an oxime compound having a high absorbance at 365 nm and 405 nm.

The molar absorption coefficient of the oxime compound at 365 nm or 405 nm is preferably 1000 to 300000, more preferably 2000 to 300000, and still more preferably 5000 to 200000 from the viewpoint of sensitivity.

The molar absorption coefficient of the compound can be measured using a well-known method. For example, it is preferable that the absorption coefficient can be measured using an ultraviolet-visible spectrophotometer (Cary-5 spectrophotometer, manufactured by Varian Medical Systems, Inc.) and ethyl acetate as a solvent at a concentration of 0.01 g/L.

Hereinafter, specific examples of the oxime compound which are preferably used in the present invention are shown below, but the present invention is not limited thereto.

(C-1)
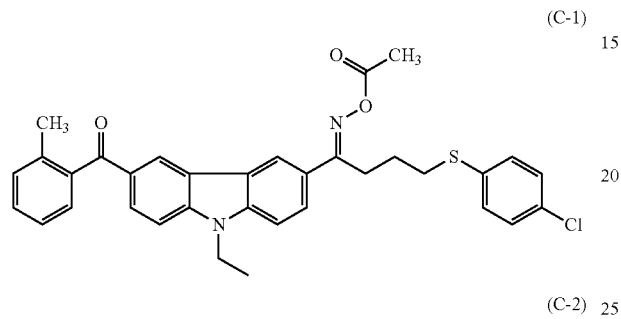

(C-2)
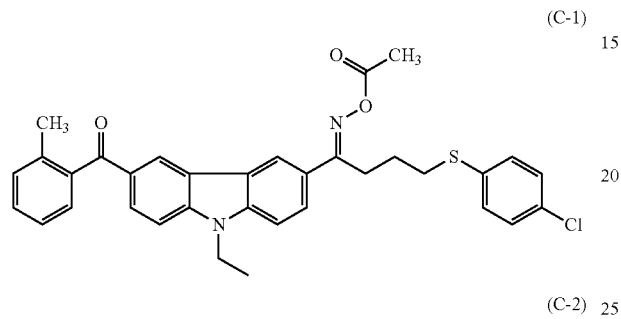

(C-3)
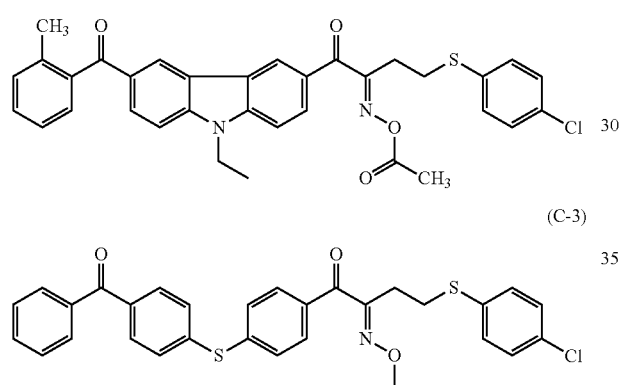

(C-4)
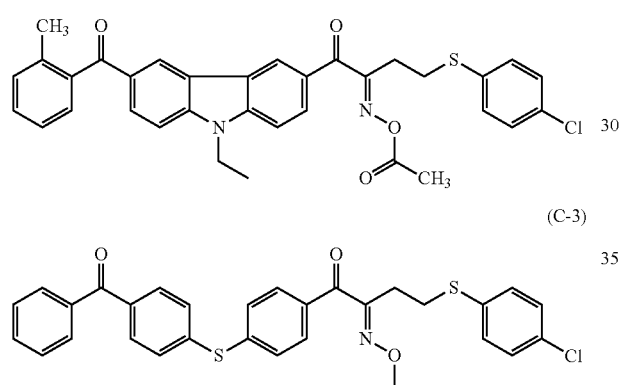

(C-5)
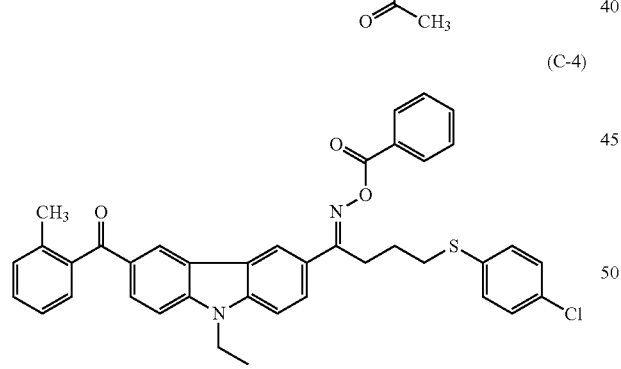

(C-6)
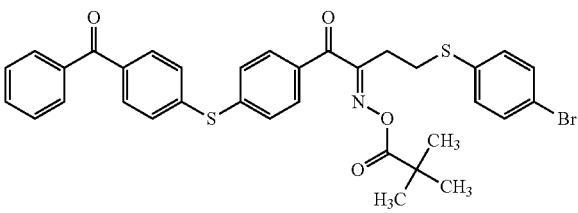

(C-7)
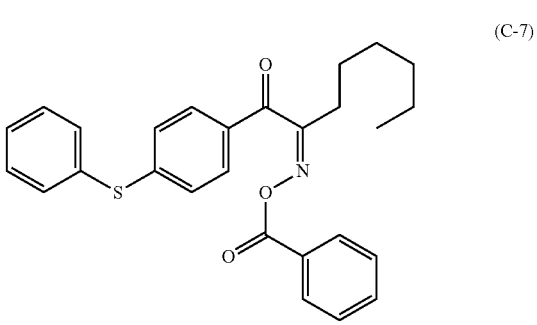

(C-8)
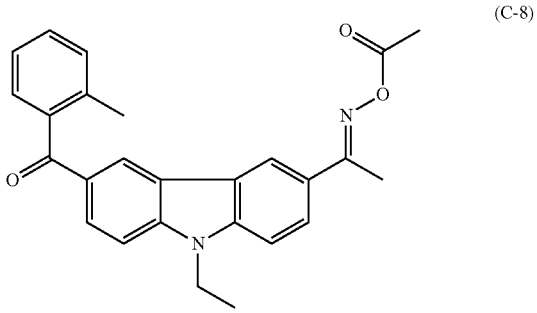

(C-9)
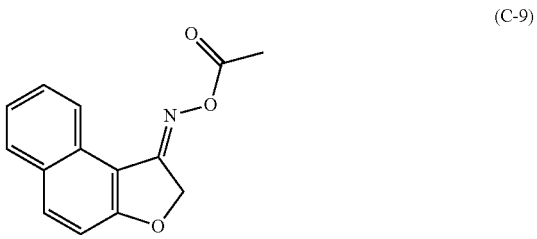

(C-10)
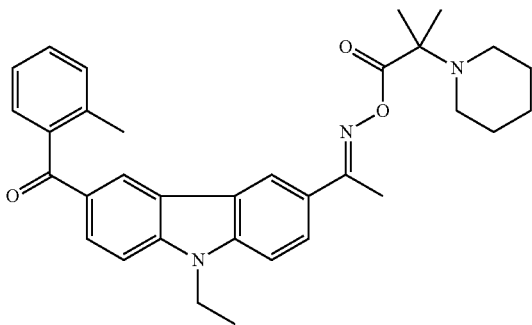

-continued

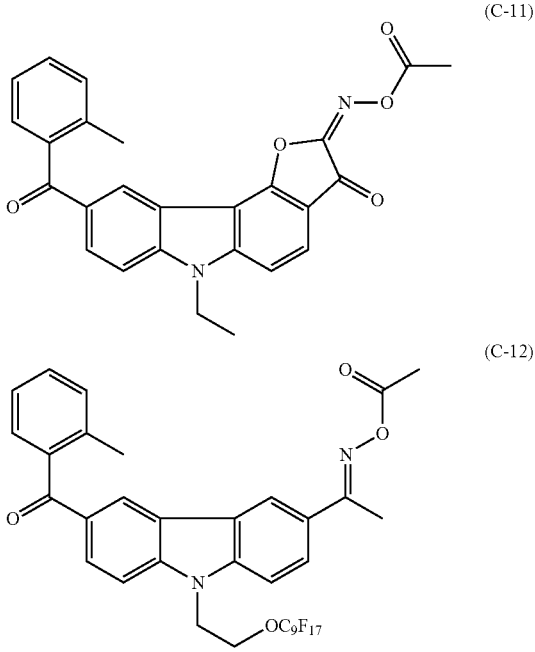

(C-11)

(C-12)

It is preferable that the photopolymerization initiator includes an oxime compound and an α-aminoketone compound. By using the oxime compound and the α-aminoketone compound in combination, the developability is improved, and a pattern having excellent rectangularity is likely to be formed. In a case where the oxime compound and the α-aminoketone compound are used in combination, the content of the α-aminoketone compound is preferably 50 to 600 parts by mass and more preferably 150 to 400 parts by mass with respect to 100 parts by mass of the oxime compound.

The content of the photopolymerization initiator is preferably 0.1 to 50 mass %, more preferably 0.5 to 30 mass %, and still more preferably 1 to 20 mass % with respect to the total solid content of the infrared absorbing composition. In the above-described range, excellent sensitivity and pattern formability can be obtained. The infrared absorbing composition may include one photopolymerization initiator or two or more photopolymerization initiators. In a case where the infrared absorbing composition includes two or more photopolymerization initiators, it is preferable that the total content of the two or more photopolymerization initiators is in the above-described range.

<<Solvent>>

The infrared absorbing composition according to the present invention may include a solvent. Examples of the solvent include water and an organic solvent. The solvent is not particularly limited as long as it satisfies the solubility of the respective components and the coating properties of the composition. It is preferable that the solvent is selected in consideration of the coating properties of the infrared absorbing composition and safety. For example, in a case where the aqueous polymer dispersion is used as the resin, it is preferable that water is used as the solvent.

Preferable examples of the organic solvent are the following organic solvents:

an ester, for example, ethyl acetate, n-butyl acetate, isobutyl acetate, cyclohexyl acetate, amyl formate, isoamyl acetate, butyl propionate, isopropyl butyrate, ethyl butyrate, butyl butyrate, methyl lactate, ethyl lactate, an alkyl oxyacetate (for example, methyl oxyacetate, ethyl oxyacetate, or butyl oxyacetate (for example, methyl methoxyacetate, ethyl methoxyacetate, butyl methoxyacetate, methyl ethoxyacetate, or ethyl ethoxyacetate)), a 3-oxypropionic acid alkyl ester (for example, 3-methyl oxypropionate or 3-ethyl oxypropionate (for example, methyl 3-methoxypropionate, ethyl 3-methoxypropionate, methyl 3-ethoxypropionate, or ethyl 3-ethoxypropionate)), a 2-oxypropionic acid alkyl ester (for example, methyl 2-oxypropionate, ethyl 2-oxypropionate, or propyl 2-oxypropionate (for example, methyl 2-methoxypropionate, ethyl 2-methoxypropionate, propyl 2-methoxypropionate, methyl 2-ethoxypropionate, or ethyl 2-ethoxypropionate)), methyl 2-oxy-2-methylpropionate or ethyl 2-oxy-2-methylpropionate (for example, methyl 2-methoxy-2-methylpropionate or ethyl 2-ethoxy-2-methylpropionate), methyl pyruvate, ethyl pyruvate, propyl pyruvate, methyl acetoacetate, ethyl acetoacetate, methyl 2-oxobutanoate or ethyl 2-oxobutanoate; an ether, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, or propylene glycol monopropyl ether acetate;

a ketone, for example, methyl ethyl ketone, cyclohexanone, cyclopentanone, 2-heptanone, or 3-heptanone; and an aromatic hydrocarbon, for example, toluene or xylene. In this case, it may be preferable that the content of the aromatic hydrocarbon (for example, benzene, toluene, xylene, or ethylbenzene) as the solvent is low (for example, 50 mass parts per million (ppm) or lower, 10 mass ppm or lower, or 1 mass ppm or lower with respect to the total mass of the organic solvent) in consideration of environmental aspects and the like.

Among these organic solvents, one kind may be used alone, or two or more kinds may be used in combination.

In a case where two or more organic solvents are used in combination, in particular, a mixed solvent is preferable, the mixed solvent including two or more organic solvents selected from the group consisting of methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate.

In the present invention, as the organic solvent, an organic solvent containing 0.8 mmol/L or lower of a peroxide is preferable, and an organic solvent containing no peroxide is more preferable.

In the present invention, as the solvent, a solvent having a low metal content is preferable. For example, the metal content in the solvent is preferably 10 parts mass per billion (ppb) or lower. Optionally, a solvent having a metal content at a mass parts per trillion (ppt) level may be used. For example, such a high-purity solvent is available from Toyo Gosei Co., Ltd. (The Chemical Daily, Nov. 13, 2015).

Examples of a method of removing impurities such as metal from the solvent include distillation (for example, molecular distillation or thin-film distillation) and filtering using a filter. The pore size of a filter used for the filtering is preferably 10 nm or less, more preferably 5 nm or less, and still more preferably 3 nm or less. As a material of the filter, polytetrafluoroethylene, polyethylene, or nylon is preferable.

The solvent may include an isomer (a compound having the same number of atoms and a different structure). In addition, the organic solvent may include only one isomer or a plurality of isomers.

The content of the solvent in the infrared absorbing composition according to the present invention is preferably 10 to 90 mass %, more preferably 20 to 80 mass %, and still more preferably 25 to 75 mass % with respect to the total mass of the infrared absorbing composition.

<<Polymerization Inhibitor>>

The infrared absorbing composition according to the present invention may include a polymerization inhibitor in order to prevent unnecessary thermal polymerization of the polymerizable compound during the manufacturing or storage of the infrared absorbing composition.

Examples of the polymerization inhibitor include a phenol hydroxyl group-containing compound, a N-oxide compound, a piperidine-1-oxyl free-radical compound, a pyrrolidine-1-oxyl free-radical compound, a N-nitrosophenylhydroxyamine, a diazonium compound, a cationic dye, a sulfide group-containing compound, a nitro group-containing compound, a phosphorus compound, a lactone compound, and a transition metal compound (for example, $FeCl_3$ or $CuCl_2$). In addition, the polymerization inhibitor may be a composite compound in which a plurality of structures which exhibit a polymerization inhibition function such as a phenol skeleton or a phosphorus-containing skeleton are present in the same molecule. For example, a compound described in JP1998-126307A (JP-H10-46035A) is also preferably used. Specific examples of the polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitrosophenylhydroxylamine salt (for example, an ammonium salt or a cerium (III) salt).

Among these, p-methoxyphenol is preferable.

The content of the polymerization inhibitor is preferably 0.01 to 5 mass % with respect to the total solid content of the infrared absorbing composition.

<<Substrate Adhesive>>

The infrared absorbing composition according to the present invention may include a substrate adhesive.

As the substrate adhesive, a silane coupling agent, a titanate coupling agent, or an aluminum coupling agent can be preferably used.

Examples of the silane coupling agent include a silane compound having a hydrolyzable group and another functional group. Here, "hydrolyzable group" refers to a substituent directly linked to a silicon atom and capable of forming a siloxane bond due to a hydrolysis reaction and/or a condensation reaction. Examples of the hydrolyzable group include a halogen atom, an alkoxy group, an acyloxy group, and an alkenyloxy group. In a case where the hydrolyzable group has carbon atoms, the number of carbon atoms is preferably 6 or less and more preferably 4 or less. In particular, an alkoxy group having 4 or less carbon atoms or an alkenyloxy group having 4 or less carbon atoms is preferable. In addition, examples of the functional group other than a hydrolyzable group include a vinyl group, a styryl group, a (meth)acryloyl group, a mercapto group, an epoxy group, an oxetanyl group, an amino group, an ureido group, a sulfide group, and an isocyanate group. Among these, a (meth)acryloyl group or an epoxy group is preferable.

Specific examples of the silane coupling agent include vinyl trimethoxysilane, vinyltriethoxysilane, 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylethyldimethoxysilane, 3-methacryloxypropyltriethoxysilane, 3-acryloxypropyltrimethoxysilane, N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxy silane, N-(vinylbenzyl)-2-aminoethyl-3-aminopropyltrimethoxysilane hydrochloride, tris-(trimethoxysilylpropyl)isocyanurate, 3-ureidopropyltriethoxysilane, 3-mercaptopropylmethyldimethoxysilane, 3-mercaptopropyltrimethoxysilane, and bis(triethoxysilylpropyl)tetrasulfide, and 3-isocyanatepropyltriethoxysilane. In addition to the above-described examples, an alkoxy oligomer can be used. In addition, the following compounds can also be used.

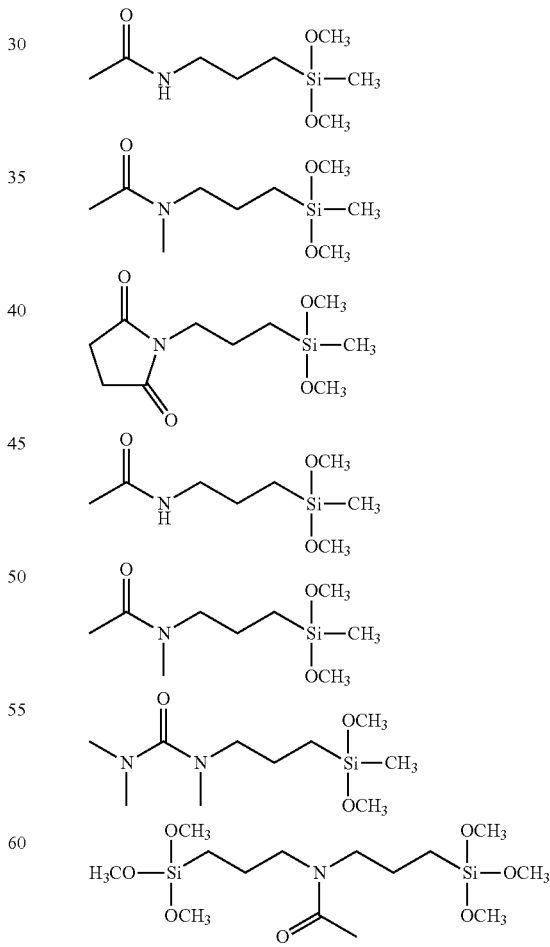

Examples of a commercially available product of the silane coupling agent include KBM-13, KBM-22, KBM- 103, KBE-13, KBE-22, KBE-103, KBM-3033, KBE-3033, KBM-3063, KBM-3066, KBM-3086, KBE-3063, KBE-3083, KBM-3103, KBM-7103, SZ-31, KPN-3504, KBM-1003, KBE-1003, KBM-303, KBM-402, KBM-403, KBE-402, KBE-403, KBM-1403, KBM-502, KBM-503, KBE-502, KBE-503, KBM-5103, KBM-602, KBM-603, KBM-903, KBE-903, KBE-9103, KBM-573, KBM-575, KBM-9659, KBE-585, KBM-802, KBM-803, KBE-846, KBE-9007, X-40-1053, X-41-1059A, X-41-1056, X-41-1805, X-41-1818, X-41-1810, X-40-2651, X-40-2655A, KR-513, KC-89S, KR-500, X-40-9225, X-40-9246, X-40-9250, KR-401N, X-40-9227, X-40-9247, KR-510, KR-9218, KR-213, X-40-2308, and X-40-9238 (all of which are manufactured by Shin-Etsu Chemical Co., Ltd.).

In addition, examples of the silane coupling agent include a compound described in paragraphs "0018" to "0036" of JP2009-288703A and a compound described in paragraphs "0056" to "0066" of JP2009-242604A, the content of which is incorporated herein by reference.

In addition, in the present invention, as the silane coupling agent, a silane coupling agent Y having at least a silicon atom, a nitrogen atom, and a curable functional group in a molecule and having a hydrolyzable group bonded to a silicon atom can be preferably used.

The silane coupling agent Y is not particularly limited as long as it has at least one silicon atom in a molecule thereof, and the silicon atom can be bonded to the following atoms and substituents. These atoms and substituents may be the same as or different from each other. Examples of the atoms and substituents bonded to the silicon atom include a hydrogen atom, a halogen atom, a hydroxyl group, an alkyl group having 1 to 20 carbon atoms, an alkenyl group, an alkynyl group, an aryl group, an amino group which can be substituted with an alkyl group and/or an aryl group, a silyl group, an alkoxy group having 1 to 20 carbon atoms, and an aryloxy group. These substituents may be further substituted with a silyl group, an alkenyl group, an alkynyl group, an aryl group, an alkoxy group, an aryloxy group, a thioalkoxy group, an amino group which can be substituted with an alkyl group and/or an aryl group, a halogen atom, a sulfonamide group, an alkoxycarbonyl group, an amide group, a urea group, an ammonium group, an alkylammonium group, a carboxyl group or a salt thereof, or a sulfo group or a salt thereof.

At least one hydrolyzable group is bonded to the silicon atom.

The silane coupling agent Y may include a group represented by the following Formula (Z).

$*-\mathrm{Si}(R^{z1})_{3-m}(R^{z2})_m$      Formula (Z)

$R^{z1}$ represents an alkyl group, $R^{z2}$ represents a hydrolyzable group, and m represents an integer of 1 to 3. The number of carbon atoms in the alkyl group represented by $R^{z1}$ is preferably 1 to 5 and more preferably 1 to 3.

The silane coupling agent Y includes at least one nitrogen atom in a molecule thereof. It is preferable that the nitrogen atom is present in the form of a secondary amino group or a tertiary amino group. It is preferable that the nitrogen atom has at least one organic group as a substituent. Regarding the structure of the amino group, the amino group may be present in a molecule in the form of a partial structure of a nitrogen-containing heterocycle, or may be present as an substituted amino group such as aniline. Here, examples of the organic group include an alkyl group, an alkenyl group, an alkynyl group, an aryl group, and a combination thereof. These organic groups may further have a substituent, and examples of the substituent which can be introduced include a silyl group, an alkenyl group, an alkynyl group, an aryl group, an alkoxy group, an aryloxy group, a thioalkoxy group, an amino group, a halogen atom, a sulfonamide group, an alkoxycarbonyl group, a carbonyloxy group, an amide group, a urea group, an alkyleneoxy group, an ammonium group, an alkylammonium group, a carboxyl group or a salt thereof, and a sulfo group.

In addition, it is preferable that the nitrogen atom is bonded to a curable functional group through an arbitrary organic linking group. Preferable examples of the organic linking group include the above-described substituents which can be introduced into the nitrogen atom and the organic group bonded to the nitrogen atom.

The curable functional group included in the silane coupling agent Y is preferably one or more groups selected from the group consisting of a (meth)acryloyloxy group, an epoxy group, an oxetanyl group, an isocyanate group, a hydroxyl group, an amino group, a carboxyl group, a thiol group, an alkoxysilyl group, a methylol group, a vinyl group, a (meth)acrylamide group, a styryl group, and a maleimide group, and still more preferably one or more groups selected from the group consisting of a (meth)acryloyloxy group, an epoxy group, and an oxetanyl group.

The silane coupling agent Y is not particularly limited as long as it has at least one curable functional group in a molecule thereof. However, the silane coupling agent Y may have two or more curable functional groups. From the viewpoints of sensitivity and stability, the number of curable functional groups in a molecule is preferably 2 to 20, more preferably 4 to 15, and most preferably 6 to 10.

Examples of the silane coupling agent Y include a compound represented by the following Formula (Y).

$(R^{y3})_n\text{-LN-Si}(R^{y1})_{3-m}(R^{y2})_m$      Formula (Y)

$R^{y1}$ represents an alkyl group, $R^{y2}$ represents a hydrolyzable group, and $R^{y3}$ represents a curable functional group.

LN represents a (n+1) valent linking group having a nitrogen atom.

m represents an integer of 1 to 3, and n represents an integer of 1 or more.

$R^{y1}$, $R^{y2}$, and m in Formula (Y) have the same definitions and the same preferable ranges as those of $R^{z1}$, $R^{z2}$, and m in Formula (Z).

In Formula (Y), $R^{y3}$ represents a curable functional group. Examples of the curable functional group include the groups described regarding the curable functional group included in the silane coupling agent Y.

n in Formula (Y) represents an integer of 1 or more. The upper limit is, for example, preferably 20 or less, more preferably 15 or less, and still more preferably 10 or less. The lower limit is, for example, preferably 2 or more, more preferably 4 or more, and still more preferably 6 or more. In addition, n may represent 1.

LN in Formula (Y) represents a group having a nitrogen atom.

Examples of the group having a nitrogen atom include at least one group selected from groups represented by the following Formula (LN-1) to (LN-4), and a group of a combination of at least one group selected from groups represented by the following Formula (LN-1) to (LN-4), —CO—, —CO$_2$—, —O—, —S—, and —SO$_2$—. The alkylene group may be linear or branched. The alkylene group and the arylene group may have a substituent or may be unsubstituted. Examples of the substituent include a halogen atom and a hydroxyl group.

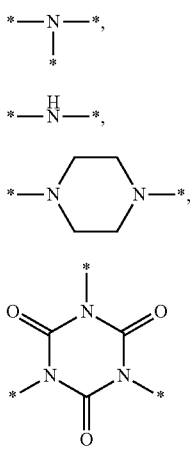

(LN-1)

(LN-2)

(LN-3)

(LN-4)

In the formula, * represents a direct bond.

Specific examples of the silane coupling agent Y include the following compounds. In the formula, Et represents an ethyl group. Other examples of the silane coupling agent Y include a compound described in paragraphs "0018" to "0036" of JP2009-288703A, the content of which is incorporated herein by reference.

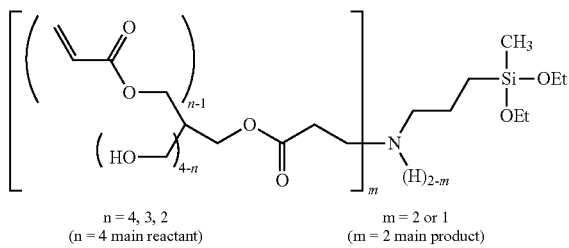

n = 4, 3, 2
(n = 4 main reactant)

m = 2 or 1
(m = 2 main product)

The content of the substrate adhesive is preferably 0.1 to 30 mass %, more preferably 0.5 to 20 mass %, and still more preferably 1 to 10 mass % with respect to the total solid content of the infrared absorbing composition.

<<Surfactant>>

The infrared absorbing composition according to the present invention may include various surfactants from the viewpoint of further improving coating properties. As the surfactants, various surfactants such as a fluorine surfactant, a nonionic surfactant, a cationic surfactant, an anionic surfactant, or a silicone surfactant can be used.

By the composition including a fluorine surfactant, liquid characteristics (for example, fluidity) of a coating solution prepared from the composition are further improved, and the uniformity in coating thickness and liquid saving properties can be further improved.

That is, in a case where a film is formed using a coating solution prepared using the composition including a fluorine surfactant, the interfacial tension between a coated surface and the coating solution decreases, the wettability on the coated surface is improved, and the coating properties on the coated surface are improved. Therefore, a film having a uniform thickness with reduced unevenness in thickness can be formed more suitably.

The fluorine content in the fluorine surfactant is preferably 3 to 40 mass %, more preferably 5 to 30 mass %, and still more preferably 7 to 25 mass %. The fluorine surfactant in which the fluorine content is in the above-described range is effective from the viewpoints of the uniformity in the thickness of the coating film and liquid saving properties, and the solubility thereof in the composition is also excellent.

Examples of the fluorine surfactant include: MEGAFACE F171, F172, F173, F176, F177, F141, F142, F143, F144, R30, F437, F475, F479, F482, F554, and F780 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC1068, SC-381, SC-383, S393, and KH-40 (all of which are manufactured by Asahi Glass Co., Ltd.); and POLYFOX PF636, PF656, PF6320, PF6520, and PF7002 (all of which are manufactured by OMNOVA Solutions Inc.).

In addition, as the fluorine surfactant, an acrylic compound in which, when heat is applied to a molecular structure which has a functional group having a fluorine atom, the functional group having a fluorine atom is cut to obtain a fluorine atom can also be preferably used. Examples of the fluorine surfactant include MEGAFACE DS series (manufactured by DIC Corporation, The Chemical Daily, Feb. 22, 2016, Nikkei Business Daily, Feb. 23, 2016), for example, MEGAFACE DS-21.

As the fluorine surfactant, a block polymer can also be used, and specific examples thereof include a compound described in JP2011-89090A.

As the fluorine surfactant, a fluorine-containing polymer compound can be preferably used, the fluorine-containing polymer compound including: a repeating unit derived from a (meth)acrylate compound having a fluorine atom; and a repeating unit derived from a (meth)acrylate compound having two or more (preferably 5 or more) alkyleneoxy groups (preferably an ethyleneoxy group and a propyleneoxy group). In addition, for example, the following compound can also be used as the fluorine surfactant used in the present invention.

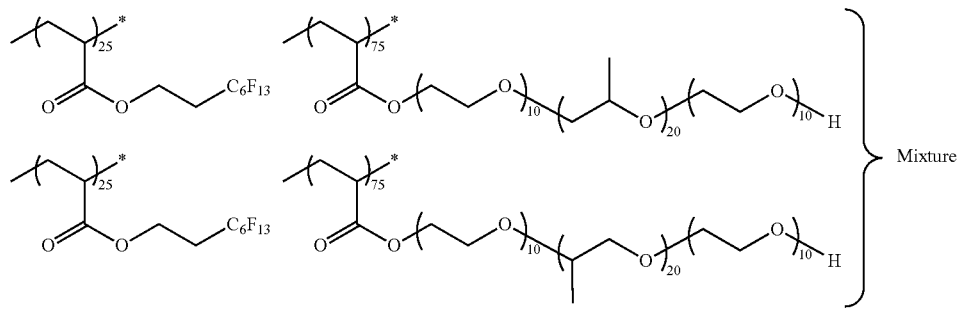

The weight-average molecular weight of the compound is preferably 3000 to 50000 and, for example, 14000.

In addition, as the fluorine surfactant, a fluorine-containing polymer having an ethylenically unsaturated group at a side chain can also be used. Specific examples include compounds described in paragraphs "0050" of "0090" and paragraphs "0289" to "0295" of JP2010-164965A, for example, MEGAFACE RS-101, RS-102, RS-718K, and RS-72-K manufactured by DIC Corporation. As the fluorine surfactant, a compound described in paragraphs "0015" to "0158" of JP2015-117327A can also be used.

Examples of the nonionic surfactant include glycerol, trimethylolpropane, trimethylolethane, an ethoxylate and a propoxylate thereof (for example, glycerol propoxylate or glycerin ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid esters (PLURONIC L10, L31, L61, L62, 10R5, 17R2, and 25R2 and TETRONIC 304, 701, 704, 901, 904, and 150R1 (all of which are manufactured by BASF SE)); SOLSPERSE 20000 (manufactured by Lubrication Technology Inc.); NCW-101, NCW-1001, and NCW-1002 (all of which are manufactured by Wako Pure Chemical Industries, Ltd.); PIONIN D-6112, D-6112-W, and D-6315 (all of which are manufactured by Takemoto Oil&Fat Co., Ltd.); and OLFIN E1010, SURFYNOL 104, 400, and 440 (all of which are manufactured by Nissin Chemical Co., Ltd.).

Specific examples of the cationic surfactant include an organosiloxane polymer KP341 (manufactured by Shin-Etsu Chemical Co., Ltd.), a (meth)acrylic acid (co)polymer POLYFLOW No. 75, No. 90, or No. 95 (manufactured by Kyoeisha Chemical Co., Ltd.), and W001 (manufactured by Yusho Co., Ltd.).

Specific examples of the anionic surfactant include W004, W005, and W017 (manufactured by Yusho Co., Ltd.), and SANDET BL (manufactured by Sanyo Chemical Industries Ltd.).

Examples of the silicone surfactant include: TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all of which are manufactured by Dow Corning Corporation); TSF-4440, TSF-4300, TSF-4445, TSF-4460, and TSF-4452 (all of which are manufactured by Momentive Performance Materials Inc.); KP341, KF6001, and KF6002 (all of which are manufactured by Shin-Etsu Chemical Co., Ltd.); and BYK307, BYK323, and BYK330 (all of which are manufactured by BYK-Chemie Japan K.K.).

Among these surfactants, one kind may be used alone, or two or more kinds may be used in combination.

The content of the surfactant is preferably 0.001 to 2.0 mass % and more preferably 0.005 to 1.0 mass % with respect to the total solid content of the composition.

<<Ultraviolet Absorber>>

The infrared absorbing composition according to the present invention may include an ultraviolet absorber.

The ultraviolet absorber is preferably a conjugated diene compound and more preferably a compound represented by the following Formula (1). In a case where this conjugated diene compound is used, a variation in development performance especially after low-illuminance exposure can be suppressed, and the dependence on exposure illuminance relating to pattern formability such as a line width of a pattern, a film thickness, or an optical spectrum can be more effectively suppressed.

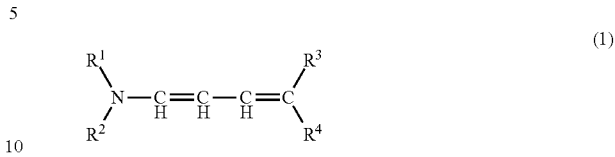

$R^1$ and $R^2$ each independently represent a hydrogen atom, an alkyl group having 1 to 20 carbon atoms, or an aryl group having 6 to 20 carbon atoms, and may be the same as or different from each other but does not represent a hydrogen atom at the same time.

$R^3$ and $R^4$ represent an electron-withdrawing group. Here, the electron-withdrawing group is an electron-withdrawing group having a Hammett substituent constant $\sigma_p$ value (hereinafter, simply referred to as "$\sigma_p$ value") of 0.20 to 1.0. The $\sigma_p$ value in the electron-withdrawing group is preferably 0.30 to 0.8.

$R^3$ and $R^4$ represent preferably an acyl group, a carbamoyl group, an alkyloxycarbonyl group, an aryloxycarbonyl group, a cyano group, a nitro group, an alkylsulfonyl group, an arylsulfonyl group, a sulfonyloxy group, or a sulfamoyl group, and more preferably an acyl group, a carbamoyl group, an alkyloxycarbonyl group, an aryloxycarbonyl group, a cyano group, an alkylsulfonyl group, an arylsulfonyl group, a sulfonyloxy group, or a sulfamoyl group.

Formula (1) can be found in paragraphs "0148" to "0158" of JP2010-049029A, the content of which is incorporated herein by reference.

Specific examples of the compound represented by Formula (1) include the following compounds. Other examples of the silane coupling agent Y include a compound described in paragraphs "0160" to "0162" of JP2010-049029A, the content of which is incorporated herein by reference.

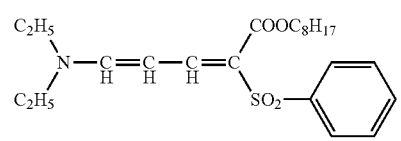

Examples of a commercially available product of the ultraviolet absorber include UV503 (manufactured by Daito Chemical Co., Ltd.).

As the ultraviolet absorber, an amino diene compound, a salicylate compound, a benzophenone compound, a benzotriazole compound, an acrylonitrile compound, or a triazine compound can be preferably used. Specific examples include a compound described in JP2013-68814A. As the benzotriazole compound, MYUA series (manufactured by Miyoshi Oil&Fat Co., Ltd.; (The Chemical Daily, Feb. 1, 2016) may be used.

The content of the surfactant ultraviolet absorber s preferably 0.01 to 10 mass % and more preferably 0.01 to 5 mass % with respect to the total solid content of the infrared absorbing composition.

<<Filler>>

The infrared absorbing composition according to the present invention may include a filler.

Examples of the filler include fine particles of an inorganic compound or an organic compound such as silica, an organic silicon compound, a melamine resin, or an acrylic resin. The average particle size of the particles is preferably 1 to 40 μm. The content of the filler is preferably 0.01 to 2 mass % and more preferably 0.01 to 1 mass % with respect to the total solid content of the infrared absorbing composition.

<<Antioxidant>>

It is preferable that the infrared absorbing composition according to the present invention includes an antioxidant. Examples of the antioxidant include a phenol compound, a phosphite compound, a thioether compound, and a hindered amine compound. Among these, a phenol compound or a hindered amine compound is preferable. The molecular weight of the antioxidant is preferably 500 or higher.

As the phenol compound, an arbitrary phenol compound which is known as a phenol antioxidant can be used. As the phenol compound, for example, a hindered phenol compound is preferable. In particular, a compound having a substituent at a position (ortho position) adjacent to a phenolic hydroxyl group is preferable. As the substituent, a substituted or unsubstituted alkyl group having 1 to 22 carbon atoms is preferable, and a methyl group, an ethyl group, a propionyl group, an isopropionyl group, a butyl group, an isobutyl group, a t-butyl group, a pentyl group, a isopentyl group, a t-pentyl group, a hexyl group, an octyl group, an isooctyl group, or a 2-ethylhexyl group is more preferable. In addition, a compound having a phenol group and a phosphite group in the same molecule is also preferable.

The phenol compound is preferably a polysubstituted phenol compound. The polysubstituted phenol compound can be roughly classified into three types (an (A) hindered type, a (B) semi-hindered type, and a (C) less-hindered type) having different substitution sites and structures.

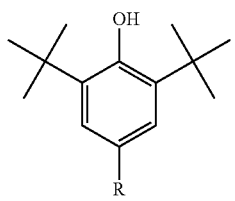

(A)

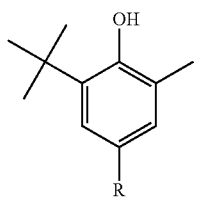

(B)

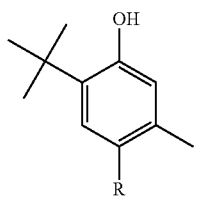

(C)

In Formulae (A) to (C) R represents a hydrogen atom or a substituent. Examples of the substituent include a halogen atom, an amino group, an alkyl group, an aryl group, an alkoxy group, an aryloxy group, an alkylamino group, an arylamino group, an alkylsulfonyl group, and an arylsulfonyl group. The amino group, the alkyl group, the aryl group, the alkoxy group, the aryloxy group, the alkylamino group, the arylamino group, the alkylsulfonyl group, or the arylsulfonyl group may further have a substituent.

As the phenol compound, a compound in which a plurality of structures represented by Formulae (A) to (C) are present in the same molecule is preferable, and a compound in which 2 to 4 structures represented by Formulae (A) to (C) are present in the same molecule is more preferable.

The phenol compound is, for example, a compound selected from the group consisting of p-methoxyphenol, di-t-butyl-p-cresol, pyrogallol, t-butylcatechol, 4,4-thiobis (3-methyl-6-t-butylphenol), 2,2-methylenebis(4-methyl-6-t-butylphenol), a phenol resin, and a cresol resin.

Representative examples of a commercially available product of (A) include SUMILIZER BHT (manufactured by Sumitomo Chemical Co., Ltd.), IRGANOX 1010 and 1222 (manufactured by BASF SE), and ADEKA STAB AO-20, AO-50, AO-50F, AO-60, AO-60G, and AO-330 (manufactured by Adeka Corporation). Representative examples of a commercially available product of (B) include SUMILIZER BBM-S (manufactured by Sumitomo Chemical Co., Ltd.), IRGANOX 245 (manufactured by BASF SE), and ADEKA STAB AO-80 (manufactured by Adeka Corporation). Representative examples of a commercially available product of (C) include ADEKA STAB AO-30 and AO-40 (manufactured by Adeka Corporation).

Examples of the hindered amine compound include a compound having one or more partial structures represented by the following Formula (HA) in one molecule.

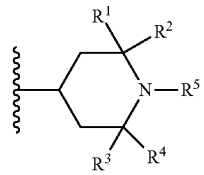

Formula (HA)

In Formula (HA), a wave line represents a direct bond to another atom or atomic group constituting the hindered amine compound. $R^1$ to $R^4$ each independently represent a hydrogen atom or an alkyl group, and $R^5$ represents a hydrogen atom, an alkyl group, an alkoxy group, an aryloxy group, an acyl group, an alkoxycarbonyl group, or an aryloxycarbonyl group.

As the hindered amine compound, a compound having two or more partial structures represented by the following Formula (HA) in one molecule is preferable. The upper limit is preferably 100 or less, more preferably 50 or less, still more preferably 20 or less, and even still more preferably 10 or less.

Examples of the hindered amine compound include ADEKA STAB LA-52, LA-57, LA-63P, LA-68, LA-72, LA-77Y, LA-77G, LA-81, LA-82, and LA-87 (manufactured by Adeka Corporation).

Examples of the phosphite compound include at least one compound selected from the group consisting of tris[2-[[2,4,8,10-tetrakis(1,1-dimethylethyl)dibenzo[d,f][1,3,2]dioxaphosphepin-6-yl]oxy]ethyl]amine, tris[2-[[4,6,9,11-tetra-t-butyldibenzo[d,f][1,3,2]dioxaphosphepin-2-yl]oxy]ethyl]amine, and ethyl bis(2,4-di-t-butyl-6-methylphenyl) phosphite.

As the antioxidant, for example, ADEKA STAB PEP-36A, or ADEKA STAB AO-412S (manufactured by Adeka Corporation) can also be used in addition to the above-described examples.

The content of the antioxidant is preferably 0.01 to 20 mass % and more preferably 0.3 to 15 mass % with respect to the total solid content of the infrared absorbing composition. As the antioxidant, one kind may be used alone, or two or more kinds may be used. In a case where two or more antioxidants are used in combination, it is preferable that the total content of the two or more antioxidants is in the above-described range.

<<Other Components>>

The infrared absorbing composition according to the present invention optionally includes: a chain transfer agent such as N,N-dialkylamino benzoic acid alkyl ester or 2-mercapto-benzothiazole; a thermal polymerization initiator such as an azo compound or a peroxide compound; a thermal polymerization component; a plasticizer such as dioctyl phthalate; a developability improving agent such as a low molecular weight organic carboxylic acid; and other various additives such as an antioxidant, or an aggregation inhibitor.

In addition, in order to increase the degree of cure of a film during heating after development, a thermal curing agent can be added. Examples of the thermal curing agent include a thermal polymerization initiator such as an azo compound or a peroxide, a novolac resin, a resol resin, an epoxy compound, and a styrene compound.

Depending on materials used and the like, the composition may include a metal element. From the viewpoint of, for example, suppressing the generation of defects, the content of a Group 2 element (for example, calcium or magnesium) in the composition is controlled to be preferably 50 ppm or lower and more preferably 0.01 to 10 ppm. In addition, the total amount of inorganic metal salts in the composition is controlled to be preferably 100 ppm or lower and more preferably 0.5 to 50 ppm.

(Method of Preparing Infrared Absorbing Composition)

The infrared absorbing composition according to the present invention can be prepared by mixing the above-described components with each other.

During the preparation of the composition, the respective components may be mixed with each other collectively, or may be mixed with each other sequentially after dissolved and/or dispersed in a solvent. In addition, during mixing, the order of addition or working conditions are not particularly limited. For example, all the components may be dissolved and/or dispersed in a solvent at the same time to prepare the infrared absorbing composition. Optionally, two or more solutions and/or dispersions may be appropriately prepared using the respective components, and the solutions and/or dispersions may be mixed with each other during use (during application) to prepare the infrared absorbing composition.

In addition, in a case where the infrared absorbing composition according to the present invention particles of a pigment or the like, it is preferable that a process of dispersing the particles is provided. Examples of a mechanical force used for dispersing the particles in the process of dispersing the particles include compression, squeezing, impact, shearing, and cavitation. Specific examples of the process include a beads mill, a sand mill, a roll mill, a ball mill, a paint shaker, a Microfluidizer, a high-speed impeller, a sand grinder, a project mixer, high-pressure wet atomization, and ultrasonic dispersion. During the pulverization of the particles using a sand mill (beads mill), it is preferable that the process is performed under conditions for increasing the pulverization efficiency, for example, by using beads having a small size and increasing the filling rate of the beads. In addition, it is preferable that rough particles are removed by filtering, centrifugal separation, and the like. In addition, as the process and the disperser for dispersing the particles, a process and a disperser described in "Complete Works of Dispersion Technology, Johokiko Co., Ltd., Jul. 15, 2005", "Dispersion Technique focusing on Suspension (Solid/Liquid Dispersion) and Practical Industrial Application, Comprehensive Reference List, Publishing Department of Management Development Center, Oct. 10, 1978", and paragraph "0022" JP2015-157893A can be suitably used. In addition, in the process of dispersing the particles, particles may be refined in a salt milling step. A material, a device, a process conditions, and the like used in the salt milling step can be found in, for example, JP2015-194521A and JP2012-046629A, the content of which is incorporated herein by reference.

In a case where a pigment is used as the infrared absorber and the chromatic colorant, it is preferable that the composition is prepared using a method including: preparing a pigment dispersion by dispersing the pigment and optionally other components such as a resin, an organic solvent, or a pigment derivative; and mixing the obtained pigment dispersion with other components of the composition.

During the preparation of the infrared absorbing composition, it is preferable that the composition is filtered through a filter, for example, in order to remove foreign matter or to reduce defects. As the filter used for filtering, any filter which is used in the related art for filtering or the like can be used without any particular limitation. Examples of the filter include filters formed of the following materials including: a fluororesin such as polytetrafluoroethylene (PTFE); a polyamide resin such as nylon (for example, nylon-6 or nylon-6,6); and a polyolefin resin (including a polyolefin resin having a high density and an ultrahigh molecular weight) such as polyethylene or polypropylene (PP). Among these materials, polypropylene (including high-density polypropylene) or nylon is preferable.

The pore size of the filter is suitably about 0.01 to 7.0 µm and is preferably about 0.01 to 3.0 µm and more preferably about 0.05 to 0.5 µm. In the above-described range, fine foreign matter, which inhibits a fine and smooth composition in the next step, can be reliably removed. In addition, it is preferable that a fibrous filter material is used. Examples of the fibrous filter material include polypropylene fiber, nylon fiber, and glass fiber. Specifically, a filter cartridge of SBP type series (manufactured by Roki Techno Co., Ltd.; for example, SBP008), TPR type series (for example, TPR002 or TPR005), SHPX type series (for example, SHPX003), or the like can be used.

In a filter is used, a combination of different filters may be used. At this time, the filtering using a first filter may be performed once, or twice or more.

In addition, a combination of first filters having different pore sizes in the above-described range may be used. Here, the pore size of the filter can refer to a nominal value of a manufacturer of the filter. A commercially available filter can be selected from various filters manufactured by Pall Corporation (for example, DFA4201NXEY), Toyo Roshi Kaisha, Ltd., Entegris Japan Co., Ltd. (former Mykrolis Corporation), or Kits Microfilter Corporation.

A second filter may be formed of the same material as that of the first filter.

For example, the filtering using the first filter may be performed only on the dispersion, and the filtering using the second filter may be performed on a mixture of the dispersion and other components.

<Infrared Cut Filter and Laminate>

Next, an infrared cut filter and a laminate according to the present invention will be described.

The infrared cut filter according to the present invention is formed by curing the above-described infrared absorbing composition according to the present invention. In addition, the laminate according to the present invention includes: the infrared cut filter according to the present invention; and a color filter that includes a chromatic colorant.

The infrared cut filter according to the present invention may be a film having a pattern or a film (flat film) not having a pattern.

The thickness of the infrared cut filter according to the present invention can be adjusted according to the purpose. The thickness is preferably 20 μm or less, more preferably 10 μm or less, and still more preferably 5 μm or less. For example, the lower limit of the thickness is preferably 0.1 μm or more, more preferably 0.2 μm or more, and still more preferably 0.3 μm or more. The infrared cut filter according to the present invention can be used in a solid image pickup element such as CCD or CMOS. In addition, the infrared cut filter according to the present invention can be used in various image display devices.

The infrared cut filter according to the present invention can be used in combination with a color filter that includes a chromatic colorant.

The color filter can be manufactured using a coloring composition including a chromatic colorant. Examples of the chromatic colorant include the chromatic colorants described regarding the infrared absorbing composition according to the present invention. The coloring composition may further include, for example, a resin, a curable compound, a photopolymerization initiator, a surfactant, a solvent, a substrate adhesive, a polymerization inhibitor, and a ultraviolet absorber. The details of the additives are the same as described above regarding the infrared absorbing composition according to the present invention. In addition, the infrared cut filter may have not only a function as an infrared cut filter but also a function as a color filter by including a chromatic colorant.

In the present invention, "infrared cut filter" refers to a filter that allows transmission of light (visible light) in the visible range and shields light (infrared light) in the infrared range. The infrared cut filter may be a filter that allows transmission of light in the entire wavelength range of the visible range, or may be a filter that allows transmission of light in a specific wavelength range of the visible range and shields light in another specific wavelength range of the visible range.

In addition, in the present invention, "color filter" refers to a filter that allows transmission of light in a specific wavelength range of the visible range and shields light in another specific wavelength range of the visible range.

The infrared cut filter according to the present invention may be used in combination with another infrared cut filter other than the infrared cut filter according to the present invention. Examples of the other infrared cut filter include a transparent layer containing copper and a band pass filter.

As the transparent layer containing copper, a glass substrate (copper-containing glass substrate) formed of glass containing copper, or a layer (copper complex-containing layer) containing a copper complex may also be used. In addition, in a case where the copper complex-containing layer is used as the transparent layer containing copper, the copper complex-containing layer may be used alone, or may be used in combination with a support.

Examples of the band pass filter include a laminate in which a high refractive index material layer and a low refractive index material layer are alternately laminated. The spectral characteristics of the band pass filter can be appropriately selected depending on the wavelength of a light source, the spectral characteristics of the infrared cut filter, and the like. By being used in combination with the band pass filter, the infrared cut filter can also shield a wide range of infrared light.

In addition, the infrared cut filter according to the present invention can be used in combination with an infrared transmitting filter. By being used in combination with an infrared transmitting filter, the infrared cut filter can be preferably used for an infrared sensor that detects infrared light at a specific wavelength. In the present invention, "infrared transmitting filter" refers to a filter that shields light (visible light) in the visible range and allows transmission of light (infrared light) in the infrared range. The wavelength of infrared light that transmits through the infrared transmitting filter can be appropriately selected according to the use.

The infrared cut filter according to the present invention may be or may not be adjacent to the color filter in the thickness direction. In a case where the infrared cut filter is not adjacent to the color filter in the thickness direction, the infrared cut filter may be formed on another substrate other than a substrate on which the color filter is formed, or another member (for example, a microlens or a planarizing layer) constituting a solid image pickup element may be interposed between the infrared cut filter and the color filter.

<Pattern Forming Method>

A pattern forming method according to the present invention includes: a step of forming an infrared absorbing composition layer on a support using the infrared absorbing composition according to the present invention; and a step of forming a pattern on the infrared absorbing composition layer using a photolithography method or a dry etching method.

In a case where a laminate the infrared cut filter according to the present invention and the color filter are laminated is manufactured, pattern formation on the infrared cut filter and pattern formation on the color filter may be separately performed. In addition, pattern formation may be performed on the laminate in which the infrared cut filter and the color filter are laminated (that is, pattern formation on the infrared cut filter and pattern formation on the color filter may be simultaneously performed).

The case where pattern formation on the infrared cut filter and pattern formation on the color filter are separately performed denotes the following aspect. Pattern formation is performed on any one of the infrared cut filter and the color filter. Next, the other filter layer is formed on the filter layer on which the pattern is formed. Next, pattern formation is performed on the filter layer on which a pattern is not formed.

The pattern forming method may be a pattern forming method using photolithography or a pattern forming method using dry etching.

In a case where the pattern forming method using photolithography is adopted, a dry etching step is not necessary, and an effect that the number of steps can be reduced can be obtained.

In a case where the pattern forming method using dry etching is adopted, a photolithography function is not necessary. Therefore, an effect that the concentration of the infrared absorber in the infrared absorbing composition can increase can be obtained.

In a case where the pattern formation on the infrared cut filter and the pattern formation on the color filter are separately performed, the pattern formations on the respective filter layers may be performed using only the photolithography method or only the dry etching method. In addition, after performing the pattern formation on one filter layer using the photolithography method, the pattern formation may be performed on the other filter layer using the dry etching method. In a case where the pattern formation is performed using a combination of the dry etching method and the photolithography method, it is preferable that a pattern is formed on a first layer using the dry etching method and a pattern is formed on a second or subsequent layer using the photolithography method.

It is preferable that the pattern formation using the photolithography method includes: a step of forming a composition layer on a support using each composition; a step of exposing the composition layer in a pattern shape; and a step of forming a pattern by removing a non-exposed portion by development. Optionally, the pattern formation further includes: a step (pre-baking step) of baking the composition layer; and a step (post-baking step) of baking the developed pattern.

In addition, It is preferable that the pattern formation using the dry etching method includes: a step of forming a composition layer on a support using each composition and curing the cured composition layer; a step of forming a photoresist layer on the cured composition layer; a step of obtaining a resist pattern by patterning the photoresist layer by exposure and development; and a step of forming a pattern by dry-etching the cured composition layer by using the resist pattern as an etching mask. Hereinafter, the respective steps will be described.

<<Step of Forming Composition Layer>>

In the step of forming a composition layer, a composition layer is formed on a support using each of the compositions.

As the support, for example, a substrate for a solid image pickup element obtained by providing a solid image pickup element (light-receiving element) such as CCD or CMOS on a substrate (for example, a silicon substrate) can be used.

The pattern according to the present invention may be formed on a solid image pickup element-formed surface (front surface) of the substrate for a solid image pickup element, or may be formed on a solid image pickup element non-formed surface (back surface) thereof.

Optionally, an undercoat layer may be provided on the support to improve adhesiveness with a layer above the support, to prevent diffusion of materials, or to make a surface of the substrate flat.

As a method of applying the composition to the support, various methods such as slit coating, an ink jet method, spin coating, cast coating, roll coating, or screen printing can be used.

The composition layer formed on the support may be dried (pre-baked). In a case where a pattern is formed through a low-temperature process, pre-baking is not necessarily performed.

In a case where pre-baking is performed, the pre-baking temperature is preferably 150° C. or lower, more preferably 120° C. or lower, and still more preferably 110° C. or lower. The lower limit is, for example, 50° C. or higher or 80° C. or higher. By setting the pre-baking temperature to be 150° C. or lower, the characteristics can be effectively maintained, for example, even in a case where a photoelectric conversion film of an image sensor is formed of an organic material.

The pre-baking time is preferably 10 to 300 seconds, more preferably 40 to 250 seconds, and still more preferably 80 to 220 seconds. Drying can be performed using a hot plate, an oven, or the like.

In a case where the pattern formation is simultaneously performed on a plurality of layers, it is preferable that a composition for forming each of the layers is applied to the composition layer to form another composition layer.

(Case where Pattern is Formed Using Photolithography Method)

<<Exposure Step>>

Next, the composition layer is exposed in a pattern shape (exposure step). For example, the composition layer is exposed in a pattern shape using an exposure device such as a stepper through a mask having a predetermined mask pattern, thereby exposing a pattern. As a result, an exposed portion can be cured.

As radiation (light) used during the exposure, ultraviolet rays such as g-rays or i-rays are preferably used (i-rays are more preferably used). For example, the irradiation dose (exposure dose) is preferably 30 to 5000 $mJ/cm^2$. The upper limit is preferably 3000 $mJ/cm^2$ or lower, more preferably 2000 $mJ/cm^2$ or lower, and still more preferably 1500 $mJ/cm^2$ or lower. The lower limit is preferably 50 $mJ/cm^2$ or higher and more preferably 80 $mJ/cm^2$ or higher.

<<Development Step>>

Next, a pattern is formed by removing a non-exposed portion by development. The non-exposed portion can be removed by development using a developer. As a result, a non-exposed portion of the composition layer in the exposure step is eluted into the developer, and only the photocured portion remains.

As the developer, an organic alkali developer which does not cause damages to a solid image pickup element as a substrate, a circuit or the like is desired.

For example, the temperature of the developer is preferably 20° C. to 30° C. The developing time is preferably 20 to 180 seconds. In addition, in order to further improve residue removing properties, a step of shaking the developer off per 60 seconds and supplying a new developer may be repeated multiple times.

Examples of an alkaline agent used in the developer include an organic alkaline compound such as ammonia water, ethylamine, diethylamine, dimethylethanolamine, tetramethylammonium hydroxide, tetraethylammonium hydroxide, tetrapropylammonium hydroxide, tetrabutylammonium hydroxide, benzyltrimethylammonium hydroxide, choline, pyrrole, piperidine, or 1,8-diazabicyclo-[5.4.0]-7-undecene.

In addition, as the alkaline agent used as the developer, an inorganic alkaline compound may be used. Preferable examples of the inorganic alkaline compound include sodium hydroxide, potassium hydroxide, sodium carbonate, sodium bicarbonate, sodium silicate, and sodium metasilicate.

As the developer, an alkaline aqueous solution is preferably used in which the above alkaline agent is diluted with pure water such that a concentration thereof is 0.001 to 10 mass % and preferably 0.01 to 1 mass %.

In addition, a surfactant may be used as the developer. Examples of the surfactant include the surfactants described above regarding the coloring composition. Among these, a nonionic surfactant is preferable.

In a case where a developer including the alkaline aqueous solution is used, in general, it is preferable that the film is rinsed with pure water after development.

After the development, it is preferable that the film is dried and then heated (post-baking). Post-baking is a heat treatment which is performed after development to completely cure the film. In a case where post-baking is performed, for example, the post-baking temperature is preferably 100° C. to 240° C. From the viewpoint of curing the film, the post-baking temperature is more preferably 200° C. to 230° C. In addition, in a case where an organic electroluminescence (organic EL) element is used as a light-emitting light source, or in a case where a photoelectric conversion film of an image sensor is formed of an organic material, the post-baking temperature is preferably 150° C. or lower, more preferably 120° C. or lower, still more preferably 100° C. or lower, and even still more preferably 90° C. or lower. The lower limit is, for example, 50° C. or higher.

The film after the development is post-baked continuously or batchwise using heating means such as a hot plate, a convection oven (hot air circulation dryer), a high-frequency heater under the above-described conditions. In addition, in a case where a pattern is formed through a low-temperature process, post-baking is not necessarily performed.

(Case where Pattern is Formed Using Dry Etching Method)

The pattern formation using the dry etching method can be performed by curing the composition layer formed on the support to form a cured composition layer, and then etching the cured composition layer with etching gas by using a patterned photoresist layer as a mask.

Specifically, it is preferable that a positive type or negative type radiation sensitive composition is applied to the cured composition layer and is dried such that a photoresist layer is formed. It is preferable that pre-baking is further performed in order to form the photoresist layer. In particular, in a preferable embodiment, as a process of forming the photoresist layer, baking after exposure or baking after development (post-baking) is performed.

As the photoresist layer, a positive type radiation sensitive composition, which is reactive with radiation including ultraviolet rays (g-rays, h-rays, i-rays), far ultraviolet rays such as excimer laser, electron beams, ion beams, and X-rays, is preferably used. Among the radiations, g-rays, h-rays, or i-rays are preferable, and i-rays are more preferable.

Specifically, as the positive type radiation sensitive composition, a composition including a quinonediazide compound and an alkali-soluble resin is preferable. In the positive type radiation sensitive composition including a quinonediazide compound and an alkali-soluble resin, a quinonediazide group is decomposed into a carboxyl group by irradiation of light having a wavelength of 500 nm or shorter such that the state of the composition is converted from alkali-insoluble to alkali-soluble. The positive type photoresist has significantly high resolution and thus is used to prepare an integrated circuit such as an integrated circuit (IC) or a large scale integration (LSI). Examples of the quinonediazide compound include a naphthoquinonediazide compound. Examples of a commercially available product of the quinonediazide compound include "FHi622BC" (manufactured by Fujifilm Electronic Materials Co., Ltd.).

The thickness of the photoresist layer is preferably 0.1 to 3 µm, more preferably 0.2 to 2.5 µm, and still more preferably 0.3 to 2 µm. As a method of applying the positive type radiation sensitive composition, the above-described methods of applying the composition is preferable.

Next, by exposing and developing the photoresist layer, a resist pattern (patterned photoresist layer) including a group of resist through-holes is formed. The formation of the resist pattern is not particularly limited and can be appropriately optimized and performed using a well-known photolithography technique of the related art. By providing the group of resist through-holes in the photoresist layer by exposure and development, a resist pattern used as an etching mask in the next etching is provided on the cured composition layer.

The exposure of the photoresist layer can be performed by exposing the positive type or negative type radiation sensitive composition with g-rays, h-rays, i-rays, or the like (preferably i-rays) through a predetermined mask pattern. By performing development using a developer after exposure, a photoresist is removed from a region where a color pattern is desired to be formed.

As the developer, any developer can be used as long as it has no effect on a cured composition layer including a colorant and an exposed portion of a positive resist and a non-cured portion of a negative resist are soluble therein. For example, a combination of various solvents or an alkaline aqueous solution can be used. It is preferable that the alkaline aqueous solution is prepared by dissolving an alkaline compound such that the concentration thereof is 0.001 to 10 mass % and preferably 0.01 to 5 mass %. Examples of the alkaline compound include sodium hydroxide, potassium hydroxide, sodium carbonate, sodium silicate, sodium metasilicate, ammonia water, ethylamine, diethylamine, dimethylethanolamine, tetramethylammonium hydroxide, tetraethylammonium hydroxide, choline, pyrrole, piperidine, and 1,8-diazabicyclo[5.4.0]-7-undecene. In a case where an alkaline aqueous solution is used, in general, a rinsing treatment using water is performed after development.

Next, patterning is performed by dry-etching the colored layer using the resist pattern as an etching mask so as to form a group of through-holes in the cured composition layer.

From the viewpoint of forming a pattern cross-section in a substantially rectangular shape or the viewpoint of further reducing damages to the support, it is preferable that dry etching is performed according the following embodiment.

In the preferable embodiment, first etching, second etching, and over etching is performed. In the first etching, etching is performed using a mixed gas of fluorine gas and oxygen gas ($O_2$) up to a region (depth) where the support is not exposed. In the second etching, after the first etching, etching is performed using a mixed gas of nitrogen gas ($N_2$) and oxygen gas ($O_2$) preferably up to a region (depth) where the support is exposed. In the over etching, etching is performed after the support is exposed. Hereinafter, a specific method of dry etching, the first etching, the second etching, and the over etching will be described.

The dry etching is performed after obtaining etching conditions in advance using the following method.

(1) An etching rate (nm/min) in the first etching, and an etching rate (nm/min) in the second etching are calculated, respectively.

(2) A time required to perform etching up to a desired thickness in the first etching, and a time required to perform etching up to a desired thickness in the second etching are calculated, respectively.

(3) The first etching is performed for the etching time calculated in (2).

(4) The second etching is performed for the etching time calculated in (2). Alternatively, an etching time may be determined based on a detected end point, and the second etching may be performed for the determined etching time.

(5) An over etching time is calculated in consideration of the total etching time of (3) and (4), and the over etching is performed for the calculated over etching time.

From the viewpoint of processing an organic material, which is a film to be etched, in a rectangular shape, it is preferable that a mixed gas used in the first etching step includes fluorine gas and oxygen gas ($O_2$). In addition, by etching up to a region where the support is not exposed in the first etching step, damages to the support can be avoided. In addition, after etching is performed using a mixed gas of fluorine gas and oxygen gas up to a region where the support is not exposed in the first etching step, in second etching step and the over etching step, it is preferable that etching is performed using a mixed gas of nitrogen gas and oxygen gas from the viewpoint of avoiding damages to the support.

It is preferable to determine a ratio between the etching amount in the first etching step and the etching amount in the second etching step such that the rectangularity obtained by etching in the first etching step does not deteriorate. A latter ratio in the total etching amount (the sum of the etching amount in the first etching step and the etching amount in the second etching step) is preferably higher than 0% and 50% or lower and more preferably 10% to 20%. The etching amount refers to a value which is calculated from a difference between the thickness of a film to be etched before etching and the thickness of the film remaining after etching.

In addition, it is preferable that the etching includes over etching. It is preferable that the over etching is performed after setting an over etching ratio. In addition, it is preferable that the over etching ratio is calculated based on a first etching time. The over etching ratio can be arbitrarily set and is preferably 30% or lower, more preferably 5 to 25%, and still more preferably 10 to 15% with respect to the total etching time of the etching process from the viewpoints of obtaining etching resistance of a photoresist and maintaining rectangularity of an etched pattern.

Next, the resist pattern (that is, the etching mask) remaining after etching is removed. It is preferable that the removal of the resist pattern includes: a step of applying a peeling solution or a solvent to the resist pattern such that the resist pattern can be peeled; and a step of removing the resist pattern using rinse water.

Examples of the step applying a peeling solution or a solvent to the resist pattern such that the resist pattern can be peeled include a step of applying a peeling solution or a solvent to at least the resist pattern and holding the peeling solution and the solvent for a predetermined time to perform puddle development. The time for which the peeling solution or the solvent is held is not particularly limited and is preferably several tens of seconds to several minutes.

In addition, examples of the step of removing the resist pattern using rinse water include a step of spraying rinse water to the resist pattern through a spray type or shower type spray nozzle to remove the resist pattern. As the rinse water, pure water is preferably used. In addition, examples of the spray nozzle include: a spray nozzle in which a spraying range includes the entire region of the support; and a movable spray nozzle in which a movable range includes the entire region of the support. In a case where the spray nozzle is movable, the nozzle moves twice or more in a region from the center of the support to end portions of the support to spray rinse water during the step of removing the resist pattern. As a result, the resist pattern can be more effectively removed.

In general, the peeling solution may further include an organic solvent or an inorganic solvent. Examples of the organic solvent include 1) a hydrocarbon compound, 2) a halogenated hydrocarbon compound, 3) an alcohol compound, 4) an ether or acetal compound, 5) a ketone or aldehyde compound, 6) an ester compound, 7) a polyhydric alcohol compound, 8), a carboxylic acid or acid anhydride compound, 9) a phenol compound, 10) a nitrogen-containing compound, 11) a sulfur-containing compound, and 12) a fluorine-containing compound. It is preferable that the peeling solution includes a nitrogen-containing compound, and it is more preferable that the peeling solution includes an acyclic nitrogen-containing compound and a cyclic nitrogen-containing compound.

It is preferable that the acyclic nitrogen-containing compound is an acyclic nitrogen-containing compound having a hydroxyl group. Specific examples of the acyclic nitrogen-containing compound having a hydroxyl group include monoisopropanolamine, diisopropanolamine, triisopropanolamine, N-ethylethanolamine, N,N-dibutylethanolamine, N-butylethanolamine, monoethanolamine, diethanolamine, and triethanolamine. Among these, monoethanolamine, diethanolamine, or triethanolamine is preferable, and monoethanolamine ($H_2NCH_2CH_2OH$) is more preferable. In addition, examples of the cyclic nitrogen-containing compound include isoquinoline, imidazole, N-ethylmorpholine, ε-caprolactam, quinoline, 1,3-dimethyl-2-imidazolidinone, α-picoline, β-picoline, γ-picoline, 2-picoline, 3-picoline, 4-picoline, piperazine, piperidine, pyrazine, pyridine, pyrrolidine, N-methyl-2-pyrrolidone, N-phenylmorpholine, 2,4-lutidine, and 2,6-lutidine. Among these, N-methyl-2-pyrrolidone or N-ethylmorpholine is preferable, and N-methyl-2-pyrrolidone (NMP) is more preferable.

It is preferable that the peeling solution includes an acyclic nitrogen-containing compound and a cyclic nitrogen-containing compound. It is more preferable that the peeling solution includes, as an acyclic nitrogen-containing compound, at least one selected from the group consisting of monoethanolamine, diethanolamine, and triethanolamine and includes, as a cyclic nitrogen-containing compound, at least one cyclic nitrogen-containing compound selected from N-methyl-2-pyrrolidone and N-ethylmorpholine. It is still more preferable that the peeling solution includes monoethanolamine and N-methyl-2-pyrrolidone.

When the peeling solution is removed, the resist pattern formed on the pattern only has to be removed. Even in a case where a deposit as an etching product is attached to a side wall of the pattern, it is not necessary to completely remove the deposit. The deposit refers to an etching product which is attached and deposited to a side wall of the cured composition layer.

In the peeling solution, the content of the acyclic nitrogen-containing compound is preferably 9 parts by mass to 11 parts by mass with respect to 100 parts by mass of the peeling solution, and the content of the cyclic nitrogen-containing compound is preferably 65 parts by mass to 70 parts by mass with respect to 100 parts by mass of the peeling solution. In addition, it is preferable that the peeling solution is obtained by diluting a mixture of the acyclic nitrogen-containing compound and the cyclic nitrogen-containing compound with pure water.

<Solid Image Pickup Element>

A solid image pickup element according to the present invention includes the infrared cut filter according to the present invention. The solid image pickup element according to the present invention is configured to include the infrared cut filter according to the present invention. The configuration of the solid image pickup element is not particularly limited as long as the solid image pickup element functions. For example, the following configuration can be adopted.

The solid image pickup element includes plural photodiodes and transfer electrodes on the support, the photodiodes constituting a light receiving area of the solid image pickup element (for example, a charge coupled device (CCD) image sensor or a complementary metal-oxide semiconductor (CMOS) image sensor), and the transfer electrode being formed of polysilicon or the like. In the solid image pickup element, a light shielding film formed of tungsten or the like which has openings through only light receiving sections of the photodiodes is provided on the photodiodes and the transfer electrodes, a device protective film formed of silicon nitride or the like is formed on the light shielding film so as to cover the entire surface of the light shielding film and the light receiving sections of the photodiodes, and the infrared cut filter according to the present invention is formed on the device protective film.

Further, a configuration in which light collecting means (for example, a microlens; hereinafter, the same shall be applied) is provided above the device protective film and below the infrared cut filter according to the present invention (on a side thereof close the support), or a configuration in which light collecting means is provided on the infrared cut filter according to the present invention may be adopted.

(First Embodiment)

Hereinafter, a solid image pickup element including the film according to the present invention will be described using the drawings.

FIG. 1 shows a solid image pickup element including infrared cut filters 111, color filters 112, and infrared transmitting filters 114. In FIG. 1, reference numeral 110 represents a solid image pickup element. In an imaging region provided on the solid image pickup element 110, the infrared cut filters 111 and the infrared transmitting filters 114 are provided. In addition, the color filters 112 are laminated on the infrared cut filters 111. Microlenses 115 are disposed on an incidence ray hv side of the color filters 112 and the infrared transmitting filters 114. A planarizing layer 116 is formed so as to cover the microlenses 115. This solid image pickup element can be used as an infrared sensor.

Characteristics of the infrared cut filters 111 can be selected depending on the emission wavelength of an infrared light emitting diode (infrared LED) described below.

The color filters 112 is not particularly limited as long as pixels which allow transmission of light having a specific wavelength in the visible range and absorbs the light are formed therein, and well-known color filters of the related art for forming an image can be used. For example, pixels of red (R), green (G), and blue (B) are formed in the color filters. For example, the details of the color filters can be found in paragraphs "0214" to "0263" of JP2014-043556A, the content of which is incorporated herein by reference.

Characteristics of the infrared transmitting filters 114 can be selected depending on the emission wavelength of the infrared LED. For example, the following description will be made assuming that the emission wavelength of the infrared LED is 850 nm.

A maximum value of a light transmittance of the infrared transmitting filter 114 in the thickness direction of the film in a wavelength range of 400 to 650 nm is preferably 30% or lower, more preferably 20% or lower, still more preferably 10% or lower and even still more preferably 0.1% or lower. It is preferable that the transmittance satisfies the above-described conditions in the entire wavelength range of 400 to 650 nm.

A minimum value of a light transmittance of the infrared transmitting filter 114 in the thickness direction of the film in a wavelength range of 800 nm or longer (preferably 800 to 1300 nm) is preferably 70% or higher, more preferably 80% or higher, and still more preferably 90% or higher. It is preferable that the transmittance satisfies the above-described conditions in at least a part of a wavelength range of 800 nm or longer, and it is more preferable that the transmittance satisfies the above-described conditions at a wavelength corresponding to the emission wavelength of the infrared LED. The maximum value of the light transmittance in a wavelength range of 800 nm to 1300 nm is typically 99.9% or lower.

The thickness of the infrared transmitting filter 114 is preferably 100 µm or less, more preferably 15 µm or less, still more preferably 5 µm or less, and even still more preferably 1 µm or less. The lower limit value is preferably 0.1 µm. In a case where the thickness is in the above-described range, the film can satisfy the above-described spectral characteristics.

A method of measuring the spectral characteristics, the thickness, and the like of the infrared transmitting filter 114 is as follows.

The thickness is obtained by measuring the thickness of the dried substrate including the film using a stylus surface profilometer (DEKTAK 150, manufactured by ULVAC Inc.).

The spectral characteristics of the film are values obtained by measuring the transmittance in a wavelength range of 300 to 1300 nm using an ultraviolet-visible-near infrared spectrophotometer (U-4100, manufactured by Hitachi High-Technologies Corporation).

The infrared transmitting filter 114 having the above-described spectral characteristics can be formed using a composition including a visible light absorbing coloring material. It is preferable that black, gray, or a color similar to black or gray is exhibited using a single visible light absorbing coloring material or a combination of a plurality of visible light absorbing coloring materials. It is preferable that the visible light absorbing coloring material satisfies the following requirement (1) or (2), and it is more preferable that the visible light absorbing coloring material satisfies the requirement (1).

(1): An aspect in which the composition includes two or more chromatic colorants (2): An aspect in which the composition includes a black colorant In the aspect (1), it is preferable that black is exhibited using a combination of two or more chromatic colorants. In addition, in the aspect (1), the first spectrally selective layer may further include a black colorant.

In the aspect (2), the first spectrally selective layer may further include one or more chromatic colorants.

Examples of the chromatic colorant include the chromatic colorants described regarding the above-described infrared absorbing composition.

In a case where the composition includes two or more chromatic colorants as the visible light absorbing coloring material, it is preferable that composition includes two or more chromatic colorants selected from the group consisting of a red colorant, a yellow colorant, a blue colorant, and a violet colorant. In addition, it is preferable that the composition includes a blue colorant and at least one colorant selected from a red colorant, a yellow colorant, and a violet colorant.

Among these, any one of the following aspects (1) to (3) is preferable.

(1) An aspect in which the composition includes a red colorant, a yellow colorant, a blue colorant, and a violet colorant (2) An aspect in which the composition includes a red colorant, a yellow colorant, and a blue colorant (3) An aspect in which the composition includes a yellow colorant, a blue colorant, and a violet colorant In a specific example of the aspect (1), the composition includes C.I. Pigment Red 254 as a red pigment, C.I.

Pigment Yellow 139 as a yellow pigment, C.I. Pigment Blue 15:6 as a blue pigment, and C.I. Pigment Violet 23 as a violet pigment.

In a specific example of the aspect (2), the composition includes C.I. Pigment Red 254 as a red pigment, C.I. Pigment Yellow 139 as a yellow pigment, and C.I. Pigment Blue 15:6 as a blue pigment.

In a specific example of the aspect (3), the composition includes C.I. Pigment Yellow 139 as a yellow pigment, C.I. Pigment Blue 15:6 as a blue pigment, and C.I. Pigment Violet 23 as a violet pigment.

In a case where the visible light absorbing coloring material includes a red colorant, a yellow colorant, a blue colorant, and a violet colorant as the chromatic colorants, it is preferable that a ratio of the mass of the red colorant is 0.1 to 0.6, a ratio of the mass of the yellow colorant is 0.1 to 0.4, a ratio of the mass of the blue colorant is 0.1 to 0.6, and a ratio of the mass of the violet colorant is 0.01 to 0.3 with respect to the total mass of the chromatic colorants. It is more preferable that a ratio of the mass of the red colorant is 0.2 to 0.5, a ratio of the mass of the yellow colorant is 0.1 to 0.3, a ratio of the mass of the blue colorant is 0.2 to 0.5, and a ratio of the mass of the violet colorant is 0.05 to 0.25 with respect to the total mass of the chromatic colorants.

In a case where the visible light absorbing coloring material includes a red colorant, a yellow colorant, and a blue colorant as the chromatic colorants, it is preferable that a ratio of the mass of the red colorant is 0.2 to 0.7, a ratio of the mass of the yellow colorant is 0.1 to 0.4, and a ratio of the mass of the blue colorant is 0.1 to 0.6 with respect to the total mass of the chromatic colorants. It is more preferable that a ratio of the mass of the red colorant is 0.3 to 0.6, a ratio of the mass of the yellow colorant is 0.1 to 0.3, and a ratio of the mass of the blue colorant is 0.2 to 0.5 with respect to the total mass of the chromatic colorants.

In a case where the visible light absorbing coloring material includes a yellow colorant, a blue colorant, and a violet colorant as the chromatic colorants, it is preferable that a ratio of the mass of the yellow colorant is 0.1 to 0.4, a ratio of the mass of the blue colorant is 0.1 to 0.6, and a ratio of the mass of the violet colorant is 0.2 to 0.7 with respect to the total mass of the chromatic colorants. It is more preferable that a ratio of the mass of the yellow colorant is 0.1 to 0.3, a ratio of the mass of the blue colorant is 0.2 to 0.5, and a ratio of the mass of the violet colorant is 0.3 to 0.6 with respect to the total mass of the chromatic colorants.

It is preferable that the black colorant is an organic black colorant. In the present invention, the black colorant as the visible light absorbing coloring material denotes a material that absorbs visible light and allows transmission of at least a part of infrared light. Accordingly, in the present invention, examples of the black colorant as the visible light absorbing coloring material do not include carbon black and titanium black. In the present invention, as the black colorant, for example, a bisbenzofuranone compound, an azomethine compound, a perylene compound, or an azo compound can also be used.

The bisbenzofuranone compound may be a pigment or a dye and is preferably a pigment. Examples of the bisbenzofuranone compound include compounds disclosed in JP2010-534726A, JP2012-515233A, and JP2012-515234A. For example, "IRAGAPHOR BLACK" (manufactured by BASF SE) is available as the bisbenzofuranone compound.

Examples of the azomethine pigment include compounds described in JP1989-170601A (H1-170601) and JP1990-34664A (H2-34664). For example, "Chromofine Black A 1103" (manufactured by Dainichiseika Color & Chemicals Mfg. Co., Ltd.) is available.

The azo dye is not particularly limited, and for example, a compound represented by the following Formula (A-1) can be suitably used.

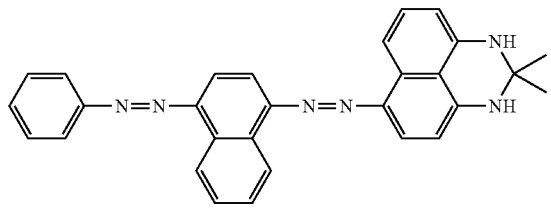

A-1

In addition, for example, in a case where the emission wavelength of the infrared LED is 940 nm, it is preferable that a maximum value of a light transmittance of the infrared transmitting filter 114 in a thickness direction in a wavelength range of 450 to 650 nm is 20% or lower, that a light transmittance of the infrared transmitting filter 114 in the thickness direction at a wavelength of 835 nm is 20% or lower, and that a minimum value of a light transmittance of the infrared transmitting filter 114 in the thickness direction in a wavelength range of 1000 to 1300 nm is 70% or higher.

The infrared transmitting filter 114 having the above-described spectral characteristics can be manufactured using a composition including a visible light absorbing coloring material and an infrared absorber having an absorption maximum in a wavelength range of 750 to 950 nm.

Examples of the visible light absorbing coloring material include the above-described visible light absorbing coloring materials, and it is preferable that black, gray, or a color similar to black or gray is exhibited using a single visible light absorbing coloring material or a combination of a plurality of visible light absorbing coloring materials.

Examples of the infrared absorber include a pyrrolopyrrole compound, a copper compound, a cyanine compound, a phthalocyanine compound, an iminium compound, a thiol complex compound, a transition metal oxide compound, a squarylium compound, a naphthalocyanine compound, a quaterrylene compound, a dithiol metal complex compound, a croconium compound, and an oxonol compound.

Examples of the phthalocyanine compound include oxotitanyl phthalocyanine. Examples of the naphthalocyanine compound include oxovanadyl naphthalocyanine. As the phthalocyanine compound, the naphthalocyanine compound, the iminium compound, the cyanine compound, the squarylium compound, or the croconium compound, for example, one of compounds described in paragraphs "0010" to "0081" of JP2010-111750A may be used, the content of which are incorporated in this specification. The cyanine compound can be found in, for example, "Functional Colorants by Makoto Okawara, Masaru Matsuoka, Teijiro Kitao, and Tsuneoka Hirashima, published by Kodansha Scientific Ltd.", the content of which is incorporated herein by reference.

Specific examples of the pyrrolopyrrole compound include the following compounds. In addition, other specific examples of the pyrrolopyrrole compound include compounds described in paragraphs "0049" to "0058" of JP2009-263614A.

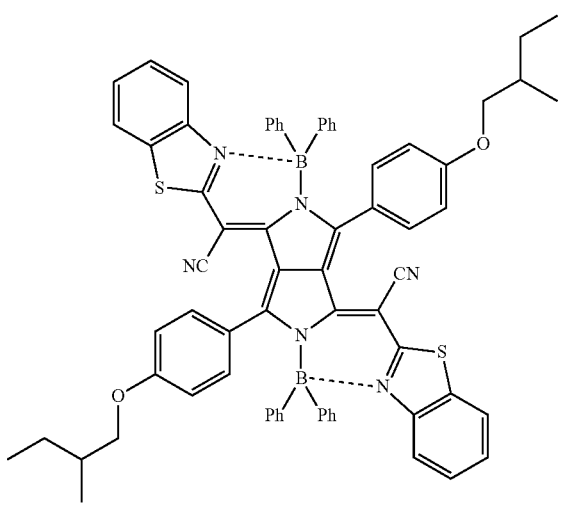

The infrared cut filters used in the solid image pickup element shown in FIG. 1 can be manufactured, for example, as follows.

Figure 2:
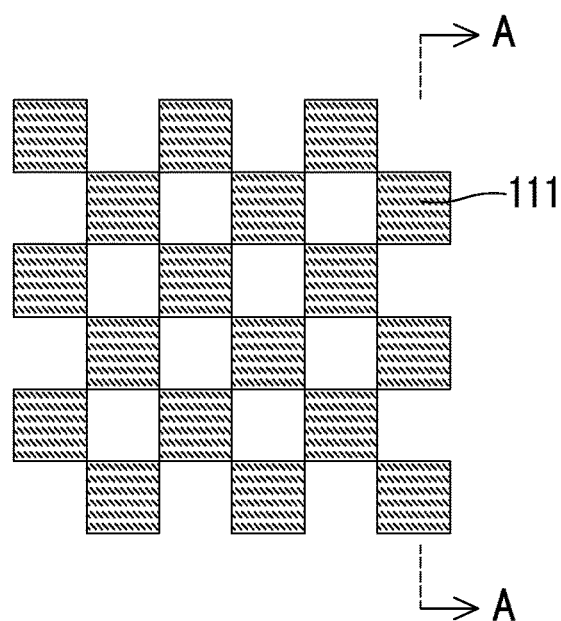
FIG. 2 is a diagram (plan view) showing a step of forming a pattern.
Figure 3:
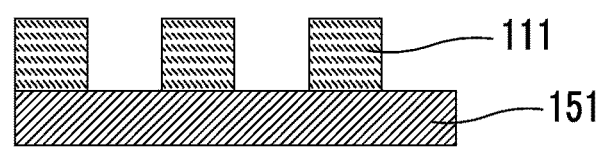
FIG. 3 is a cross-sectional view taken along line A-A of FIG. 2.

First, the infrared absorbing composition according to the present invention is applied to a support 151 shown in FIG. 3 to form an infrared absorbing composition layer thereon. Next, a pattern is formed on the infrared absorbing composition layer as shown in FIGS. 2 and 3. The pattern forming method may be any one of the photolithography method and the dry etching method. In FIGS. 2 and 3, a Bayer (lattice) pattern is formed on the infrared absorbing composition layer. However, a shape of the pattern can be appropriately selected according to the use.

Figure 4:
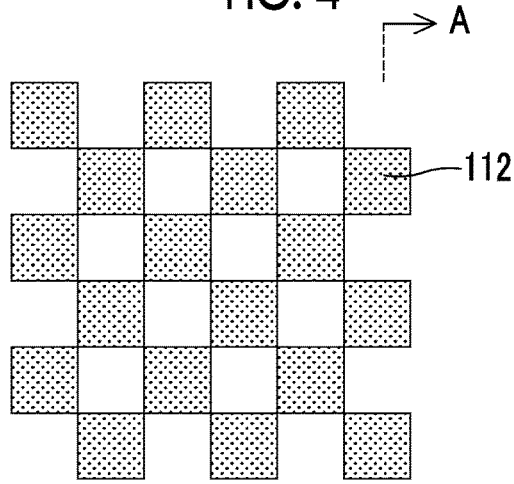
FIG. 4 is a diagram (plan view) showing a step of forming a pattern.
Figure 5:
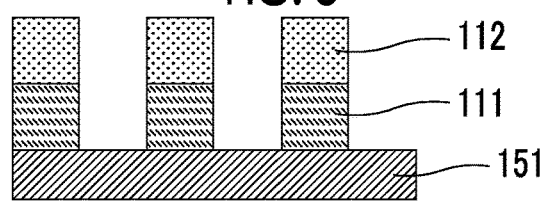
FIG. 5 is a cross-sectional view taken along line A-A of FIG. 4.

Next, a coloring composition for forming the color filter is applied to the Bayer pattern (the infrared cut filters 111) of the infrared absorbing composition layer to form a coloring composition layer thereon. Next, as shown in FIGS. 4 and 5, the coloring composition layer is patterned to form a Bayer pattern (the color filters 112) of the coloring composition layer on the Bayer pattern (the infrared cut filters 111) of the infrared absorbing composition layer. The pattern forming method may be any one of the photolithography method and the dry etching method and is preferably the photolithography method.

Figure 6:
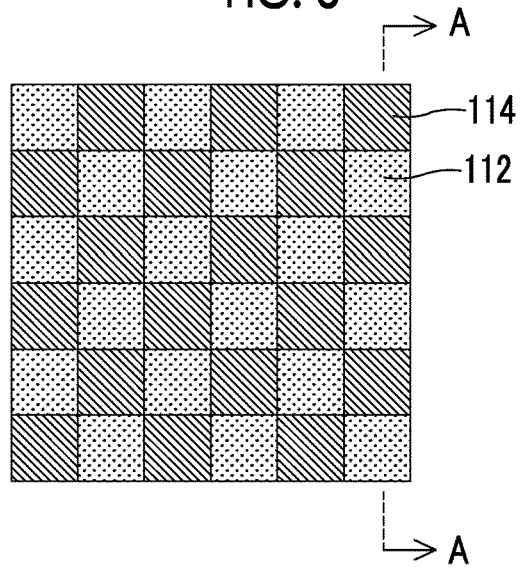
FIG. 6 is a diagram (plan view) showing a step of forming a pattern.
Figure 7:
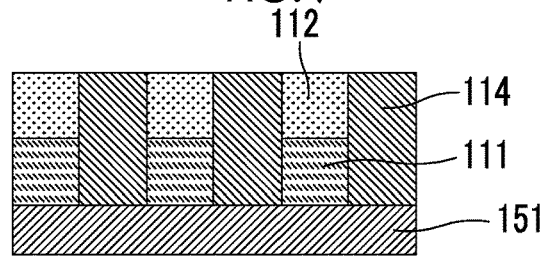
FIG. 7 is a cross-sectional view taken along line A-A of FIG. 6.

Next, a composition for forming the infrared transmitting filter is applied to the films on which the color filters 112 are formed to form a composition layer thereon. Next, as shown in FIGS. 6 and 7, the composition layer is patterned to form a pattern of the infrared transmitting filters 114 on a portion where the Bayer pattern of the infrared cut filters 111 is not formed.

The solid image pickup element according to the present invention may further include another infrared cut filter, such as a band pass filter, other than the infrared cut filter according to the present invention.

Figure 8:
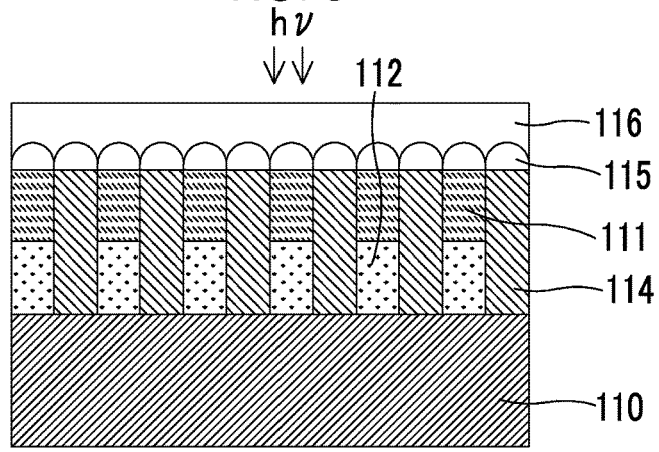
FIG. 8 is a schematic diagram showing another embodiment of the solid image pickup element according to the present invention.

In addition, in the embodiment shown in FIG. 1, the color filters 112 are provided on the incidence ray hv side compared to the infrared cut filters 111. As shown in FIG. 8, the lamination order of the infrared cut filters 111 and the color filters 112 may be reversed, and the infrared cut filters 111 may be provided on the incidence ray hv side compared to the color filters 112.

Figure 9:
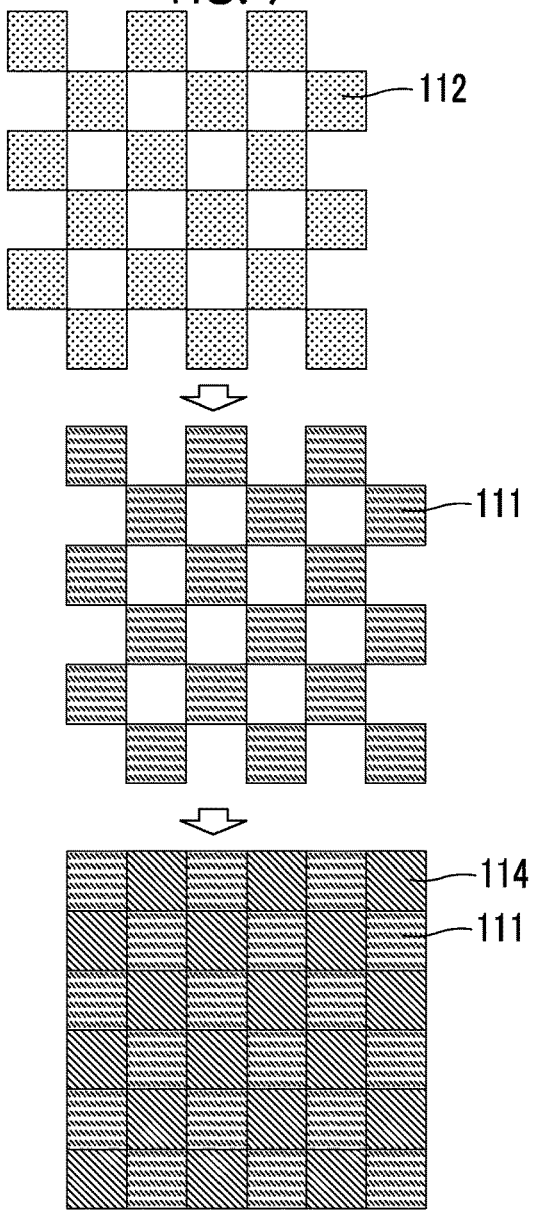
FIG. 9 is a diagram (plan view) showing a step of forming a pattern.

The infrared cut filters used in the solid image pickup element shown in FIG. 8 can be manufactured, for example, as shown in FIG. 9.

First, a coloring composition for forming the color filter is applied to the support 151 (refer to FIG. 3) to form a coloring composition layer thereon. Next, as shown in FIG. 9, the coloring composition layer is patterned to form a Bayer pattern (the color filters 112) of the coloring composition layer. The pattern forming method of the coloring composition layer may be any one of the photolithography method and the dry etching method.

Next, the infrared absorbing composition according to the present invention is applied to the Bayer pattern (the color filters 112) of the coloring composition layer to form an infrared absorbing composition layer. Next, as shown in FIG. 9, the infrared absorbing composition layer is patterned to form a Bayer pattern (the infrared cut filters 111) of the infrared absorbing composition layer on the Bayer pattern (the color filters 112) of the coloring composition layer.

Next, a composition for forming the infrared transmitting filter is applied to the films on which the infrared cut filters 111 are formed to form a composition layer thereon. Next, as shown in FIG. 9, the composition layer was patterned to form a pattern of the infrared transmitting filters 114 on a portion where the Bayer pattern of the infrared cut filters 111 is not formed.

Figure 10:
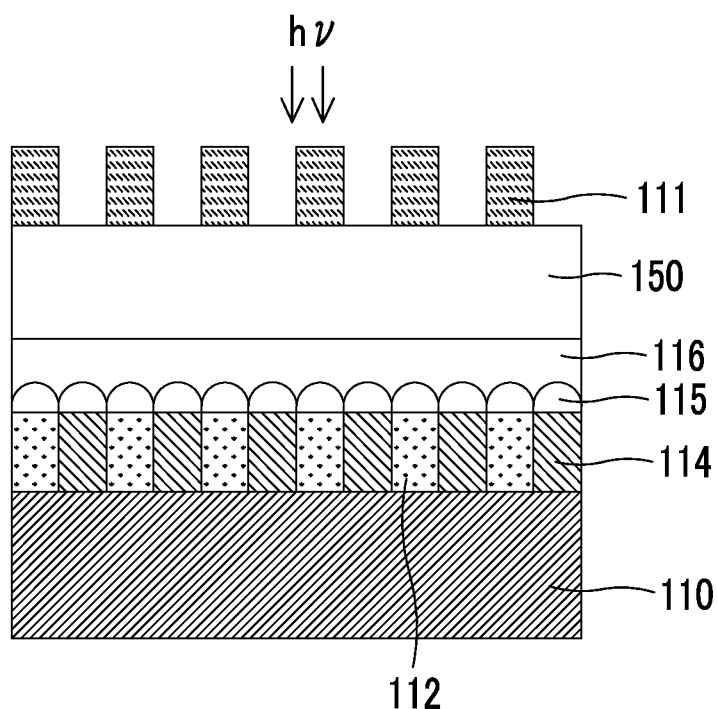
FIG. 10 is a schematic diagram showing still another embodiment of the solid image pickup element according to the present invention.

In addition, in the embodiment shown in FIG. 1, the infrared cut filters 111 and the color filters 112 are laminated adjacent to each other. However, the infrared absorbing filters 111 and the color filters 112 are not necessarily provided adjacent to each other. For example, as shown in FIG. 10, the infrared cut filters 111 may be formed on another support 150 other than the support on which the color filters 112 are formed.

As the support 150, any transparent substrate can be preferably used. The support 150 may further include the other infrared cut filter.

Figure 11:
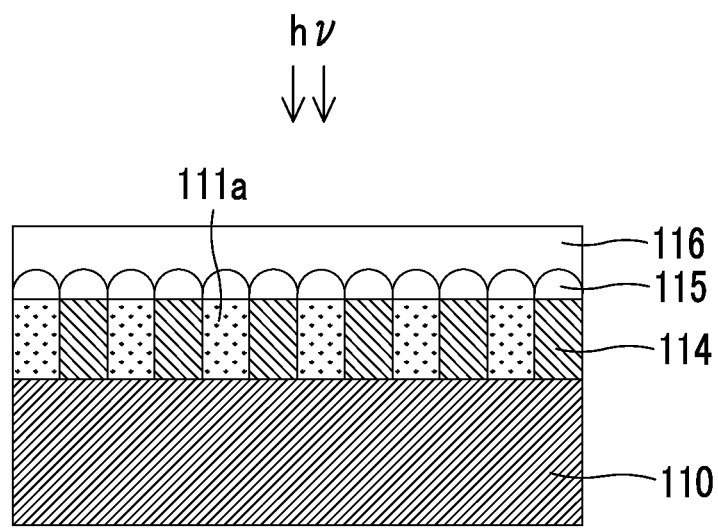
FIG. 11 is a schematic diagram showing still another embodiment of the solid image pickup element according to the present invention.

In addition, in a case where the infrared cut filters 111 further have a function as a color filter by including a chromatic colorant, the color filters 112 are not necessarily provided as shown in FIG. 11. In FIG. 11, reference numeral 111a represents an infrared cut filter including a chromatic colorant which also has a function as a color filter.

Figure 12:
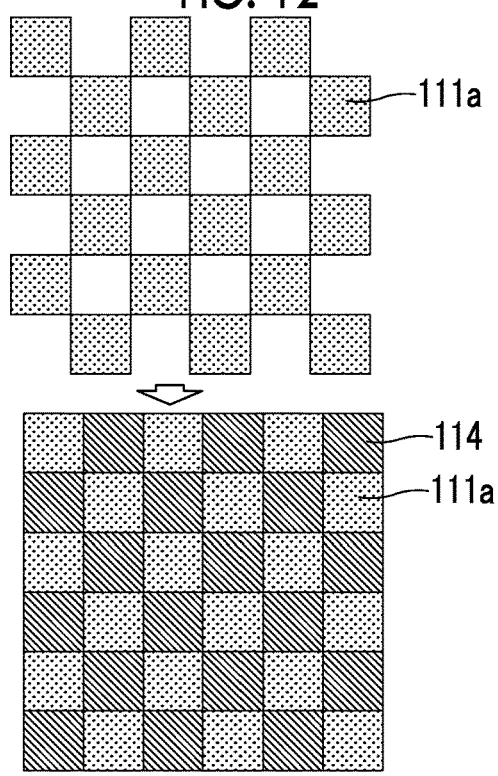
FIG. 12 is a diagram (plan view) showing a step of forming a pattern.

The infrared cut filters used in the solid image pickup element shown in FIG. 11 can be manufactured, for example, as shown in FIG. 12.

First, a composition for forming the infrared absorbing composition according to the present invention (the composition including an infrared absorber and a chromatic colorant) is applied to the support 151 (refer to FIG. 3) to form an infrared absorbing composition layer. Next, as shown in FIG. 12, the infrared absorbing composition layer is patterned to form infrared cut filters 111a. The pattern forming method of the infrared absorbing composition layer may be any one of the photolithography method and the dry etching method.

Next, a composition for forming the infrared transmitting filter is applied to the films on which the infrared cut filters 111a are formed to form a composition layer thereon. Next, as shown in FIG. 12, the composition layer is patterned to form a pattern of the infrared transmitting filters 114 on a portion where the Bayer pattern of the infrared cut filters 111a is not formed.

(Second Embodiment)

Figure 13:
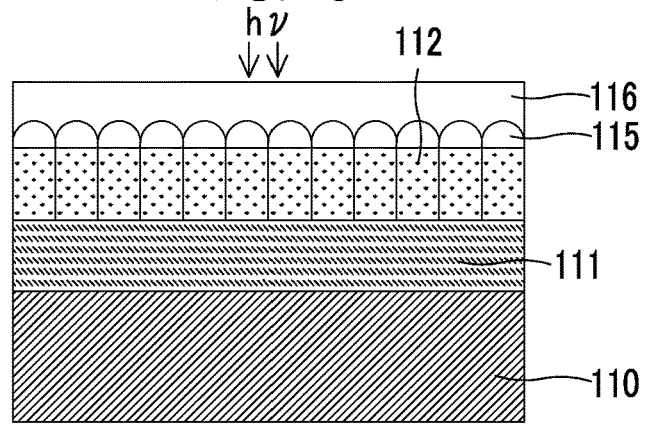
FIG. 13 is a schematic diagram showing still another embodiment of the solid image pickup element according to the present invention.

A solid image pickup element shown in FIG. 13 includes the infrared cut filter 111 and the color filters 112. In FIG. 13, reference numeral 110 represents a solid image pickup element. In an imaging region provided on the solid image pickup element 110, the infrared cut filter 111 is provided. In addition, the color filters 112 are laminated on the infrared cut filter 111. The microlenses 115 are disposed on the incidence ray hv side of the color filters 112. The planarizing layer 116 is formed so as to cover the microlenses 115. In FIG. 13, a pattern may be or may not be formed on the infrared cut filter 111.

In FIG. 13, the solid image pickup element may further include another infrared cut filter other than the infrared cut filter according to the present invention.

In addition, in the embodiment shown in FIG. 13, the color filters 112 are provided on the incidence ray hv side compared to the infrared cut filter 111. The lamination order of the infrared cut filter 111 and the color filters 112 may be reversed, and the infrared cut filter 111 may be provided on the incidence ray hv side compared to the color filters 112.

Figure 14:
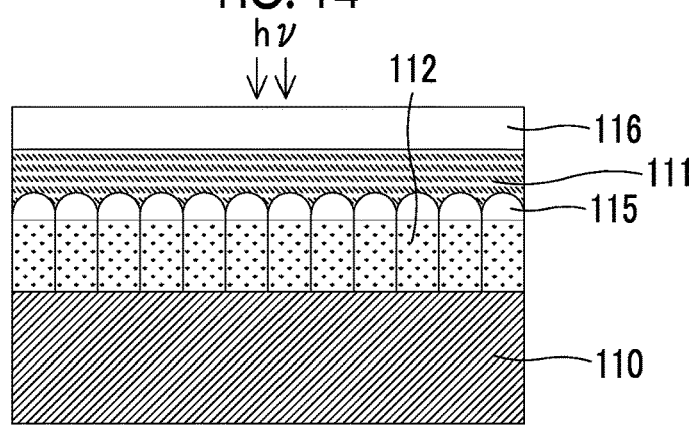
FIG. 14 is a schematic diagram showing still another embodiment of the solid image pickup element according to the present invention.

In addition, as shown in FIG. 14, the infrared cut filter 111 may be formed on the microlenses 115.

Figure 15:
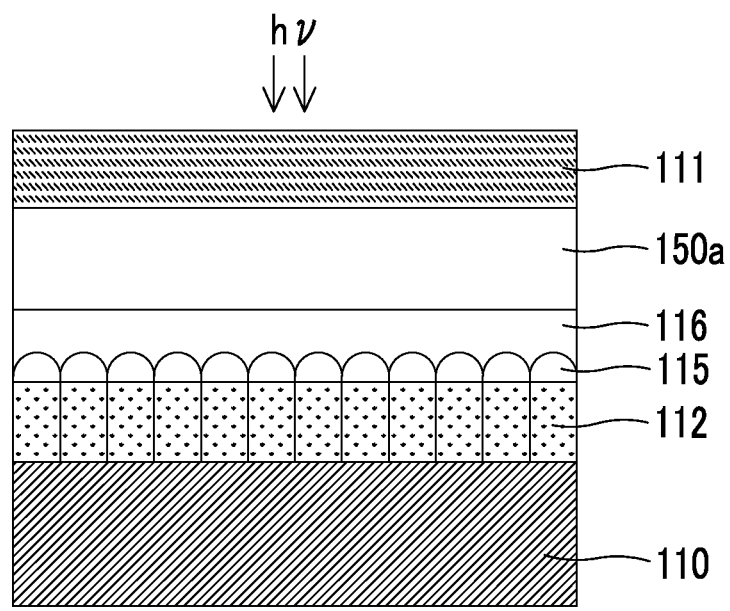
FIG. 15 is a schematic diagram showing still another embodiment of the solid image pickup element according to the present invention.

In addition, as shown in FIG. 15, the infrared cut filter 111 may be formed on another support 150a other than the support on which the color filters 112 are formed. As the support 150a, any transparent substrate can be preferably used. The support 150a may further include the other infrared cut filter.

Figure 16:
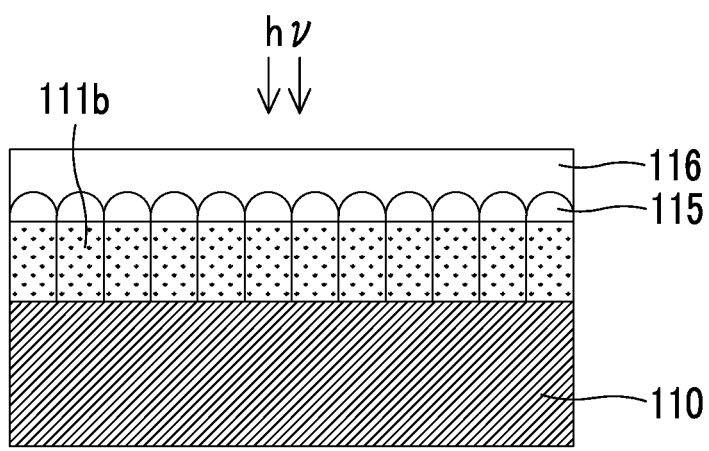
FIG. 16 is a schematic diagram showing still another embodiment of the solid image pickup element according to the present invention.

In addition, in a case where the infrared cut filter 111 further has a function as a color filter by including a chromatic colorant, the color filters 112 are not necessarily provided as shown in FIG. 16. In FIG. 16, reference numeral 111b represents an infrared cut filter including a chromatic colorant which also has a function as a color filter.

<Image Display Device>

The infrared cut filter according to the present invention can also be used in an image display device such as a liquid crystal display device or an organic electroluminescence (organic EL) display device. For example, by using the infrared cut filter in combination with the respective colored pixels (for example, red, green, blue), the infrared cut filter can be used for the purpose of shielding infrared light included in light emitted from a backlight (for example, a white light emitting diode (white LED)) of a display device to prevent a malfunction of a peripheral device, or for the purpose of forming an infrared pixel in addition to the respective color display pixels.

The definition of a display device and the details of each display device can be found in, for example, "Electronic Display Device (by Akiya Sasaki, Kogyo Chosakai Publishing Co., Ltd., 1990)" or "Display Device (Sumiaki Ibuki, Sangyo Tosho Co., Ltd., 1989). In addition, the details of a liquid crystal display device can be found in, for example, "Next-Generation Liquid Crystal Display Techniques (Edited by Tatsuo Uchida, Kogyo Chosakai Publishing Co., Ltd., 1994)". The liquid crystal display device to which the present invention is applicable is not particularly limited. For example, the present invention is applicable to various liquid crystal display devices descried in "Next-Generation Liquid Crystal Display Techniques".

The image display device may include a white organic EL element. It is preferable that the white organic EL element has a tandem structure. The tandem structure of the organic EL element is described in, for example, JP2003-45676A, or pp. 326-328 of "Forefront of Organic EL Technology Development—Know-How Collection of High Brightness, High Precision, and Long Life" (Technical Information Institute, 2008). It is preferable that a spectrum of white light emitted from the organic EL element has high maximum emission peaks in a blue range (430 nm to 485 nm), a green range (530 nm to 580 nm), and a yellow range (580 nm to 620 nm). It is more preferable that the spectrum has a maximum emission peak in a red range (650 nm to 700 nm) in addition to the above-described emission peaks.

EXAMPLES

Hereinafter, the present invention will be described in detail using examples. Materials, used amounts, ratios, treatment details, treatment procedures, and the like shown in the following examples can be appropriately changed within a range not departing from the scope of the present invention. Accordingly, the scope of the present invention is not limited to the following specific examples. Unless specified otherwise, "part(s)" and "%" represent "part(s) by mass" and "mass %".

A structure of a compound used as an infrared absorber is the same as that the compound having the chemical structure described above regarding the infrared absorber.

<Measurement of Weight-Average Molecular Weight (Mw) and Number-Average Molecular Weight (Mn)>

The weight-average molecular weight (Mw) and the number-average molecular weight (Mn) were measured using the following method.

Kind of Column: TSKgel Super HZ4000 (manufactured by Tosoh Corporation, 4.6 mm (Inner diameter)×15 cm)

Developing solvent: tetrahydrofuran

Column temperature: 40° C.

Flow rate (sample injection volume): 60 μL

Device name: High-Speed GPC (HLC-8220GPC), manufactured by Tosoh Corporation

Calibration curve base resin: polystyrene

<Measurement of Absorption Maximum of Infrared Absorber>

Each compound was dissolved in a measurement solvent to prepare a solution having a concentration of 1 g/L. Next, the solution in which the compound was dissolved was appropriately diluted with the measurement solvent such that an absorbance at an absorption maximum (maximum absorption wavelength) was in a range of 0.7 to 1.2. As a result, a measurement sample was prepared. The absorption spectrum of the measurement sample was measured using UV-1800 (manufactured by Shimadzu Corporation) to measure an absorption maximum (maximum absorption wavelength).

In the case of a compound which was soluble in chloroform, chloroform was used as the measurement solvent. In addition, in the case of a compound which was insoluble in chloroform and in which it was difficult to adjust the absorbance of the measurement sample to be in a range of 0.7 to 1.2, water was used as the measurement solvent.

(Preparation of Infrared Absorbing Composition)

The components having the following compositions were mixed and stirred, and the obtained mixture was filtered through a nylon filter (manufactured by Pall Corporation) having a pore size of 0.45 μm to prepare an infrared absorbing composition.

(Composition 1)

| Infrared absorber Dispersion 1 | 60 parts by mass |
|---|---|
| Curable compound 1 | 6 parts by mass |
| Resin 1 | 4.45 parts by mass |
| Photopolymerization Initiator 1 | 1.99 parts by mass |
| Surfactant 1 | 4.17 parts by mass |
| Polymerization Inhibitor 1 | 0.003 parts by mass |
| Propylene Glycol Methyl Ether Acetate (PGMEA) | 23.39 parts by mass |

(Composition 2)

| Infrared Absorber (compound shown in the table) | 3.29 parts by mass |
|---|---|
| Curable Compound 1 | 2.38 parts by mass |
| Resin 2 | 12.5 parts by mass |
| Photopolymerization Initiator 1 | 2.61 parts by mass |
| Surfactant 2 | 9.09 parts by mass |
| Polymerization Inhibitor 1 | 0.001 parts by mass |
| PGMEA | 70.14 parts by mass |

(Composition 3)

| Infrared Absorber (compound shown in the table) | 2.40 parts by mass |
|---|---|
| Curable Compound 2 | 6.80 parts by mass |
| Curable Compound 3 | 14.5 parts by mass |
| Pyromellitic Anhydride | 3.50 parts by mass |
| Polymerization Inhibitor 1 | 0.10 parts by mass |
| Cyclohexanone: | 72.65 parts by mass |
| Surfactant 1 | 0.05 parts by mass |

(Composition 4)

| Infrared Absorber (compound shown in the table) | 2 parts by mass |
|---|---|
| Resin 3 | 100 parts by mass |
| Curable Compound 7 | 3.2 parts by mass |
| Silica Particles (average particle size 0.8 μm) | 0.2 parts by mass |
| Surfactant 3 | 0.8 parts by mass |
| Water | added with respect to 200 parts by mass of the total amount |

(Composition 5)

| Red Pigment Dispersion | 53.9 parts by mass |
|---|---|
| Infrared Absorber (compound shown in the table) | 1.8 parts by mass |
| Resin 4 (40% PGMEA solution) | 23.1 parts by mass |
| Curable Compound 4 | 1.8 parts by mass |
| Photopolymerization Initiator 1 | 1.0 part by mass |
| Surfactant 1 | 4.2 parts by mass |
| PGMEA | 14.2 parts by mass |

(Composition 6)

| Green Pigment Dispersion | 61.4 parts by mass |
|---|---|
| Infrared Absorber (compound shown in the table) | 1.8 parts by mass |
| Resin 4 (40% PGMEA solution) | 18.2 parts by mass |
| Curable Compound 1 | 3.2 parts by mass |
| Photopolymerization Initiator 1 | 1.5 parts by mass |
| Surfactant 1 | 4.2 parts by mass |
| Ultraviolet Absorber 1 | 0.8 parts by mass |
| PGMEA | 8.9 parts by mass |

(Composition 7)

| Blue Pigment Dispersion | 47.8 parts by mass |
|---|---|
| Infrared Absorber (compound shown in the table) | 1.8 parts by mass |
| Resin 4 (40% PGMEA solution) | 16.2 parts by mass |
| Curable Compound 1 | 4.3 parts by mass |
| Curable Compound 4 | 1.8 parts by mass |
| Photopolymerization Initiator 1 | 2.2 parts by mass |
| Surfactant 1 | 4.2 parts by mass |
| PGMEA | 21.7 parts by mass |

(Composition 8)

8.04 parts by mass of the following resin A, 0.1 parts by mass of the following compound Q-39 as an infrared absorber, 0.07 parts by mass of KAYARAD DPHA (manufactured by Nippon Kayaku Co., Ltd.) as a polymerizable compound, 0.265 parts by mass of MEGAFACE RS-72-K (manufactured by DIC Corporation), 0.38 parts by mass of the following compound as a photopolymerization initiator, and 82.51 parts by mass of PGMEA as a solvent were mixed and stirred, and the obtained mixture was filtered through a nylon filter (manufactured by Pall Corporation) having a pore size of 0.5 μm to prepare an infrared absorbing composition having a composition 8.

Resin A: a resin (Mw: 41000) having the following structure

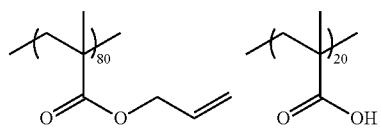

Compound Q-39: a compound (squarylium colorant, having an absorption maximum at a wavelength of 650 nm or longer) having the following structure.

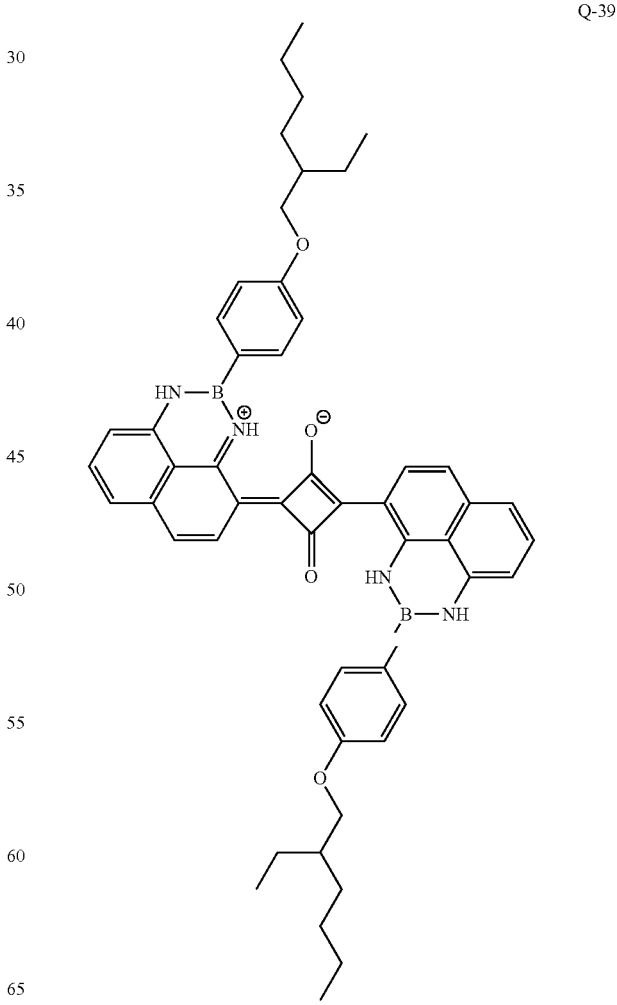

Photopolymerization initiator: the following structure

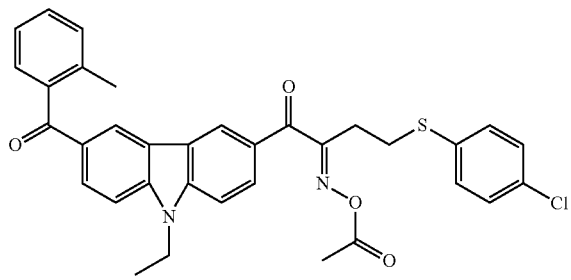 [SMILES: CCn1c2ccc(C(=O)/C(CCSc3ccc(Cl)cc3)=N/OC(C)=O)cc2c2cc(C(=O)c3ccccc3C)ccc21]

(Composition 9)

0.5 parts by mass of the following compound C-15 was dissolved in 69.5 parts by mass of ion exchange water, 30.0 parts by mass of a gelatin 10 mass % aqueous solution was further added, 0.3 parts by mass of 1,3-divinylsulfonyl-2-propanol as a hardening agent was further added, and the components were stirred. As a result, an infrared absorbing composition having a composition 9 was prepared.

Compound C-15: a compound (cyanine colorant, having an absorption maximum at a wavelength of 650 nm or longer) having the following structure.

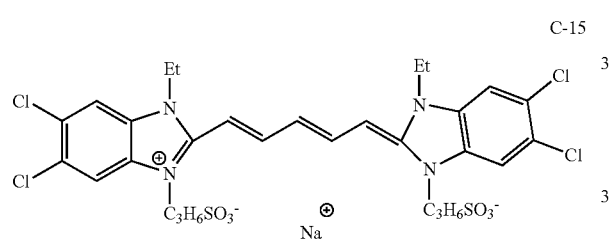

C-15

(Composition 10)

An infrared absorbing composition having a composition 10 was prepared using the same method as that of the composition 9, except that the following compound 31 was used instead of the compound C-15.

Compound 31: a compound (cyanine colorant, having an absorption maximum at a wavelength of 650 nm or longer) having the following structure.

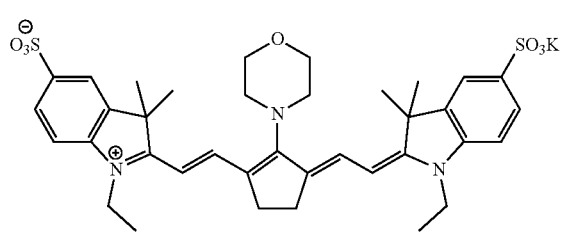

31

(Composition 11)

An infrared absorbing composition having a composition 11 was prepared using the same method as that of the composition 8, except that the following compound 101 was used instead of the compound Q-39.

Compound 101: a compound (squarylium colorant, having an absorption maximum at a wavelength of 650 nm or longer) having the following structure.

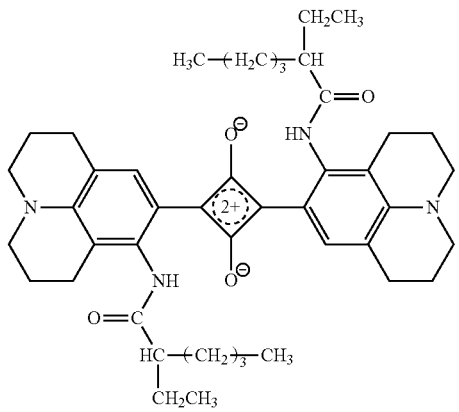

101

(Composition 12)

An infrared absorbing composition having a composition 12 was prepared using the same method as that of the composition 8, except that the following compound 102 was used instead of the compound Q-39.

Compound 102: a compound (squarylium colorant, having an absorption maximum at a wavelength of 650 nm or longer) having the following structure.

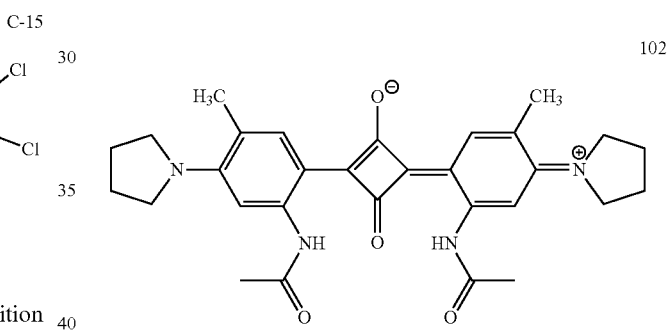

102

(Composition 13)

An infrared absorbing composition having a composition 13 was prepared using the same method as that of the composition 8, except that the following compound 103 was used instead of the compound Q-39.

Compound 103: a compound (squarylium colorant, having an absorption maximum at a wavelength of 650 nm or longer) having the following structure.

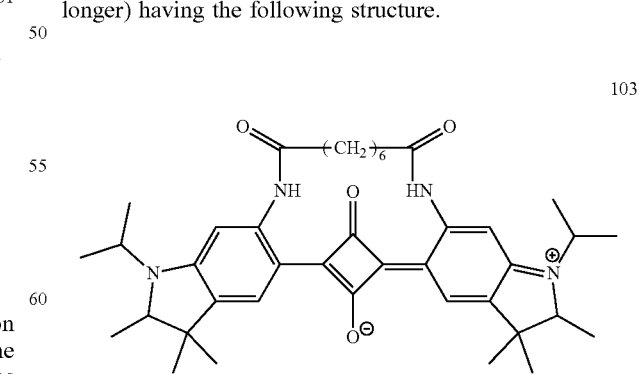

103

(Composition 14)

An infrared absorbing composition having a composition 14 was prepared using the same method as that of the composition 8, except that the following compound 104 was used instead of the compound Q-39.

Compound 104: a compound (squarylium colorant, having an absorption maximum at a wavelength of 650 nm or longer) having the following structure.

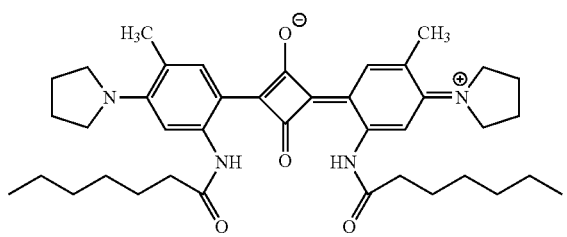

104

(Composition 15)

An infrared absorbing composition having a composition 15 was prepared using the same method as that of the composition 8, except that the following compound 105 was used instead of the compound Q-39.

Compound 105: a compound (squarylium colorant, having an absorption maximum at a wavelength of 650 nm or longer) having the following structure.

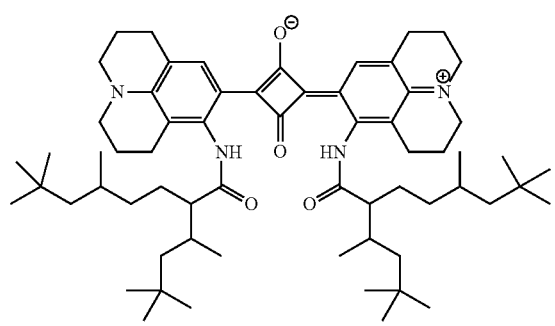

105

(Composition 16)

An infrared absorbing composition having a composition 16 was prepared using the same method as that of the composition 8, except that the following compound 106 was used instead of the compound Q-39.

Compound 106: a compound (squarylium colorant, having an absorption maximum at a wavelength of 650 nm or longer) having the following structure.

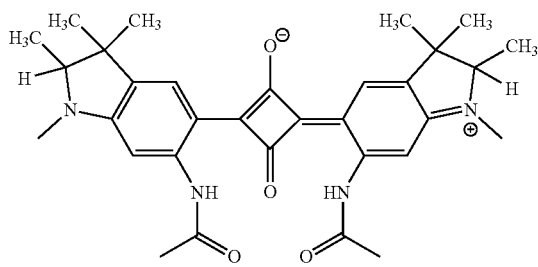

106

(Composition 17)

An infrared absorbing composition having a composition 17 was prepared using the same method as that of the composition 8, except that the following compound 108 was used instead of the compound Q-39.

Compound 108: a compound (cyanine colorant, having an absorption maximum at a wavelength of 650 nm or longer) having the following structure.

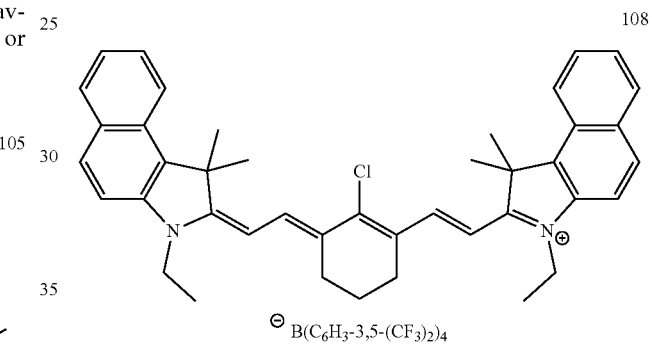

108

(Composition 18)

An infrared absorbing composition having a composition 18 was prepared using the same method as that of the composition 8, except that the following compound 109 was used instead of the compound Q-39.

Compound 109: a compound (cyanine colorant, having an absorption maximum at a wavelength of 650 nm or longer) having the following structure.

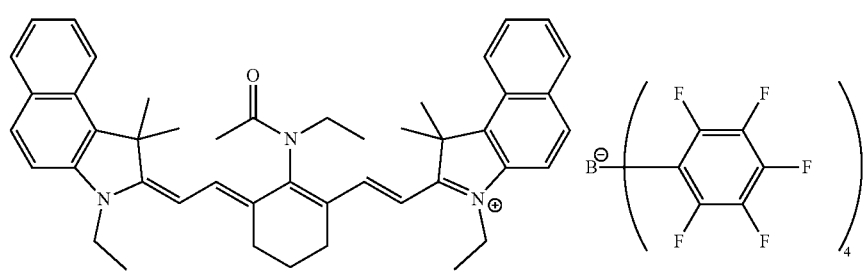

109

(Composition 19)

An infrared absorbing composition having a composition 19 was prepared using the same method as that of the composition 8, except that the following compound 110 was used instead of the compound Q-39.

Compound 110: a compound (cyanine colorant, having an absorption maximum at a wavelength of 650 nm or longer) having the following structure.

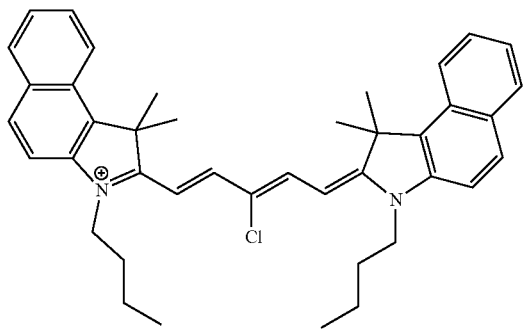

(Composition 20)

An infrared absorbing composition having a composition 20 was prepared using the same method as that of the composition 8, except that the following compound 111 was used instead of the compound Q-39.

Compound 111: a compound (squarylium colorant, having an absorption maximum at a wavelength of 650 nm or longer) having the following structure.

111

(Composition 21)

An infrared absorbing composition having a composition 21 was prepared using the same method as that of the composition 8, except that the following compound 112 was used instead of the compound Q-39.

Compound 112: a compound (squarylium colorant, having an absorption maximum at a wavelength of 650 nm or longer) having the following structure.

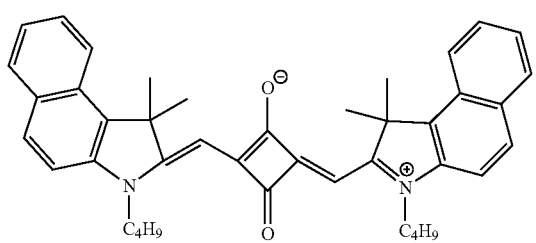

(Composition 22)

An infrared absorbing composition having a composition 22 was prepared using the same method as that of the

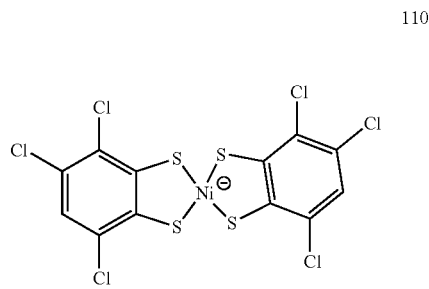

composition 9, except that the following compound 113 was used instead of the compound C-1539.

Compound 113: a compound (cyanine colorant, having an absorption maximum at a wavelength of 650 nm or longer) having the following structure.

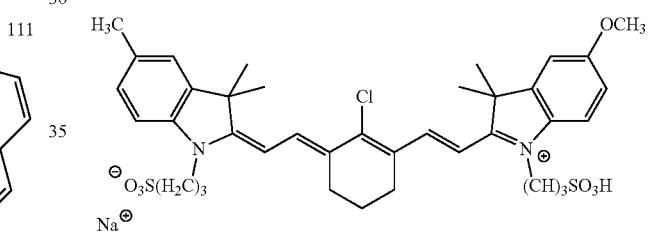

(Composition 23)

An infrared absorbing composition having a composition 23 was prepared using the same method as that of the composition 8, except that the following compound 114 was used instead of the compound Q-39.

Compound 114: a compound (cyanine colorant, having an absorption maximum at a wavelength of 650 nm or longer) having the following structure.

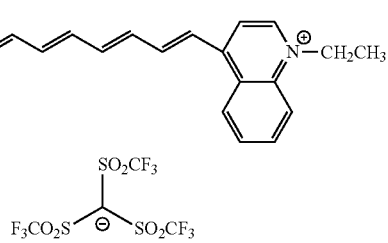

(Composition 24)

An infrared absorbing composition having a composition 24 was prepared using the same method as that of the composition 8, except that the following compound 115 was used instead of the compound Q-39.

Compound 115: a compound (cyanine colorant, having an absorption maximum at a wavelength of 650 nm or longer) having the following structure.

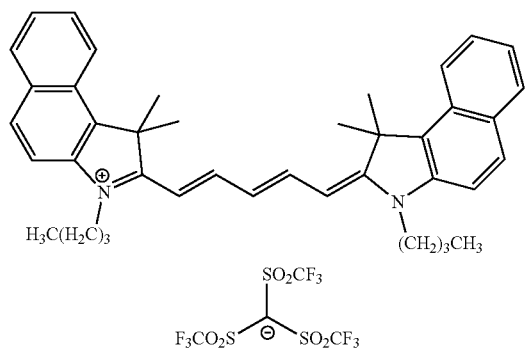

115

(Composition 25)

An infrared absorbing composition having a composition 25 was prepared using the same method as that of the composition 8, except that the following compound 116 was used instead of the compound Q-39.

Compound 116: a compound (cyanine colorant, having an absorption maximum at a wavelength of 650 nm or longer) having the following structure.

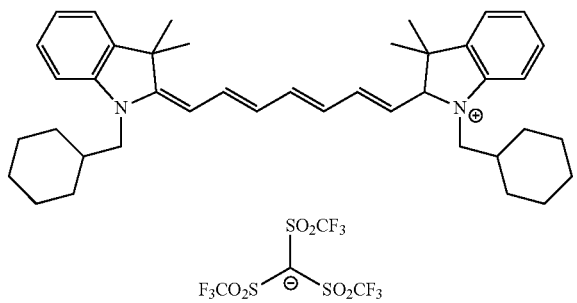

116

(Composition 26)

An infrared absorbing composition having a composition 26 was prepared using the same method as that of the composition 8, except that the following compound 117 was used instead of the compound Q-39.

Compound 117: a compound (cyanine colorant, having an absorption maximum at a wavelength of 650 nm or longer) having the following structure.

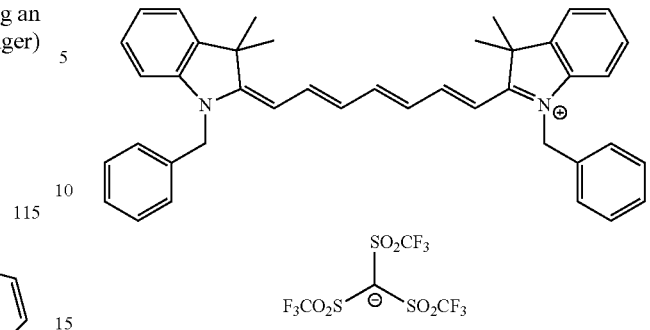

117

(Composition 27)

An infrared absorbing composition having a composition 27 was prepared using the same method as that of the composition 8, except that the following compound 118 was used instead of the compound Q-39.

Compound 118: a compound (cyanine colorant, having an absorption maximum at a wavelength of 650 nm or longer) having the following structure.

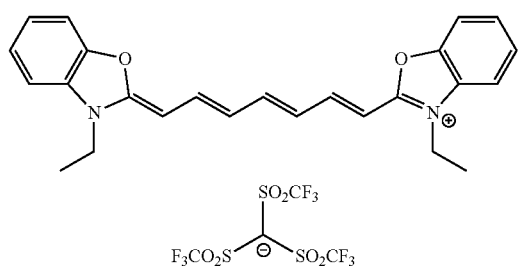

118

(Composition 28)

An infrared absorbing composition having a composition 28 was prepared using the same method as that of the composition 8, except that ARTON F4520 (manufactured by JSR Corporation) was used instead of the resin A.

(Composition 29)

50.0 parts by mass of a random polymer having a glycidyl methacrylate skeleton (MARPROOF G-0150M, manufactured by NOF Corporation, weight-average molecular weight: 10000) as an epoxy resin and 100 parts by mass of methyl ethyl ketone were added and stirred at 20° C. to 35° C. for 2 hours to dissolve the components. Next, 0.500 parts by mass of a compound 119 (maximum absorption wavelength (absorption maximum) in chloroform=831 nm; refer to JP2008-88426A) and 0.250 parts by mass of a compound 120 (maximum absorption wavelength (absorption maximum) in chloroform=758 nm; refer to JP2008-88426A) as infrared absorbers were added and stirred at 20° C. to 35° C. to be homogeneous. Further, 0.500 parts by mass (1 part by mass with respect to 100 parts by mass of the epoxy resin) of butanedioic acid as an epoxy resin curing agent was added, and the components were stirred at 20° C. to 35° C. for 1 hour. As a result, an infrared absorbing composition having a composition 29 was prepared.

Compounds 119 and 120: compounds (cyanine colorants, having an absorption maximum at a wavelength of 650 nm or longer) having the following structures

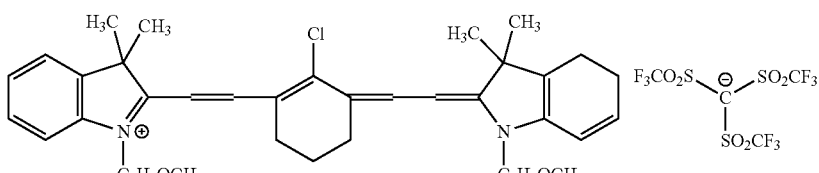

119

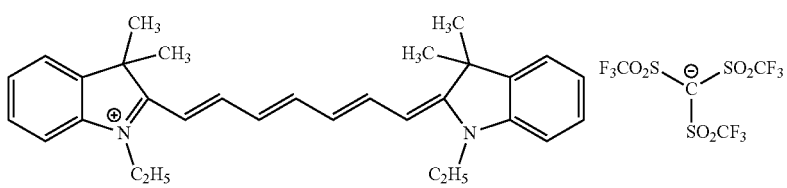

120

(Preparation of Red Composition)

The following components were mixed and stirred, and the obtained mixture was filtered through a nylon filter (manufactured by Pall Corporation) having a pore size of 0.45 μm to prepare a Red composition.

| Red Pigment Dispersion | 51.7 parts by mass |
|---|---|
| Resin 4 (40% PGMEA solution) | 0.6 parts by mass |
| Curable Compound 4 | 0.6 parts by mass |
| Photopolymerization Initiator 1 | 0.3 parts by mass |
| Surfactant 1 | 4.2 parts by mass |
| PGMEA | 42.6 parts by mass |

(Preparation of Green Composition)

The following components were mixed and stirred, and the obtained mixture was filtered through a nylon filter (manufactured by Pall Corporation) having a pore size of 0.45 μm to prepare a Green composition.

| Green Pigment Dispersion | 73.7 parts by mass |
|---|---|
| Resin 4 (40% PGMEA solution) | 0.3 parts by mass |
| Curable Compound 1 | 1.2 parts by mass |
| Photopolymerization Initiator 1 | 0.6 parts by mass |
| Surfactant 1 | 4.2 parts by mass |
| Ultraviolet Absorber 1 | 0.5 parts by mass |
| PGMEA | 19.5 parts by mass |

(Preparation of Blue Composition)

The following components were mixed and stirred, and the obtained mixture was filtered through a nylon filter (manufactured by Pall Corporation) having a pore size of 0.45 μm to prepare a Blue composition.

| Blue Pigment Dispersion | 44.9 parts by mass |
|---|---|
| Resin 4 (40% PGMEA solution) | 2.1 parts by mass |
| Curable Compound 1 | 1.5 parts by mass |
| Curable Compound 4 | 0.7 parts by mass |
| Photopolymerization Initiator 1 | 0.8 parts by mass |
| Surfactant 1 | 4.2 parts by mass |
| PGMEA | 45.8 parts by mass |

(Preparation of Composition for Forming Infrared Transmitting Filter)

The components having the following compositions were mixed and stirred, and the obtained mixture was filtered through a nylon filter (manufactured by Pall Corporation) having a pore size of 0.45 μm to prepare a composition for forming a infrared transmitting filter.

(Composition 100)

| Pigment Dispersion 1-1 | 46.5 parts by mass |
|---|---|
| Pigment Dispersion 1-2 | 37.1 parts by mass |
| Curable Compound 5 | 1.8 parts by mass |
| Resin 4 | 1.1 parts by mass |
| Photopolymerization Initiator 2 | 0.9 parts by mass |
| Surfactant 1 | 4.2 parts by mass |
| Polymerization Inhibitor 1 | 0.001 parts by mass |
| Substrate Adhesive | 0.6 parts by mass |
| PGMEA | 7.8 parts by mass |

(Composition 101)

| Pigment Dispersion 2-1 | 22.67 parts by mass |
|---|---|
| Pigment Dispersion 3-1 | 11.33 parts by mass |
| Pigment Dispersion 3-2 | 22.67 parts by mass |
| Pigment Dispersion 3-3 | 10.34 parts by mass |
| Pigment Dispersion 3-4 | 6.89 parts by mass |
| Curable Compound 6 | 1.37 parts by mass |
| Resin 2 | 3.52 parts by mass |
| Photopolymerization Initiator 1 | 0.86 parts by mass |
| Surfactant 1 | 0.42 parts by mass |
| Polymerization Inhibitor 1 | 0.001 parts by mass |
| PGMEA | 19.93 parts by mass |

Materials used for preparing the infrared absorbing compositions, the Red composition, the Green composition, the Blue composition, and the composition for forming an infrared transmitting filter are as follows.

Infrared Absorber Dispersion 1

13 parts by mass of an infrared absorber (the compound Q-56, Q-62, C-11, C-15, C-21, C-34, C-36, or O-6), 7.8 parts by mass of a resin 6, 109 parts by mass of PGMEA, and 520 parts by mass of zirconia beads having a diameter of 0.5 mm were dispersed using a paint shaker for 30 minutes. Next, the dispersion was filtered through DFA4201NXEY (a 0.45 μm nylon filter, manufactured by Pall Corporation) to separate the beads by filtration. As a result, an infrared absorber dispersion 1 was prepared.

Red Pigment Dispersion 9.6 parts by mass of C.I. Pigment Red 254, 4.3 parts by mass of C.I. Pigment Yellow 139, 6.8 parts by mass of a dispersant (BYK-161 (manufactured by BYK)), and 79.3 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO- 3000-10 (manufactured by Nippon BEE Chemical Co., Ltd.) equipped with a pressure reducing mechanism, the pigment dispersion was further dispersed under a pressure of 2000 kg/cm$^3$ at a flow rate of 500 g/min. This dispersing treatment was repeated 10 times. As a result, a Red pigment dispersion was obtained.

Green Pigment Dispersion 6.4 parts by mass of C.I. Pigment Green 36, 5.3 parts by mass of C.I. Pigment Yellow 150, 5.2 parts by mass of a dispersant (BYK-161 (manufactured by BYK)), 83.1 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2000 kg/cm$^3$ at a flow rate of 500 g/min. This dispersing treatment was repeated 10 times. As a result, a Green pigment dispersion was obtained.

Blue Pigment Dispersion 9.7 parts by mass of C.I. Pigment Blue 15:6, 2.4 parts by mass of C.I. Pigment Violet 23, 5.5 parts by mass of a dispersant (BYK-161 (manufactured by BYK)), 82.4 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2000 kg/cm$^3$ at a flow rate of 500 g/min. This dispersing treatment was repeated 10 times. As a result, a Blue pigment dispersion was obtained.

Pigment Dispersion 1-1

A mixed solution having a composition shown below was mixed and dispersed for 3 hours using a beads mill (a high-pressure dispersing machine with a pressure reducing mechanism, NANO-3000-10 (manufactured by Nippon BEE Chemical Co., Ltd.)) in which zirconia beads having a diameter of 0.3 mm were used. As a result, Pigment Dispersion 1-1 was prepared.

| | |
|---|---|
| Mixed pigment including a red pigment (C.I. Pigment Red 254) and a yellow pigment (C.I. Pigment Yellow 139) | 11.8 parts by mass |
| Resin (BYK-111, manufactured by BYK) | 9.1 parts by mass |
| PGMEA | 79.1 parts by mass |

Pigment Dispersion 1-2

A mixed solution having a composition shown below was mixed and dispersed for 3 hours using a beads mill (a high-pressure dispersing machine with a pressure reducing mechanism, NANO-3000-10 (manufactured by Nippon BEE Chemical Co., Ltd.)) in which zirconia beads having a diameter of 0.3 mm were used. As a result, Pigment Dispersion 1-2 was prepared.

| | |
|---|---|
| Mixed pigment including a blue pigment (C.I. Pigment Blue 15:6) and a violet pigment (C.I. Pigment Violet 23) | 12.6 parts by mass |
| Resin (BYK-111, manufactured by BYK) | 2.0 parts by mass |
| Resin 10 | 3.3 parts by mass |
| Cyclohexanone | 31.2 parts by mass |
| PGMEA | 50.9 parts |

Resin 10: a resin having the following structure (A ratio in a repeating unit is a molar ratio; Mw = 14000)

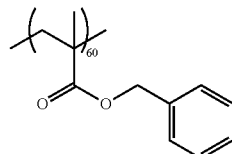

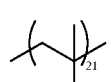

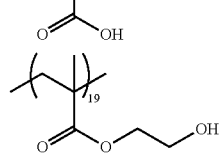

Pigment Dispersion 2-1

A mixed solution having the following composition was mixed and dispersed using a beads mill (a high-pressure dispersing machine with a pressure reducing mechanism, NANO-3000-10 (manufactured by Nippon BEE Chemical Co., Ltd.)), with zirconia beads having a diameter of 0.3 mm, until an average particle size (secondary particles) of an pyrrolopyrrole pigment was 75 nm or less. As a result, a pigment dispersion was prepared. The volume average particle size of a pigment in the pigment dispersion was measured using MICROTRAC UPA 150 (manufactured by Nikkiso Co., Ltd.).

| | |
|---|---|
| Pyrrolopyrrole Pigment | 13.5 parts by mass |
| Resin (BYK-111, (manufactured by BYK)) | 4 parts by mass |
| PGMEA | 82.5 parts by mass |

Pyrrolopyrrole Pigment: the following structure

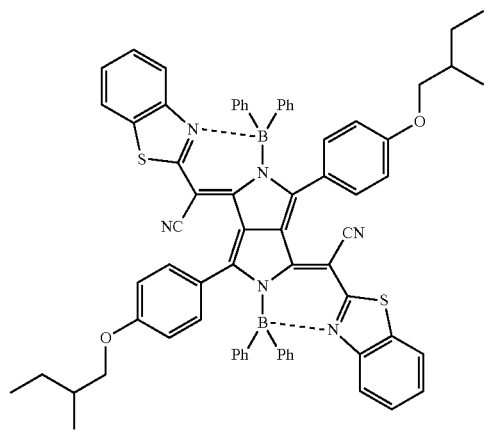

Pigment Dispersion 3-1

A mixed solution having a composition shown below was mixed and dispersed using a beads mill (a high-pressure dispersing machine with a pressure reducing mechanism, NANO-3000-10 (manufactured by Nippon BEE Chemical Co., Ltd.)) with zirconia beads having a diameter of 0.3 mm. This way, pigment dispersions were prepared.

| | |
|---|---|
| C.I. Pigment Red 254 | 13.5 parts by mass |
| Resin 11 | 2 parts by mass |
| Resin 12 | 2 parts by mass |
| PGMEA | 82.5 parts by mass |

Resin 11: the following structure (Mw: 7950)

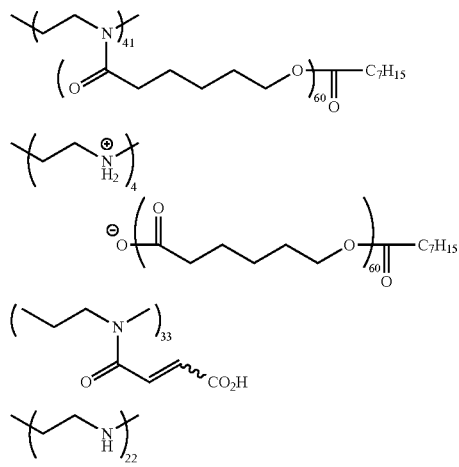

Resin 12: the following structure (Mw: 12000)

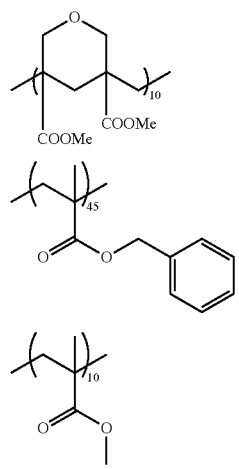

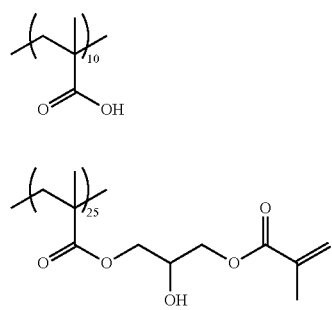

Pigment Dispersion 3-2

A mixed solution having a composition shown below was mixed and dispersed using a beads mill (a high-pressure dispersing machine with a pressure reducing mechanism, NANO-3000-10 (manufactured by Nippon BEE Chemical Co., Ltd.)) with zirconia beads having a diameter of 0.3 mm. This way, pigment dispersions were prepared.

| | |
|---|---|
| C.I. Pigment Blue 15:6 | 13.5 parts by mass |
| Resin 13 | 4 parts by mass |
| PGMEA | 82.5 parts by mass |

Resin 13: the following structure (Mw: 30000)

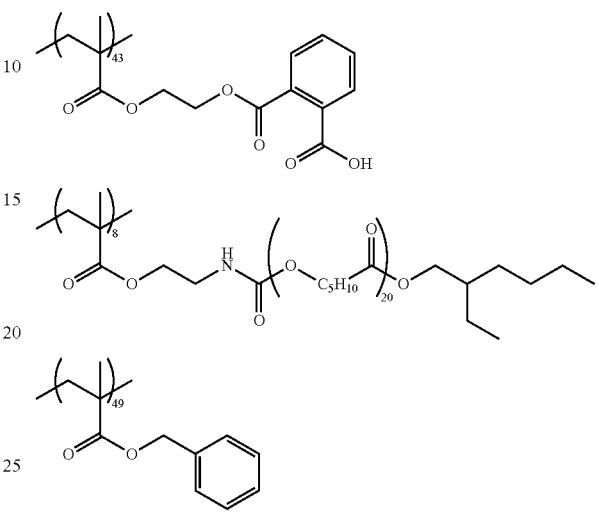

Pigment Dispersion 3-3

A mixed solution having a composition shown below was mixed and dispersed using a beads mill (a high-pressure dispersing machine with a pressure reducing mechanism, NANO-3000-10 (manufactured by Nippon BEE Chemical Co., Ltd.)) with zirconia beads having a diameter of 0.3 mm. This way, pigment dispersions were prepared.

| | |
|---|---|
| C.I. Pigment Yellow 139 | 14.8 parts by mass |
| Resin (BYK-111, (manufactured by BYK)) | 3 parts by mass |
| Resin 12 | 2.2 parts by mass |
| PGMEA | 80 parts by mass |

Pigment Dispersion 3-4

A mixed solution having a composition shown below was mixed and dispersed using a beads mill (a high-pressure dispersing machine with a pressure reducing mechanism, NANO-3000-10 (manufactured by Nippon BEE Chemical Co., Ltd.)) with zirconia beads having a diameter of 0.3 mm. This way, pigment dispersions were prepared.

| | |
|---|---|
| C.I. Pigment Violet 23 | 14.8 parts by mass |
| Resin (BYK-111, (manufactured by BYK)) | 3 parts by mass |
| Resin 12 | 2.2 parts by mass |
| PGMEA | 80 parts by mass |

Curable Compound 1: KAYARAD DPHA (manufactured by Nippon Kayaku Co., Ltd.)

Curable Compound 2: a polymer (Mw=13300, dispersity Mw/Mn=2.26) having the following structure synthesized using a method described paragraph "0104" of JP2015-17244A

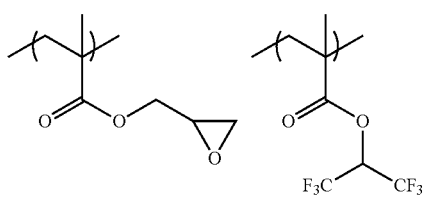

Curable Compound 3: EHPE 3150 (manufactured by Daicel Corporation)

Curable Compound 4 . . . the following structure

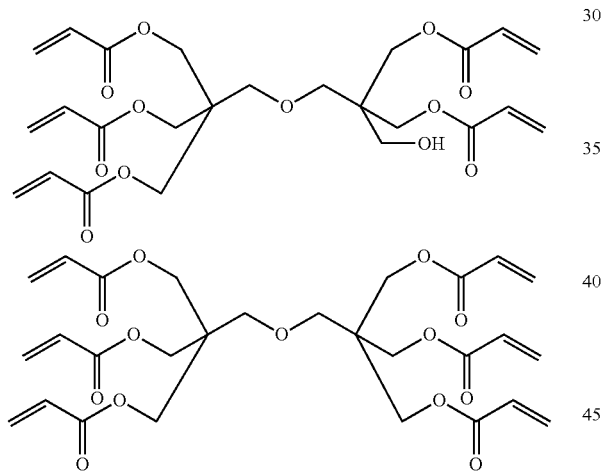

Curable Compound 5: the following structures (a mixture in which a molar ratio between a left compound and a right compound is 7:3)

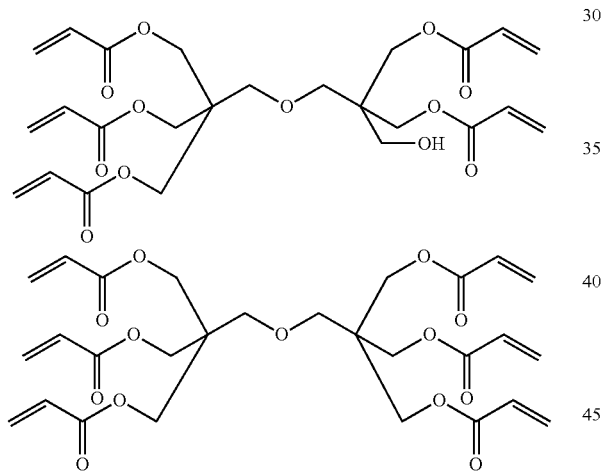

Curable Compound 6: M-305 (including 55 to 63 mass % of triacrylate; manufactured by Toagosei Co., Ltd.)
Curable Compound 7: DENACOL EX-614B (manufactured by Nagase ChemteX Corporation)
Resin 1: CYCLOMER P(ACA)230AA (manufactured by Daicel Corporation)
Resin 2: the following structure (Mw: 40000)

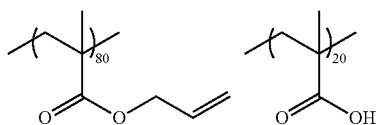

Resin 3: JURYMER ET410 (manufactured by Nihon Junyaku Co., Ltd., an aqueous acrylic resin dispersion, solid content: 30%)
Resin 4: the following structure (acid value: 70 mgKOH/g, Mw=11000)

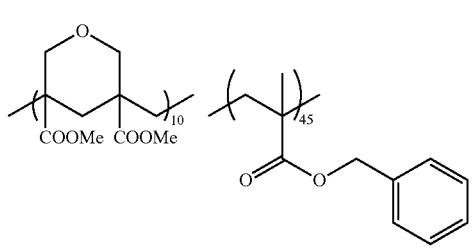

-continued

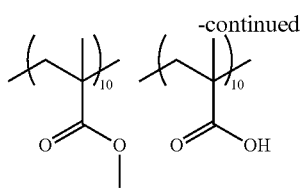

Photopolymerization Initiator 1: IRGACURE-OXE 01 (manufactured by BASF SE)
Photopolymerization initiator 2: the following structure

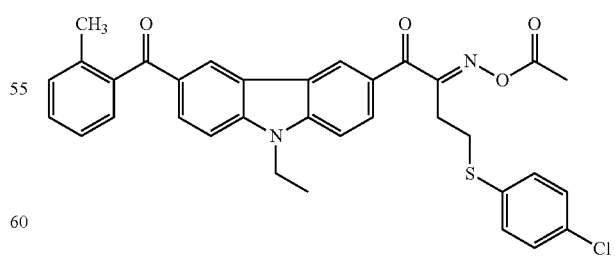

Surfactant 1: the following mixture (Mw: 14000, 1% PGMEA solution)

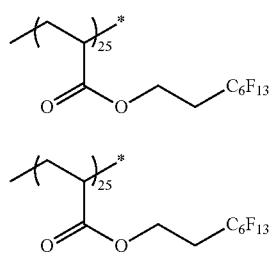
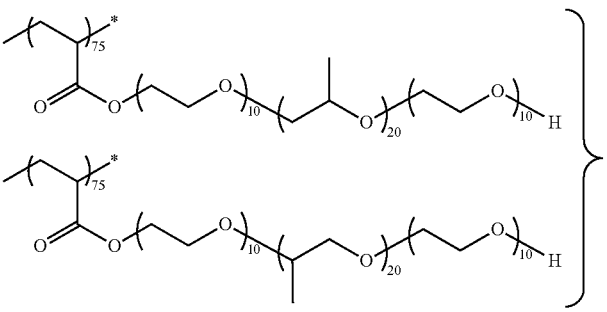

Surfactant 2: MEGAFACE RS-72-K (manufactured by DIC Corporation, 30% PGMEA solution)

Surfactant 3: SANDET BL (manufactured by Sanyo Chemical Industries Ltd., an anionic surfactant, solid content: 45%)

Substrate Adhesive: the following structure

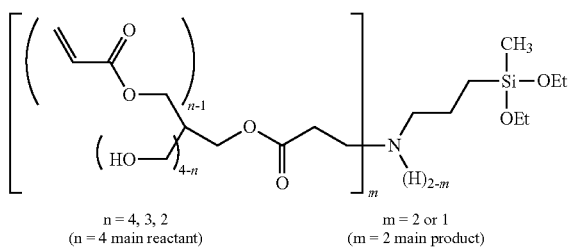

n = 4, 3, 2 (n = 4 main reactant)  m = 2 or 1 (m = 2 main product)

Polymerization Inhibitor 1: p-methoxyphenol
Ultraviolet Absorber: the following structure

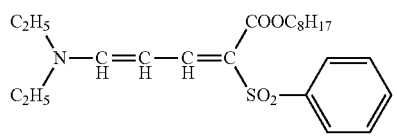

(Pattern Formation)
Forming Method (1)

The infrared absorbing composition was applied to a silicon wafer using a spin coating method such that the thickness of the formed film was 1.0 µm. Next, the silicon wafer was heated using a hot plate at 100° C. for 2 minutes. Next, the silicon wafer was heated using a hot plate at 200° C. for 5 minutes. Next, a 2 µm Bayer pattern (infrared cut filter) was formed using a dry etching method.

Next, the Red composition was applied to the Bayer pattern of the infrared cut filter using a spin coating method such that the thickness of the formed film was 1.0 µm. Next, the silicon wafer was heated using a hot plate at 100° C. for 2 minutes. Next, using an i-ray stepper exposure device FPA-3000 i5+ (manufactured by Canon Corporation) at 1000 mJ/cm$^2$, a 2 µm dot pattern was exposed through a mask at 1000 mJ/cm$^2$. Next, puddle development was performed at 23° C. for 60 seconds using a tetramethylammonium hydroxide (TMAH) 0.3 mass % aqueous solution. Next, the silicon wafer was rinsed by spin showering and was washed with pure water. Next, the silicon wafer was heated using a hot plate at 200° C. for 5 minutes. As a result, the Red composition was patterned on the Bayer pattern of the infrared cut filter. Likewise, the Green composition and the Blue composition were sequentially patterned to form red, green, and blue color patterns.

Next, the composition for forming an infrared transmitting filter (the composition 100 or the composition 101) was applied to the pattern-formed film using a spin coating method such that the thickness of the formed film was 2.0 µm. Next, the silicon wafer was heated using a hot plate at 100° C. for 2 minutes. Next, using an i-ray stepper exposure device FPA-3000 i5+ (manufactured by Canon Corporation) at 1000 mJ/cm$^2$, a 2 µm Bayer pattern was exposed through a mask at 1000 mJ/cm$^2$. Next, puddle development was performed at 23° C. for 60 seconds using a tetramethylammonium hydroxide (TMAH) 0.3 mass % aqueous solution. Next, the silicon wafer was rinsed by spin showering and was washed with pure water. Next, the silicon wafer was heated using a hot plate at 200° C. for 5 minutes. As a result, the infrared transmitting filter was patterned on a portion where the Bayer pattern of the infrared cut filter was not formed. This filter was incorporated into a solid image pickup element using a well-known method.

Forming Method (2)

The infrared absorbing composition was applied to a silicon wafer using a spin coating method such that the thickness of the formed film was 1.0 µm. Next, the silicon wafer was heated using a hot plate at 100° C. for 2 minutes. Next, using an i-ray stepper exposure device FPA-3000 i5+ (manufactured by Canon Corporation) at 1000 mJ/cm$^2$, a 2 µm Bayer pattern was exposed through a mask at 1000 mJ/cm$^2$.

Next, puddle development was performed at 23° C. for 60 seconds using a tetramethylammonium hydroxide (TMAH) 0.3 mass % aqueous solution. Next, the silicon wafer was rinsed by spin showering and was washed with pure water. Next, the silicon wafer was heated using a hot plate at 200° C. for 5 minutes. As a result, a 2 µm Bayer pattern (infrared cut filter) was formed.

Next, the Red composition was applied to the Bayer pattern of the infrared cut filter using a spin coating method such that the thickness of the formed film was 1.0 µm. Next, the silicon wafer was heated using a hot plate at 100° C. for 2 minutes. Next, using an i-ray stepper exposure device FPA-3000 i5+ (manufactured by Canon Corporation) at 1000 mJ/cm$^2$, a 2 µm dot pattern was exposed through a mask at 1000 mJ/cm$^2$. Next, puddle development was performed at 23° C. for 60 seconds using a tetramethylammonium hydroxide (TMAH) 0.3 mass % aqueous solution. Next, the silicon wafer was rinsed by spin showering and was washed with pure water. Next, the silicon wafer was heated using a hot plate at 200° C. for 5 minutes. As a result, the Red composition was patterned on the Bayer pattern of the infrared cut filter. Likewise, the Green composition and the Blue composition were sequentially patterned to form red, green, and blue color patterns.

Next, the composition for forming an infrared transmitting filter (the composition 100 or the composition 101) was applied to the pattern-formed film using a spin coating method such that the thickness of the formed film was 2.0 µm. Next, the silicon wafer was heated using a hot plate at 100° C. for 2 minutes. Next, using an i-ray stepper exposure device FPA-3000 i5+ (manufactured by Canon Corporation) at 1000 mJ/cm$^2$, a 2 µm Bayer pattern was exposed through a mask at 1000 mJ/cm$^2$. Next, puddle development was performed at 23° C. for 60 seconds using a tetramethylammonium hydroxide (TMAH) 0.3 mass % aqueous solution. Next, the silicon wafer was rinsed by spin showering and was washed with pure water. Next, the silicon wafer was heated using a hot plate at 200° C. for 5 minutes. As a result, the infrared transmitting filter was patterned on a portion where the Bayer pattern of the infrared cut filter was not formed. This filter was incorporated into a solid image pickup element using a well-known method.

Forming Method (3)

The Red composition was applied to a silicon wafer using a spin coating method such that the thickness of the formed film was 1.0 µm. Next, the silicon wafer was heated using a hot plate at 100° C. for 2 minutes. Next, using an i-ray stepper exposure device FPA-3000 i5+ (manufactured by Canon Corporation) at 1000 mJ/cm$^2$, a 2 µm dot pattern was exposed through a mask at 1000 mJ/cm$^2$. Next, puddle development was performed at 23° C. for 60 seconds using a tetramethylammonium hydroxide (TMAH) 0.3 mass % aqueous solution. Next, the silicon wafer was rinsed by spin showering and was washed with pure water. Next, the silicon wafer was heated using a hot plate at 200° C. for 5 minutes to obtain a 2 µm dot pattern. Likewise, the Green composition and the Blue composition were sequentially patterned to form red, green, and blue color patterns.

The infrared absorbing composition was applied to the red, green, and blue color patterns using a spin coating method such that the thickness of the formed film was 1.0 µm. Next, the silicon wafer was heated using a hot plate at 100° C. for 2 minutes. Next, the silicon wafer was heated using a hot plate at 200° C. for 5 minutes. Next, a 2 µm Bayer pattern (infrared cut filter) was formed using a dry etching method.

Next, the composition for forming an infrared transmitting filter (the composition 100 or the composition 101) was applied to the pattern-formed film using a spin coating method such that the thickness of the formed film was 2.0 µm. Next, the silicon wafer was heated using a hot plate at 100° C. for 2 minutes. Next, using an i-ray stepper exposure device FPA-3000 i5+ (manufactured by Canon Corporation) at 1000 mJ/cm$^2$, a 2 µm Bayer pattern was exposed through a mask at 1000 mJ/cm$^2$. Next, puddle development was performed at 23° C. for 60 seconds using a tetramethylammonium hydroxide (TMAH) 0.3 mass % aqueous solution. Next, the silicon wafer was rinsed by spin showering and was washed with pure water. Next, the silicon wafer was heated using a hot plate at 200° C. for 5 minutes. As a result, the infrared transmitting filter was patterned on a portion where the Bayer pattern of the infrared cut filter was not formed. This filter was incorporated into a solid image pickup element using a well-known method.

Forming Method (4)

The Red composition was applied to a silicon wafer using a spin coating method such that the thickness of the formed film was 1.0 µm. Next, the silicon wafer was heated using a hot plate at 100° C. for 2 minutes. Next, using an i-ray stepper exposure device FPA-3000 i5+ (manufactured by Canon Corporation) at 1000 mJ/cm$^2$, a 2 µm dot pattern was exposed through a mask at 1000 mJ/cm$^2$. Next, puddle development was performed at 23° C. for 60 seconds using a tetramethylammonium hydroxide (TMAH) 0.3 mass % aqueous solution. Next, the silicon wafer was rinsed by spin showering and was washed with pure water. Next, the silicon wafer was heated using a hot plate at 200° C. for 5 minutes to obtain a 2 µm dot pattern. Likewise, the Green composition and the Blue composition were sequentially patterned to form red, green, and blue color patterns.

The infrared absorbing composition was applied to the red, green, and blue color patterns using a spin coating method such that the thickness of the formed film was 1.0 µm. Next, the silicon wafer was heated using a hot plate at 100° C. for 2 minutes. Next, using an i-ray stepper exposure device FPA-3000 i5+ (manufactured by Canon Corporation) at 1000 mJ/cm$^2$, a 2 µm Bayer pattern was exposed through a mask at 1000 mJ/cm$^2$. Next, puddle development was performed at 23° C. for 60 seconds using a tetramethylammonium hydroxide (TMAH) 0.3 mass % aqueous solution. Next, the silicon wafer was rinsed by spin showering and was washed with pure water. Next, the silicon wafer was heated using a hot plate at 200° C. for 5 minutes. As a result, a 2 µm Bayer pattern (infrared cut filter) was formed.

Next, the composition for forming an infrared transmitting filter (the composition 100 or the composition 101) was applied to the pattern-formed film using a spin coating method such that the thickness of the formed film was 2.0 µm. Next, the silicon wafer was heated using a hot plate at 100° C. for 2 minutes. Next, using an i-ray stepper exposure device FPA-3000 i5+ (manufactured by Canon Corporation) at 1000 mJ/cm$^2$, a 2 µm Bayer pattern was exposed through a mask at 1000 mJ/cm$^2$. Next, puddle development was performed at 23° C. for 60 seconds using a tetramethylammonium hydroxide (TMAH) 0.3 mass % aqueous solution. Next, the silicon wafer was rinsed by spin showering and was washed with pure water. Next, the silicon wafer was heated using a hot plate at 200° C. for 5 minutes. As a result, the infrared transmitting filter was patterned on a portion where the Bayer pattern of the infrared cut filter was not formed. This filter was incorporated into a solid image pickup element using a well-known method.

Forming Method (5)

The infrared absorbing composition having the composition 5 was applied to a silicon wafer using a spin coating method such that the thickness of the formed film was 2.0 µm. Next, the silicon wafer was heated using a hot plate at 100° C. for 2 minutes. Next, using an i-ray stepper exposure device FPA-3000 i5+ (manufactured by Canon Corporation) at 1000 mJ/cm$^2$, a 2 µm dot pattern was exposed through a mask at 1000 mJ/cm$^2$. Next, puddle development was performed at 23° C. for 60 seconds using a tetramethylammonium hydroxide (TMAH) 0.3 mass % aqueous solution. Next, the silicon wafer was rinsed by spin showering and was washed with pure water. Next, the silicon wafer was heated using a hot plate at 200° C. for 5 minutes to obtain a 2 µm dot pattern. Likewise, the infrared absorbing composition having the composition 6 and the infrared absorbing composition having the composition 7 were sequentially patterned to form red, green, and blue color patterns (infrared cut filter).

Next, the composition for forming an infrared transmitting filter (the composition 100 or the composition 101) was applied to the pattern-formed film using a spin coating method such that the thickness of the formed film was 2.0 µm. Next, the silicon wafer was heated using a hot plate at 100° C. for 2 minutes. Next, using an i-ray stepper exposure device FPA-3000 i5+ (manufactured by Canon Corporation) at 1000 mJ/cm$^2$, a 2 µm Bayer pattern was exposed through a mask at 1000 mJ/cm$^2$. Next, puddle development was performed at 23° C. for 60 seconds using a tetramethylammonium hydroxide (TMAH) 0.3 mass % aqueous solution.

Next, the silicon wafer was rinsed by spin showering and was washed with pure water. Next, the silicon wafer was heated using a hot plate at 200° C. for 5 minutes. As a result, the infrared transmitting filter was patterned on a portion where the Bayer pattern of the infrared cut filter was not formed. This filter was incorporated into a solid image pickup element using a well-known method.

Forming Method (6) (Comparative Example)

A $TiO_2$ film as a high refractive index material layer and a $SiO_2$ film as a low refractive index material layer were alternately laminated by vapor deposition to form a dielectric multi-layer film. The thicknesses of the respective films in the dielectric multi-layer film are shown in the table below. In the table below, left numerical values represent the order of laminating. "1" represents the substrate side, and "11" represents the outermost surface side.

In a case where an infrared transmitting filter was formed using the composition for forming an infrared transmitting filter having the composition 100, a laminate A as a dielectric multi-layer film was formed. In a case where an infrared transmitting filter was formed using the composition for forming an infrared transmitting filter having the composition 101, a laminate B as a dielectric multi-layer film was formed.

TABLE 13

| Laminate A | | Laminate B | | |
|---|---|---|---|---|
| Layer No. | Kind | Thickness (nm) | Layer No. | Kind | Thickness (nm) |
| 1 | $SiO_2$ | 0.073 | 1 | $SiO_2$ | 0.081 |
| 2 | $TiO_2$ | 0.094 | 2 | $TiO_2$ | 0.104 |
| 3 | $SiO_2$ | 0.146 | 3 | $SiO_2$ | 0.162 |
| 4 | $TiO_2$ | 0.094 | 4 | $TiO_2$ | 0.104 |
| 5 | $SiO_2$ | 0.146 | 5 | $SiO_2$ | 0.162 |
| 6 | $TiO_2$ | 0.094 | 6 | $TiO_2$ | 0.104 |
| 7 | $SiO_2$ | 0.146 | 7 | $SiO_2$ | 0.162 |
| 8 | $TiO_2$ | 0.094 | 8 | $TiO_2$ | 0.104 |
| 9 | $SiO_2$ | 0.146 | 9 | $SiO_2$ | 0.162 |
| 10 | $TiO_2$ | 0.094 | 10 | $TiO_2$ | 0.104 |
| 11 | $SiO_2$ | 0.146 | 11 | $SiO_2$ | 0.162 |
| Total | — | 1.277 | Total | — | 1.413 |

Next, a 2 μm Bayer pattern (dielectric multi-layer film) was formed using a dry etching method.

Next, the Red composition was applied to the Bayer pattern of the dielectric multi-layer film using a spin coating method such that the thickness of the formed film was 1.0 μm. Next, the silicon wafer was heated using a hot plate at 100° C. for 2 minutes. Next, using an i-ray stepper exposure device FPA-3000 i5+ (manufactured by Canon Corporation) at 1000 mJ/cm², a 2 μm dot pattern was exposed through a mask at 1000 mJ/cm². Next, puddle development was performed at 23° C. for 60 seconds using a tetramethylammonium hydroxide (TMAH) 0.3 mass % aqueous solution. Next, the silicon wafer was rinsed by spin showering and was washed with pure water. Next, the silicon wafer was heated using a hot plate at 200° C. for 5 minutes. As a result, the Red composition was patterned on the Bayer pattern of the dielectric multi-layer film. Likewise, the Green composition and the Blue composition were sequentially patterned to form red, green, and blue color patterns.

Next, the composition for forming an infrared transmitting filter (the composition 100 or the composition 101) was applied to the pattern-formed film using a spin coating method such that the thickness of the formed film was 2.0 μm. Next, the silicon wafer was heated using a hot plate at 100° C. for 2 minutes. Next, using an i-ray stepper exposure device FPA-3000 i5+ (manufactured by Canon Corporation) at 1000 mJ/cm², a 2 μm Bayer pattern was exposed through a mask at 1000 mJ/cm². Next, puddle development was performed at 23° C. for 60 seconds using a tetramethylammonium hydroxide (TMAH) 0.3 mass % aqueous solution. Next, the silicon wafer was rinsed by spin showering and was washed with pure water. Next, the silicon wafer was heated using a hot plate at 200° C. for 5 minutes. As a result, the infrared transmitting filter was patterned on a portion where the pattern of the dielectric multi-layer film was not formed. This filter was incorporated into a solid image pickup element using a well-known method.

(Evaluation of Incidence Angle Dependency)

The infrared absorbing composition was applied to a glass substrate using a spin coater (manufactured by Mikasa Co., Ltd.) to form a coating film. The application amount was adjusted such that the thickness of the formed film was 1.0 μm.

The coating film was heated (pre-baked) using a hot plate at 100° C. for 120 seconds. Further, the coating film was heated (post-baked) using a hot plate at 200° C. for 5 minutes. As a result, an infrared cut filter (thickness: 1.0 μm) was obtained.

The incidence angle dependency of the obtained infrared cut filter was measured using U-4100 (manufactured by Hitachi High-Technologies Corporation). Specifically, the measurement wavelength range was set as 400 to 1200 nm, a normal direction perpendicular to a surface of the infrared cut filter was set as 0°, and then the transmittances of the infrared cut filter at different incidence angles of 0°, 20°, and 40° were measured. The obtained measurement results were evaluated based on the following standards. More specifically, a wavelength (=X) at which the transmittance was 50(%) and which was most closest to the short wavelength side among absorption maximums measured at an incidence angle of 0° was compared to a wavelength (=Y) at which the transmittance was 50(%) and which was most closest to the short wavelength side among absorption maximums measured at an incidence angle of 20° or 40°, and the absolute value of a difference (shift) |X−Y| was evaluated.

"A": the absolute value of a difference (shift) |X−Y| was less than 10 nm

"B": the absolute value of a difference (shift) |X−Y| was 10 nm or more and less than 20 nm "C": the absolute value of a difference (shift) |X−Y| was 20 nm or more (Evaluation of Recognition)

Using the obtained solid image pickup element, an object was irradiated with a infrared light emitting diode (infrared LED) as a light source in a low-illuminance environment (0.001 Lux) to acquire images. Next, the image performances of the solid image pickup elements were compared to each other for evaluation. Evaluation standards are as described below.

In a case where an infrared transmitting filter was formed using the composition for forming an infrared transmitting filter having the composition 100, an infrared LED having an emission wavelength of 850 nm was used. In a case where an infrared transmitting filter was formed using the composition for forming an infrared transmitting filter having the composition 101, an infrared LED having an emission wavelength of 940 nm was used.

<Evaluation Standards>

3: Satisfactory (an object was able to be clearly recognized on the image)

2: Less satisfactory (an object was able to be recognized on the image)

1: Unsatisfactory (an object was not able to be recognized on the image)

TABLE 14

| | Infrared Absorbing Composition | | | | Evaluation | |
|---|---|---|---|---|---|---|
| | Kind of Infrared Absorber | | | | Evaluation of | |
| | Kind of Formula | Kind of Colorant | Compound No. | Pattern Forming Method | Incidence Angle Dependency | Evaluation of Recognition |
| Example 1 | Composition 1 | Squarylium | Q-56 | Forming Method (1) | A | 3 |
| Example 2 | | | | Forming Method (2) | A | 3 |
| Example 3 | | | | Forming Method (3) | A | 3 |
| Example 4 | | | | Forming Method (4) | A | 3 |
| Example 5 | | | Q-62 | Forming Method (2) | A | 3 |
| Example 6 | | Cyanine | C-11 | Forming Method (1) | A | 3 |
| Example 7 | | | | Forming Method (2) | A | 3 |
| Example 8 | | | | Forming Method (3) | A | 3 |
| Example 9 | | | | Forming Method (4) | A | 3 |
| Example 10 | | | C-15 | Forming Method (2) | A | 3 |
| Example 11 | | | C-21 | | A | 3 |
| Example 12 | | | C-34 | | A | 3 |
| Example 13 | | | C-36 | | A | 3 |
| Example 14 | | Oxonol | O-6 | Forming Method (1) | A | 2 |
| Example 15 | | | | Forming Method (2) | A | 2 |
| Example 16 | | | | Forming Method (3) | A | 2 |
| Example 17 | | | | Forming Method (4) | A | 2 |
| Example 18 | Composition 2 | Squarylium | Q-3 | Forming Method (1) | A | 3 |
| Example 19 | | | | Forming Method (2) | A | 3 |
| Example 20 | | | | Forming Method (3) | A | 3 |
| Example 21 | | | | Forming Method (4) | A | 3 |
| Example 22 | | | Q-26 | Forming Method (2) | A | 3 |
| Example 23 | | | Q-28 | | A | 3 |
| Example 24 | | | Q-32 | | A | 3 |
| Example 25 | | | Q-35 | | A | 3 |
| Example 26 | | | Q-39 | | A | 3 |
| Example 27 | | | Q-42 | | A | 3 |
| Example 28 | | | Q-49 | | A | 3 |
| Example 29 | | Cyanine | S-6 | Forming Method (1) | A | 3 |
| Example 30 | | | | Forming Method (2) | A | 3 |
| Example 31 | | | | Forming Method (3) | A | 3 |
| Example 32 | | | | Forming Method (4) | A | 3 |
| Example 33 | | | S-11 | Forming Method (2) | A | 3 |
| Example 34 | | | S-14 | | A | 3 |
| Example 35 | | | I-11 | | A | 3 |
| Example 36 | | | S-33 | | A | 3 |
| Example 37 | | Oxonol | O-4 | Forming Method (1) | A | 2 |
| Example 38 | | | | Forming Method (2) | A | 2 |
| Example 39 | | | | Forming Method (3) | A | 2 |
| Example 40 | | | | Forming Method (4) | A | 2 |
| Example 41 | | | O-13 | Forming Method (2) | A | 2 |
| Example 42 | | | O-10 | | A | 2 |
| Example 43 | | | O-18 | | A | 2 |

TABLE 15

| | Infrared Absorbing Composition | | | | Evaluation | |
|---|---|---|---|---|---|---|
| | Kind of Infrared Absorber | | | | Evaluation of | |
| | Kind of Formula | Kind of Colorant | Compound No. | Pattern Forming Method | Incidence Angle Dependency | Evaluation of Recognition |
| Example 44 | Composition 3 | Squarylium | Q-3 | Forming Method (1) | A | 3 |
| Example 45 | | | | Forming Method (3) | A | 3 |
| Example 46 | | | Q-26 | Forming Method (1) | A | 3 |
| Example 47 | | | Q-28 | | A | 3 |
| Example 48 | | | Q-32 | | A | 3 |
| Example 49 | | | Q-35 | | A | 3 |
| Example 50 | | | Q-39 | | A | 3 |
| Example 51 | | | Q-42 | | A | 3 |
| Example 52 | | | Q-49 | | A | 3 |
| Example 53 | | Cyanine | S-6 | Forming Method (1) | A | 3 |
| Example 54 | | | | Forming Method (3) | A | 3 |
| Example 55 | | | S-11 | Forming Method (1) | A | 3 |
| Example 56 | | | S-14 | | A | 3 |
| Example 57 | | | I-11 | | A | 3 |
| Example 58 | | | S-33 | | A | 3 |
| Example 59 | | Oxonol | O-4 | Forming Method (1) | A | 2 |
| Example 60 | | | | Forming Method (3) | A | 2 |

TABLE 15-continued

| | Infrared Absorbing Composition | | | | Evaluation | |
|---|---|---|---|---|---|---|
| | Kind of Infrared Absorber | | | | Evaluation of | |
| | Kind of Formula | Kind of Colorant | Compound No. | Pattern Forming Method | Incidence Angle Dependency | Evaluation of Recognition |
| Example 61 | | | O-13 | Forming Method (1) | A | 2 |
| Example 62 | | | O-10 | | A | 2 |
| Example 63 | | | O-18 | | A | 2 |
| Example 64 | Composition 4 | Squarylium | Q-56 | Forming Method (1) | A | 3 |
| Example 65 | | | | Forming Method (3) | A | 3 |
| Example 66 | | | Q-62 | Forming Method (1) | A | 3 |
| Example 67 | | Cyanine | C-11 | Forming Method (1) | A | 3 |
| Example 68 | | | | Forming Method (3) | A | 3 |
| Example 69 | | | C-15 | Forming Method (1) | A | 3 |
| Example 70 | | | C-21 | | A | 3 |
| Example 71 | | | C-34 | | A | 3 |
| Example 72 | | | C-36 | | A | 3 |
| Example 73 | | Oxonol | O-6 | Forming Method (1) | A | 2 |
| Example 74 | | | | Forming Method (3) | A | 2 |
| Example 75 | Compositions 5 to 7 | Squarylium | Q-3 | Forming Method (5) | A | 3 |
| Example 76 | | | Q-26 | | A | 3 |
| Example 77 | | | Q-28 | | A | 3 |
| Example 78 | | | Q-32 | | A | 3 |
| Example 79 | | | Q-35 | | A | 3 |
| Example 80 | | | Q-39 | | A | 3 |
| Example 81 | | | Q-42 | | A | 3 |
| Example 82 | | | Q-49 | | A | 3 |
| Example 83 | | Cyanine | S-6 | | A | 3 |
| Example 84 | | | S-11 | | A | 3 |
| Example 85 | | | S-14 | | A | 3 |
| Example 86 | | | I-11 | | A | 3 |
| Example 87 | | | S-33 | | A | 3 |
| Example 88 | | Oxonol | O-4 | | A | 2 |
| Example 89 | | | O-13 | | A | 2 |
| Example 90 | | | O-10 | | A | 2 |
| Example 91 | | | O-18 | | A | 2 |
| Comparative Example 1 | | | — | Forming Method (6) | C | — |
| Comparative Example 2 | | | — | | C | — |

TABLE 16

| | Infrared Absorbing Composition | | | Evaluation | |
|---|---|---|---|---|---|
| | | Kind of Infrared Absorber | | Evaluation of | |
| | Kind of Formula | Kind of Colorant | Pattern Forming Method | Incidence Angle Dependency | Evaluation of Recognition |
| Example 92 | Composition 8 | Squarylium | Forming Method (1) | A | 3 |
| Example 93 | Composition 9 | Cyanine | | A | 3 |
| Example 94 | Composition 10 | Cyanine | | A | 3 |
| Example 95 | Composition 11 | Squarylium | | A | 3 |
| Example 96 | Composition 12 | Squarylium | | A | 3 |
| Example 97 | Composition 13 | Squarylium | | A | 3 |
| Example 98 | Composition 14 | Squarylium | | A | 3 |
| Example 99 | Composition 15 | Squarylium | | A | 3 |
| Example 100 | Composition 16 | Squarylium | | A | 3 |
| Example 101 | Composition 17 | Cyanine | | A | 3 |
| Example 102 | Composition 18 | Cyanine | | A | 3 |
| Example 103 | Composition 19 | Cyanine | | A | 3 |
| Example 104 | Composition 20 | Squarylium | | A | 3 |
| Example 105 | Composition 21 | Squarylium | | A | 3 |
| Example 106 | Composition 22 | Cyanine | | A | 3 |
| Example 107 | Composition 23 | Cyanine | | A | 3 |
| Example 108 | Composition 24 | Cyanine | | A | 3 |
| Example 109 | Composition 25 | Cyanine | | A | 3 |
| Example 110 | Composition 26 | Cyanine | | A | 3 |
| Example 111 | Composition 27 | Cyanine | | A | 3 |
| Example 112 | Composition 28 | Squarylium | | A | 3 |
| Example 113 | Composition 29 | Cyanine | | A | 3 |

In the above results, the incidence angle dependency of Examples was satisfactory. Further, the evaluation results of the recognition were also satisfactory. In addition, in Examples, the infrared cut filter was able to be manufactured in the coating step through a small number of steps.

On the other hand, in Comparative Example, the incidence angle dependency was poor.

In Examples 1 to 74, the same effects were obtained even in a case where the infrared cut filter was formed on another substrate different from the substrate on which the red, green and blue color patterns were formed and then was incorporated into the solid image pickup element shown in FIG. 10.

The infrared absorbers described in "Compound No." of Tables 14 and 15 are the compounds having the structures described as the specific examples of the polymethine colorant. All the infrared absorbers described in "Compound No." of Tables 14 and 15 have an absorption maximum at a wavelength of 650 nm or longer.

EXPLANATION OF REFERENCES

110: solid image pickup element
111, 111a, 111b: infrared cut filter
112: color filter
114: infrared transmitting filter
115: microlens
116: planarizing layer
150, 150a, 151: support

What is claimed is:
1. An infrared cut filter which is obtained by curing an infrared absorbing composition, the infrared absorbing composition comprising:
an infrared absorber having an absorption maximum at a wavelength of 650 nm or longer which is a polymethine colorant,
wherein the polymethine colorant is at least one of Q-21, Q-22, Q-23, Q-24, Q-25, Q-26, Q-42, Q-43, Q-44, Q-45, Q-46, or Q-47

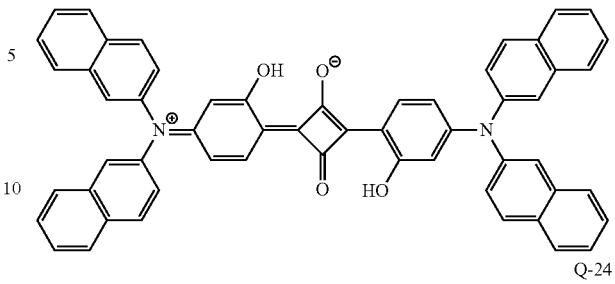
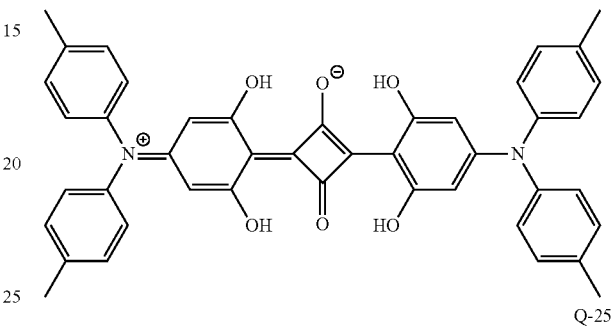
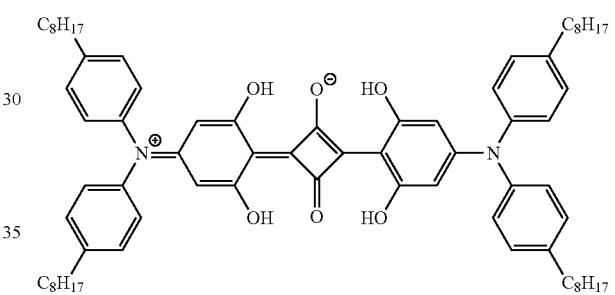
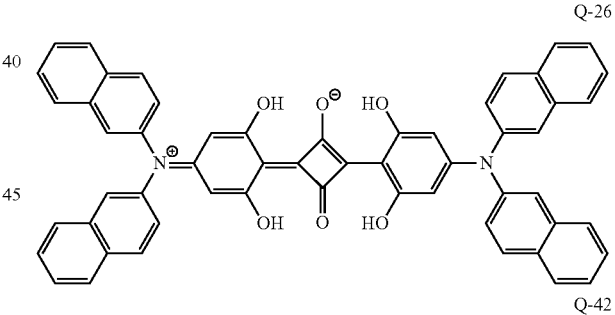
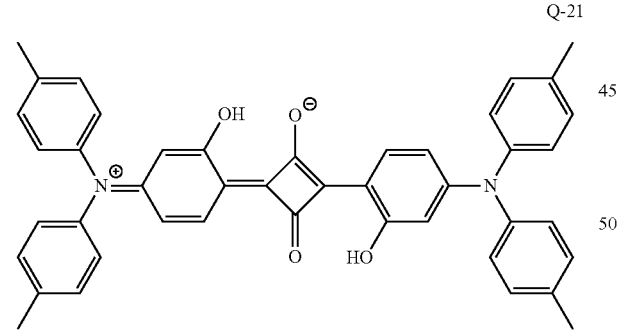
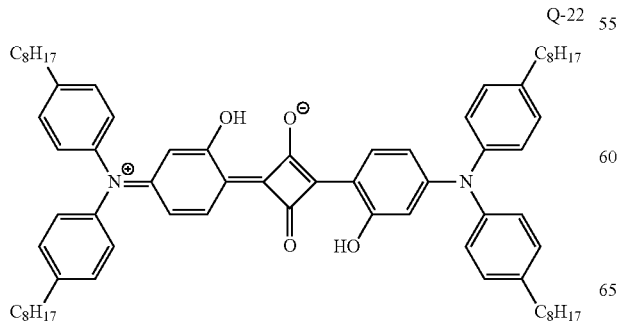
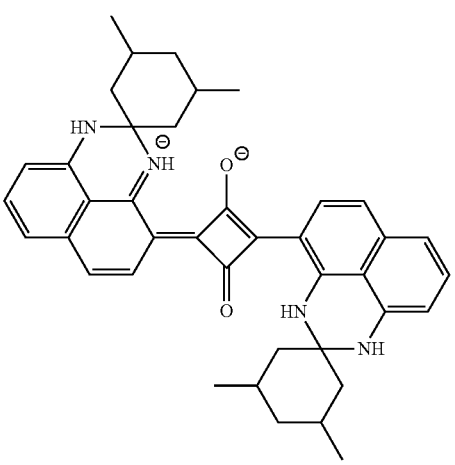

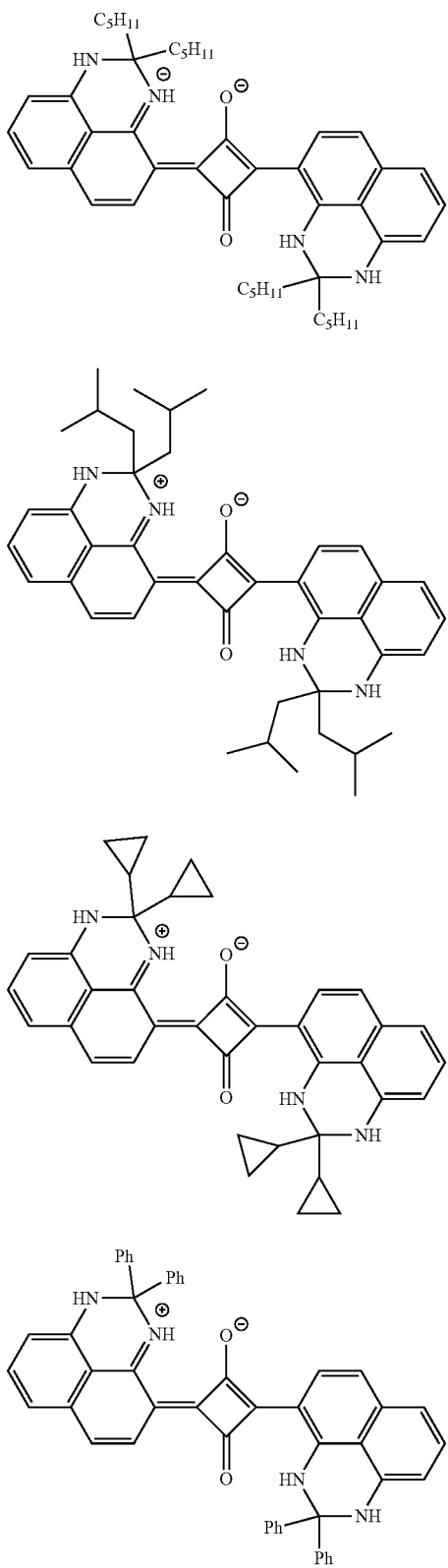

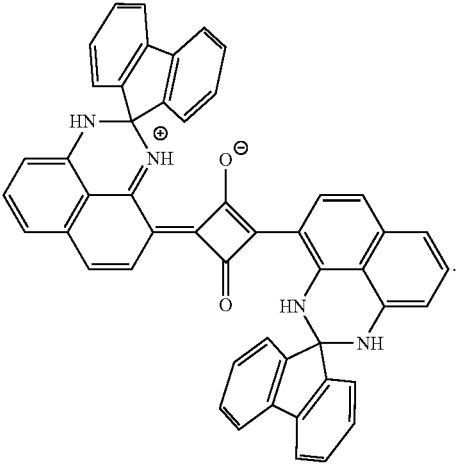

2. The infrared cut filter according to claim 1, wherein the infrared absorbing composition further includes at least one selected from the group consisting of a resin and a curable compound.

3. The infrared cut filter according to claim 1, wherein the infrared absorbing composition further includes a solvent.

4. The infrared cut filter according to claim 1, wherein the infrared absorbing composition further includes a chromatic colorant.

5. A laminate comprising:
the infrared cut filter according to claim 4; and
a color filter that includes a chromatic colorant.

6. A laminate comprising:
the infrared cut filter according to claim 1; and
a color filter that includes a chromatic colorant.

7. A solid image pickup element comprising:
the infrared cut filter according to claim 1.

8. The solid image pickup element according to claim 7, further comprising:
a color filter that includes a chromatic colorant.

9. The solid image pickup element according to claim 8, wherein the infrared cut filter and the color filter are adjacent to each other in a thickness direction of the infrared cut filter.

10. The solid image pickup element according to claim 7, further comprising:
an infrared transmitting filter.

11. The infrared cut filter according to claim 1, wherein the polymethine colorant is at least one of Q-21, Q-22, Q-23, Q-24, Q-25, or Q-26.

12. The infrared cut filter according to claim 1, wherein the polymethine colorant is at least one of Q-42, Q-43, Q-44, Q-45, Q-46, or Q-47.

13. The infrared cut filter according to claim 1, wherein the polymethine colorant is at least one of Q-42 or Q-47.

14. The infrared cut filter according to claim 1, further comprising:
a fluorine surfactant,
wherein the fluorine content in the fluorine surfactant is 3 to 40 mass %.

* * * * *